US009481949B2

(12) United States Patent
Zhang et al.

(10) Patent No.: US 9,481,949 B2
(45) Date of Patent: Nov. 1, 2016

(54) FABRICATION AND APPLICATION OF NANOFIBER RIBBONS AND SHEETS AND TWISTED AND NON-TWISTED NANOFIBER YARNS

(71) Applicant: Board of Regents, The University of Texas System, Austin, TX (US)

(72) Inventors: Mei Zhang, Plano, TX (US); Shaoli Fang, Richardson, TX (US); Ray H. Baughman, Dallas, TX (US); Anvar A. Zakhidov, McKinney, TX (US); Kenneth Ross Atkinson, Victoria (AU); Ali E. Aliev, Dallas, TX (US); Sergey Li, Dallas, TX (US); Chris Williams, Dallas, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 14/332,632

(22) Filed: Jul. 16, 2014

(65) Prior Publication Data
US 2015/0308018 A1 Oct. 29, 2015

Related U.S. Application Data

(63) Continuation of application No. 11/718,954, filed as application No. PCT/US2005/410301 on Nov. 9, 2005, now Pat. No. 8,926,933.

(60) Provisional application No. 60/702,444, filed on Jul. 26, 2005, provisional application No. 60/666,351, filed on Mar. 30, 2005, provisional application No. 60/626,314, filed on Nov. 9, 2004.

(51) Int. Cl.
*D01F 9/12* (2006.01)
*D01F 9/127* (2006.01)
(Continued)

(52) U.S. Cl.
CPC ........... *D02G 3/44* (2013.01); *B01L 3/502707* (2013.01); *B29C 47/0059* (2013.01);
(Continued)

(58) Field of Classification Search
CPC ............ C01B 31/022; C01B 31/0226; C01B 31/0233; C01B 31/024; C01B 31/0246; C01B 31/0253; C01B 31/026; C01B 31/0266; C01B 31/0273; C01B 31/028; C01B 31/0286; C01B 31/0293; C01B 2202/00; C01B 2202/02; C01B 2202/04

USPC ........ 423/447.1–447.3, 445 B; 977/742–754, 977/842–848
See application file for complete search history.

(56) References Cited

U.S. PATENT DOCUMENTS

| | | |
|---|---|---|
| 4,434,611 A | 3/1984 | Hasegawa |
| 5,350,644 A | 9/1994 | Graetzel et al. |

(Continued)

FOREIGN PATENT DOCUMENTS

| | | |
|---|---|---|
| JP | 2004149996 | 5/2004 |
| WO | 8807409 A1 | 10/1988 |

(Continued)

OTHER PUBLICATIONS

Bohannon, Science retracts gay marriage paper without agreement of lead author LaCour, accessed online at http://www.sciencemag.org/news/2015/05/science-retracts-gay-marriage-paper-without-agreement-lead-author-lacour (May 28, 2015).*

(Continued)

*Primary Examiner* — Daniel C McCracken
(74) *Attorney, Agent, or Firm* — Dickinson Wright PLLC; Ross Spencer Garsson

(57) ABSTRACT

The present invention is directed to nanofiber yarns, ribbons, and sheets; to methods of making said yarns, ribbons, and sheets; and to applications of said yarns, ribbons, and sheets. In some embodiments, the nanotube yarns, ribbons, and sheets comprise carbon nanotubes. Particularly, such carbon nanotube yarns of the present invention provide unique properties and property combinations such as extreme toughness, resistance to failure at knots, high electrical and thermal conductivities, high absorption of energy that occurs reversibly, up to 13% strain-to-failure compared with the few percent strain-to-failure of other fibers with similar toughness, very high resistance to creep, retention of strength even when heated in air at 450° C. for one hour, and very high radiation and UV resistance, even when irradiated in air. Furthermore these nanotube yarns can be spun as one micron diameter yarns and plied at will to make two-fold, four-fold, and higher fold yarns. Additional embodiments provide for the spinning of nanofiber sheets having arbitrarily large widths. In still additional embodiments, the present invention is directed to applications and devices that utilize and/or comprise the nanofiber yarns, ribbons, and sheets of the present invention.

18 Claims, 111 Drawing Sheets

(51) Int. Cl.

| | | |
|---|---|---|
| *D02G 3/44* | (2006.01) | |
| *B82Y 10/00* | (2011.01) | |
| *D02G 3/28* | (2006.01) | |
| *H01L 51/00* | (2006.01) | |
| *H01L 51/52* | (2006.01) | |
| *H01G 11/36* | (2013.01) | |
| *B29C 47/00* | (2006.01) | |
| *B32B 5/02* | (2006.01) | |
| *B32B 5/12* | (2006.01) | |
| *B32B 18/00* | (2006.01) | |
| *D02G 3/16* | (2006.01) | |
| *C01B 31/02* | (2006.01) | |
| *C04B 35/622* | (2006.01) | |
| *C04B 35/628* | (2006.01) | |
| *B01L 3/00* | (2006.01) | |
| *D04H 3/002* | (2012.01) | |
| *D06B 15/00* | (2006.01) | |
| *G02F 1/15* | (2006.01) | |
| *H01M 4/86* | (2006.01) | |

(52) U.S. Cl.
CPC ............ *B32B 5/02* (2013.01); *B32B 5/12* (2013.01); *B32B 18/00* (2013.01); *B82Y 10/00* (2013.01); *C01B 31/0293* (2013.01); *C04B 35/62231* (2013.01); *C04B 35/62272* (2013.01); *C04B 35/62281* (2013.01); *C04B 35/62855* (2013.01); *C04B 35/62892* (2013.01); *C04B 35/62897* (2013.01); *D01F 9/12* (2013.01); *D01F 9/127* (2013.01); *D02G 3/16* (2013.01); *D02G 3/28* (2013.01); *D04H 3/002* (2013.01); *D06B 15/00* (2013.01); *H01G 11/36* (2013.01); *H01L 51/0048* (2013.01); *H01L 51/5206* (2013.01); *B32B 2262/106* (2013.01); *B32B 2310/00* (2013.01); *B32B 2313/04* (2013.01); *C04B 2235/422* (2013.01); *C04B 2235/526* (2013.01); *C04B 2235/5248* (2013.01); *C04B 2235/5264* (2013.01); *D01F 9/1275* (2013.01); *D10B 2101/122* (2013.01); *G02F 2001/1515* (2013.01); *H01L 51/5234* (2013.01); *H01M 4/8605* (2013.01); *Y02E 10/549* (2013.01); *Y02E 60/13* (2013.01); *Y02P 70/521* (2015.11); *Y10S 977/742* (2013.01); *Y10S 977/745* (2013.01); *Y10S 977/843* (2013.01); *Y10S 977/847* (2013.01); *Y10S 977/848* (2013.01); *Y10T 428/30* (2015.01)

(56) References Cited

U.S. PATENT DOCUMENTS

| | | |
|---|---|---|
| 5,441,827 A | 8/1995 | Gratzel et al. |
| 5,646,479 A | 7/1997 | Troxell |
| 5,728,487 A | 3/1998 | Gratzel et al. |
| 6,232,706 B1 | 5/2001 | Dai et al. |
| 6,417,025 B1 | 7/2002 | Gengel |
| 6,527,964 B1 | 3/2003 | Smith et al. |
| 6,555,945 B1 | 4/2003 | Baughman et al. |
| 6,590,346 B1 | 7/2003 | Hadley et al. |
| 6,611,093 B1 | 8/2003 | Haven et al. |
| 6,623,579 B1 | 9/2003 | Smith et al. |
| 6,682,677 B2 | 1/2004 | Lobovsky et al. |
| 6,731,353 B1 | 5/2004 | Credelle et al. |
| 6,777,869 B2 | 8/2004 | Pavlovsky |
| 6,780,696 B1 | 8/2004 | Schatz |
| 6,803,708 B2 | 10/2004 | Simon et al. |
| 6,914,381 B2 | 7/2005 | Okai et al. |
| 6,933,674 B2 | 8/2005 | Im et al. |
| 6,943,493 B2 | 9/2005 | Uemura et al. |
| 6,957,993 B2 | 10/2005 | Jiang et al. |
| 7,045,108 B2* | 5/2006 | Jiang ................. B01J 23/74 423/447.1 |
| 7,054,064 B2* | 5/2006 | Jiang ................. B82Y 20/00 359/485.05 |
| 7,160,531 B1 | 1/2007 | Jacques et al. |
| 7,655,302 B2 | 2/2010 | Smalley et al. |
| 7,704,480 B2* | 4/2010 | Jiang ................. B82Y 30/00 423/447.1 |
| 8,323,607 B2* | 12/2012 | Liu .................... B82B 3/0047 423/447.1 |
| 8,329,134 B2* | 12/2012 | Liu .................... B82Y 30/00 423/447.1 |
| 8,343,451 B2* | 1/2013 | Feng ................. B82Y 30/00 264/292 |
| 8,414,859 B2* | 4/2013 | Feng ................. B82Y 30/00 423/447.1 |
| 8,444,947 B2* | 5/2013 | Feng ................. B82Y 30/00 423/447.1 |
| 8,602,765 B2* | 12/2013 | Jiang ................. B82Y 30/00 19/66 R |
| 8,668,896 B2* | 3/2014 | Liu .................... B82B 3/00 423/447.1 |
| 2003/0133865 A1* | 7/2003 | Smalley ............. B82Y 15/00 423/447.1 |
| 2004/0047038 A1* | 3/2004 | Jiang ................. B82Y 20/00 359/485.01 |
| 2004/0051432 A1 | 3/2004 | Jiang et al. |
| 2004/0053053 A1 | 3/2004 | Jiang et al. |
| 2004/0053780 A1* | 3/2004 | Jiang ................. B01J 23/74 502/182 |
| 2004/0184981 A1 | 9/2004 | Liu et al. |
| 2004/0197546 A1 | 10/2004 | Rinzler et al. |
| 2004/0222081 A1 | 11/2004 | Tour et al. |
| 2005/0006801 A1 | 1/2005 | Kinloch et al. |
| 2006/0175950 A1 | 8/2006 | Itou et al. |
| 2006/0219687 A1 | 10/2006 | Best et al. |
| 2007/0036709 A1 | 2/2007 | Lashmore et al. |
| 2007/0116631 A1 | 5/2007 | Li et al. |
| 2007/0166223 A1* | 7/2007 | Jiang ................. B82Y 30/00 423/447.1 |
| 2007/0237959 A1 | 10/2007 | Lemaire |
| 2008/0181839 A1 | 7/2008 | Arendt et al. |
| 2009/0136751 A1 | 5/2009 | Zhu et al. |
| 2009/0208708 A1 | 8/2009 | Wei et al. |
| 2009/0208742 A1 | 8/2009 | Zhu et al. |
| 2010/0173037 A1* | 7/2010 | Jiang ................. B82Y 30/00 425/223 |
| 2010/0301518 A1* | 12/2010 | Feng ................. B82Y 30/00 264/238 |
| 2011/0020210 A1* | 1/2011 | Liu .................... B82B 3/00 423/447.1 |
| 2011/0052478 A1* | 3/2011 | Feng ................. B82Y 30/00 423/447.1 |
| 2011/0142744 A1* | 6/2011 | Feng ................. B82Y 30/00 423/447.1 |
| 2011/0159190 A1* | 6/2011 | Liu .................... B82Y 30/00 427/294 |
| 2011/0318255 A1* | 12/2011 | Liu .................... B82B 3/0047 423/447.2 |

FOREIGN PATENT DOCUMENTS

| | | |
|---|---|---|
| WO | 9707531 A1 | 2/1997 |
| WO | 2004052559 A2 | 6/2004 |
| WO | 2005007926 A2 | 1/2005 |
| WO | 2005083751 A2 | 9/2005 |
| WO | 2005084378 A2 | 9/2005 |
| WO | 2005102924 A1 | 11/2005 |
| WO | 2006073460 A2 | 7/2006 |
| WO | 2006137893 A2 | 12/2006 |

OTHER PUBLICATIONS

Callaway, Faked peer reviews prompt 64 retractions, accessed online at http://www.nature.com/news/faked-peer-reviews-prompt-64-retractions-1.18202 (Aug. 18, 2015).*

(56) References Cited

OTHER PUBLICATIONS

Definition of lateral, accessed online at: http://www.merriam-webster.com/dictionary/laterally on Aug. 20, 2014.
Li, et al., Air-assisted growth of ultra-long carbon nanotube bundles, Nanotechnology 2008; 19(45): 1-7.
Mirfakhrai, et al., Electrochemical actuation of carbon nanotube yarns, Smart. Mater. Struct. 2007; 16: S243-S249.
Nanotech Discoveries Land Starring Role on PBS Show, accessed online at: http://www.utdallas.edu/news/2011/1/19-8121_Nanotech-Discoveries-Land-Starring-Role-on-PBS-Sho_article.html on Aug. 21, 2014.
Zhang, X., et al., Spinning and Processing Continuous Yarns from 4-Inch Wafer Scale Super-Aligned Carbon Nanotube Arrays, Adv. Mater. 2006; 18: 1505-1510.
Homer, The Odyssey, Book XII, accessed online at http://classics.mit.edu/Homer/odyssey.12.xii.html on Aug. 21, 2014.
Zhang, et al., Multifuncitonal Carbon Nanotube Yarns by Downsizing an Ancient Technology, Scinece 2004; 306: 1358-1361 (Nov. 19, 2004).
Monthioux, et al., Who should be given credit for the discovery of carbon nanotubes?, Carbon 2006; 44: 1621, 1622.
Dalton, et al., Super-tough carbon-nanotube fibers, Nature 2002; 423: 703.
U.S. Appl. No. 60/620,088, filed Oct. 18, 2004 to Zhu.
Rodriguez, et al., Carbon Nanofibers: A Unique Catalyst Support Medium, J. Phys. Chem. 1994; 98: 13108-13111.
Willems, et al., Control of the outer diameter of thin carbon nanotubes synthesized by catalytic decomposition of hydrocarbons, Chemical Physics Letters 2000; 317: 71-76.
Kaatz, et al., Diameter control and emission properties of carbon nanotubes grown using chemical vapor deposition, Materials Science and Engineering C 2003; 23: 141-146.
Choi, et al. Controlling the diameter, growth rate, and density of vertically aligned carbon nanotubes synthesized by microwave plasma-enhanced chemical vapor deposition, Applied Physics Letters 2000; 76(17): 2367-2369.
Huang, et al., Growth of Millimeter-Long and Horizontally Aligned Single-Walled Carbon Nanotubes on Flat Substrates, J. Am. Chem. Soc. 2003, 125: 5636-5637.
Teo, et al., Field emission from denses, sparse, and patterned arrays of carbon nanofibers, Applied Physics Letters 2002; 80(11 ): 2011-2013.
Li, et al., Carbon Nanotube Nanoelectrode Array for Ultrasensitive DNA Detection, Nano Letters 2003; 3(5): 597-602.
Baughman, et al., Carbon Nanotubes—the Route Toward Applications, Science 2002; 297: 787-792.
Li, et al., Direct Spinning of Carbon Nanotube Fibers from Chemical Vapor Deposition Synthesis, Science 2004; 304: 276-278.
Jiang, et al., Spinning continuous carbon nanotube yarns, Nature 2002; 419:801.
A good old yarn, Materials Today, Dec. 2002:10 (no author).
Tubes, chains and threads, Smart Materials Bulletin, Dec. 2002:4.
Satishkumar, et al., Bundles of aligned carbon nanotubes obtained by the pyrolysis of ferrocene-hydrocarbon mixtures: role of the metal nanoparticles produced in situ, Chemical Physics Letters 1999; 307: 158-152.
Certified file history of U.S. Appl. No. 60/702,444, filed Jul. 26, 2005 to Atkinson.
Dai, Carbon Nanotubes: Synthesis, Integration, and Properties, Acc. Chem. Res. 2002; 35: 1035-1044.
Dai, Carbon nanotubes: opportunities and challenges, Surface Science 2002; 500: 218-241.
R. W. Moncrieff, Artificial Fibers 6-7 (2d ed., National Trade Press Limited 1954).
Certified file history of U.S. Appl. No. 60/626,314, filed Nov. 9, 2004 to Zhang.
Japanese Patent Office; English Translation of Notice of Reasons for Rejection, Issued in Connection with Japanese application No. 2007-540423; Aug. 18, 2011; 4 pages; Japan.
English Translation of Arguments Submitted with the Japanese Patent Office, Filed in Connection with Japanese application No. 2007-540423; Feb. 22, 2012; 12 pages; Japan.
Amended Claims Filed with the Japanese Patent Office, Filed in Connection with Japanese application No. 2007-540423 (in English); Feb. 22, 2012; 17 pages; Japan.
Japanese Patent Office; English Translation of Notice of Reasons for Rejection, Issued in Connection with Japanese application No. 2007-540423; Aug. 16, 2012; 4 pages; Japan.
Amended Claims Filed with the Japanese Patent Office, Filed in Connection with Japanese application No. 2007-540423 (in English); Jan. 9, 2013; 12 pages; Japan.
Allowed Claims Filed with the Japanese Patent Office, Filed in Connection with Japanese application No. 2007-540423 (in English); Jan. 9, 2013; 8 pages; Japan.
Allowed Claims Filed with the Japanese Patent Office, Filed in Connection with Japanese application No. 2007-540423 (in English); Jan. 9, 2013; 7 pages; Japan.
Japanese Patent Office; Notice of Allowance, Issued in Connection with Japanese application No. 2007-540423; Jul. 25, 2013; 3 pages; Japan.
Certified file history of U.S. Appl. No. 60/666,351, filed Mar. 30, 2005 to Atkinson.
Kumar, et al.; Synthesis, Structure, and Properties of PBO/SWNT Composites; Oct. 5, 2001; Macromolecules 35, 9039.
Sreekumar et al.; Polyacrylonitrile Single-Walled Carbon Nanotube Composite Fibers; (2004) Advanced Materials 16, 58 (2004).
Vigolo, et al.; Macroscopic Fibers and Ribbons of Oriented Carbon Nanotubes; Nov. 17, 2000; Science 290, 1331.
R.H. Baughman, Putting a New Spin on Carbon Nanotubes; Nov. 17, 2000; Science 290 1310.
Baughman, et al., Carbon Nanotube Actuators; 1999; Science 284, 1340.
Rinzler, et al.; Large-scale Purification of Carbon Nanotubes: process, product and characterization; 1998; Applied Physics A 67, 29.
Endo, et al.; "Buckypaper" from coaxial nanotubes; Feb. 2005; Nature 433, 476.

\* cited by examiner

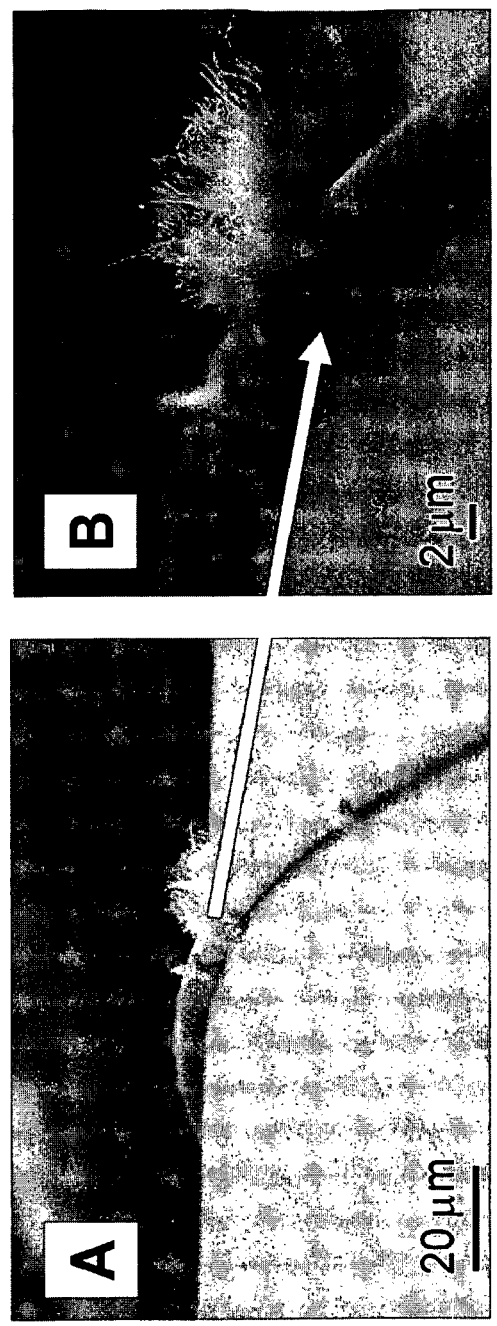
Figure 74, A and B

Polymeric LED using CNT sheet as hole-injecting electrode

Small molecule OLED using CNT sheet as hole-injecting electrode

FABRICATION AND APPLICATION OF NANOFIBER RIBBONS AND SHEETS AND TWISTED AND NON-TWISTED NANOFIBER YARNS

CROSS-REFERENCE TO RELATED APPLICATIONS

This application for patent is a continuation of U.S. patent application Ser. No. 11/718,954, filed May 9, 2007, which was a 371 of PCT/US05/41031 filed Nov. 9, 2005, and claims priority to the following U.S. Provisional Patent Applications: U.S. Provisional Patent Application Ser. No. 60/626,314, filed Nov. 9, 2004; U.S. Provisional Patent Application Ser. No. 60/666,351, filed Mar. 30, 2005; and U.S. Provisional Patent Application Ser. No. 60/702,444, filed Jul. 26, 2005. All of these above-identified patent applications are commonly assigned to the Assignee of the present invention and are hereby incorporated herein by reference in their entirety for all purpose.

This work was supported by Defense Advanced Research Projects Agency/US Army Research Office grant W911NF-04-1-0174, the Texas Advanced Technology Program grant 009741-0130-2003, and the Robert A. Welch Foundation.

FIELD OF THE INVENTION

Methods and apparatus are described for spinning high performance twisted, false twisted and non-twisted yarns comprising nanofibers and for drawing sheets and ribbons comprising nanofibers. Shaped articles, composites, and applications are described for these yarns, ribbons, and sheets.

DESCRIPTION OF THE BACKGROUND ART

Commercial synthesis methods produce nanofibers of either carbon single wall nanotubes (SWNTs) or carbon multiwalled nanotubes (MWNTs) as a soot-like material. The strength and elastic modulus of individual carbon nanotubes in this soot are well known to be exceptionally high, ~37 GPa and ~0.64 TPa, respectively, for about 1.4 nm diameter SWNTs (R. H. Baughman, A. A. Zakhidov, and W. A. de Heer, Science 297, 787-792 (2002)). Relevant for applications needing strong, but lightweight materials, the density-normalized modulus and strength of individual SWNTs are even more impressive, being factors of ~19 and ~54 higher, respectively, than for high-tensile-strength steel wire.

A critical problem hindering applications of these and other nanofibers is the need for methods for assembling these nanofibers into long yarns, sheets, and shaped articles that effectively utilize the properties of the nanofibers. Since such nanofibers can confer functionalities other than mechanical properties, methods are needed for enhancing the mechanical properties of fibers made of the nanofibers without compromising these other functionalities. Important examples of these other functionalities, which combine with the mechanical functionality to make the fibers multifunctional, are electrochromism, electrical and thermal conductivity, electromechanical actuation, and electrical energy storage.

Methods are known for growing both single wall and multiwalled nanotubes as forests of parallel aligned fibers on a solid substrate and for utilizing MWNT forests for a process to produce nanofiber assemblies (K. Jiang et al., Nature 419, 801 (2002)); and in U.S. Patent Application Publication No. 20040053780 (Mar. 18, 2004). However, the resulting assemblies are extremely weak, so they cannot be used for applications that require any significant level of tensile strength.

Although advances have been made in spinning polymer solutions or polymer melts containing either SWNTs or MWNTs, the melt viscosity becomes too high for conventional melt or solution spinning when the nanotube content is much above 10%. Nevertheless, impressive mechanical properties have been obtained for polymer-solution-spun SWNTs, which in large part can be attributed to the mechanical properties of the nanotubes (see S. Kumar et al. Macromolecules 35, 9039 (2002) and T. V. Sreekumar et al., Advanced Materials 16, 58 (2004)). Another problem with both polymer melt and polymer solution spinning is that the nanotubes are not present in sufficient quantities in the polymer to effectively contribute to such properties as thermal and electrical conductivities. Additionally, the unique mechanical properties of the individual nanotubes are diluted, since by far the major component of the fiber is polymer.

A. Lobovsky et al. (U.S. Pat. No. 6,682,677) have described a sheath-core melt spinning process that attempts to avoid the usual limitations caused by low concentrations of carbon nanotubes in melt spun yarns. This process involves melt compounding 30 weight percent of very large diameter carbon MWNTs (150-200 nm in diameter and 50-100 microns in length) in a polypropylene matrix. This nanotube/polymer mixture was successfully spun as the sheath of a sheath/core polymer that contains polypropylene as the core. Despite the high viscosity of the nanotube/polymer mixture in the sheath and the brittleness of the solidified composition, the presence of the polymer core permitted this sheath-core spinning and the subsequent partial alignment of nanotubes in the sheath. Pyrolysis of the polypropylene left a nanotube yarn that is hollow (with outer diameter 0.015 inch and inner diameter 0.0084 inch). To increase the strength of the hollow nanotube yarn, it was coated with carbon using a chemical vapor deposition (CVD) process. Even after this CVD coating process, the hollow nanotube yarns had low strength and low modulus and were quite brittle (see Lobovsky et al. in U.S. Pat. No. 6,682,677).

A gel-based process enabled spinning continuous fibers of SWNT/poly(vinyl alcohol) composites (B. Vigolo et al., Science 290, 1331 (2000); R. H. Baughman, Science 290, 1310 (2000); B. Vigolo et al., Applied Physics Letters 81, 1210 (2002); A. Lobovsky, J. Matrunich, M. Kozlov, R. C. Morris, and R. H. Baughman, U.S. Pat. No. 6,682,677; and A. B. Dalton et al., Nature 423, 703 (2003)). Present problems with this process result from the fact that the nanotubes are simultaneously assembled in combination with poly(vinyl alcohol) (PVA) to form gel fibers, which are converted to solid nanotube/PVA fibers. This PVA then interferes with electrical and thermal contact between carbon nanotubes. The PVA can be removed by thermal pyrolysis, but this severely degrades the mechanical properties of the fibers.

Unfortunately, the polymer-containing fibers made by the above gel spinning processes are not useful for applications as electrodes immersed in liquid electrolytes because they swell dramatically (by 100% or more) and lose most of their dry-state modulus and strength. This process means that these polymer-containing fibers are unusable for critically important applications that use liquid electrolytes, such as in supercapacitors and in electromechanical actuators (R. H. Baughman, Science 290, 1310 (2000)).

In another process (V. A. Davis et al., U.S. Patent Application Publication No. 20030170166), SWNTs were first dispersed in 100% sulfuric acid and then wet-spun into a diethyl ether coagulation bath. Though highly electrically conductive (W. Zhou et al., Journal of Applied Physics 95, 649 (2004)), such prepared yarns have compromised properties, in part due to partial degradation of SWNTs caused by prolonged contact with sulfuric acid. This degradation, which can be partially reversed by high temperature thermal annealing in vacuum, creates a serious obstacle for practical applications. Moreover, any solution- or melt-based processing method that directly forms a polymer assembly is limited to short nanotube lengths (typically a few microns) by the viscosity increases associated with polymer dispersion and formation of globules having little nanotube orientation as a result of nanotube coiling.

Y. Li et al. (*Science* 304, 276 (2004)) reported that MWNT yarns could be formed directly from unoriented carbon nanotube aerogels during nanotube synthesis by CVD. While a twisted yarn was pictured, the ratio of nanotube length (~30 μm) to yarn diameter was about unity, which means that important property enhancements due to lateral forces generated by twisting were not obtainable.

Twisting together micrometer-diameter fibers to make twisted yarns having enhanced mechanical properties is well known in the art, and has been widely practiced for thousands of years. However, no successful means has been conceived in the prior art for achieving the potential benefits of yarn twisting for nanofibers that are a thousand-fold or more smaller in diameter than for the twisted yarns of the prior art. About a hundred thousand individual nanofibers would be in the cross-section of a 5 μm diameter yarn, as compared with the 40-100 fibers in the cross-section of typical commercial wool (worsted) and cotton yarns. The challenge of assembling this enormous number of nanofibers to make a twisted yarn having useful properties as a result of a twist is enormous, and the teachings of the present invention will describe the structural features that must be achieved and how they are achieved.

Reflecting these problems with prior-art technologies of nanofiber yarns, important applications have not yet been commercially enabled, such as carbon nanotube artificial muscles (R. H. Baughman et al., Science 284, 1340 (1999) and U.S. Pat. No. 6,555,945), carbon nanotube yarn supercapacitors, structural composites involving carbon nanotubes, and electronic textiles involving strong, highly conducting nanofiber yarns, No methods of the prior art have been developed for continuously producing strong nanotube ribbons and sheets that are free of polymer or other binding agent, although said sheets would be quite valuable for diverse applications. Carbon nanotube sheets of the prior art are usually made using variations on the ancient art of paper making, by typically week-long filtration of nanotubes dispersed in water and peeling the dried nanotubes as a layer from the filter (see A. G. Rinzler et al., Applied Physics A 67, 29 (1998) and M. Endo et al. Nature 433, 476 (2005)). Interesting variations of the filtration route provide ultra-thin nanotube sheets that are highly transparent and highly conducting (see Z. Wu et al., Science 305, 1273 (2004) and L. Hu, D. S. Hecht, G. Grüner, Nano Letters 4, 2513 (2004)). While filtration-produced sheets are normally isotropic within the sheet plane, sheets having partial nanotube alignment result from applying high magnetic fields during filtration (J. E. Fischer et al., J. Applied Phys. 93, 2157 (2003)) and mechanically rubbing nanotubes that are vertically trapped in filter pores (W. A. De Heer et al., Science 268, 845 (1995)). In other advances, nanotube sheets that are either weak or have unreported strengths have been fabricated from an un-oriented nanotube aerogel (Y. Li, I. A. Kinloch, A. H. Windle, Science 304, 276 (2004), by Langmuir-Blodgett deposition (Y. Kim et al., Jpn. J. Appl. Phys. 42, 7629 (2003)), by casting from oleum (T. V. Sreekumar et al., Chem. Mater. 15, 175 (2003)) and by spin coating (H. Ago, K. Petritsch, M. S. P. Shaffer, A. H. Windle, R. H. Friend, Adv. Mat. 11, 1281 (1999)).

For electrical device applications, nanofiber sheets are needed that combine transparency, electrical conductivity, flexibility, and strength. Applications needs include, for instance light emitting diodes (LEDs), photovoltaic cells, flat panel liquid crystal displays, "smart" windows, electrochromic camouflage, and related applications.

Eikos, Inc. developed a transparent conductive coating based on carbon nanotubes (P. J. Glatkowski and A. J. David, WO2004/052559 A2 (2004)). They used solution-based technology involving carbon single wall nanotube inks. Transparent carbon nanotube (CNT) films involving a polymeric binder were made by N. Saran et al. (Journal American Chemical Society Comm. 126, 4462-4463 (2003)) using a solution deposition method. Also, transparent SWNT electrodes have been made by A. G. Rinzler and Z. Chen (U.S. Patent Application Publication No. US2004/0197546). A. G. Rinzler noticed high transmittance of a SWNT film in both the visible range and the near infrared (NIR) range (3-5 μm) (A. G. Rinzler and Z. Chen, Transparent electrodes from single wall carbon nanotubes, US2004/0197546)).

All of these processing methods are liquid based, and none provides strong, transparent, nanofiber electrode materials or those that can be self-supporting when transparent. Also, none of these methods provides nanotube-based electrodes having useful anisotropic in-plane properties, like anisotropic electrical and thermal conductivity and the ability to polarize light.

There are reports about a successful application of a non-transparent carbon nanotube film as a counter electrode in a Grätzel photoelectrochemical cell, which uses either liquid phase or solid phase electrolytes (see K.-H. Jung et al., Chemistry Letters 864-865 (2002); and S.-R. Jang et al., Langmuir 20, 9807-9810 (2004)). However, strong, transparent nanofiber electrodes have not been available for use in dye solar cells (DSCs), although the need for them is apparent, particularly for flexible solid-state DSCs.

Additionally, none of the above-mentioned approaches have addressed the problem of charge collection or injection from such transparent CNT coatings into organic electronic devices: organic light emitting diodes (OLEDs), optical field effect transistors (OFETs), solar cells, etc. This problem requires either very low work function (w.f.) for electron injection or high w.f. for hole injection.

Nanofibers, and in particular carbon nanofibers, are well known to be useful as electron field emission sources for flat panel displays, lamps, gas discharge tubes providing surge protection, and x-ray and microwave generators (see W. A. de Heer, A. Châtelain, D. Ugarte, Science 270, 1179 (1995); A. G. Rinzler et al., Science 269, 1550 (1995); N. S. Lee et al., Diamond and Related Materials 10, 265 (2001); Y. Saito and S. Uemura, Carbon 38, 169 (2000); R. Rosen et al., Appl. Phys. Lett. 76, 1668 (2000); and H. Sugie et al., Appl. Phys. Lett. 78, 2578 (2001)). A potential applied between a carbon nanotube-containing electrode and an anode produces high local fields as a result of the small radius of the nanofiber tip and the length of the nanofiber. These local fields cause electrons to tunnel from the nanotube tip into the vacuum. Electric fields direct the field-emitted electrons toward the anode, where a selected phosphor produces light for a flat panel display application and (for higher applied voltages) collision with a metal target produces x-rays for the x-ray tube application.

Methods are known for creating both single-wall and multiwall carbon nanotubes as forests of parallel aligned fibers on a solid substrate and for utilizing such nanotube forests as cathodes (S. Fan, Science 283, 512 (1999) and J. G. Wen et. al., Mater. Res. 16, 3246 (2001)). However, the resulting forest assemblies have various instabilities at large current loads, one such instability being the flash evaporation of catalyst and carbon, followed by spark emission of light and by the transfer of CNTs from cathode to anode, thereby destroying the cathode (R. Nanjundaswamy et. al., in Functional Carbon Nanotubes, edited by D. Carroll et al. (Mater. Res. Soc. Symp. Proc. 858E, Warrendale, Pa., 2005)). Although advances have been made in creating robust forests of oriented CNTs on glass substrates (e.g., by Motorola and Samsung), such forests are still not the best solution for the nanofiber cold cathode.

One of the most challenging issues with oriented CNT arrays is the emission non-uniformity. Due to problems with screening effects and variations in CNT structure and overall sample uniformity, only a very small fraction of the CNTs emit at any given time. Thus, unless special treatment is performed (e.g., chemical or plasma), emission from such types of CNT forest cathodes is often dominated by edge emission and hot spots (Y. Cheng, O. Zhou, C. R. Physique 4, (2003)).

Stability is the second main technical issue which remains to be solved. Two primary reasons are usually responsible for the emission instability, namely the adsorption of residual gas molecules and Joule heating of the CNTs (J.-M. Bonard, et al., Appl. Phys. Lett. 78, 2775 (2001), N.Y. Huang et al., Phys. Rev. Lett. 93, 075501 (2004)). Other methods of making cold cathodes from CNTs include formation of a composite with polymeric binder (O. Zhou et al., Acc. Chem. Res. 35, 1045 (2002)) in which CNTs are not oriented. Nevertheless, impressive emissive properties have been obtained for polymer binder/SWNT cold cathodes. The field screening effect seems not to play a crucial role in randomly oriented CNTs simply due to their statistical distribution. Also, in these types of emitters, field-induced alignment is possible that might significantly enhance field emission properties. However, the same problems that exist for oriented forests of CNTs also exist in these types of emitters.

The problem with polymer binder/CNT cathodes is that the nanotubes are not present in sufficient quantities in the polymer to effectively contribute to field electron emission and also to such properties as thermal and electrical conductivities (so that the binder is destroyed by heat and current). Additionally, the unique electrical properties of the individual nanotubes are diluted, since the major component of the cathode is by far the polymer binder. Thus, the upper level of stable field emission current is significantly reduced.

A critical problem hindering applications of these carbon nanotubes (CNT) cold cathodes is the need for methods of assembling these nanotubes into the framework of a macroscopic mounting system that is sufficiently strong and suitably shaped such that the properties of the CNTs for field emission can be effectively utilized.

SUMMARY OF THE INVENTION

The present invention is directed to nanofiber yarns, methods of making said yarns, and to applications of said yarns. Additional embodiments provide for the drawing of nanofiber ribbons, as well as sheets having arbitrarily large widths. Importantly, this yarn spinning and sheet and ribbon drawing technology can be extended to produce various yarns, sheets, and ribbons of diverse nanofiber materials for use in a variety of applications and devices.

In some embodiments, processes of the present inventions for spinning yarns comprising nanofibers comprise the steps of: (a) arranging nanofibers in an array selected from the group consisting of (i) an aligned array, and (ii) an array that is converging towards alignment, so as to provide a primary assembly about whose alignment axis twist can occur; (b) twisting about the alignment axis of said primary assembly to produce a twisted yarn; and (c) collecting said twisted yarn via a technique selected from the group consisting of (i) winding the twisted yarn on a spindle, (ii) depositing the twisted yarn on a substrate, and (iii) incorporating said twisted yarn into another structure; wherein (i) a significant component of the nanofibers have a maximum thickness orthogonal to the nanofiber axis of less than approximately 500 nm, (ii) the nanofibers have a minimum length-to-thickness ratio in the thinnest lateral thickness direction of at least approximately 100, (iii) the minimum ratio of nanofiber length to yarn circumference is greater than approximately 5, and (iv) the net introduced twist in one direction per yarn length, compensated by twist in an opposite direction, for a twisted yarn of diameter D is at least approximately $0.06/D$ turns. In some embodiments, the step of arranging involves a drawing process.

Prior to or after yarn collection, twist in one direction in a singles yarn can be compensated by twist in an opposite direction at another stage in processing for a variety of useful purposes, such as for (a) plying yarns by folding them onto themselves and (b) forming composite or welded structures in which the nanotubes are untwisted or minimally twisted. The benefits provided by the initially introduced twist can be yarn densification and/or increases in yarn strength that enable application of increased forces on the yarn during initial processing.

In some embodiments, the present invention is directed to a process of producing a yarn comprising nanofibers, the process comprising the steps of: (a) providing a pre-primary assembly, wherein the pre-primary assembly comprises a substantially parallel array of nanofibers; (b) drawing from the pre-primary assembly to provide a primary assembly of the nanofibers having an alignment axis about which twisting can occur, wherein the primary assembly is selected from the group consisting of (i) an aligned array and (ii) an array that is converging toward alignment about the alignment axis; and (c) twisting about the alignment axis of said primary assembly to produce a twisted yarn.

In some embodiments, the present invention is directed to an apparatus for producing a yarn comprising nanofibers, the apparatus operable to perform a process comprising the steps of: (a) providing a pre-primary assembly, wherein the pre-primary assembly comprises a substantially parallel array of nanofibers; (b) drawing from the pre-primary assembly to provide a primary assembly of the nanofibers having an alignment axis about which twisting can occur, wherein the primary assembly is selected from the group consisting of (i) an aligned array and (ii) an array that is converging toward alignment about the alignment axis; and (c) twisting about the alignment axis of said primary assembly to produce a twisted yarn.

In some embodiments, the present invention is directed to an apparatus for producing a yarn comprising nanofibers, said apparatus comprising: (a) a pre-primary assembly, wherein the pre-primary assembly comprises a substantially parallel array of nanofibers; (b) a drawing mechanism attached to the pre-primary assembly, wherein the drawing mechanism is operable to draw from the pre-primary assembly to provide a primary assembly of the nanofibers having an alignment axis about which twisting can occur, wherein the primary assembly is selected from the group consisting of (i) an aligned array and (ii) an array that is converging toward alignment about the alignment axis; and (c) a twisting mechanism, wherein the twisting mechanism is operable to twist about the alignment axis of said primary assembly to produce a twisted yarn.

In some embodiments, the present invention is directed to a process of producing a nanofiber ribbon or sheet comprising the following steps: (a) arranging nanofibers to provide a substantially parallel nanofiber array having a degree of inter-fiber connectivity within the nanofiber array; and (b) drawing said nanofibers from the nanofiber array as a ribbon or sheet without substantially twisting the ribbon or sheet, wherein the ribbon or sheet is at least about one millimeter in width.

In some embodiments, the present invention is directed to an apparatus for producing a nanofiber ribbon or sheet, the apparatus operable to perform a process comprising the steps of: (a) arranging nanofibers to provide a substantially parallel nanofiber array having a degree of inter-fiber connectivity within the nanofiber array; and (b) drawing said nanofibers from the nanofiber array as a ribbon or sheet without substantially twisting the ribbon or sheet, wherein the ribbon or sheet is at least about one millimeter in width.

In some embodiments, the present invention is directed to an apparatus for producing a nanofiber ribbon or sheet, the apparatus comprising: (a) a substantially parallel nanofiber array having a degree of inter-fiber connectivity within the nanofiber array; and (b) a drawing mechanism, wherein said drawing mechanism is operable for drawing nanofibers from the nanofiber array as a ribbon or sheet without substantially twisting the ribbon or sheet, wherein the ribbon or sheet is at least about one millimeter in width.

In some embodiments, the present invention is directed to a nanofiber singles yarn comprising about at least about a ten thousand nanofibers in a square micron of a cross-section of nanofiber singles yarn, wherein: (a) the nanofiber singles yarn is at least about one meter in length; (b) the nanofiber singles yarn has a diameter less than about ten microns; and (c) the nanofiber singles yarn is in the form selected from the groups consisting of unplied, plied and combinations thereof.

In some embodiments, the present invention is directed to a process comprising the steps of: (a) selecting a porous yarn comprising nanofibers; (b) knotting the yarn to form a knotted yarn; and (c) obtaining a region-selective material manipulation of the yarn by exposing the knotted yarn to a substance selected from the group consisting of a gas; vapor; plasma; liquid; solution; fluid dispersion; super critical liquid; melt; conditions resulting in electrochemical deposition, electrochemical materials removal, electrochemical polymerization, and combinations thereof.

In some embodiments, the present invention is directed to a process for making a deformable nanofiber sheet or ribbon comprising the steps of: (a) selecting a substrate from the group consisting of an elastically deformable substrate, an electrically deformable substrate, and combinations thereof; (b) elongating the substrate to form a deformed substrate, wherein said elongation is selected from the group consisting of elastically elongating, electrically elongating, and combinations thereof; (c) adhesively applying a nanofiber sheet or ribbon to the deformed substrate; and (d) enabling at least partial return of said elongation after said adhesive application step.

In some embodiments, the present invention is directed to a process for embedding an elastomerically deformable nanofiber sheet between two elastomeric polymer sheets comprising: (a) selecting a first elastomeric polymer sheet; (b) elastically elongating the first elastomeric polymer sheet to form a deformed substrate; (c) adhesively applying a nanofiber sheet to the deformed substrate; (d) enabling at least partial return of said elastic elongation after said adhesive application step; (e) applying a resin precursor for a second elastomeric polymer sheet to the nanofiber sheet when the first elastomer polymer sheet is in relaxed or partially relaxed state; and (f) curing the resin precursor to form the second elastomeric polymer sheet while the first elastomer polymer sheet is in a relaxed or partially relaxed state.

In some embodiments, the present invention is directed to a process for spinning yarns comprising nanofibers, the process comprising the steps of: (a) drawing a primary assembly comprising aligned nanofibers from a forest of nanofibers, wherein the angle between direction of drawing and alignment direction of the nanofibers in the forest is between about ninety degrees and about five degrees; and (b) twisting the primary assembly of nanofibers about an axis that is generally aligned with the nanofibers of the primary assembly to produce a nanofiber twisted yarn.

In some embodiments, the present invention is directed to process for spinning yarns comprising nanofibers, the process comprising the steps of: (a) drawing from an array of as synthesized nanofibers to form a primary assembly comprising a plurality of generally aligned nanofibers, wherein the nanofibers from the array of nanofibers are successively linked during the drawing step, have maintained previous linkages during the drawing step, or combinations thereof; and (b) twisting the primary assembly of aligned nanofibers about an axis generally aligned with the nanofibers to produce a nanofiber twisted yarn, wherein length of the significantly prevalent nanofibers is at least five times the circumference of the twisted nanofiber yarn.

In some embodiments, the present invention is directed to a process of making twisted yarn comprising nanofibers, the process comprising the steps of: (a) spinning a nanofiber yarn comprising at least 20% by weight nanofibers using a liquid-based method, and (b) twisting about the yarn direction to provide a twisted yarn.

In some embodiments, the present invention is directed to a process for producing a nanofiber ribbon or sheet from a nanofiber forest that comprises the following steps: (a) producing a nanofiber forest comprising nanofibers, wherein the nanofiber forest is suitable for drawing ribbons or sheets from the nanofiber forest, wherein the ribbon or sheet would be at least about one millimeter in width and wherein the nanofiber forest has a sidewall; (b) connecting an attachment to the sidewall or near the sidewall of the nanofiber forest, and (c) drawing the nanofiber ribbon or sheet from the nanofiber forest by drawing upon the attachment.

In some embodiments, the present invention is directed to a process comprises the following steps: (a) producing a carbon nanotube forest comprising nanotubes, wherein the carbon nanotube forest is suitable for drawing ribbons or sheets from the carbon nanotube forest, wherein the ribbon or sheet would be at least about one millimeter in width and wherein the carbon nanotube forest has a sidewall; (b) connecting an attachment to the sidewall or near the sidewall of the carbon nanotube forest; (c) drawing the ribbon or sheet from the carbon nanotube forest by drawing upon the attachment, wherein the ribbon or sheet is a highly oriented aerogel ribbon or sheet; and (d) infiltrating the sheet or ribbon with a liquid and subsequently evaporating the liquid from the sheet or ribbon, wherein the infiltration and evaporation at least partially densifies the sheet or ribbon and forms a densified sheet or ribbon.

In some embodiments, the present invention is directed to a process for strengthening a yarn, ribbon, or sheet comprising nanofibers, wherein said process comprises the steps of: (a) infiltrating a liquid into the yarn, ribbon or sheet, and (b) evaporating the liquid from the yarn, ribbon, or sheet to strengthen the yarn, ribbon or sheet.

In some embodiments, the present invention is directed to process of strengthening a yarn comprising nanofibers, said process comprising the steps of: (a) twisting the yarn in a first direction; and (b) twisting the yarn in a second direction, wherein the second direction is opposite the first direction and net twist of the twisting in the first and second direction is about zero.

In some embodiments, the present invention is directed to an apparatus for producing a twisted nanofiber yarn, wherein the apparatus comprises: (a) a supply of nanofibers; (b) a transport tube for transporting the nanofibers from the supply to a collector; (c) the collector that collects nanofibers from the supply, wherein the collector is rotatable; (d) a winder that withdraws twisted nanofiber yarn from the collector while the collector is rotated, whereby as the twisted nanofiber yarn is withdrawn from the collector the nanofibers within the collector are twisted to form twisted nanofiber yarn.

In some embodiments, the present invention is directed to a process of producing a twisted nanofiber yarn, wherein the process comprises: (a) continuously supplying nanofibers to a collector; (b) rotating the collector to form an assembly of largely parallel nanofibers; (c) forming a nanofiber yarn from the assembly; and (d) withdrawing the nanofiber yarn from the assembly, wherein the yarn is twisted due to the rotation of the collector to form a twisted nanofiber yarn.

In some embodiments, the present invention is directed to an apparatus for producing a twisted nanofiber yarn, the apparatus operable to perform a process comprising the steps of: (a) continuously supplying nanofibers to a collector; (b) rotating the collector to form an assembly of largely parallel nanofibers; (c) forming a nanofiber yarn from the assembly; (d) withdrawing the nanofiber yarn from the assembly, wherein the yarn is twisted due to the rotation of the collection to form a twisted nanofiber yarn.

In some embodiments, the present invention is directed to a device comprising an array of aligned conductive channels, wherein (a) said conductive channels are operable for directional transport of species selected from the group consisting of electrons, ions, phonons, and combinations thereof; and (b) said conductive channels are provided for by nanofibers in a form selected from the group consisting of ribbons, sheets, and combinations thereof.

In some embodiments, the present invention is directed to a method comprising the steps of: (a) providing oriented nanofibers in a form selected from the group consisting of ribbons, sheets, and combinations thereof; and (b) using said oriented nanofibers as an array of conductive channels for the directional transport of species selected from the group consisting of electrons, ions, phonons, and combinations thereof.

In some embodiments, the present invention is directed to a device comprising: (a) a cathode, wherein said cathode comprising nanofibers in a form selected from the group consisting of yarns, ribbons, sheets and combinations thereof; and (b) an anode, wherein a region of low gas pressure separates said anode from said cathode.

In some embodiments, the present invention is directed to a device comprising: (a) a cold cathode, said cold cathode comprising nanofibers in a form selected from the group consisting of yarns, ribbons, sheets, and combinations thereof, wherein said form is made by a process comprising the steps of: (i) arranging nanofibers in aligned arrays having sufficient inter-fiber connectivity within the array so as to provide a primary assembly; and (ii) drawing said nanofibers as an electrode material from the primary assembly; and (b) an anode, wherein a region of low gas pressure separates said anode from said cathode.

In some embodiments, the present invention is directed to a process of patterning nanofiber sheets along their length, the process comprising a patterning technique selected from the group consisting of photo-polymerization, photolithography, electron-beam induced reaction of polymer; pressure-induced material transfer; liquid, gas phase, and plasma treatments to deposit, remove, and transform materials; and combinations thereof.

In some embodiments, the present invention is directed to an optoelectronic device comprising: (a) a first electrode, said first electrode comprising nanofibers in a form selected from the group consisting of yarns, ribbons, sheets and combinations thereof; (b) an active layer operably associated with the first electrode; and (c) a second electrode operably associated with the active layer and the first electrode.

In some embodiments, the present invention is directed to an optoelectronic device comprising: (a) a first electrode, said first electrode comprising nanofibers in a form selected from the group consisting of ribbons, sheets, and combinations thereof, wherein said form is made by a process comprising the steps of: (i) arranging the nanofibers in aligned arrays having sufficient inter-fiber connectivity within the array so as to provide a primary assembly; and (ii) drawing said nanofibers as an electrode material from the primary assembly; (b) an active layer operably associated with the first electrode; and (c) a second electrode operably associated with the active layer and the first electrode.

In some embodiments, the present invention is directed to a method for making an optoelectronic device, said method comprising the steps of: (a) providing components comprising: (i) a free-standing nanofiber material operable for use as a first electrode, wherein said material is in a form selected from the group consisting of yarns, ribbons, sheets, and combinations thereof, and wherein the material has a three-dimensional network of pores comprising a surface area in the range between about 100 $m^2/g$ and about 300 $m^2/g$; (ii) an active material layer operably associated with the first electrode; and (iii) a second electrode operably associated with the active material and the first electrode; and (b) assembling the components to operatively form the optoelectronic device.

In some embodiments, the nanotube yarns comprise carbon nanotubes. Such carbon nanotube yarns of the present invention provide unique properties and property combinations such as extreme toughness, resistance to failure at knots, high electrical and thermal conductivities, high absorption of energy that occurs reversibly, up to 13% strain-to-failure compared with the few percent strain-to-failure of other fibers with similar toughness, very high resistance to creep, retention of strength even when heated in air at ~450° C. for one hour, and very high radiation and UV resistance, even when irradiated in air. Furthermore, these nanotube yarns can be spun as one micron diameter yarns and plied at will to increase the linear density (i.e., the weight per yarn length) by forming two-folded, four-folded, and multi-folded yarns.

In some embodiments, the nanofibers are nanoscrolls. In some embodiments, the nanofibers are chemically and/or physically modified before or after a twist spinning or a ribbon or sheet draw process. In some embodiments, the nanofiber yarns are used to form composites.

The nanofiber yarns of the present invention can be used in a variety of diverse applications. In some embodiments, this spinning technology can be extended to produce various nanofibers and nanoribbons of diverse materials that can extend the range of applications. Applications for the nanofiber yarns of the present invention include textiles; electronic devices; conducting wires and cables; electrochemical devices such as fiber-based supercapacitors, batteries, fuel cells, artificial muscles, and electrochromic articles; field emission and incandescent light emission devices; protective clothing; tissue scaffold applications; and mechanical and chemical sensors.

Advantages of the present invention will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

For a more complete understanding of the present invention, and the advantages thereof, reference is now made to the following descriptions taken in conjunction with the accompanying drawings, in which:

FIG. 59 D shows an example of a single sheet bolometer that uses thin wires (5911) of iron and of constantan as a sensitive thermocouple.

FIG. 62 B demonstrates the feasibility of the device concept by demonstrating that a large change in resistance results when a SWNT sheet is exposed to either benzene of alcohol vapor.

FIG. 74 C schematically illustrates formation of a hairy nanofiber yarn as a result of electric field effect on yarn regions that are closest to the anode. The illustrated nanofiber yarn is spirally wrapped around a wire or cylindrical capillary.

DETAILED DESCRIPTION OF THE PREFERRED EMBODIMENTS

Figure 1:
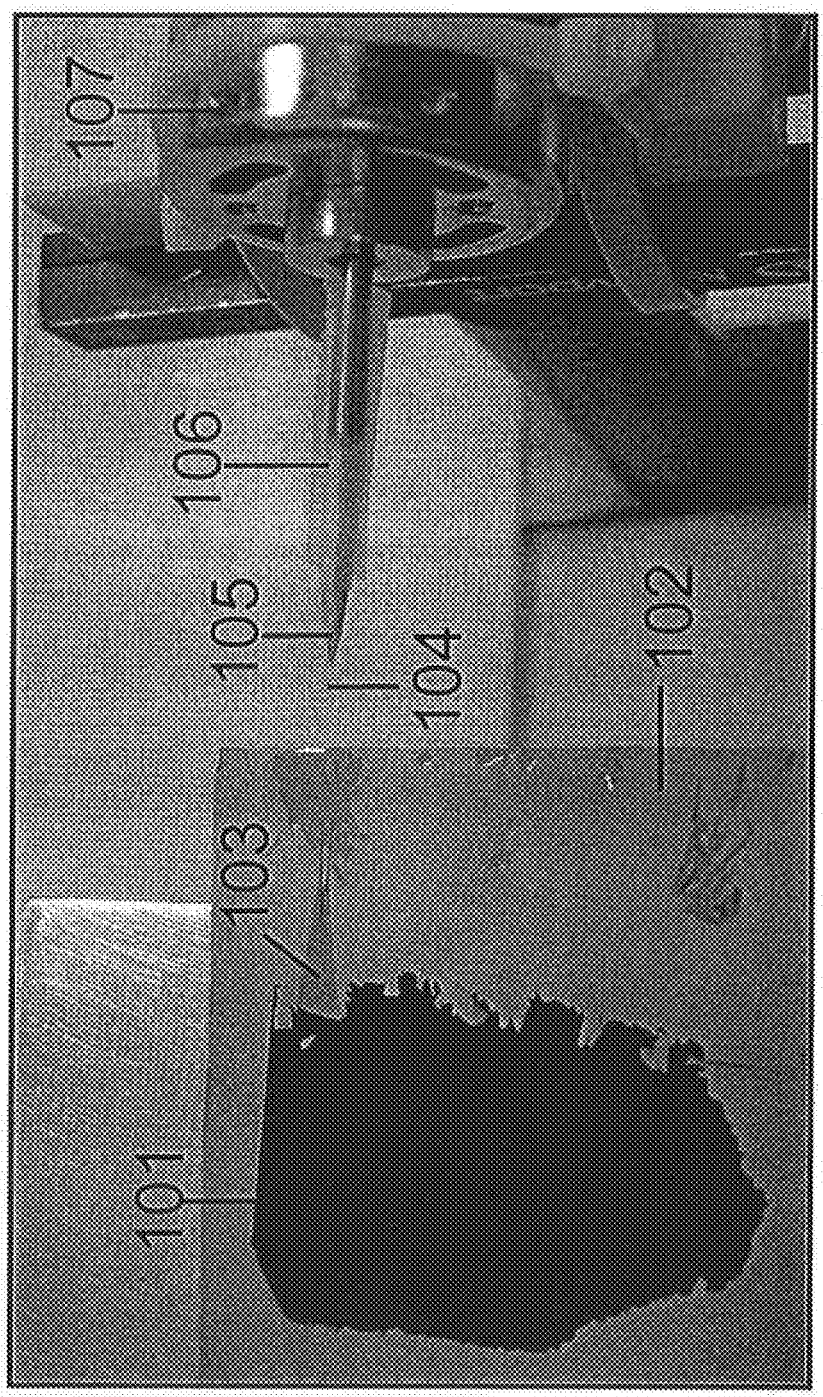
FIG. 1 is an optical micrograph showing nanotube fibers being drawn from a nanotube forest, while twisted at high rate using the pictured motor.

Invention embodiments described herein provide novel fabrication methods, compositions of matter, and applications of nanofiber yarns, ribbons, and sheets having quite useful properties. For example, carbon nanotube yarns of the invention embodiments provide the following unique properties and unique property combinations: (1) toughness comparable to that of fibers used for bullet proof vests, (2) resistance to failure at knots (contrasted with the sensitivity to knotting for the Kevlar® and Spectra® fibers used for antiballistic vests), (3) high electrical and thermal conductivities, (4) high reversible absorption of energy, (5) up to 13% strain-to-failure compared with the few percent strain-to-failure of other fibers with similar toughness, (6) very high resistance to creep, (7) retention of strength even when heated in air at 450° C. for one hour, and (8) very high radiation and UV resistance, even when irradiated in air.

Moreover, the Inventors (i.e., Applicants) show that these nanotube yarns can be spun as one micron diameter yarns (or either lower or much higher diameter yarns), and plied at will to make twofold, fourfold, and higher folded yarns. Additionally, the inventor's show that novel yarns having the above-described properties can be spun using either carbon SWNTs or carbon MWNTs, the latter being much less expensive to produce than the former.

Invention embodiments also provide for the fabrication of nanofiber sheets having arbitrarily large widths at commercially useful rates. These sheets are optically transparent and have a higher gravimetric strength than the strongest steel sheet and the Mylar® and Kapton® sheets presently used because of their high gravimetric strength for ultra-light air vehicles.

Importantly, the inventors also teach how this technology can be used to produce various yarns, sheets, and ribbons of diverse nanofibers, and how produced yarns, sheets, and ribbons of these nanofibers can be applied.

For the purpose of most efficiently and clearly describing the embodiments of this invention, a nanofiber is herein defined as a fiber or ribbon having a largest thickness normal to the fiber axis of less than 100 nm.

Since the smallest possible nanofibers for a particular system can form bundles and aggregates of bundles (which can potentially also fall under the above definition of nanofibers), the Inventors hereby define the nanofibers described herein to be the smallest diameter nanofibers whose discrete nature is importantly relevant either for the assembly of pre-processing arrays or the structure of fabricated sheets, ribbons, or yarns.

Also, unless specifically otherwise indicated, no differentiation is made between the terms knitted, braided, and woven. The reason for ignoring differences in these terms herein is that statements made about any one of these terms typically applies generically to all of these terms and like terms. Also, the terms two-fold and two-ply, and like terms are used equivalently for plied (i.e., folded) yarns.

The challenge of spinning nanofibers into twisted yarns of this invention is in downscaling prior-art technologies of usual spinning about a thousand fold to provide the special geometries in which twist can be successfully utilized. Optionally and preferably the maximum total applied twist in one direction per unit fiber length for a twisted yarn of diameter D is at least approximately 0.06/D turns and a significant component of the nanofibers have (i) a maximum width of less than approximately 500 nm, (ii) a minimum length-to-width ratio of at least approximately 100, and (iii) a ratio of nanofiber length to yarn circumference greater than approximately 5.

For the purpose of fabricating nanotube sheets and ribbons by solid-state draw processes, optionally and preferably a significant component of the nanofibers have (i) a maximum width of less than approximately 500 nm and a (ii) a minimum length-to-width ratio of at least approximately 100.

The net twist is defined as the overall twist introduced during all processing from an initial fiber assembly to the product used for applications. Processes that result in untwisting are included in the evaluation of net twist. Optionally and preferably for twisted yarns, the maximum total twist in one direction (uncompensated by the possible occurrence of twist in an opposite direction) is at least 0.06/D. Optionally and preferably, the net twist (defined as compensated by applied yarn twists in opposite directions) for the nanofiber yarn can vary from negligible to at least approximately 0.12/D turns for some applications and at least 0.18/D for other applications. Especially for the purpose of applications where high deformability without rupture and low yarn strength is needed (such as for yarn actuators where the actuating material is predominately a material that is imbibed into the yarn), the net yarn twist is preferably above 0.18/D.

For the purposes of this invention, a false twist is herein defined as a twist in one direction that is followed by an essentially equal twist in the opposite direction, so that the net twist is essentially zero. The definition is herein applied whether the net twist of near zero is introduced by simply applying a twist at an intermediate position in a yarn (so that twist is introduced on one side of the twist position and automatically substantially removed on the opposite side of the twist position) or by first twisting at the end of a yarn and then releasing the original twist by applying an equal and opposite twist to the same yarn end.

The Inventors differentiate between ribbons and ribbon shaped yarns (also called yarns) by defining a ribbon as having a width of at least a millimeter.

For the purpose of draw-based fabrication processes the inventors here define pre-primary and primary nanofiber assemblies. A pre-primary assembly of nanofibers is an assembly of at least approximately parallel nanofibers (i.e., oriented nanofibers) that undergoes a substantial change in nanofiber orientation direction during the process of making an oriented nanofiber yarn, a twisted nanofiber yarn (including a false twisted yarn having little net twist), a nanofiber ribbon, or a nanofiber sheet. A primary assembly of nanofibers is an oriented nanofiber array or a nanofiber array that is converging on an orientation direction, wherein the draw direction for yarn, sheet, or ribbon formation is either the direction of nanofiber orientation or the direction of nanotube orientation that is being converged upon.

A solid-state fabrication process is one that can be practiced without the required presence of a liquid during nanofiber yarn, ribbon, or sheet formation.

Unless the needed nanofiber properties are obviously not those obtainable for carbon nanotubes, carbon nanotubes are nanofibers that are included in the group of optionally preferred nanofibers for the embodiments of this invention. Also, the fabrication method employed for converting a nanofiber array into a sheet, ribbon, or yarns is preferably by solid-state fabrication methods of invention embodiments.

Also, a yarn made by plying at least one singles yarn is understood to comprise a singles yarn.

So that invention embodiments can be further understood, the inventors herein use the term knot for both mathematical knots and knots called unknots, since unknots can be inexpensively tied without using the ends of a robe or yarn. Useful examples of unknots are slip knots.

Unknots are important because they can be economically produced, such as in conventional weaving processes, and because their untying unknots that are slip knots (by applying stress to yarn ends) is a useful way to increase energy dissipation before failure for a given weight nanofiber yarn (i.e., yarn toughness).

1. Forest-Based Nanofiber Fabrication Invention Embodiments (a) Twist-Based Yarn Spinning from Nanofiber Forests One preferred process of this invention involves twist-based spinning of carbon nanotubes from a nanotube forest, so called because the nanotubes grow from a substrate like approximately parallel trees and have close to the same height. The nature of the nanofiber forest used for spinning is critically important, and will be elaborated on in another section. Most nanofiber forests are unsuitable for twisted yarn, ribbon, or sheet production. Other nanofiber forests yield yarns or ribbons which are far too weak to be useful for most applications. For example, Jiang et al. have described (in Nature 419, 801 (2002) and in U.S. Patent Application Publication No. 20040053780 (Mar. 18, 2004)) the production of very weak untwisted yarns from nanotube forest that they grow. These yarns are weak likely both because of the low performance of the utilized carbon nanotube forest and the lack of realization that twist processes can be downscaled to nanofibers to provide strength increases.

In some important embodiments the yarns of the present invention are simultaneously twisted while being drawn from a nanotube forest. FIG. 1 shows an arrangement used in the laboratory for accomplishing this twist process during drawing, and FIGS. 2 A and 2B are SEM pictures showing nanotube assembly into yarn during the spinning process, in which the nanotubes are simultaneously drawn from the nanotube forest and twisted. Element 101 in FIG. 1 is a nanotube forest, prepared as described in Example 1. Element 102 is the silicon growth substrate, element 103 is a ribbon drawn from the forest, and element 104 is the nanotube yarn resulting from twisting this ribbon, which is wedge-shaped when viewed in 3-D and has a maximum wedge thickness of about equal to the height of the nanotube forest. Element 104 is often referred to in conventional textile processing as the 'spinning triangle'. The overlapping images of both the nanotube wedge and yarn are a result of reflection in the mirror-like silicon substrate. Element 105 is the end of a miniature wooden spindle about which the nanotube fiber has been wrapped. Element 106 is adhesive tape that attaches this wooden spindle to the rotating rod of motor 107.

The direction of drawing is very nearly orthogonal to the original nanotube direction and parallel to the silicon substrate in FIG. 1. Nevertheless, this spinning process is sufficiently robust that the angle between the initial nanotube direction and the draw direction can be decreased from 90° to almost 0°. Although this spinning process is amenable to automation for spinning continuous yarns, Example 2 describes yarns that were prepared by hand drawing from a nanotube forest while they were twisted using a variable speed motor operated at ~2000 rpm. The diameter of the twisted yarns ranged from below one micron to above 10 microns, and depended upon the sidewall area on the nanotube forest from which the MWNT yarn was drawn. The obtained combination of yarn diameters that are hundreds of times smaller than the nanotube length (about 300 μm) and high twist (about 80,000 turn/m) resulted in yarns having quite attractive properties.

For twist-based nanofiber draw and other nanofiber draw processes of invention embodiments for yarn spinning, it is preferred that nanofibers are simultaneously pulled from essentially the full height of the nanofiber forest sidewall.

The Inventors have found that achieving very useful properties from such twist spinning of nanoscale fibers requires that a number of conditions are optimally satisfied, and these conditions provide the basis for numerous preferred embodiments. Such conditions are described below.

First, a significant component of the nanofibers should optionally and preferably have a maximum thickness of less than approximately 500 nm. For circular nanofibers, this maximum thickness corresponds to the nanofiber diameter (which is the nanofiber width if the nanofiber is a nanoribbon). More optionally and preferably, a significant component of said nanofibers should have a maximum thickness of less than approximately 100 nm. Most optionally and preferably, a significant component of said nanofibers should have a maximum thickness of less than approximately 30 nm. By significant component, the Inventors mean a component of the nanofiber thickness distribution that is sufficiently prevalent to significantly affect yarn properties.

Second, the nanofibers optionally and preferably should have a minimum aspect ratio, i.e., ratio of nanotube length to diameter, of at least approximately 100 at the thinnest lateral section. More preferably, the nanofibers should have a minimum length-to-thickness ratio in the thinnest lateral direction of at least approximately 1000. Most preferably, the majority weight fraction component of the nanofibers should have an aspect ratio in the thinnest lateral section of at least approximately 10000.

Third, optionally and preferably the nanofibers in the yarns should have a minimum ratio of nanofiber length to yarn circumference that is greater than approximately 5. More preferably, the nanofibers in the yarns have a minimum ratio of nanofiber length to yarn circumference that is greater than approximately 20. Most preferably the major weight component of the nanofibers has a ratio of nanofiber length to yarn circumference of greater than approximately 50.

Fourth, the maximum applied twist per yarn length, uncompensated by possibly applied twist in an opposite direction, for a twisted yarn of diameter D is optionally and preferably at least approximately 0.06/D turns. Optionally and more preferably for some applications, the maximum applied twist for a twisted yarn of diameter D is at least approximately 0.12/D turns. Optionally and most preferably for some applications, the maximum applied twist for a twisted yarn of diameter D is at least approximately 0.18/D turns. Preferably for some applications, the maximum applied twist is preferably above 0.06/D turns and below 0.12/D.

The weight-averaged nanofiber length in the yarn is optionally and preferably at least approximately 2 times the inverse of the yarn twist (measured in turns per yarn length).

Additionally, it is optionally preferable that at least a 20% of the total weight fraction of the nanofibers in the yarns migrate from near to the yarn surface to deep in the yarn interior and return to close to the yarn surface in a distance that is less than approximately 50% of the nanofiber length. More preferably, the major weight fraction of nanofibers in the yarns migrate from near to the yarn surface to deep in the yarn interior and return to close to the yarn surface in a distance that is less than approximately 20% of the nanofiber length.

The twist-based spinning process for nanofiber yarns is preferably accomplished by arranging nanofibers in approximately aligned arrays or in an array that is converging towards alignment so as to provide a primary assembly. A primary assembly is above defined as one in which the nanotubes are either approximately arrayed parallel to a draw direction or are converging on such alignment. Hence, a nanotube assembly can possibly change from a primary assembly to the above defined pre-primary assembly— depending upon the direction of draw.

This primary assembly can optionally be formed from a precursor assembly, such as a nanotube forest, which can be either a primary assembly or a pre-primary assembly, depending upon the direction of draw. Nanofibers converging towards alignment can be formed by drawing these nanofibers from a nanotube forest. This nanofiber forest is suitable for formation of the primary assembly, or as a primary assembly, can be on a planar or non-planar substrate and the nanofibers in the forest can either be deposited over substantially the entire substrate surface or only on part of the surface. Also, different types of nanotubes can be in different regions of the surface, or they can be mixed in the same forest regions.

For convenience in facilitating nanotube yarn spinning and ribbon and sheet draw, the minimum radius for the forest-occupied-area of a curved forest substrate is optionally over ten times the maximum height of the forest.

Figure 2:
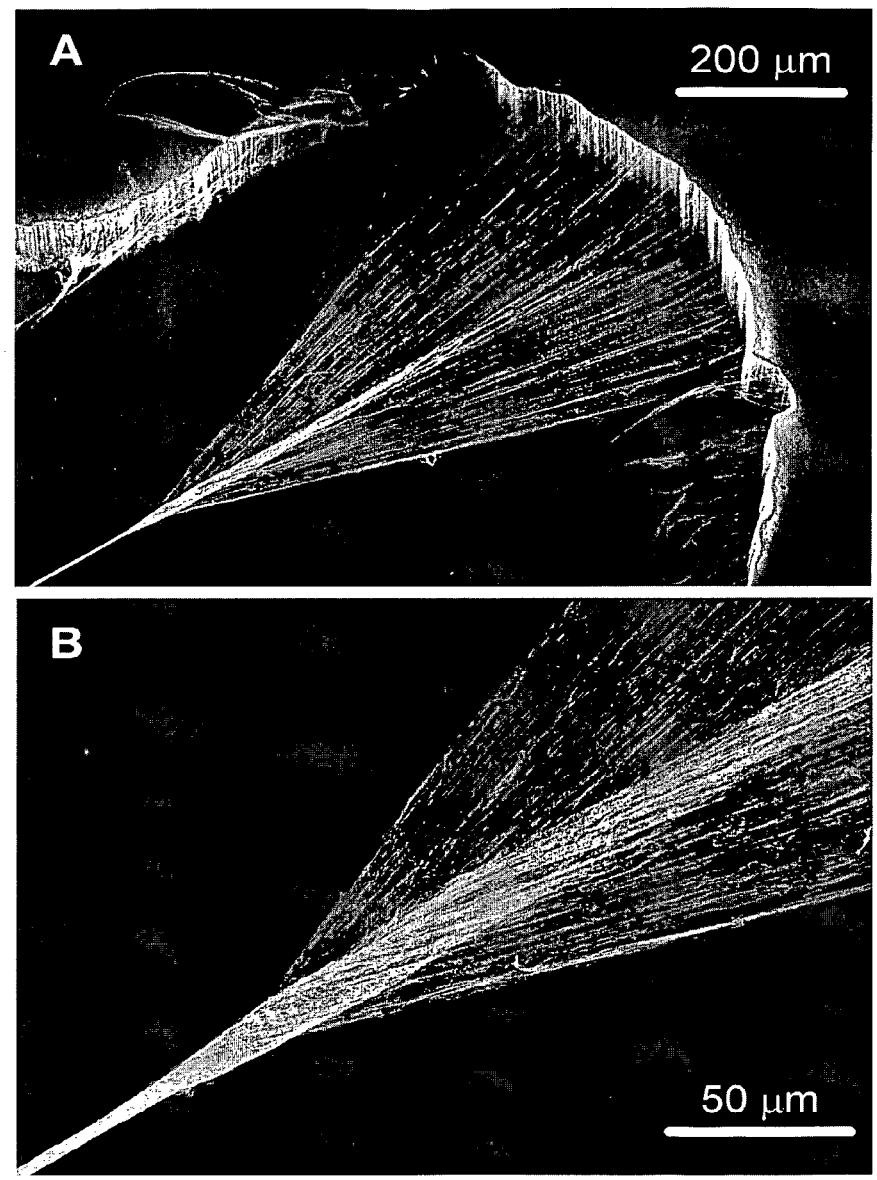
FIG. 2 shows scanning electron microscope (SEM) micrographs, at two different magnifications (A and B), of the consolidation of a drawn ribbon into a twisted yarn during draw-twist spinning from a forest of MWNTs, wherein an ~600 μm wide forest strip formed the pictured 3.2 μm diameter twisted nanofiber yarn.

The twist process to make yarn can be accomplished (as illustrated in FIG. 2, where B has a higher magnification than A) in close proximity to a pre-primary assembly (such as a nanofiber forest). In such cases a rectangular nanotube ribbon does not form prior to the twist process. Alternatively, a rectangular nanotube ribbon can be drawn from the forest and twisted into a yarn after the rectangular ribbon is substantially formed.

It is important to note in FIG. 2 that a spinning triangle is formed as the nanotubes are drawn from a forest and progressively converge to form a yarn having a substantially circular cross section. The geometry of the spinning triangle down to the nanoscale is related to the width of the nanofiber forest sidewall (i.e., edge) selected for spinning, the forest height, and the helix angle needed for the spun yarn (which is in turn determined by the ratio of yarn twist rate to yarn draw rate). Since the strength of the nanofiber array in the convergence zone (i.e., the spinning triangle) is lower than that of the yarn, it is optionally preferable that convergence to a partially twisted yarn having approximately circular cross-section be substantially complete within about 50 millimeters of the nanofiber forest or a pre-primary assembly of any sort. Optionally and more preferably, this substantially complete convergence to produce the tip of the spinning triangle occurs within about 5 mm from the nanotube forest. The optimal convergence distance also depends on forest height. Optionally and preferably, this substantially complete convergence to partially twisted yarn having approximately circular cross-section occurs within a distance from a nanofiber forest that is less than 50 times the average height of the nanofiber forest. More optionally preferable, this substantially complete convergence occurs within a distance that is less than about 5 times the average height of the nanofiber forest or a pre-primary assembly of any sort.

It is also important to note in FIG. 2 that initial twisted core formation is evident at approximately the center of the wedge that is being twisted during draw. It is optionally preferable that yarn core formation appears ¼ to ¾ of the distance between wedge end to wedge apex. It is also optionally preferable that the twisted fiber core appears at between ¼ and ¾ of the lateral distance between the lateral wings of the wedge.

The Inventors find, surprisingly, that the draw angle (between the draw direction and the direction of the nanofibers in the forest) can usefully vary between 90° and nearly 0° (nearly orthogonal to the plane of the substrate and attached forest). For some spinning processes, the draw angle is preferably between about 90° and 60°, and for other processes the draw angle is preferably between about 0° and 50°.

The nanofiber forests can optionally be stripped from the growth substrate and spun into nanofiber yarns, ribbons, or sheets while not attached to this growth substrate. This stripping process can optionally occur during the spinning process. Where a forest substrate does not restrict the draw angle, the draw angle can optionally and preferably vary over the range from 85° above the plane of the forest to 85° below the plane of the forest.

Nanofiber forests stripped from the growth substrate can optionally be stacked upon each other to provide an array of layers from which the nanofiber yarns are spun (see Example 43). These nanofiber layers can be optionally mechanically compressed orthogonal to the plane of the forests to provide a degree of interpenetration between nanofibers in neighboring nanotube forest layers. The forest layers in the laminated nanotube forests can optionally comprise nanotubes having the same height and density within the forest, or they can differ in nanotube height and density within the forest, the chemical composition or structure of the nanotubes, or optional coating materials or friction aids within the individual nanotube forests.

The nanofibers in neighboring contacting forests can optionally be terminated with reactive groups that cause end-to-end or near-end sidewall binding between individual nanofibers or nanofiber bundles in different layers. Such binding processes can enable faster spinning rates than are otherwise possible and improve the properties of the yarn by effectively increasing the nanofiber or nanofiber bundle lengths.

The draw-twist spinning process can be conveniently and optionally and preferably practiced at close to ambient temperature, i.e., ordinary room temperature or temperatures reached without intentional heating or cooling. However, in some embodiments it is optionally preferred that the draw-twist spinning process is accomplished at either above or below ambient temperature. For example, such higher or lower temperatures can optionally be employed to optimize the degree of direct or indirect inter-fiber bonding for the draw-twist process. For example, an inter-fiber binding aid can optionally be employed to provide a self-supporting capability for nanotube forests that have been stripped from the growth substrate. Local heating at close to the edge of the nanofiber forest can be usefully employed for evaporating the binding aid or causing this binding aid to become fluid, so that the draw twist process can occur most productively. Also, said heating process can be used for reaction with gas phase additives that facilitate the draw-twist process or improve yarn properties. This heating can be accomplished by various means, such as using heating induced by visible, ultraviolet, infrared, radio frequency, or microwave frequency absorption or resistive heating using solid- or gas-phase contact heating (and combinations thereof). The heating or cooling processes optionally provide a nanofiber temperature of between −200° C. and 2000° C. Optionally and more preferably, this heating or cooling process is between −20° C. and 500° C. Optionally and most preferably for some invention embodiments, the initial draw step and the initial twist step to form the twisted nanofiber yarn is conducted at below 60° C. Local heating for regions being spun, such as the edge of a nanotube forest, can usefully be accomplished via resistive heating by using a voltage applied between the spun yarn and the nanotube source, which results in a current along the nanofiber yarn.

One particularly advantageous arrangement is to synthesize the nanofibers as a forest on a surface that continuously moves from a furnace region (where CVD is used to grow the nanofibers as a forest) into a region where the nanofibers in the forest are either draw-twist or nanofiber ribbons or sheets are drawn from the nanofiber forest. The method of growth of the nanofiber forest in the furnace region can be by the various methods known in the art, and variations on these methods, such as shown in Example 1.

In one optional and preferred method the growth substrate is either a flexible belt or is attached to moving belt. This moving belt carries the nanofiber forest from the forest growth region of the production apparatus to the region where yarns are twist spun or nanofiber ribbons or sheets are spun. The spun twisted nanofiber yarns, nanofiber ribbons, or nanotube sheets can be optionally transferred in a continuous process to manufacture steps where the nanofibers yarns ribbons are optionally plied, the nanofiber ribbons or sheets are laminated, and where the nanofiber yarns, ribbons, or sheets are optionally overcoated or infiltrated with an agent (such as a polymer) that serves any of various functions (such as to increase the bonding between nanofibers, to provide electrical insulation, or to provide ionic conductivity for use of these yarns, ribbons, and sheets for electrochemical device applications).

Materials that are both suitable as belt or drum materials and suitable for nanotube forest growth are known in the literature. For instance, Ch. Emmenegger et al. report (Applied Surface Science 162-163, 452 (2000)) that aluminum and cobalt are suitable substrates for nanotube growth. In addition, L. Liang et al. (U.S. Patent Application Publication No. 20040184981 A1) describe the application of the oxidized surfaces or many metals for the growth of nanotube forests, where the benefit of the metal oxide layer is to prevent the deactivation of the catalyst used for forest growth.

Another suitable drum material is an outer layer of amorphous $SiO_2$ or crystalline $SiO_2$ (quartz), which is known to be an effective substrate material for nanotube forest growth, as well as the growth of at least eight forests upon each other (X. Li et al., Nano Letters 5, 1997 (2005) and Y. Murakami, et al. Science 385, 298 (2004)). The $SiO_2$ is also suited for application on belts used for nanotube forest growth (and stripping to form yarns, sheets, and ribbons), as long as the $SiO_2$ layer on the belt is sufficiently thin, relative to the maximum radius of belt curvature (usually corresponding approximately to the radius of rollers used to move the belt) such that fracture of the $SiO_2$ does not occur.

In some embodiments, nanotube synthesis to make a primary or pre-primary array, and the nanotube spinning can be accomplished as a continuous process by employing a rotating drum. This drum is preferably at least 50 centimeters in diameter. Synthesis of the nanofibers (such as forests made by CVD processes) on one side of the drum is followed by nanofiber yarn draw and subsequent twist-based, false-twist-based, or liquid-densification-based spinning processes to make yarn or the drawing of ribbons or sheets from a distant part of the rotating drum.

As another alternative, the fabrication of the primary or pre-primary nanotube array and the nanotube spinning can be accomplished in different apparatus, such as by coiling a substrate containing the primary or pre-primary nanofiber array into a roll. This roll can then be unwound as a separate process for conducting spinning, and especially draw-twist spinning processes.

Example 37 demonstrates such a process wherein forest-spun nanotube sheets are attached to a plastic film substrate, densified on this substrate using liquid infiltration and evaporation, and then draw-twist spun into a carbon nanotube yarn by drawing a nanotube ribbon from the plastic film substrate and twisting this ribbon.

The nanofibers on the primary assembly or the pre-primary assembly can be optionally patterned, and patterned depositions of different nanofibers on the same substrate can be optionally employed and these different nanofibers can be optionally spun into either the same yarn or different yarns. Such patterned deposition of nanofibers, which can be obtained, for example, by the patterned deposition of nanofiber growth catalyst, can be used to help determine the diameter of twisted yarn or the width of spun ribbons. For the mentioned invention embodiments in which moving belts or rotating drums are used, this patterned deposition of nanofibers is preferably as parallel strips that extend in the direction of substrate displacement.

As a useful alternative to patterned deposition of nanotubes, the nanotubes can be grown uniformly over the substrate (such as by CVD deposition of a nanotube forest on the surface of a drum or belt) and laser trimming can be used for patterning the nanotube array for subsequent draw-twist spinning. This laser trimming is optionally and preferably such that narrow lines of removed nanotubes separate parallel regions where the nanofiber forest is largely unexposed to the laser beam. These lines of removed nanotubes are preferably parallel to the translation direction resulting from drum rotation or belt translation. Laser trimming can also be used to uniformly decrease the height of nanofibers in a forest of nanofibers. The benefit of such trimming of nanofiber height along the length of a strip of nanofiber forest used for spinning is to control yarn structure along the length of draw-twist yarns. Such trimming of nanotube height along a forest strip length can be optionally done periodically, so that the produced draw-twist fibers have periodic variation in structure along the fiber length. Such variation in yarn structure along the yarn length can be useful for achieving property variations along this length, such as electronic property variations or for increasing the yarn density by providing thin yarn segments that can fit in void spaces between segments of larger diameter yarns. The yarn structures having variations along the yarn length are preferably either twisted yarns, false-twisted yarns, liquid densified yarns, or non-twisted yarns that are infiltrated with an agent that provides inter-nanofiber binding, such as an organic polymer.

As will be described below in more detail, the effect of the above change in nanofiber length for different segments of the yarn is to change the local density of the twisted yarn, and this change in local density can be employed for directing processes that selectively transform the electrical properties of one yarn segment relative to that of other yarn segments. The effect is that various electronic devices can be made along the yarn length, such as diodes based on n-p junctions. Various processes can be used for this selective area patterning, which make use of the effect of local density changes. The local density of a particular yarn segment depends upon the length of the nanofibers in that segment, since the nanotube length affects inter-fiber bonding, and thereby the distribution of twist between different segments of the yarn—which affects the yarn density (porosity) for a segment and the dependence of local yarn density on an applied tensile strain. The electrical conductivity of a segment, and the temperature rise caused by a current through the yarn, is also affected by the porosity differences between segments and the varying number of inter-fiber contacts per nanotube.

Porosity differences along the yarn can be used for selectively doping different yarn segments, selectively chemically modifying them, or for protecting one yarn segment from chemical exposure effects that affect other yarn segments (by selective infiltration of protecting chemicals in different yarn segments). These processes form the initial basis for yarn lithography processes of device embodiments, which enable the construction of electronic devices in the nanofiber yarns (see Section 10(a)). The porosity differences between different yarn segments having different structure can be tuned by varying the tensile stress applied to the yarn. Also useful for this new type of yarn lithography, the selective heating of different yarn segments, due to the porosity differences and resulting electrical conductivity differences of these segments, can be used for the selective deposition, selective reaction, or selective removal of particular chemicals from specific yarn segments.

Various agents can be used to modify the properties of, and interactions between, nanotubes during processing; the final yarn, ribbon, or sheet; or the properties of the intermediate or final products made of or incorporating said yarn, ribbon, or sheet. Such agents can be selected to optimize yarn properties including, but not limited to, friction or binding, strength, thermal and electrical conductivity, chemical reactivity, and surface energy and chemistry.

Suitable agents can provide the desired function when in either the solid state, liquid state or adsorbed gas state and can be applied either from the gas, vapor or liquid state, from a gas plasma, from a suspension, solution, dispersion, emulsion or colloid, electrochemically from a solution, or by particle, fiber or layer infiltration and by other methods familiar to those skilled in the art of application. These agents can be applied to a pre-primary assembly like a nanotube forest, to the primary assembly, or after formation of the twisted yarn, ribbon, or sheet. Agents for the chemical or physical modification of carbon nanotubes and inter-nanotube interaction in nanotube forests for yarn, sheet, or ribbon fabrication processes are optionally and preferably delivered from gas phase, vapor phase, or plasma states.

Agents used for modifying the properties of the pre-primary assembly, primary assembly or yarn, ribbon, or sheet can be selected to physically or chemically modify the surface of the nanotube fibers, as in oxidation, reduction, or substitution with functional groups, such as by (1) covalently binding molecular, polymeric, or ionic species to the nanotubes; (2) forming non-covalent binding, as in van der Waals and charge-transfer binding (3) covalently or non-covalently binding species capable of hydrogen bonding, and/or (4) physically over coating with a polymer, a metal or metal alloy, a ceramic, or other material. Agents can be selected that, irrespective of bonding, at least partially encapsulate, envelop, or coat individual nanotubes or bundled nanotubes on the nanoscale.

Irrespective of the nature of any bonding, agents can be selected so as to have one or more physical dimensions of a similar order to the nanotubes, that is to say nanolayers, nanofibers and nanoparticles, and thereby or otherwise to interpose between the nanotubes and produce a variety of physical or chemical interactions between them. Such interactions can encompass, but not be limited to, locking tubes together, or facilitating their relative motion, or of facilitating or limiting the transfer of electrical or thermal or light or sound energy between them or of facilitating or limiting the transfer of strain or compression or shear or rotary force between them. Irrespective of their size and the nature of their interactions, agents can be selected which interpose to separate nanotubes and thereby limit or facilitate their interactions, or which occupy the interstices between nanotubes but do not interpose or separate them and hence or otherwise allow or facilitate direct inter-tube contact.

Notwithstanding that agents mentioned heretofore are applicable to interactions between individual or bundled nanotubes within a pre-primary assembly, primary assembly or yarn, ribbon or sheet, all such agents are also similarly able to facilitate or limit interaction between said pre-primary assembly, primary assembly or yarn, ribbon or sheet and the externality including, but not limited to, the substrate on which the nanotubes are grown, the tools and equipment used to produce, handle, process or store them and the intermediate or final products into which they are fashioned or in which they are incorporated, including but not limited to yarns, textiles and composites. Such interaction with the externality can include deliberate connection to the externality by, but not limited to, the methods of bonding, soldering, welding, attaching, connecting and other such methods used by those skilled in the art of connection. Said interaction can also include deliberate prevention of connection in the nature of, but not limited to, insulating, isolating, masking, desensitizing or rendering incompatible.

Agents can be selected which are applied and present only for that operation for which they are intended and then are removed or otherwise depart having fulfilled their function. Such agents may be washed out with a solvent, liquefied, evaporated or decomposed by thermal energy, decomposed or altered by any form of radiation or chemical treatment, or otherwise be rendered, soluble, mobile, labile, volatile or fugitive in order that such agent may wholly or substantially be removed from or leave the nanotubes. Agents can be selected which are applied and present for a particular function but which then remain either serving no further purpose, or continuing to serve their initial function, or serve alternative or additional functions in subsequent operations and intermediate and final products. Such agents may remain wholly unchanged or may undergo chemical or physical changes or both. An example of such an agent is a chemical which, in its monomeric form acts as a lubricant or friction modifier for yarn assembly and is subsequently polymerized in situ to promote or facilitate nanotube or yarn adhesion and interaction.

Those skilled in the art will recognize that the agents described herein fulfill many of the functions applied in conventional fiber processing and are of recognized types including, but not limited to, fillers, surfactants, lubricants, modifiers, humectants, binders, sizes, linkers, adhesives, monomers and polymers. Those skilled in the art will also recognize that the applications of these agents to a pre-primary assembly, primary assembly or yarn, ribbon or sheet of nanotubes or to intermediate or final products made of or incorporating them introduce unique and hitherto undiscovered or unobtainable qualities and functions to them.

The pre-primary and primary nanofiber assemblies and the final twisted yarns can optionally include (1) nanofibers having substantially different lengths or diameters, (2) non-nanosize diameter fibers that are either continuous or limited in length, (3) nanofibers having different chemical or physical surface treatments, or (4) nanofibers that have effectively continuous lengths. One benefit of including continuous or effectively continuous twisted fibers in the twisted yarns is that these effectively continuous fibers can help bind short length nanofibers into a mechanically robust assembly. Optionally and most preferably, these effectively continuous fibers are also either microdenier fibers (weighing less than a gram per 9000 meter length) or nanofibers. These nanofibers having effectively infinite length are preferably made by electrostatic spinning. These continuous or effectively continuous fibers optionally and preferably largely comprise either a metal or an organic polymer.

One preferred method to spin a singles yarn that comprises nanofibers having different lengths, different chemical compositions, or different coatings is to effectively and simultaneously draw-twist these fibers from the same pre-primary or primary assembly. This pre-primary or primary assembly is optionally and preferably a nanofiber forest.

It is optionally preferred for selected applications that the twisted nanofiber yarns comprising different fiber components are assembled in a segregated manner, such as alternating strips in a nanofiber forest.

(b) False-Twist-Based Yarn Spinning from Nanofiber Forests

The Inventors have surprisingly discovered that a substantial part of the mechanical strength enhancement due to twist-based spinning of nanofibers can be obtained by using false twist. False twist is basically twist in one direction followed by an approximately equal twist in the opposite direction. This unexpected discovery has enormous practical importance for several reasons. First, false twist can be introduced very rapidly, which decreases the cost of spinning processes. Second, false-twisted nanofiber yarns can be advantageously used for formation of yarns in which twist is not needed to provide inter-nanofiber coupling, which can be the case for yarns in which nanofiber length is very long and ones in which an infiltrated material (such as a polymer) provides mechanical coupling between nanofibers. For example, the discovered strength enhancement due to false twist enables application of the higher stresses needed for fast spinning, whether or not true twist (net twist in one direction) is later introduced into the yarn. Finally, the absence of significant true twist for a nanotube/polymer composite yarn can enhance yarn toughness (the energy required to break the yarn), since the presence of substantial twist can interfere with the energy dissipative processes that otherwise occur over large yarn deformations.

Figure 52:
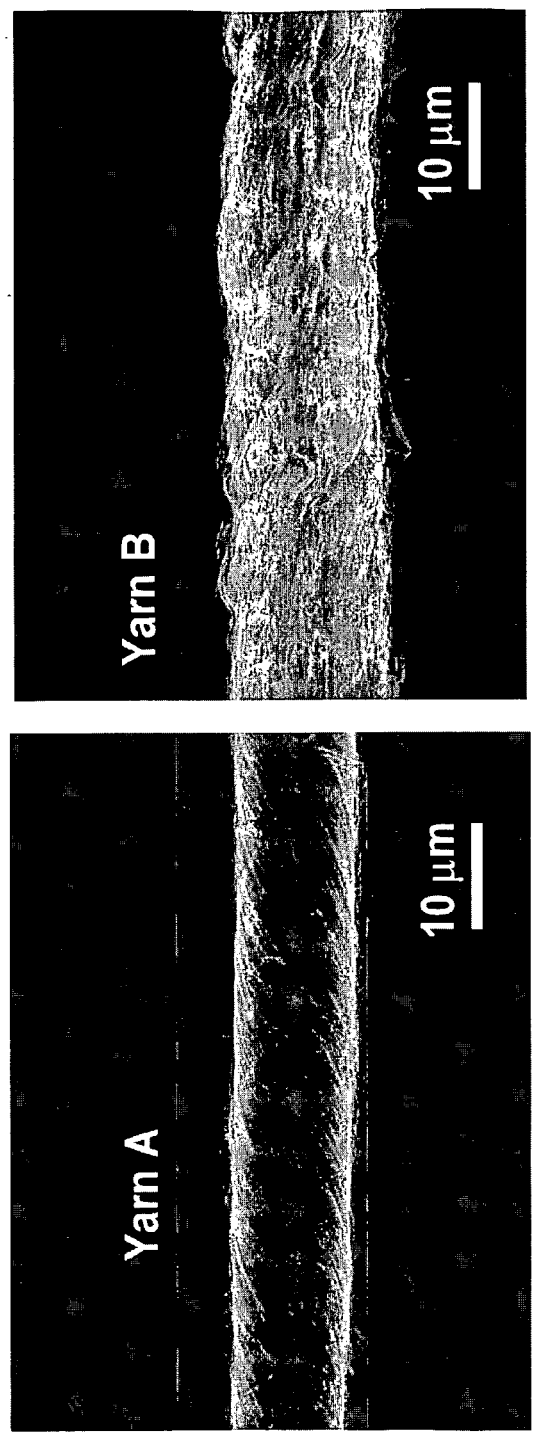
FIG. 52 compares SEM images of (a) Yarn A: with a 26000 turns/m clockwise twist and (b) Yarn B: a 26000 turns/m clockwise twist was introduced first and then the same twist was introduced anticlockwise to release the twist.

The experiments of Example 40 show that twist dramatically increases yarn tensile strength, even when this twist is subsequently eliminated by an equal twist in an opposite direction. In this experiment, ribbons having fixed width were pulled from a carbon nanotube forest. In the absence of twist or false twist, the strength of the ribbon was too low to be measured. When twisted to form a twist angle of 28°, strength increased from this negligible value to 339 MPa. However, unlike the case for yarns comprising large diameter fibers, an important percentage of this strength increase (33%) was retained when the carbon nanotube yarn was subsequently untwisted by an amount equal to the initial twist. Note that the increase in yarn diameter (compare A and B SEM micrographs of FIG. 52) as a result of twist de-insertion is relatively small.

Since strong untwisted yarns are highly desirable for use in forming nanotube/polymer composite yarns have both high strength and high toughness, this surprising discovery that false twist (twist insertion followed by twist de-insertion) can dramatically increase yarn strength is quite important. This discovery provides the motivation for the false-twist spinning apparatus described in FIGS. 44-46.

False twist processes can optionally be applied more than once to a yarn, so as to provide yarn densification and other desirable results. Also, twist-based spinning and liquid-densification-based spinning (see Section 1(e)) can be optionally and beneficially applied during nanofiber yarn spinning.

(c) Sheet and Ribbon Fabrication from Nanofiber Forests

While drawing yarns from carbon nanotube forests have been described in the prior art, these yarns have a maximum reported width of only 200 µm and are much too weak to be useful. The Inventors herein show that strong sheets having arbitrarily wide widths can be drawn from nanotube forests.

The structural nature of the nanotube forest is important for drawing both sheets and wide ribbons from nanotube forests, and the preferred structural nature of the forest is described in Section 1(e).

Figure 22:
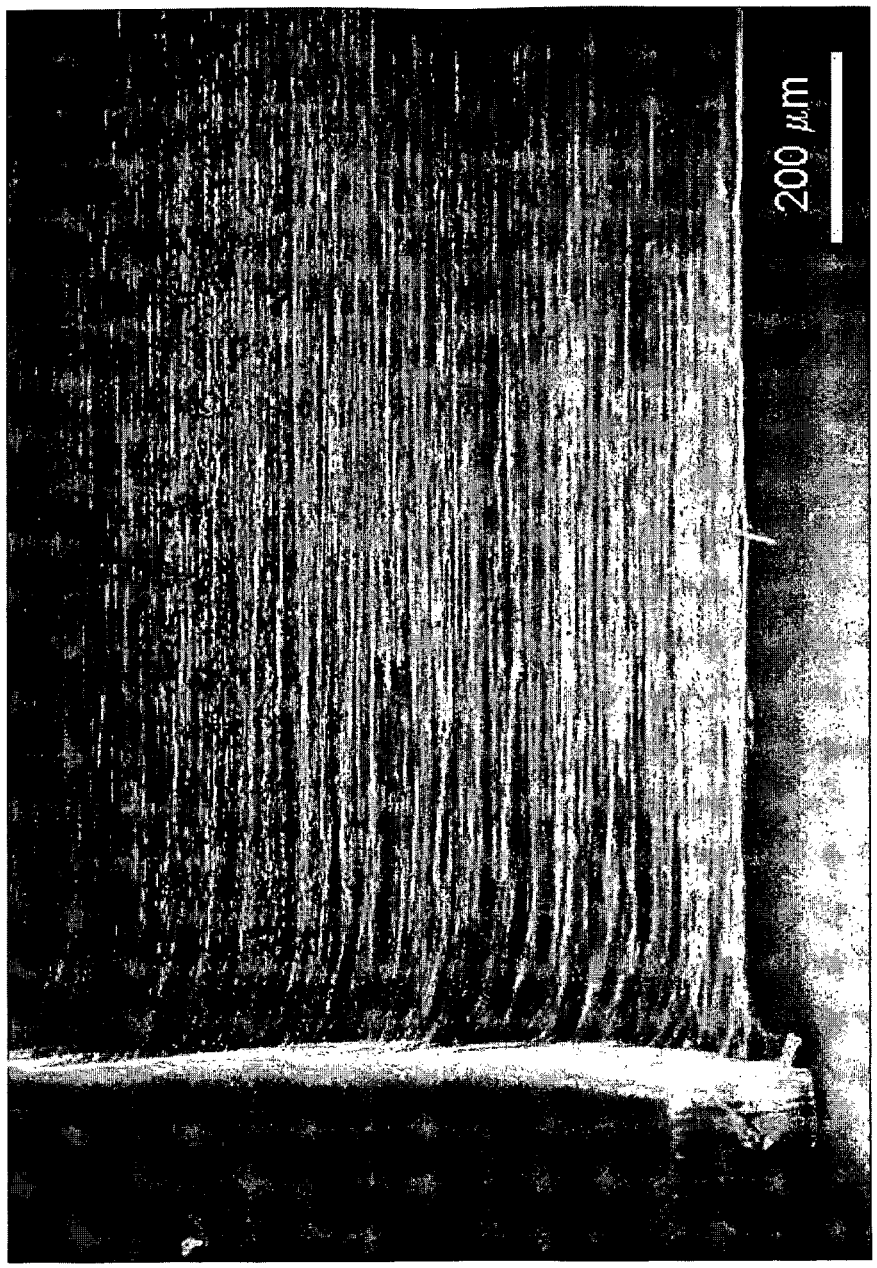
FIG. 22 is a Scanning electron microscopy (SEM) image, at a 35° angle with respect the forest plane, capturing a MWNT forest being drawn into a sheet.
Figure 23:
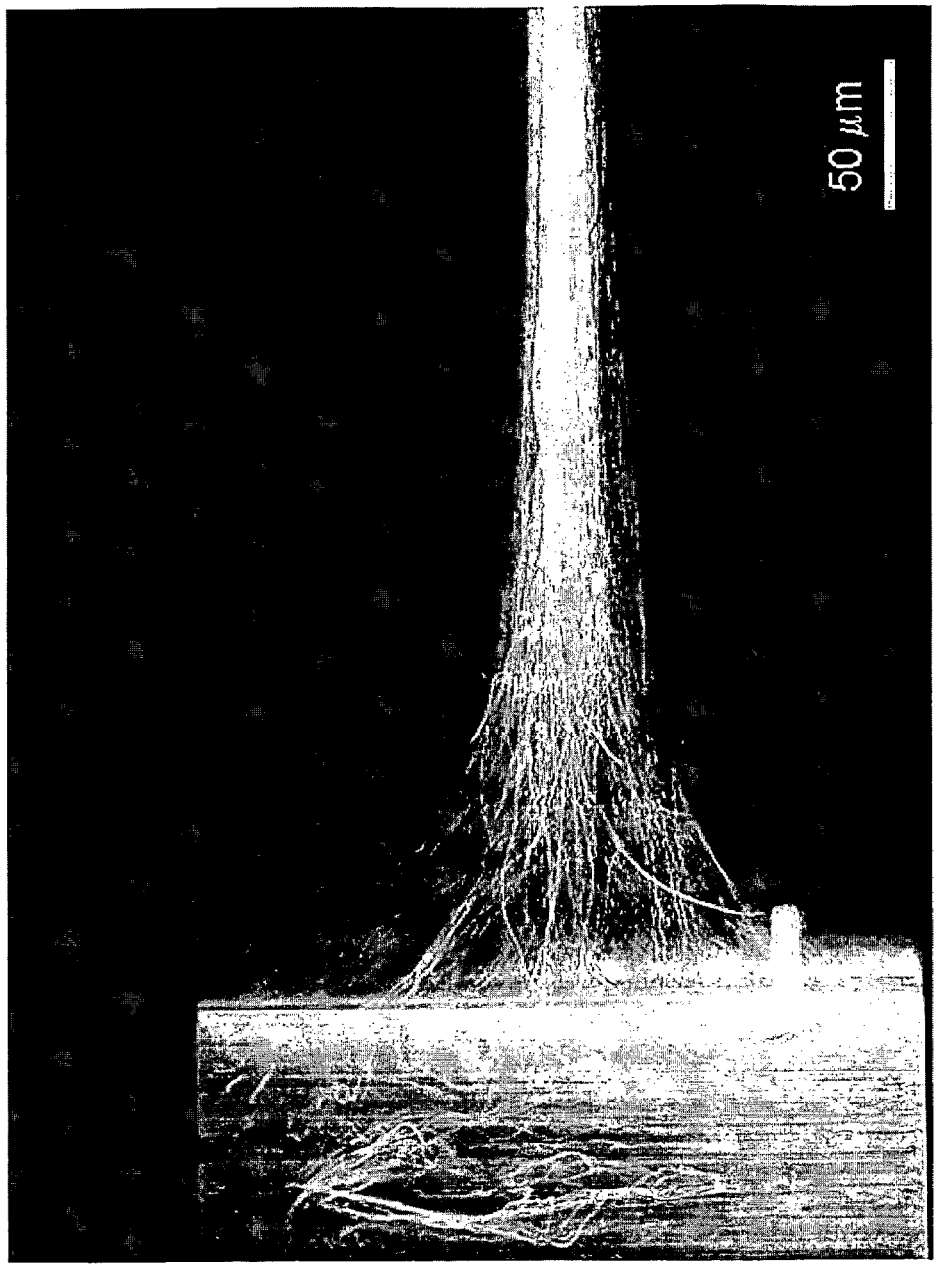
FIG. 23 is a SEM micrograph showing the cooperative 90° rotation of MWNTs in a forest to form a strong carbon nanotube sheet.

Example 21 demonstrates the drawing of about five centimeter width transparent nanotube sheets from the sidewall of multiwalled nanotube (MWNT) forest. Draw was initiated using an adhesive strip to contact MWNTs teased from the forest sidewall. Importantly, bundled nanotubes were simultaneously pulled from different elevations in the forest sidewall, so that they join with bundled nanotubes that have reached the top and bottom of the forest, thereby minimizing breaks in the resulting fibrils (FIGS. 22 and 23). Sheet production rates of up to ten meters per minute where demonstrated, which is comparable to the rates used commercially for twisting wool together to make yarn. Even when the measured areal density of the sheet was only ~2.7 µg/cm², meter-long, 500 cm² sheets were self-supporting during draw. A one centimeter length of 245 µm high forest converted to about a three-meter-long free-standing MWNT sheet. The sheet fabrication process is quite robust and no fundamental limitations on sheet width and length are apparent: the obtained 5 cm sheet width equaled the forest width when the draw rate was about 5 m/min or lower. The nanotubes are highly aligned in the draw direction, as indicated by the striations in the SEM micrograph of FIG. 22.

For applications in which sheet or ribbon transparency is needed, the carbon nanofiber sheets or ribbons preferably have an areal density of less than 10 µg/cm².

As for twist-based nanofiber draw, it is preferred that nanofibers are simultaneously pulled from essentially the full height of the nanofiber forest sidewall (edge).

For economic reasons, the ribbon and sheet draw processes are optionally preferably conducted at least 5 meters per minute. Also, for reasons of economic fabrication, the nanotube sheets optionally have a width of about 5 cm or greater.

Example 22 shows that the solid-state drawn nanotube sheet of Example 21 comprises a novel, useful state of matter that was previously unknown: an aerogel comprising highly oriented carbon nanotubes. From the measured areal density of about 2.7 µg/cm² and the sheet thickness of about 18 µm, the volumetric density is approximately 0.0015 g/cm³. Hence, the as-produced sheets are an electronically conducting, highly anisotropic aerogel that is transparent and strong. The high degree of nanotube orientation in the nanotube sheet is demonstrated by the Raman spectra of FIG. 41, which indicates a polarization degree of about 0.69 to 0.75. The anisotropy of light absorption (FIG. 25) also indicates the high anisotropy of the nanotube sheets. Ignoring the effect of light scattering, the ratio of absorption coefficient for parallel and perpendicular polarizations for the as-drawn single sheet was 4.1 at 633 nm, and monotonically increased to 6.1 at 2.2 µm. The striations parallel to the draw direction in the SEM micrograph of FIG. 22 provides more evidence for the high degree of nanotube orientation for the as-drawn nanotube sheets.

For certain applications, it is optionally preferred that the aerogel sheets and ribbons made by invention embodiments have a density of less than 0.005 g/cm³.

The width of the nanofiber sheet can be optionally increased or decreased to ribbon type widths. This can be optionally accomplished by controlling the width of the nanotube forest sidewall (or other pre-primary nanofiber assembly) that is contacted when ribbon draw is initiated, patterning forest deposition, or by separating wide drawn sheets into ribbons (such as by mechanical or laser-assisted cutting). The ribbon width is optionally preferred to be at least 0.5 mm. More optionally preferred, the ribbon width is above one millimeter.

In another method of invention embodiments, nanofiber sheets of arbitrarily large lateral extent are obtained by assembling nanofiber ribbons or narrower sheets, so that adjacent ribbons or narrower sheets at least partially overlap to provide inter-ribbon binding. This assembly can be accomplished on a planar or non-planar substrate, such as a rotating drum. Since the inter-ribbon binding will normally be low, a binding agent (such as a polymer like polyvinyl alcohol) can optionally be used to enhance inter-ribbon bonding in the sheet. Alternatively, inter-ribbon bonding can be enhanced by other means, such as by using electron beam, microwave, or radio frequency welding (optionally in the presence of a bonding agent). Soaking the sheet in liquid, such as methanol or isopropyl alcohol, and then drying (see section 1(d)) is another way to fix the binding (inter-ribbon binding and/or the binding between ribbon and substrate).

(d) Liquid-Based Densification for Strengthening Nanotube Sheets and Ribbons

The Inventors have also surprisingly discovered that liquid imbibing, followed by liquid evaporation can be used for causing over 300 fold densification of nanofiber sheets an ribbons, and for increasing both strength and tenacity (gravimetric strength).

More specifically, Example 23 shows that the Inventors can easily densify these highly anisotropic aerogel sheets into highly oriented sheets having a thickness of 50 nm or less and a density of ~0.5 g/cm$^3$. In this specific instance they obtain a 360-fold density increase by simply adhering by contact the as-produced sheet to a planar substrate (e.g. glass, many plastics, silicon, gold, copper, aluminum, and steel), immersing the substrate with attached MWNT sheet into a liquid (e.g. ethanol), retracting the substrate from the liquid, and then permitting evaporation. Densification of the entire sheet, or selected areas within the sheet, can also be similarly obtained by dropping or otherwise injecting such a liquid onto the sheet area where densification is desired, and allowing evaporation. Surface tension effects during ethanol evaporation shrank the aerogel sheet thickness to 30-50 nm for the MWNT sheet prepared as described in Example 1. The aerogel sheets can be effectively glued to a substrate by contacting selected regions with ethanol, and allowing evaporation to densify the aerogel sheet. Adhesion increases because the collapse of aerogel thickness increases contact area between the nanotubes and the substrate.

Example 27 shows that the densification process substantially increases the mechanical properties of the nanotube sheets. Stacks of undensified identically oriented sheets have an observed gravimetric tensile strength of between 120 and 144 MPa/(g/cm$^3$). A densified stack containing identically oriented sheets had a strength of 465 MPa/(g/cm$^3$), which decreased to 175 MPa/(g/cm$^3$) when neighboring sheets in the stack were orthogonally oriented to make a densified biaxial structure. These density-normalized strengths are comparable to or higher than the ~160 MPa/(g/cm$^3$) strength of the Mylar® and Kapton® films used for ultra-light air vehicles and proposed for solar sails for space applications (see D. E. Edwards et al., High Performance Polymers 16, 277 (2004)) and those for ultra-high strength steel sheet (~125 MPa/(g/cm$^3$)) and aluminum alloys (~250 MPa/(g/cm$^3$)).

Figure 28:
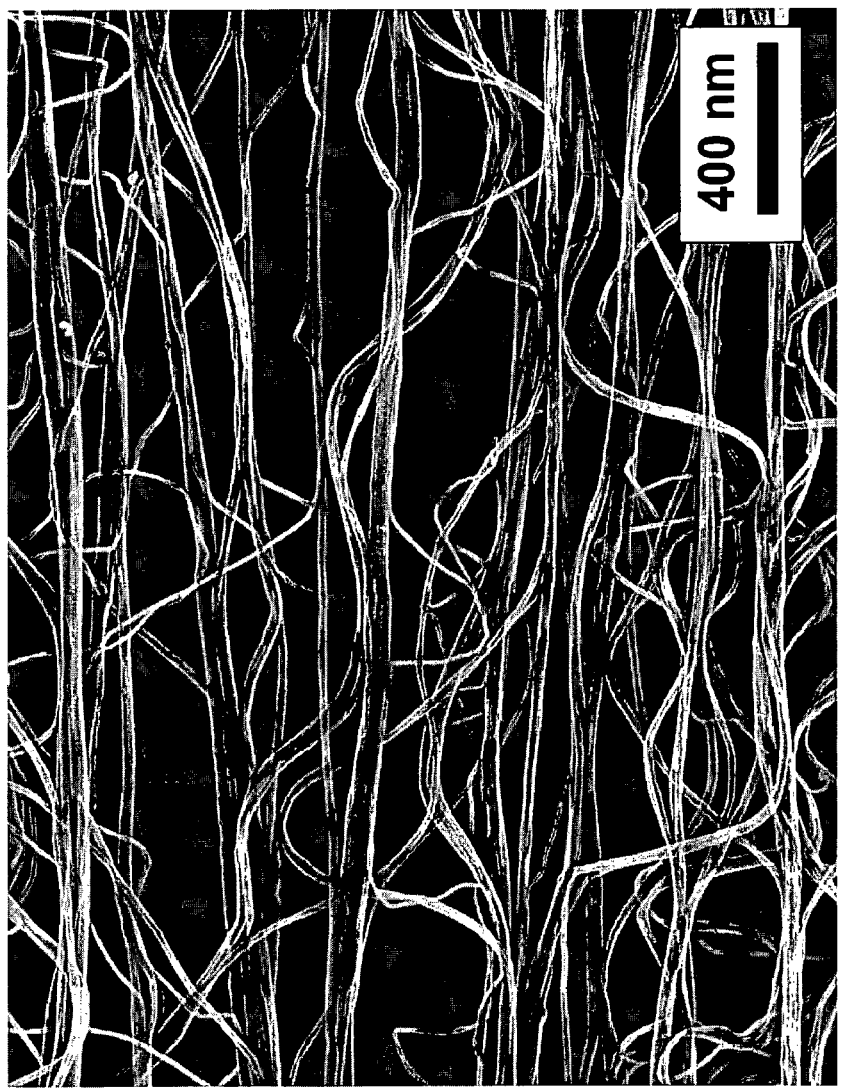
FIG. 28 is a SEM image showing the branching of fibrils within a densified solid-state fabricated MWNT sheet.

Example 35 shows that the nanotube sheets are a type of self-assembled textile in which nanofiber bundles branch and then recombine with other branches to form a network having a degree of lateral connectivity orthogonal to the draw direction. The SEM micrograph of FIG. 28 shows this branching and branch recombination. Fibril branching continues throughout the sheet, thereby making a laterally-extended, inherently interconnected fibril network.

(e) Liquid-Densification-Based Spinning from Nanofiber Forests

The inventors find that a strong nanotube yarn can be obtained from a nanotube forest by using liquid-based densification, thereby avoiding the need for either twist or false twist. While Example 38 demonstrates this process for a ribbon drawn from a forest, the inventors find that this process can also be applied for narrow yarns. If no twist is applied and the yarns are used as-drawn from the forest, the yarn mechanical strength was too low to be measured using the available apparatus. The effect of liquid treatment (involving liquid imbibing, and filament densification during liquid evaporation) was to dramatically increase strength, as well as to increase tenacity (see Example 20). For the case of the ribbon described in Example 36, the obtained strength resulting from liquid-densification was 215 MPa.

The choice of liquids for liquid-densification-based nanotube spinning is guided in part by surface energy and liquid cohesive energy considerations, since it is desirable that the imbibed liquid is adequately imbibed into the nanotube sheet, ribbon, or yarn. Since the surface energy of the nanotubes can be dramatically effected by chemical derivatization and surface coatings (see Section 7), this choice of liquid depends upon whether or not this derivatization has occurred (for example, as a result of reactions during forest synthesis, post-synthesis treatment of the nanotube forest, or after initially drawing the nanotube ribbon, sheet, or yarn). For the largely non-derivatized nanotube forests of Example 1, acetone, ethanol, methanol, isopropyl alcohol, toluene, chloroform, and chlorobenzene preform well as liquids for sheet, ribbon, or yarn densification. The performance of liquids that do not perform well for a particular type of nanotube can be enhanced by adding a suitable surfactant. For example, water does not perform satisfactorily for densifying the nanotube sheets prepared using the method of Example 22 from the nanotube forests of Example 1. However, a surfactant/water mixture (either 0.7 weight percent Triton X-100 in water or 1.2 weight percent lithium dodecyl sulfonated in water) was a satisfactory densification agent (see Example 23). Other considerations for the choice of liquid for densification are liquid viscosity (which affects the rate of the liquid infiltration process) and the ease at which this liquid can be volatilized during subsequent processing.

The optionally preferred degree of infiltration is optionally and preferably the maximum that can be achieved without unnecessarily increasing processing costs. However, it is sometimes useful to obtain yarns, sheets, and ribbons in which liquid is imbibed only into the outer surface regions of these articles. The benefit of such partial infiltration is to obtain densification for principally the imbibed regions.

Various methods can be usefully employed for achieving infiltration of the liquid used for densification into the nanofiber yarn, ribbon, or sheet. These include among other possibilities the condensation of a vapor, immersion into the liquid, and exposure to an aerosol of the liquid. Removal of the densification liquid is preferably by evaporation. Supercritical fluids can also optionally be used as liquids for achieving yarn, sheet, or ribbon densification.

The liquid used for densification can optionally contain a binding agent or other functionally useful agent for enhancing yarn properties (see Section 8), which can be either dissolved in the densification agent or dispersed within it as colloidal material. Useful types of colloidal particle include catalyst particles and nanofibers, especially largely unbundled carbon single walled nanotubes.

Twist-based spinning, liquid-densification-based spinning (see Section 1(e)), and false-twist based spinning can be optionally and beneficially applied in any combination during yarn spinning. Also, liquid-densification-based spinning can be optionally combined simultaneously with twist-based spinning—and the twist can either be retained or subsequently be partially or completely removed during later yarn processing. The inventors show in Example 38 that densification of drawn ribbons prior to twist made it possible to obtain uniformly twisted singles yarn even when the applied twist is very low (corresponding to a helix angle of 5°). Application of such low twist in the absence of pre-applied liquid-based yarn densification resulted in non-uniform twist and yarn diameter.

(f) Elaboration of Nanofiber Forest Types Useful for Yarn, Sheet, and Ribbon Production Most types of nanotube forests are either unsuitable for spinning or produce weak yarns or ribbons. The nanotube forests used for spinning either have a degree of entanglement or other bonding between the substantially parallel nanotubes in the forest, or one that develops early in the spinning process. A degree of bundling in the forest, wherein one nanotube meanders between different bundles, can be obtained by using such type of CVD forest growth processes as described in Example 1. Such a degree of bundling and meandering is preferable. It is more specifically preferable that nanotubes in the forest undergo intermittent bundling, meaning that a individual nanotube forms small bundles with a small group of neighboring nanotubes at one location along the forest height and with other small group of neighboring nanotubes at other locations along the forest height.

Transition from spinable to non-spinable or difficulty spinable forests can be caused by relatively minor changes in the reaction conditions used for nanotube forest growth. Even changing the furnace size and type used for spinning can importantly change the spinability of forests and the ease of drawing forests. However, those having ordinary skills in the known art of forest growth will be able make small changes in growth conditions, so as to provide useful nanotube forests for nanotube sheet, ribbon, and yarn production.

Figure 56:
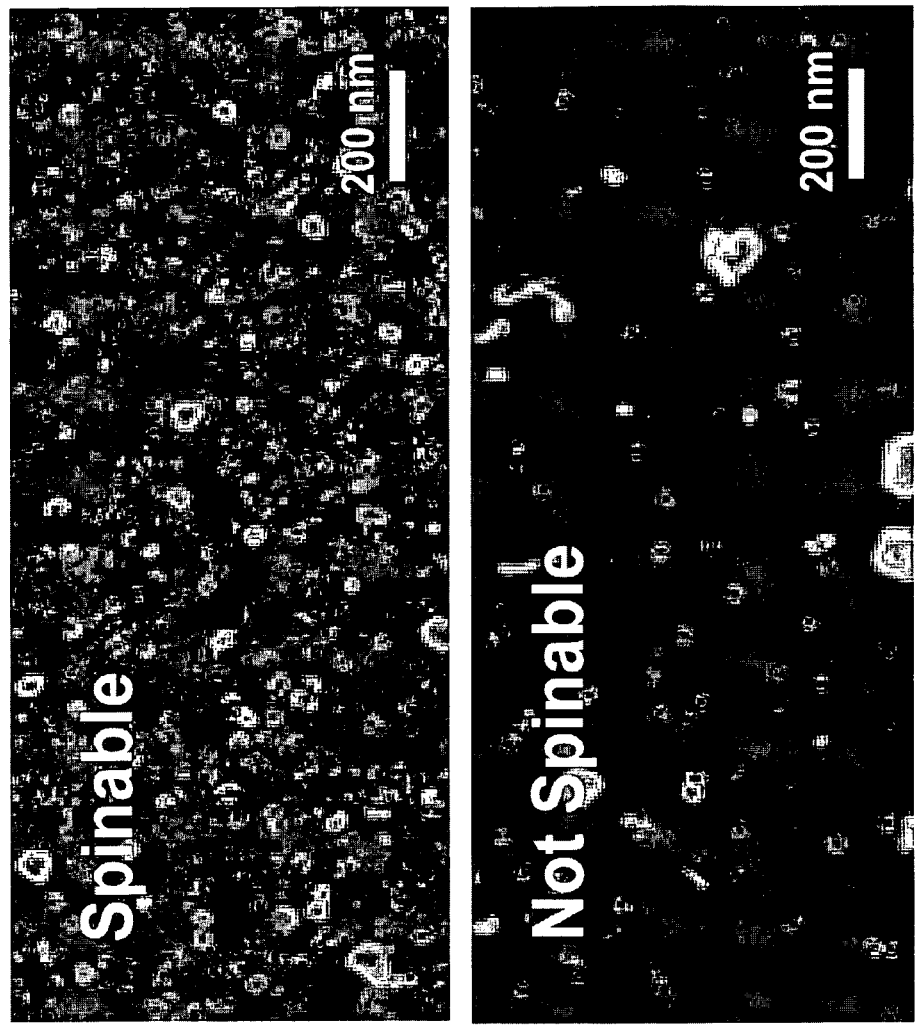
FIG. 56 compares SEM micrographs of the growth substrates for spinable and non-spinable nanotube forests (after removal of the nanotubes) wherein the small diameter pits on the growth substrate correspond to the growth site of a MWNT.

Too low a density of nanotubes in a forest renders a forest difficult to spin. This is illustrated in FIG. 56 where SEM micrographs of the growth substrates are compared for spinable and practically non-spinable nanotube forests (after removal of the nanotubes) wherein the small diameter pits on the growth substrate correspond to the growth site of MWNTs. The nanotube diameters (about 10 nm) are roughly the same for both of these spinable and practically non-spinable forests. However, the inventors have observed nanotube forest base area densities of 90 billion to 200 billion nanotubes/cm$^2$ for nanotube forests that are highly spinable, as compared with 9 billion to 12 billion nanotubes/cm$^2$ for low density nanotube forests that were difficult or impossible to spin. Also, the inventors observed that the percentage of the forest base area that was occupied by nanotubes was much higher (7% to 15%) for highly spinable forests, as compared with 1.1% to 2.5% for nanotube forests that were difficult or impossible to spin.

While these measurements of nanotube density and fraction of forest area that is occupied are most conveniently measured using the base plane, it should be understood that nanotube forest density can differ from the base plane value, both increasing because individual nanotubes prematurely stop growth and because new nanotube growth is initiated above the forest base. Optionally and preferably at least 20% of the nanotubes initiated on the base area continue growth to essentially the top of the forest. Optionally and more preferably, at least about 50% of the nanotubes initiated on the base area continue growth to essentially the top of the forest.

Reflecting these complications the terms maximum nanotube forest density and maximum % of forest area are used, which are defined as the maximum values of these parameters when measured on planes parallel to the growth surface. Also, in some cases it is useful to employ a non-planar growth surface. In which case, the terms nanotube forest density and fraction of surface occupied by nanotubes is defined using either the non-planar growth surface or for a surface essentially parallel to the growth surface.

Based on these surprising observations, nanotube forests used directly for yarn, ribbon, or sheet draw preferably have a maximum nanofiber density of at least 20 billion nanotubes/cm$^2$ when the nanotube diameter is approximately 10 nm. More generally for these and other nanotube diameters, nanotube forests used directly for yarn, ribbon, and sheet draw have a maximum percentage of the forest area that is occupied by nanotubes that is optionally and preferably above about 4%. Optionally and more preferably, the nanotube forests used directly for yarn, ribbon, and sheet draw have a nanofiber density on the forest base of at least 20 billion nanotubes/cm$^2$ when the nanotube diameter is approximately 10 nm. Also, optionally and more preferably, the nanotube forests used directly for yarn, ribbon, and sheet draw have a percentage of the forest base area that is occupied by nanotubes that is above about 4%.

Too high a density of nanotubes in the forest and too large an interaction between the nanotubes in a forest can also make nanotube forests difficult or impossible to spin. The problem here is that interactions within the forest are so strong that the draw-induced transformation from nanotube orientation in the forest to that in the yarns and sheets is interrupted, and principally clumps of nanotubes are withdrawn from the forest.

Nanotube forests used directly for yarn, ribbon, and sheet draw have a maximum percentage of the forest area that is occupied by nanotubes that is optionally and preferably less than 40%. Also, optionally and more preferably, the nanotube forests used directly for yarn, ribbon, and sheet draw have a percentage of the forest base area that is occupied by nanotubes that is below about 40%.

The product of the number of nanotubes per unit area in the forest and the nanotube diameter is optionally and preferably in the range between 0.16 and 1.6 when measured on the forest base, since this parameter range is especially useful for sheet, ribbon, and yarn spinning from carbon nanotube forests.

This nanofiber forest suitable for formation of the primary assembly, or as a primary assembly, can be on a planar or non-planar substrate and the nanofibers in the forest can either be deposited over substantially the entire substrate surface or only on part of the surface. Also, different types of nanotubes can be in different regions of the surface or can be mixed in the same forest regions.

For convenience in facilitating nanotube yarn spinning and ribbon and sheet draw, the minimum radius for the forest-occupied-area of a curved forest substrate is optionally over ten times the maximum height of the forest. Use of a curved surface substrate, whether or not this substrate is subsequently removed before ribbon or sheet draw, can facilitate the draw of ribbons and sheets that are non-planar. For the purpose of drawing such ribbons and sheets, the tool used to start spinning or draw should preferably have a matching shape, meaning that this tool is sufficiently matched in shape to the curved substrate that appropriate forest contact can be made every where to start spinning.

(g) Elaboration on Methods for Starting Sheet, Ribbon, and Yarn Draw

Example 46 describes methods for initiating the drawing of a nanotube sheet, ribbon, ribbon array, yarn, or yarn array from a nanotube forest using an adhesive, an array of pins, or a combination of an adhesive and an array of pins. Interestingly, the inventors find that contact of an adhesive tape to either the top or sidewall of the nanotube forest is useful for providing the mechanical contact that enables the start of sheet draw. Any of an enormous variety of adhesive tapes and adhesives applied to surfaces are suitable, including the various Scotch® brand adhesive tapes of 3M and the adhesive strip of 3M Post-It® Notes. Contact of a straight adhesive strip (so that the adhesive strip is orthogonal to the draw direction) is especially efficient for starting the draw of a high structural perfection sheet. The reason that this top contact method is especially advantageous is that nanotube forests typically have non-straight sidewalls, and the use of a straight adhesive strip (or a straight array of suitably spaced pins) provides straight contact for forest draw to make a sheet.

An array of closely spaced pins can also be usefully employed to start sheet draw. In one experiment, the pin array consisted of a single line of equally spaced pins. The mechanical contact needed for spinning was in this case initiated by partial insertion of the linear pin array into the nanotube forest (see Example 46). The pin diameter was 100 micron, the pin tip was less than one micron, and the spacing between the edges of adjacent pins was less than a millimeter. Satisfactory sheet draw was achieved using pin penetration of between ⅓ and ¾ of the height of the forest (in the range between 200 and 300 microns).

Optionally and preferably, neighboring pins in the pin array can have differing lengths, so that they are inserted to differing depths in the nanotube forest. Also, instead of using a single linear array of pins, the pin array can be two dimensional in lateral extent. For example the pin array can beneficially consist of two or three rows of pins perpendicular to the draw direction in which adjacent rows are optionally offset in the row direction by one-half of the inter-pin spacing in the row direction. The pins in the pin array are optionally and preferably approximately equidistant from nearest neighbor pins.

Draw processes of multiple ribbons or yarns can be similarly initiated using a linear array of adhesive patches or a linear array of pins that are separated into segments. The separation distance between adhesive patches along the length of the linear array determines the ribbon or yarn width. The yarn can be subsequently strengthened by, for instance, twist-based spinning, false-twist spinning, liquid-densification-based spinning, or any combinations thereof. Mechanical separation of the sheet strip patches or the pin patches in the linear array during the start of draw is usefully employed in order to avoid interference during processing of adjacent ribbons or yarns, such as during the introduction of twist.

Use of adhesive patches (or pin patches) that have different lengths along the strip direction can be usefully employed—such as to draw-twist adjacent strips to produce different diameter yarns (which can be optionally combined to provide a plied yarn in which different singles yarns in the plied yarn have different diameters). Different degrees of twist or directions of twist can be conveniently and usefully applied to different singles yarns that are drawn using the segmented adhesive or pin strip, and these different singles yarns can then be optionally plied together in a yarn containing a freely-selected number of plies. Importantly, using the above methods for introducing different diameter singles yarns into a plied yarn can be employed to produce a plied yarn having enhanced density, since smaller diameter single yarns can help fill-in void spaces between larger diameter singles yarns.

(h) Spinning Nanotube Yarns from Either Free-Standing or Substrate Supported Nanotube Sheets and Ribbons The inventors have demonstrated that nanotube sheets can be drawn from a nanotube forest, separated into ribbons, and that these ribbons can be subsequently twisted to make yarns. Similarly, the inventors show that ribbons drawn from a nanotube forest can be subsequently twisted to make yarn.

For instance, Example 36 shows a process wherein a 3 cm wide free-standing ribbon is folded upon itself along the draw direction and then subsequently twisted to make a 50 micron diameter yarn.

Example 37 demonstrates a process wherein forest-spun nanotube sheets are attached to a plastic film substrate, densified on this substrate using liquid infiltration and evaporation, and then draw-twist spun into a carbon nanotube yarn by drawing a nanotube sheet ribbon from the plastic film substrate and twisting this ribbon.

Example 52 shows that liquid-densified nanotube sheet stacks can be formed on cellulose tissue paper, that the nanotube sheets or ribbons can be easily peeled from this cellulose substrate, and that these ribbons can be twist spun to make strong nanotube yarn. This example indicates that any of a variety of porous substrates, such as poly(propylene) and polyethylene-based paper sheets, can be used as carrier substrates for the storage and shipment of densified nanotube yarn sheets in rolls, and the latter separation of nanotube sheets from the substrate as free-standing ribbons or sheets for subsequent applications, such as the twist-based spinning of yarns, the formation of lamellar composites, and the use of ribbons and sheets as electrodes.

Polymer-infiltrated nanofibers yarns can be made by (a) placing densified or non-densified oriented nanofiber sheets (or a single oriented nanofiber sheet) on a fusible substrate film or film strip so that the nanofiber sheets share a common nanofiber orientation direction, (b) optionally cutting or otherwise sectioning the resulting laminate along the nanofiber orientation direction to provide a laminate ribbon of suitable width (determined according to the desired yarn diameter), (c) heating the ribbon laminate while the ribbon laminate is under tension in the orientation direction or compression is applied orthogonal to the ribbon surface, so that the fusible material attaches to and at least partially infiltrates into the nanofiber sheet, (d) optionally drawing the ribbon laminate while the fusible material is at a temperature where it is easily deformable, (e) optionally twisting the ribbon while the fusible material is at a temperature where it is easily deformable, and then (f) cooling the fusible material to ambient temperature. The fusible substrate is preferably a fusible organic polymer and the nanofiber sheet is preferably a carbon nanotube sheet, and the carbon nanotube sheet is preferably made by draw from a carbon nanotube forest.

In another useful process, (a) densified or undensified nanotube sheets are laminated together with a sheet or sheets of a fusible sheet material to form a laminate, (b) the laminate is heated to above a temperature at which point fusion occurs while the laminate is under tension in an orientation direction or compression orthogonal to the sheet surface, and (c) cooling the laminate to ambient temperature. This process can be optionally conducted so that fusion between the fusible material and the nanotube sheets between heated rollers that provide a lateral pressure. The product of this process can optionally be cut into ribbon shaped yarns that are infiltrated with the fusible material. The fusible material is optionally and preferably an organic polymer. For this purpose of film cutting, micro-slitter and winder equipment is available from Ito Seisakusho Co., Ltd (Japan) that is suitable for converting continuous nanotube sheets to continuous ribbons and yarns.

(i) Post Yarn Spinning and Post Ribbon and Sheet Fabrication Processes Using Actinic Radiation and Thermal Treatment Various means can be optionally employed for the post spinning processing of twisted yarns of Section 1(a), the false-twist yarns of Section 1(b), the liquid-densified sheets and ribbons of Section 1(d), and the liquid-densification spun yarns of Section 1(e).

These methods include thermal annealing at a temperature of less than 2500° C. for multiwalled carbon nanotubes and less than 1700° C. for single walled carbon nanotubes or exposure to actinic radiation, such as gamma ray, electron beam, microwave, or radiofrequency radiation.

Typically, mechanical strength increases as a result of such treatments (perhaps due to inter-tube coalescence for single walled carbon nanotubes and inter-tube covalent bonding for both single walled and multiwalled carbon nanotubes) and then decreases with further treatment. Thermal annealing can optionally and usefully be combined either simultaneously of sequentially and thermal annealing can optionally be conducted by resistive heating caused by passage of an electrical current through the nanotube yarns and sheets. The conditions needed to maximize strength by such processes strongly depend upon nanotube type, but can be easily determined for a particular nanotube type and assembly type by one having ordinary skill in the art. Information on these methods is found, for example, in P. M. Ajayan and F. Hanhart, Nature Materials 3, 135 (2004), in T. J. Imholt et al., Chem. Mater. 15, 3969 (2003), in A. Kis et al., Nature Materials 3, 153 (2004), and in US 2004/0222081 A1 by J. M. Tour et al.

2. Synthesis and Modification of Nanofibers for Yarn, Sheet, and Ribbon Fabrication MWNTs and SWNTs are optionally and especially preferred for use in invention embodiments. Laser deposition, CVD, and the carbon-arc discharge methods are optional and preferred methods for making the carbon nanotubes, and these methods are well known in the literature (R. G. Ding et al., Journal of Nanoscience and Nanotechnology 1, 7 (2001) and J. Liu et al., MRS Bulletin 29, 244 (2004)). Synthetic methods generally result in mixtures of nanotubes having different diameters. Use of catalyst for nanotube synthesis that is close to monodispersed in size (and stable in size at the temperatures used for synthesis) can dramatically decrease the polydispersity in SWNT diameter, and nanotubes having this narrower range of nanotube diameters can be useful for invention embodiments. S. M. Bachilo et al. describe such a method in Journal of the American Chemical Society 125, 11186 (2003).

The twisted SWNT yarns, nanotube sheets, and nanotube ribbons of the present invention can be produced from nanotube forests analogously as described here for MWNT yarns. However, the preparation of SWNT forests differs from that of MWNT forests. The alcohol-CVD technique is used successfully to synthesize SWNT forest (Y. Murakami et al., Chem. Phys. Lett. 385, 298 (2004)). The method of forest growth described by K. Hata et al. in Science 306, 1362 (2004) is especially useful, since both SWNT and MWNT forests result from this method and the forest height can be higher than 2.5 mm. In this method catalytic activity is stimulated by a precisely controlled amount of water vapor during CVD growth of the nanotube forests.

As for MWNT forests, not all SWNT forests can be used advantageously for spinning yarns and for fabricating yarns and ribbons by forest-based processes. For this purpose, the SWNT forest should preferably have the characteristics described in Section 1(f).

Multiple forest layers can readily be grown upon each other (for example, using the methods described by X. Li et al. in Nano Letters 5, 1998 (2005)) and these different layers (when optimized for forest spinning or sheet or ribbon draw) can be simultaneously utilized, which optimizes materials throughput. These stacked forests can optionally be stripped from the substrate prior to the sheet, ribbon, or yarn fabrication by the methods of this invention.

Figure 14:
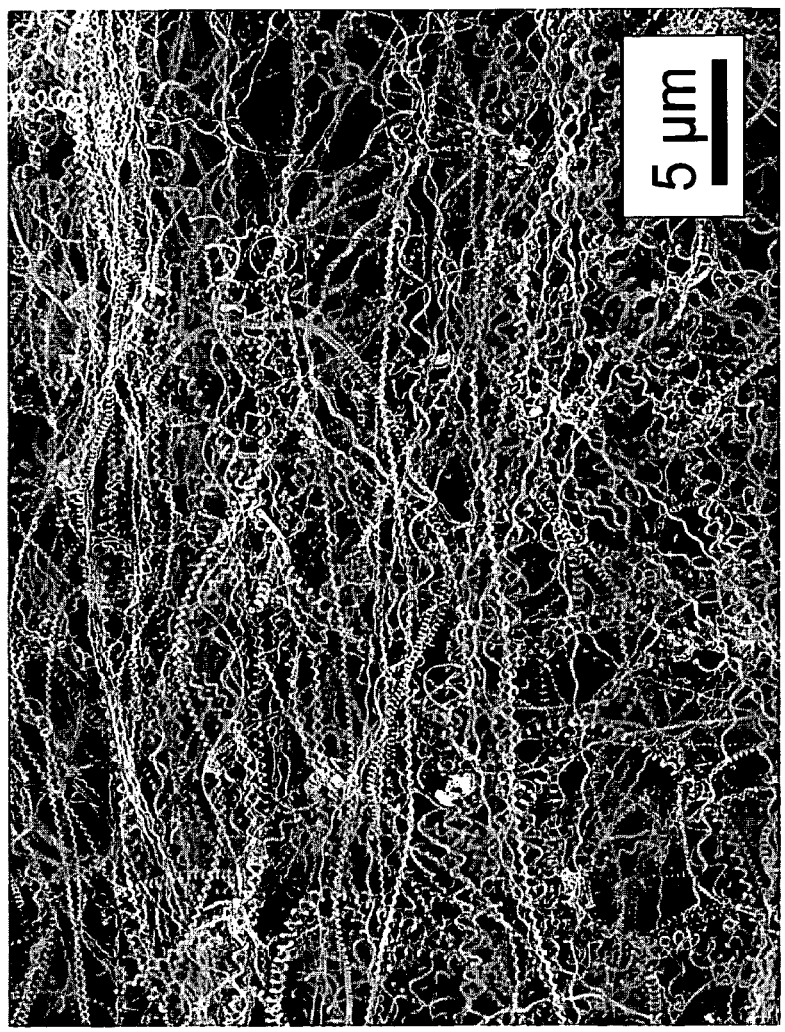
FIG. 14 shows an SEM micrograph of CVD-produced coiled carbon nanofibers that are useful for producing highly extensible nanofiber yarns.
Figure 15:
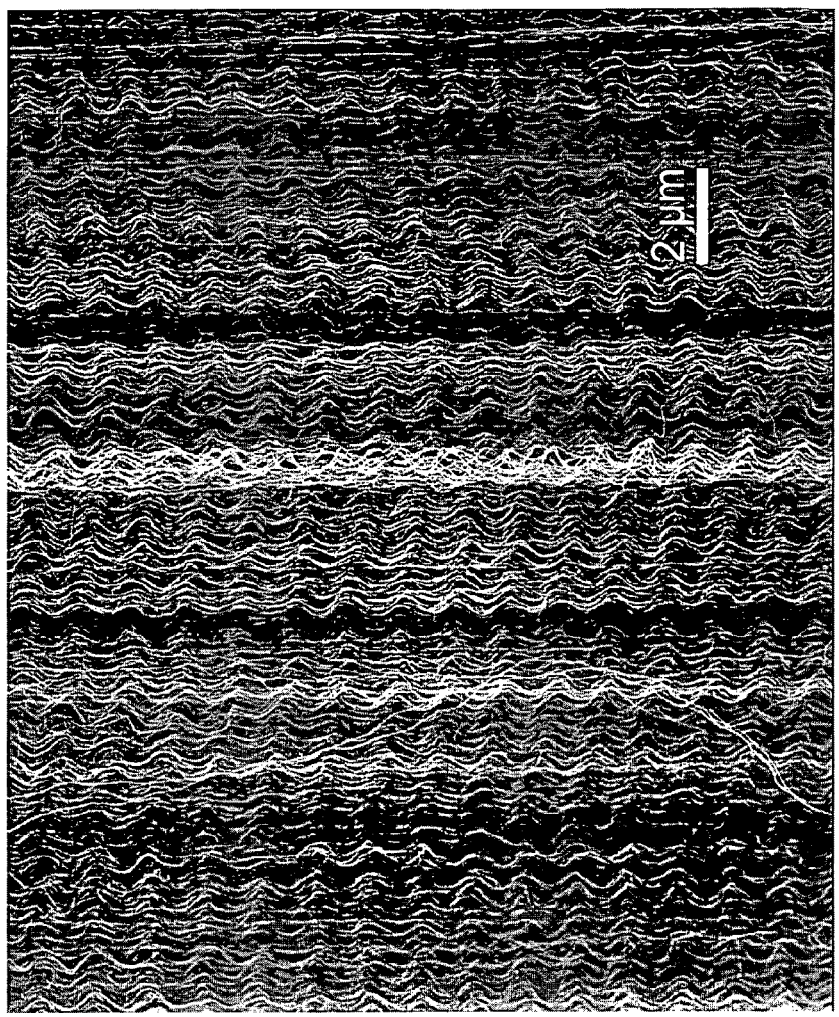
FIG. 15 shows an SEM micrograph of a section of a 280 micron high forest of crimped and aligned nanofibers that was produced by a CVD process.

The nanofibers used for spinning and for ribbon and sheet fabrication can optionally contain coiled (FIG. 14) or crimped nanofibers (FIG. 15). One benefit of such inclusion is an increase in the extensibility of the nanofiber yarns as a consequence of the increase in the effective breaking strain of the coiled or crimped nanofibers. One optionally preferred method for spinning such coiled or crimped nanofibers into yarns is to utilize draw-twist assembly from a forest comprised of such coiled or crimped nanofibers. An alloy of iron with indium tin oxide as catalyst can be used to grow coiled or crimped nanotubes as forests (see M. Zhang et. al., Jpn. J. Appl. Phys. 39, 1242 (2000)).

Various methods of separating SWNTs according to electrical properties are useful for invention embodiments, such as for enhancing achieved electrical conductivity. Examples of known methods for such separation involve (1) use of charge transfer agents that complex most readily with metallic nanotubes, (2) complexation with selected types of DNA, and (3) dielectrophoresis (R. Krupke et al., Nano Letters 3, 1019 (2003) and R. C. Haddon et al., MRS Bulletin 29, 252-259 (2004))

Yarn performance can also be optimized by filling component nanotubes or nanotube scrolls (single spirally-wrapped graphite sheet) with materials to enhance mechanical, optical, magnetic, or electrical properties. Various methods are particularly useful in invention embodiments for filling or partially filling nanotubes. These methods for SWNTs and MWNTs typically include a first step of opening nanotube ends, which is conveniently accomplished using gas phase oxidants, other oxidants (like oxidizing acids), or mechanical cutting. The opened nanotubes (as well as scrolled nanotubes) can be filled in various ways, like vapor, liquid phase, melt phase, or supercritical phase transport into the nanotube. Methods for filling nanotubes with metal oxides, metal halides, and related materials can be like those used in the prior art to fill carbon nanotubes with mixtures of KCl and $UCl_4$; KI; mixtures of AgCl and either AgBr or AgI; $CdCl_2$; $CdI_2$; $ThCl_4$; $LnCl_3$; $ZrCl_3$; $ZrCl_4$, $MoCl_3$, $FeCl_3$, and $Sb_2O_3$. In an optional additional step, the thereby filled (or partially filled) nanotubes can be optionally treated to transform the material inside the nanotube, such as by chemical reduction or thermal pyrolysis of a metal salt to produce a metal, such as Ru, Bi, Au, Pt, Pd, and Ag. M. Monthioux has provided (Carbon 40, 1809-1823 (2002)) a useful review of these methods for filling and partially filling nanotubes, including the filling of nanotubes during nanotube synthesis. The partial or complete filling of various other materials useful for invention embodiments is described in J. Sloan et al., J. Materials Chemistry 7, 1089-1095 (1997).

Nanofibers need not contain carbon in order to be useful for invention embodiments, and a host of processes are well known in the art for making nanofibers that are not carbon based. Some examples are the growth of superconducting $MgB_2$ nanowires by the reaction of single crystal B nanowires with the vapor of Mg (Y. Wu et al., Advanced Materials 13, 1487 (2001)), the growth of superconducting lead nanowires by the thermal decomposition of lead acetate in ethylene glycol (Y. Wu et al., Nano Letters 3, 1163-1166 (2003)), the solution phase growth of selenium nanowires from colloidal particles (B. Gates et al., J. Am. Chem. Soc. 122, 12582-12583 (2000) and B. T. Mayer et al., Chemistry of Materials 15, 3852-3858 (2003)), and the synthesis of lead nanowires by templating lead within channels in porous membranes or steps on silicon substrates. The latter methods and various other methods of producing metal and semiconducting nanowires of types suitable for the practice of invention embodiments are described in Wu et al., Nano Letters 3, 1163-1166 (2003), and are elaborated in associated references. Y. Li et al. (J. Am. Chem. Soc. 123, 9904-9905 (2001)) has shown how to make bismuth nanotubes. Also, X. Duan and C. M. Lieber (Advanced Materials 12, 298-302 (2000)) have shown that bulk quantities of semiconductor nanofibers having high purity can be made using laser-assisted catalytic growth. These obtained nanofibers are especially useful for invention embodiments and include single crystal nanofibers of binary group III-V elements (GaAs, GaP, InAs, InP), tertiary III-V materials (GaAs/P, InAs/P), binary II-VI compounds (ZnS, ZnSe, CdS, and CdSe), and binary SiGe alloys. Si nanofibers, and doped Si nanofibers, are also useful for invention embodiments. The preparation of Si nanofibers by laser ablation is described by B. Li et al. (Phys. Rev. B 59, 1645-1648 (1999)). Various methods for making nanotubes of a host of useful materials are described by R. Tenne in Angew. Chem. Int. Ed. 42, 5124-5132 (2003). Also, nanotubes of GaN can be usefully made by epitaxial growth of thin GaN layers on ZnO nanowires, followed by the removal of the ZnO (see J. Goldberger et al., Nature 422, 599-602 (2003)). Nanofibers having approximate composition $MoS_{9-x}I_x$, which are commercially available from Mo6 (Teslova 30, 1000 Ljubljana, Slovenia) are included in preferred compositions (most especially for x between about 4.5 and 6).

While some of these above-described non-carbon-based nanofibers do not have the dimensional characteristics that are optionally preferred for nanofiber spinning and the fabrication of nanofiber sheets and ribbons, the prior art teaches methods for synthesizing nanofibers of these types that are in optionally preferable dimensional ranges. For example, synthesis of nanofibers by templating anodized alumina is a well known technology, and the nanofiber diameter and nanofiber length can be appropriately adjusted by appropriate selection of the thickness of the anodized alumina and the diameter of the channels in this anodized alumina.

Nanoscrolls are especially useful for invention embodiments, because the inventors find that they can provide mechanical properties advantages over multiwalled nanotubes and other non-scrolled nanofiber types. These nanoscrolls are individual sheets or a thin stack of sheets of a layered material that automatically wind to make a scroll, which is structurally analogous to a jelly roll. Almost any sheet-like material can self-assemble into scrolls—as long as the lateral sheet dimension is sufficiently large that the energy gain from non-covalent binding between layers of the scroll can compensate for the elastic energy cost of forming the scroll. Some examples of materials that have been shown to form nanoscrolls are bismuth, BN, C, $V_2O_5$, $H_2Ti_3O_7$, gallium oxide hydroxide, zinc and titanium oxides, CdSe, $Cu(OH)_2$, selected perovskites, InGa/GaAs and $Ge_xSi_{1-x}/Si$ heterolayer structures, and mixed layer compounds like $MTS_3$ and $MT_2S_5$ (M=Sn, Pb, Bi, etc.; T=Nb, Ta, etc.). This generality of the scroll formation process for layered materials, from bismuth to carbon and boron nitride, means that there is a host of candidate compositions to choose from for yarn formation. Since scrolls can be made by simply exfoliating materials that are presently made in high volume at low cost, yarns of this invention can also be made at low cost. Methods of synthesizing nanoscrolls of a host of layered materials are known, and these methods can be used for the practice of present invention embodiments (see L. M Viculis, L. M., J. J. Mack, and R. B. Kaner, Science 299, 1361-1361 (2003); Z. L. Wang, Advanced Materials 15, 432-436 (2003); X. D. Wang et al., Advanced Materials 14, 1732-(2002); W. L. Hughes and Z. L. Wang, Applied Physics Letters 82, 2886-2888 (2003); J. W. Liu et al., Journal of Physical Chemistry B 107, 6329-6332 (2003); and Y. B. Li, Y. Bando, and D. Golberg, Chemical Physics Letters 375, 102-105 (2003)).

3. Non-Forest Nanofiber Assemblies Suitable for Yarn, Sheet, and Ribbon Fabrication As an alternative to employing a nanotube forest as the pre-primary or primary assembly, various other nanofiber arrays can be employed.

For instance, Example 37 describes a method of twist spinning of carbon nanotube yarns from a densified nanotube sheet. In this example the densified nanotube sheet serves as a pre-primary array. An as-drawn, free-standing MWNT sheet (made as in Example 21) was placed onto a substrate (e.g., glass, plastic, or metal foil) and densified using a liquid. A plastic substrate, like Mylar film, was most conveniently used. A desired width of the densified sheet was easily drawn from the substrate using an adhesive tape to start the draw process (in which the nanofiber yarn of ribbon is generated by peeling nanotubes from the substrate). By attaching one end of the separated sheet strip to a motor to introduce twist while the yarn was drawn, a uniform diameter spun yarn was obtained.

Example 36 demonstrates that the solid-state fabricated MWNT sheets can be conveniently drawn and spun into large diameter yarns having uniform diameter. In this example the densified nanotube sheet serves as a primary array. A 10.5 cm long, 3-cm-wide as-drawn nanotube sheet was folded upon itself to make a quasi-circular assembly having about the same length. One end was attached to the tip of a spindle and the other end was attached to a fixed cupper wire. By introducing twist, uniform spun yarn was formed at a twist level of ~2000 turns/meter.

Although an aerogel comprising sufficiently long carbon nanotubes is suitable for twist-based spinning of yarns, the benefits of lateral stress transfer are not realized unless the ratio of nanofiber length to nanofiber circumference is above 5 and more preferably above 20. While nanotube yarns have been previously spun in a CVD furnace at about 100° C. and either simultaneously or subsequently twisted, the described experiments (Y. Li et al., Science 304, 276 (2004), I. A. Kinlock et. al., WO 2005/007926 A2, and M. Motta, Nano Letters 5, 1529 (2005)) provided a ratio of nanofiber length to yarn circumference of below unity, which is inadequate for achieving the benefits of twist-generated lateral stress transfer.

Carbon nanotube aerogel comprised of suitably long nanotubes can be used as a pre-primary array for false-twist-based yarn spinning and for liquid-densification-based yarn spinning, as well as for the production of strong ribbons and sheets by the liquid-densification-based strengthening of aerogel ribbons or sheets drawn from the aerogel. Drawn ribbons of these aerogels, optionally strengthened by liquid densification, can be converted into nanotube yarns using twist, false twist, or a combination of false twist and twist.

Other nanofiber aerogels are also suitable as a pre-primary array for false-twist-based yarn spinning and for liquid-densification-based yarn spinning, as well as for the production of strong ribbons and sheets by the liquid-densification-based strengthening of aerogel ribbons or sheets drawn from the aerogel. Drawn ribbons of these aerogels, optionally strengthened by liquid densification, can also be converted using twist, false twist, or a combination of false twist and twist into nanofiber yarns. Examples of nanofiber gels providing useful compositions for spinning and for sheet and ribbon formation are vanadium oxide aerogels, vanadium oxide/carbon nanotubes composites aerogels, and nanofibrillar cellulose aerogels. The preparation of gels of these types are described by J. S. Sakamato and B. Dunn (Journal of the Electrochemical Society 149, A26 (2002)), by W. Dong et al. (Science and Technology of Advanced Materials 4, 3 (2003)), and by H. Jin et al. (Colloids and Surfaces A 240, 63 (2004)). Well-known methods can be usefully employed for increasing nanofiber length and minimizing the length-to-width ratio, so as to improve or provide applicability of these nanofibers for fiber spinning and for sheet and ribbon draw.

Magnetically oriented nanofiber sheets, electrically oriented nanofiber sheets, or nanofiber sheets oriented by shear flow can be employed as primary arrays for yarn spinning. These nanotube sheets can be obtained in highly oriented form by various processes, such as the application of either shear flow fields or magnetic or electric fields during a filtration process that provides nanotube sheets (see M. J. Casavant et al., J. Applied Physics 93, 2153-2156, (2003)), and such forms are useful for the practice of invention embodiments.

In order to remove impurities, it is optionally useful for some applications to anneal the nanofiber sheets to remove impurities, such as possible surfactants used for nanotube suspension and possible functionalities introduced during nanotube purification. This optional annealing for carbon nanotubes is preferably conducted at temperatures of at least 400° C. for 0.5 hours or longer. In order to preserve carbon nanotube structure, annealing is optionally and preferably carried out in an inert atmosphere at a temperature that is preferably below about 1500° C. for single walled nanotubes.

Such oriented arrays of nanofibers can be employed as a primary assembly for twist-based spinning. The inventors have discovered that such twist-based spinning will not be very successful in producing a high strength yarn unless the maximum total applied twist in one direction per unit fiber length for a twisted yarn of diameter D is at least approximately 0.06/D turns and a significant component of the nanofibers have (i) a maximum width of less than approximately 500 nm, (ii) a minimum length-to-width ratio of at least approximately 100, and (iii) a ratio of nanofiber length to yarn circumference greater than approximately 5.

The inventors find that the oriented carbon nanotube sheets described in the literature (having nanofiber lengths of less than a few microns) are largely unsuitable for making high strength twisted yarns of diameter 1 micron or larger. The reason that the inventors find is that the nanofiber length should preferably be at least five times the yarn circumference and more preferably 20 times the yarn circumference. However, the inventors find that the filtration-based sheet formation process works for much longer nanotubes (such as the up to 300 micron long nanotubes produces by the method of Example 1), and such longer nanotubes are optionally and preferably employed for invention embodiments.

Yarns made by coagulation spinning processes are also useful for invention embodiments as long as nanofiber lengths in these yarns are increased to preferably over at least five times the circumference of the yarn. This condition has not been realized for the spun yarns in the literature. Moreover, the nanotube lengths in these yarns are more preferably over at least twenty times the circumference of the yarn These coagulation-based spinning methods include, for example, the coagulation spinning using polymers like polyvinyl alcohol in the coagulation bath (B. Vigolo et al., Science 290, 1331 (2000); R. H. Baughman, Science 290, 1310 (2000); B. Vigolo et al., Applied Physics Letters 81, 1210 (2002); and A. B. Dalton et al. Nature 423, 703 (2003)), coagulation spinning using an aqueous nanotube dispersion and an acidic or basic non-polymeric coagulant (co-pending PCT Patent Application Serial No. PCT/US2005/035220), and spinning processes that use acidic spinning solutions and a non-polymeric coagulation bath (V. A. Davis et al., U.S. Patent Application Publication No. 20030170166). However, for those spinning processes in which a polymer coagulant is used or the spinning solution contains a polymer, the inventors find that the polymer-containing yarn is preferably drawn to a highly oriented state while the polymer is present and that the polymer is then most desirably substantially removed (such as by thermal pyrolysis) prior to the twist process. In the invention embodiments of this paragraph the yarn formed by coagulation spinning can be the primary assembly for the spinning process. The inventors also find that hollow yarns containing highly oriented nanofibers are suitable for the practice of invention embodiments involving twist processes, provided that the shortest nanofiber lengths in the hollow yarn are greater than approximately five times the yarn circumference.

Nanotube yarns spun from super acids (V. A. Davis et al., U.S. Patent Application Publication No. 20030170166; W. Zhou, et al., J. Applied Physics 95, 649-655 (2004)) are also optionally especially preferred as primary assemblies for preparation of twisted yarns of invention embodiments. However, the nanotubes in the yarns that have been spun in the prior art using the super acid spinning process are too short for deriving high performance carbon nanotube yarns having micron and larger diameters, unless a polymer binder is employed. Also, the reported yarn diameters are about 60 $\mu$m and larger (W. Zhou, et al., J. Applied Physics 95, 649-655 (2004)). Hence, both because of the large spun yarn diameters and the short nanotube lengths, the insertion of twist does not improve the performance of these yarns, either as-spun or after thermal annealing. According to the teachings of the present invention embodiments, twist spinning or draw-twist spinning should preferably provide a ratio of nanofiber length to yarn circumference that is greater than approximately 5 for a significant component of nanotubes in the yarn. More preferably, a significant component of nanofibers in the yarns has a minimum ratio of nanofiber length to yarn circumference of greater than approximately 20. Optionally and most preferably, a major component of the nanofibers has a ratio of nanofiber length to yarn circumference of greater than approximately 20. Hence, the acid-spun yarns of the prior art with 60 $\mu$m yarn diameter can be twisted to substantially achieve the benefits of twist if the nanofiber length is about 940 $\mu$m, which is about 1000 times the likely nanofiber length in the super acid spun fibers of the prior art.

4. Twist and False-Twist Polymer-Free Nanofiber Yarns Having Previously Unobtainable Diameters The invention embodiments provide twisted yarns that are a thousand-fold or smaller in diameter than the twisted yarns of the prior art. About one hundred thousand individual carbon nanofibers are in the cross-section of a 5 $\mu$m diameter nanotube yarn, corresponding to a nanofiber density of 5000 nanofibers per square micron, as compared with the 40-100 fibers in the cross-section of typical commercial wool (worsted) and cotton yarns. For comparison, the smallest diameter nanotube fibers reported using prior-art technologies are more than ten times larger in diameter than the micron diameter twisted carbon nanotube yarns whose preparation is described in Example 2. Since yarn volume per meter of yarn length and linear density are proportional to fiber diameter squared, the yarns of present invention embodiments are more than one hundred times lower in linear density and volume per meter than has been achieved for textile yarns in the prior art. Microfibers, which are widely used because they are extremely soft to the touch, drapable, and highly absorbent, are defined in the textile industry as being of under one denier (i.e., less than 1 den), that is one filament weighs less than one gram per nine thousand meters of length or 0.11 mg/m. For comparison, the linear density of unplied MWNT yarns of 5 micron diameter (called "singles" and comprising about 100,000 fibers in the cross section) is typically about 10 µg/m (0.09 den) compared with the usual 10 mg/m (90 den) and 20-100 mg/m (180-900 den) for cotton and wool yarns, respectively.

As a result of the small diameters of the twisted nanofiber yarns and the component nanofibers, linear densities are achieved that are smaller than current twisted microfiber yarns by factors of between $10^2$ and $10^6$, which makes the yarns promising for textile applications in military clothing and space suits. Benefits in textiles include the combination of "breathability" and water and wind resistance, impermeability of closely-woven micron-diameter yarns to bacteria like anthrax, high thermal and electrical conductivities, radio-frequency and microwave absorption, electrostatic discharge protection, penetration protection, and fabric softness and drapability, which is in stark contrast with the uncomfortable stiffness of some electronic textiles. Comparable toughness to Kevlar® fibers used in antiballistic vests, resistance to knot and abrasion-induced failure, high failure strains, and high ultraviolet light and thermal stability are other major advantages of the nanotube yarns for textile applications.

As a result of these achieved benefits, for some application areas, the optionally preferred yarns of invention embodiments for these low denier applications areas have a nanofiber singles yarn diameter of less than approximately 10 microns and a yarn length of over one meter. Optionally more preferred for these applications, the nanofiber singles yarn diameter is less than approximately 5 microns. The draw-twist yarns optionally and preferably contain at least 500 nanofibers that pass through each square micron of yarn cross-sectional area. Optionally and more preferably, at least 1000 nanofibers pass through each square micron of nanofiber yarn cross-sectional area.

5. Elaboration on Twist Insertion, Densification, and Filament Storage Methods During Spinning Various known methods of twist insertion can be used for introducing twist during nanotube spinning into yarns. Such methods include, but are not limited to, ring spinning, mule spinning, cap spinning, open-end spinning, vortex spinning, and false twist spinning technologies (see E. Oxtoby, Spun Yarn Technology, Butterworths, 1987 and C. A. Lawrence, Fundamentals of Spun Yarn Technology, CRC Press, 2002). Mule spinning has the disadvantage of being a batch process (spin then wind-on), but has the advantage of not requiring rings or travelers.

Figure 38:
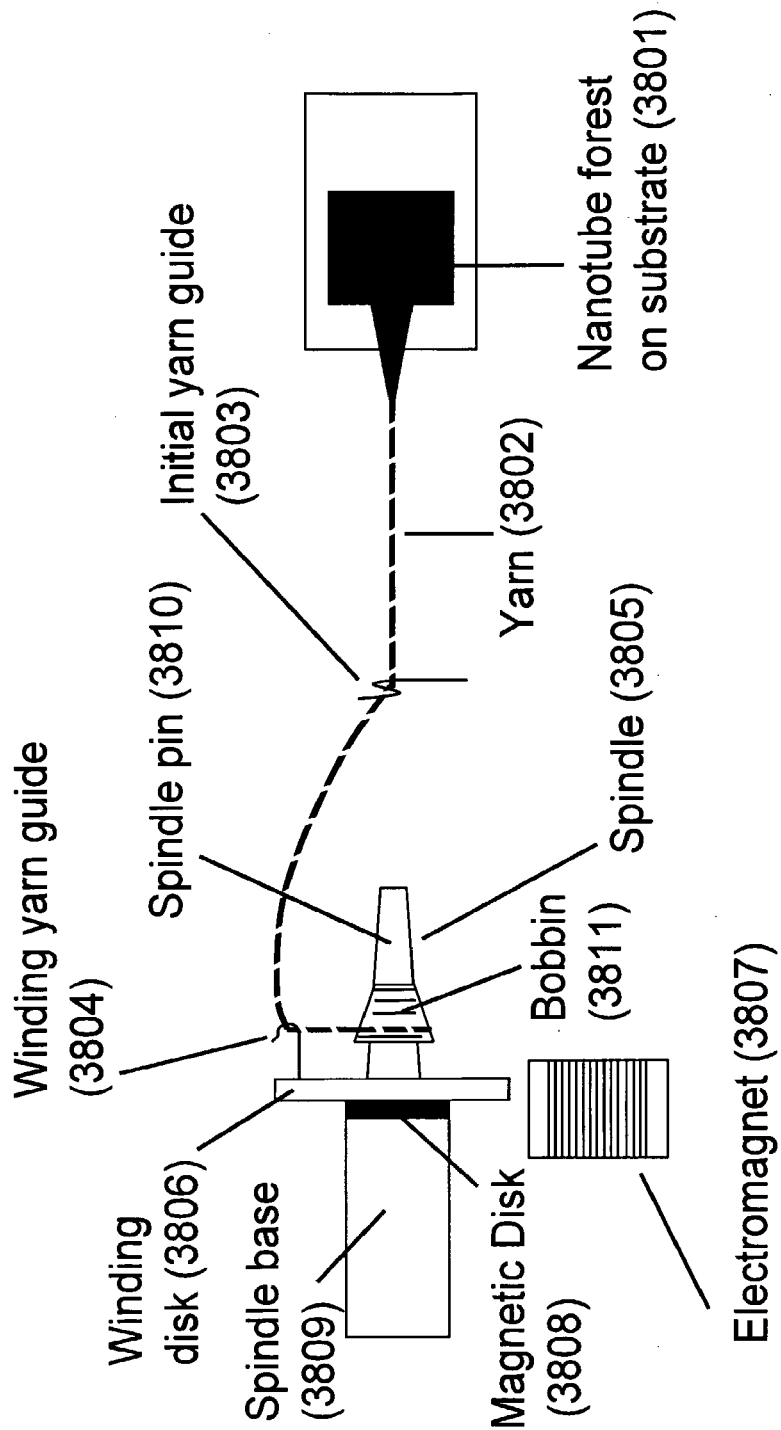
FIG. 38 schematically illustrates a process of utilizing one motor to simultaneously and independently vary twisting and winding rates for yarns. The process imposes minimal tension on the spun yarns, which is especially useful when the yarn diameter is very small, when low strength yarns are being processes prior to subsequent strength enhancement, or when low strength yarns having high elastic deformability are needed.
Figure 39:
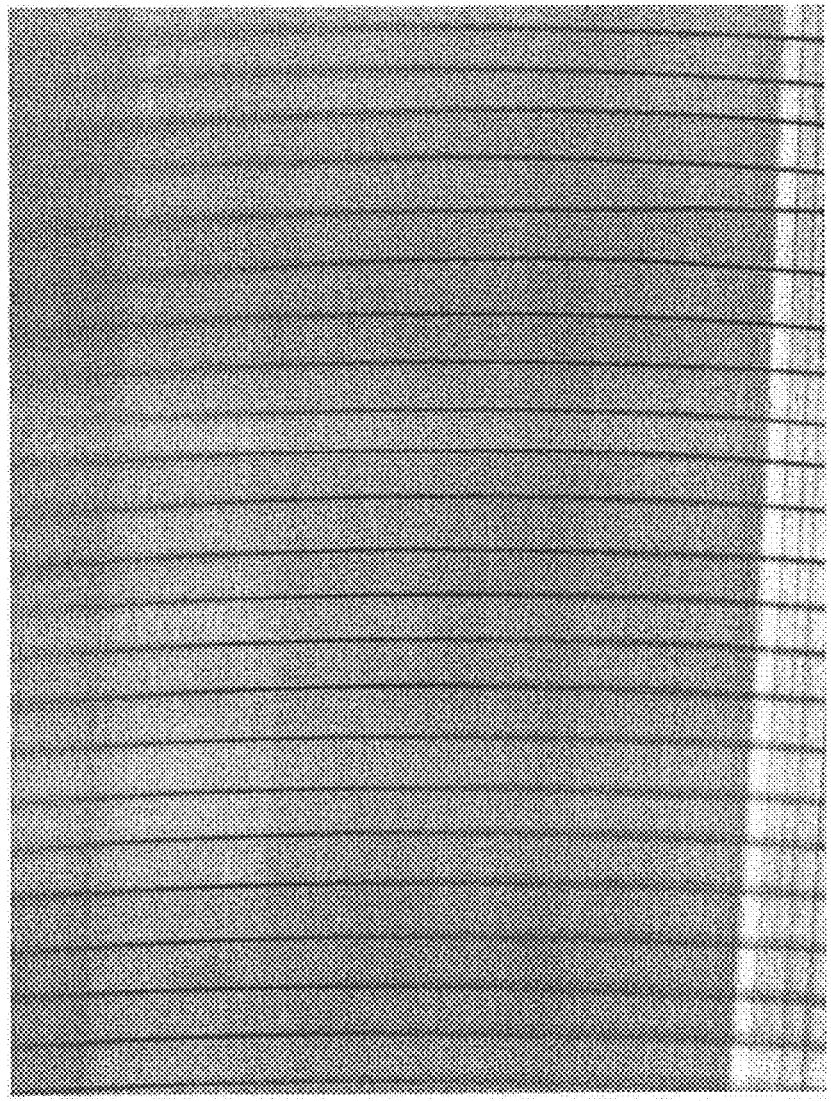
FIG. 39 shows an optical micrograph of a multiwalled nanotube yarn wound helically on a bobbin (a 5 mm diameter plastic tube) during twist-based spinning of yarn from a carbon nanotube forest.

A novel continuous spinning apparatus is provided for spinning fine and ultra-fine nanofiber yarns, which introduces twist as it winds the spun yarn onto a bobbin. The apparatus is shown schematically in FIG. 38. The fiber source is the nanotube forest on substrate (3801). The produced yarn (3802) is passed through an initial yarn guide (3803). The spinning apparatus comprises a spindle (3805), a donut-shaped winding disk (3806) with an associated winding yarn guide (3804), an electromagnet (3807), and a donut-shaped metal magnetic disk (3808), which contacts the ferromagnetic spindle base (3805), which is typically made of steel. On one end, the spindle is driven by a variable-speed motor (not shown). On the opposite end there is a removable bobbin (3811) that takes up and stores the spun fiber. The spindle base contains a spindle pin (3810) that protrudes from the spindle base, and passes through the centers of the magnetic disk (3808) and the ferromagnetic winding disk (3806). A variable-speed motor rotates the spindle at angular speed $\omega_1$ and the magnetically-induced friction between the spindle base (3809) and the magnetic disk (3808) and between the magnetic disk and the ferromagnetic winding disk (3806) causes the winding disk to rotate. An electromagnet is used to introduce a variable braking force onto the winding disk, which reduces its angular speed ($\omega_2$) relative to the spindle. The rotation of the drafted nanofiber assembly about the axis of the spindle introduces twist, thereby forming the yarn, while the slower rotation of the winding disk winds the spun yarn onto the spindle. The winding speed is determined by the speed difference between $\omega_1$ and $\omega_2$ [$\omega(winding)=\omega_1-\omega_2$], which can be continuously adjusted by varying the voltage applied to the electromagnet. Advantageously, both twist level and spinning speed can be independently controlled by an electronic interface to independently regulate motor speed and applied magnetic field. This system imposes minimal tension to the spun yarns and can handle spinning of yarns with either high or low breaking force. This same apparatus can also be utilized to ply multiple single-strand yarns together to continuously make multi-strand yarns. In such a case, the nanotube forest is replaced by reels of unplied yarn.

Various modifications of the spinning apparatus can be usefully employed. For example, the magnetic disk (3808) can be eliminated, and a direct frictional force between the winding disk and the spindle base can be provided by spring loading the winding disk. The electromagnet (3807) can be eliminated if spring loading is provided by electrically controlled actuators (such as ferroelectric or ferroelectric actuators), Alternatively, the magnetic disk (3807) can be replaced with a ferroelectric disk whose thickness is electrically controlled to regulate indirect mechanical coupling between the winding disk and the spindle base. In this latter case, the electromagnet (3807) can be eliminated and frictional forces between the spindle base, the ferroelectric disk, and the winding disk can be produced by spring loading.

Another preferred method of spinning the carbon nanotubes into yarns is to employ a direct spinning method that twists as it winds the spun yarn onto a bobbin. The apparatus is outlined schematically in FIGS. 19 and 20.

Figure 19:
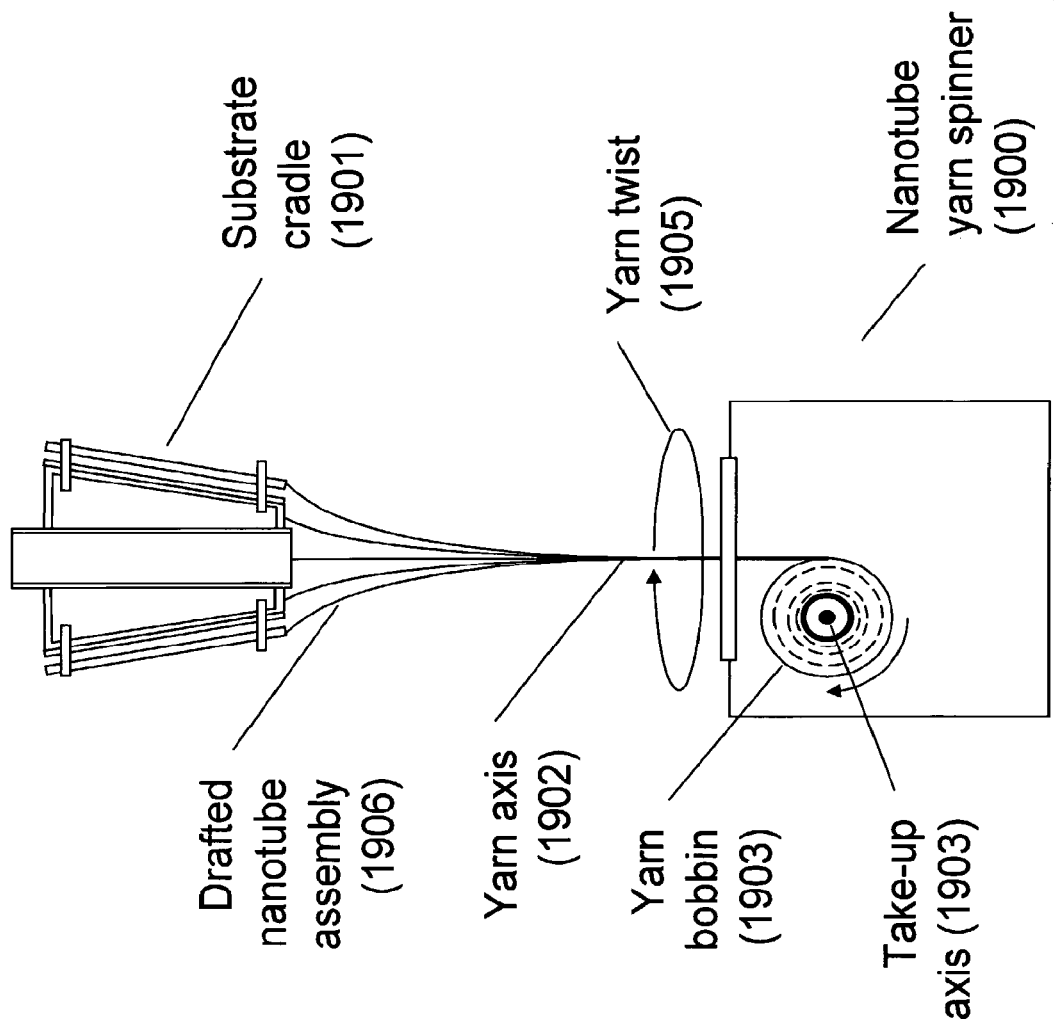
FIG. 19 is a line drawing illustrating a preferred spinning system for producing MWNT yarns in accordance with some embodiments of the present invention, wherein the drawing shows how the yarn can be formed without the need for rings, travelers, or caps that would significantly increase the tension in the yarn.

FIG. 19 shows a spinning unit (1900) consisting of a substrate cradle (1901) located above a bobbin (1902) that rotates about an axis (1903) that is coincident with the yarn axis, while simultaneously rotating about a take-up axis (1904). The rotation about the yarn axis introduces twist (1905) into the drafted nanotube assembly (1906), thereby forming the yarn, while the rotation about its own axis winds the spun yarn onto the bobbin fitted firmly onto the drive roller.

Figure 20:
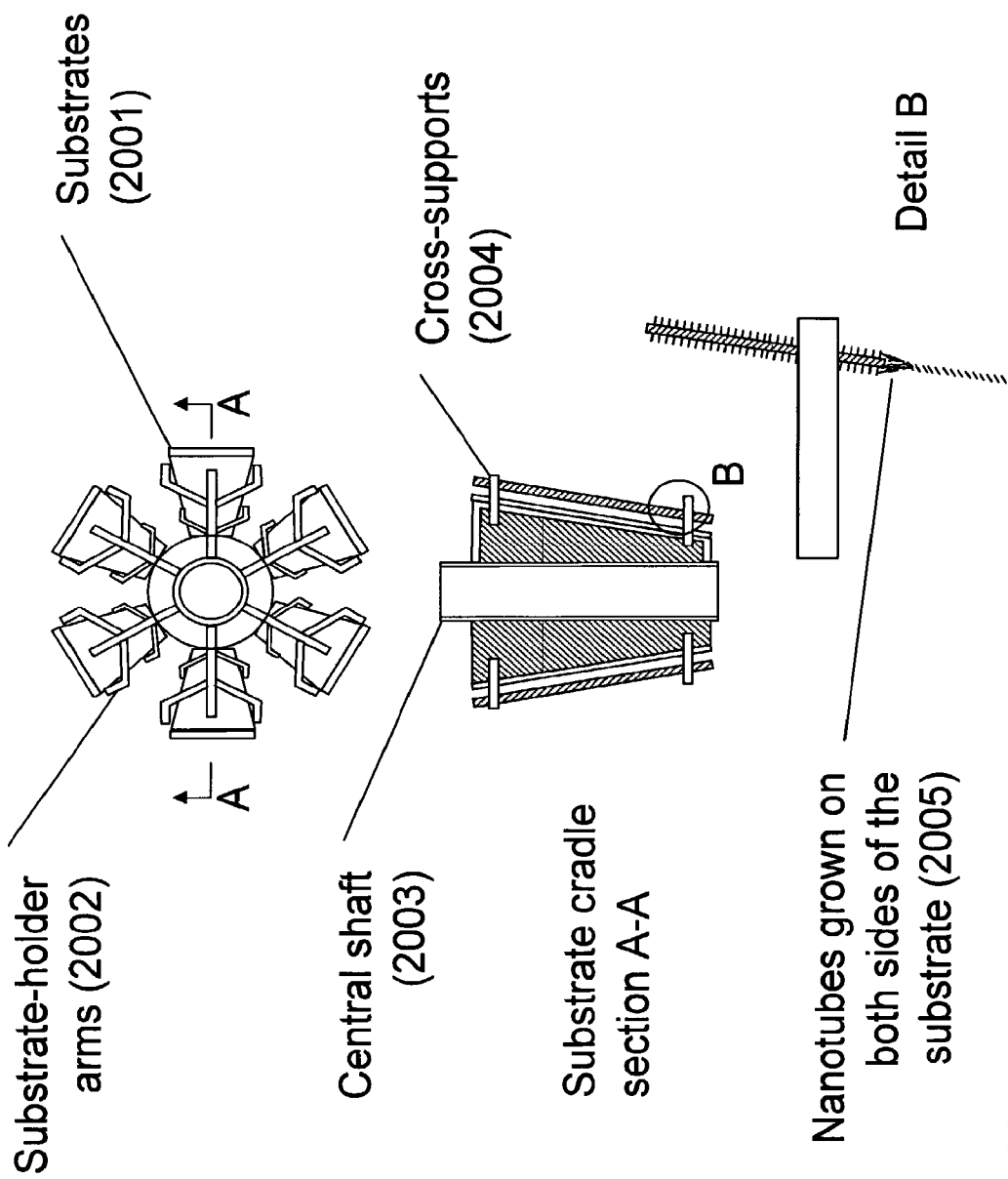
FIG. 20 is a schematic drawing showing details of the substrate holder that in this case optionally uses 6 substrates with nanotubes optionally coated on both sides of a substrate.

FIG. 20 gives the details of the substrate cradle, which is shown with 6 substrate units (2001) supported by a network of substrate-holder arms (2002), a central shaft (2003), and cross-supports (2004). It will be appreciated, however, that many variations of the design are possible that are consistent with the outlined scheme. It is also possible that MWNT forests be grown on one side or both sides (2005) of the substrate. An advantage of growing nanotubes on both sides of the substrate is that it increases the capacity of the spinner.

The advantages of this direct spinning method are that the coincidence between the spinning and yarn axes eliminates the spinning balloon and the nanotube yarn does not make contact with any surfaces until after the twist is inserted, by which time it has sufficient cohesion to be handled without disruption. The twist level can be set independently of the wind-on by running the wrap and twist drives independently of each other using variable speed motors.

The apparatus of FIGS. 19 and 20 can be made continuous by using substrates for the nanotube forests that are flexible belts, which bend away from the yarn produced by nanotube extraction, continuously move to a furnace for nanotube growth, and then return to the point of nanotube extraction to produce yarn.

Technologies known in the art can be fitted to the spinner to improve functionality and productivity, such as monitoring of the tension in the yarn, automatic loading of new substrates and removal of used substrates, automatic threading-up and doffing, and systems to manage the build of the yarn package.

The inventors have surprisingly discovered that a variant of open end or break spinning can be downsized by a factor of over a thousand, from applicability to micron diameter fibers to nanometer diameter fibers. Open end spinning of conventional textile fibers comprises the following steps: (1) preparation of an assembly of straight, parallel, and individualized fibers; (2) a method for detaching single fibers from the assembly; (3) means of conveying the fibers to the internal surface of a cup-shaped collector (rotor); (4) methods for supporting and driving the collector at high speed; and (5) a method of withdrawing the fibers from the collector, during which twist is inserted to form the yarn, and winding the yarn onto a package. All of these steps are also required to open end spin nanofibers, but the inventors have found adaptations are needed in order for the process to operate satisfactorily for nanoscale fibers, namely, (1) ensuring that all surfaces that the nanofibers come into contact with and the surfaces of the nanotubes are chosen to prevent the nanofibers from sticking to the surfaces and (2) developing and using methods applicable on the nanoscale for delivery of nanofibers that are suitably individualized and oriented for delivery to the to the collector for twist insertion. Unlike the case of conventional spinning, the suitably individualized nanofibers can be nanofiber bundles or robes comprising many thousands for component nanofibers that must be appropriately assembled during the steps of yarn spinning or during pre-spinning processing. While natural fibers also contain component nanofibers, nature's biology does the self assembly.

Figure 43:
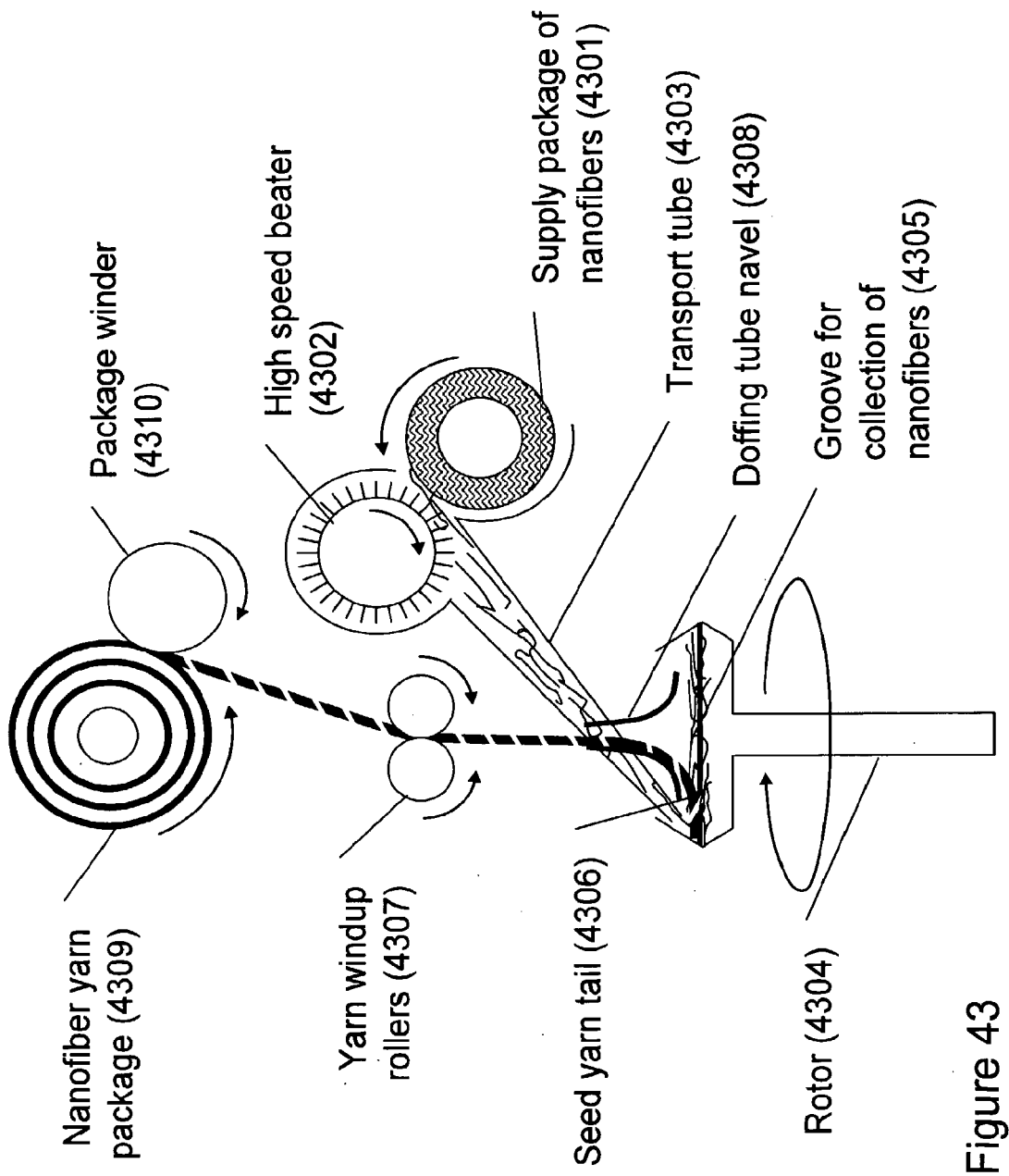
FIG. 43 schematically illustrates a rotor spinner that converts nanofibers, such as carbon nanotubes, into twisted yarn.

The design of an open end spinner suitable for spinning nanofibers is shown in FIG. 43. The diagram shows nanotubes being detached from a supply package (4301) on which they were deposited by sheet-drawing from a pre-primary array. Roller 4301 may be quite long in order to maximize storage. Nanofibers and nanofiber assemblies are detached from the supply roller by means of a high speed beater (4302) that is equipped with a multitude of fine pins of high surface finish located in close proximity to the supply roller. The nanofibers and nanofiber assemblies are ejected into a transport tube (4303) where airflow carries the nanofibers into a rotor 4304. The airflow is generated by sustaining the air pressure in the rotor below atmospheric pressure. The nanofibers and nanofiber assemblies collect against the internal face of the rotor and slide into a groove (4305) under the influence of the centrifugal force where they form an assembly of largely parallel fibers. Once a sufficient number of nanofibers have accumulated in the groove, a seed yarn (4306) is introduced into the rotor, which is aided by the low pressure, whereupon the nanofibers start to twist to form a yarn, one turn of twist being introduced for every turn of the rotor. Immediately, the yarn is withdrawn by the rollers 4307 but as with conventional open end spinning, a doffing tube navel (4308) is used to insert false twist into the forming yarn in the rotor in order to increase the twist in the tail (4306) and improve the reliability of spinning. As the yarn is formed, it is wrapped onto a yarn package 4309 by a package winder 4310. Variations of the basic design are possible as would be known by those skilled in the art.

False twist spinning is used in conventional textile processing either to impart bulk to continuous filaments or for staple fibers when a second yarn is available to trap the false twist in a twofold structure. False twist spinning has limited use for conventional staple fiber yarns because the twist disappears once the yarn passes the twister and the yarn loses its strength and tenacity. Surprisingly, the inventors find that the nanofiber yarns described here retain strength and tenacity after introduced twist is removed, which is likely due in part to densification of the yarns. This means that false twist can be used to produce yarns that are suitable for use either with or without applied inter-yarn binder, such as an infiltrated polymer. This discovery provides the motivation for the false-twist spinning apparatus described in FIGS. 44-46. Even if the nanofiber yarns are later subjected to a permanently introduced twist, the introduced false twist increases nanofiber strength so that higher processing speeds are possible without causing yarn breakage.

These measurement results on the effects of twist insertion and equivalent twist de-insertion (called false twist insertion) are provided in Example 40. The obtained strength (when twist insertion is followed by equal twist de-insertion) (113 MPa) is much higher than the negligible strength for non-twisted yarns, but lower than for the case where the initially inserted degree of twist insertion is retained (339 MPa). Nevertheless, the yarns that have undergone the twist insertion/twist de-insertion process are highly desirable for use in forming nanotube/polymer composite yarns and have both high strength and high toughness, as well as for developing the dense packing that transfers stress as a result of van der Waals interactions between very long nanotubes. The point here is that appropriately laterally coupled nanofiber yarns will have the greatest strength when the twist is zero. Twist is introduced to provide lateral coupling. However, the infiltration of nanofiber yarns with a coupling agent (such as an infiltrated polymer) can also provide the needed lateral coupling. In addition, any false twist process that provides densification of yarns (and corresponding adequate enhancement of nanofiber-nanofiber coupling) will provide high strengths if the nanotubes are adequately long.

Corresponding to these discoveries, invention embodiments are provided in which false twist is introduced and the nanofiber yarn is later infiltrated with a binding agent, such as a polymer. The nature of appropriate binding agents is diverse and can include polymers, metals (such as those melt infiltrated, chemically, or electrochemically infiltrated), and other organic and inorganic materials (such as $SiO_2$). Binding agents, such as a polyacrylonitrile, can be optionally pyrolized, and additional infiltration steps can be followed by additional pyrolysis steps in order to obtain optimal filling of the nanofiber yarns with binding agent.

Figure 46:
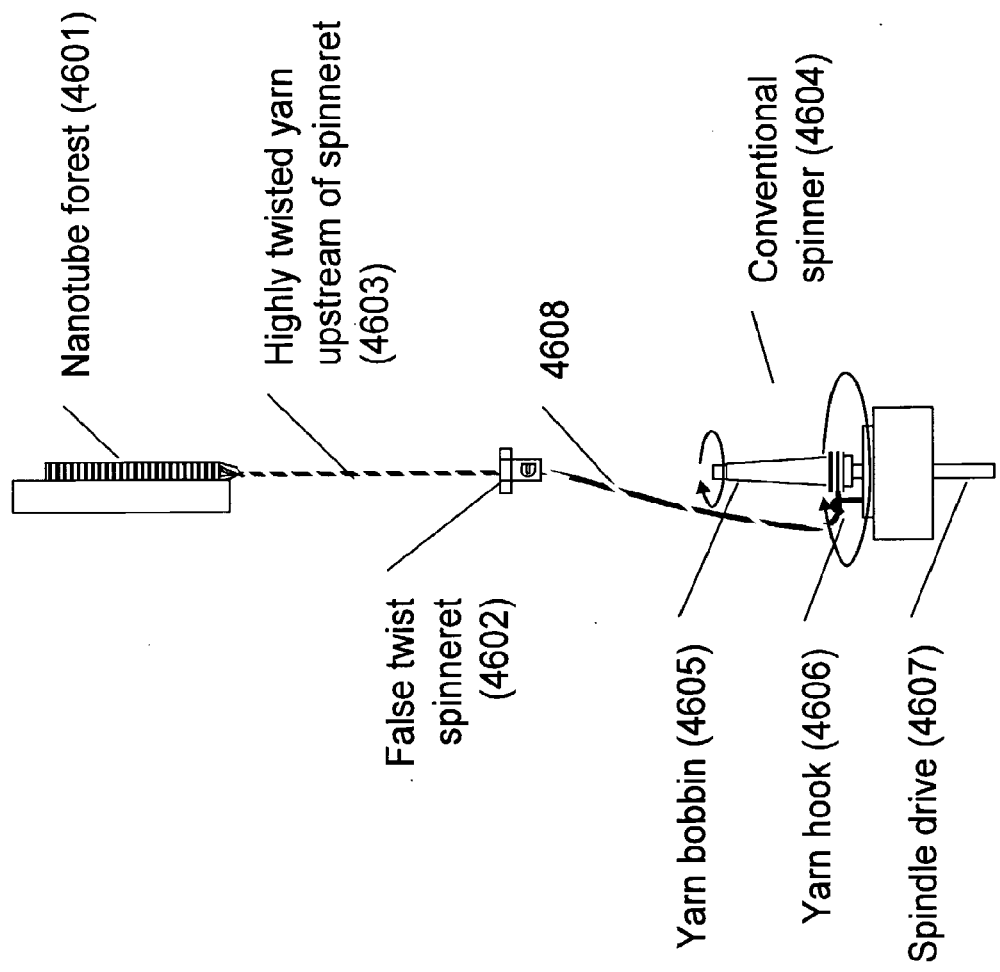
FIG. 46 schematically illustrates a spinning apparatus in which a false-twist spinneret is used for the densification and strength enhancement for a nanotube yarn before the introduction of net twist (also called real twist).

False twist spinning can also be used to easily provide a high twist zone that can densify the yarn at high speed as a pretreatment to inserting lower levels of real twist. Without the preliminary densification, higher levels of real twist would be required slowing the production rate of the yarn. Apparatus to do this is shown in FIG. 46, where the pre-primary array (4601) is shown being drawn off a substrate and being twisted by the false twist spinneret 4602 to give a highly twisted yarn 4603 upstream of the spinneret.

Downstream of the spinneret is a conventional spinning system 4604, comprising a bobbin for winding the yarn (4605), a traveler-type hook (4606) for inserting twist and a drive (4607) that introduces a lower level of twist than in the false twist zone. Motions to provide for package build are not shown but are familiar to those skilled in the art. Because the yarn has been densified by the high twist imparting some strength, lower levels of real twist are required in order to attain reasonable strengths for the nanofiber yarn.

Figure 44:
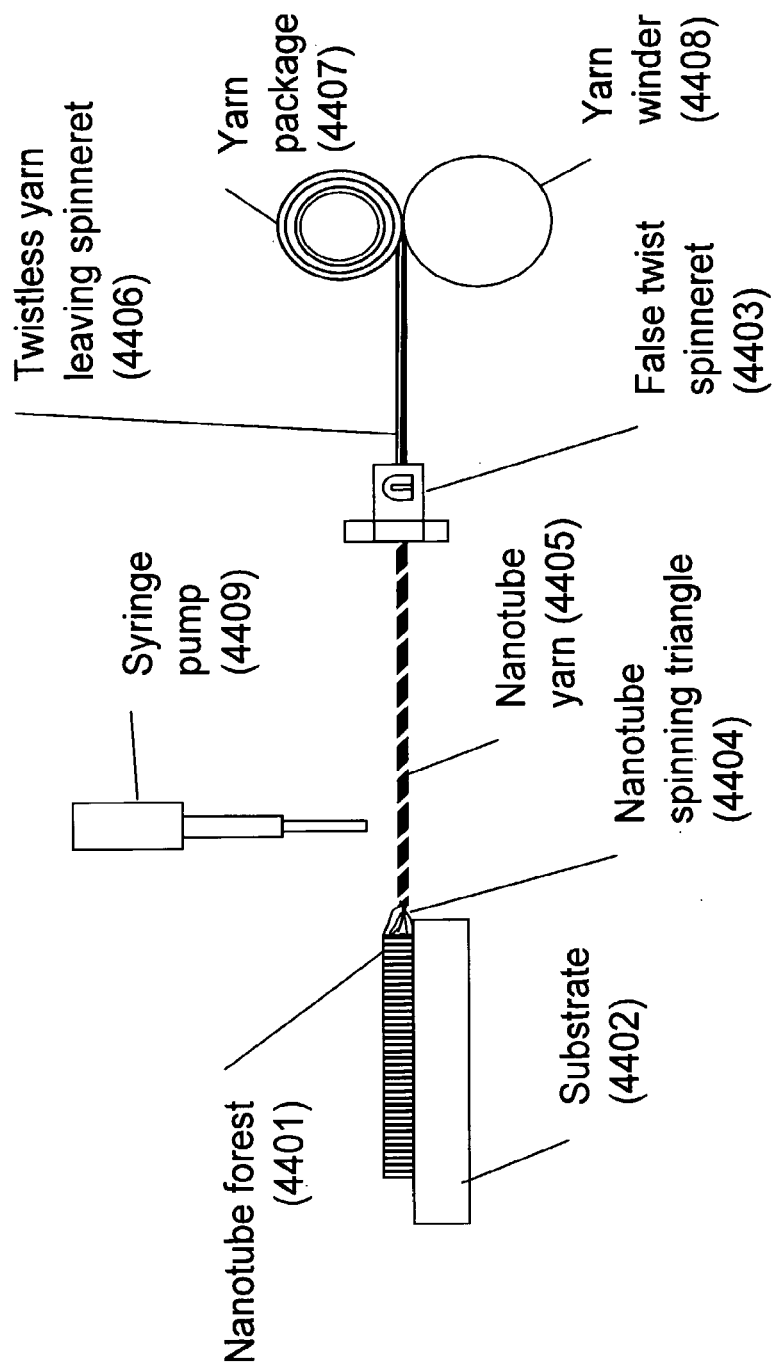
FIG. 44 schematically illustrates an apparatus for densifying carbon nanotube yarns using a spinneret that introduces false twist, meaning the absence of net twist. An optional method for additional densification and inserting additives (a syringe pump) is also pictured.

A design for a false twist system that is suitable for spinning nanofibers is shown in FIG. 44. Nanofibers are withdrawn from the nanotube forest (4401), which is supported on substrate (4402), and are being simultaneously twisted by the false-twist spindle 4403 (spinneret) to form the spinning triangle (4404) and the highly twisted yarn (4405). When the spinning system has reached equilibrium, the yarn leaving the spinneret has no twist (4406) but has some strength because of densification that was imparted as a result of the twist upstream of the spinneret. The yarn is wound onto a package (4407) by the package winder (4408).

Figure 45:
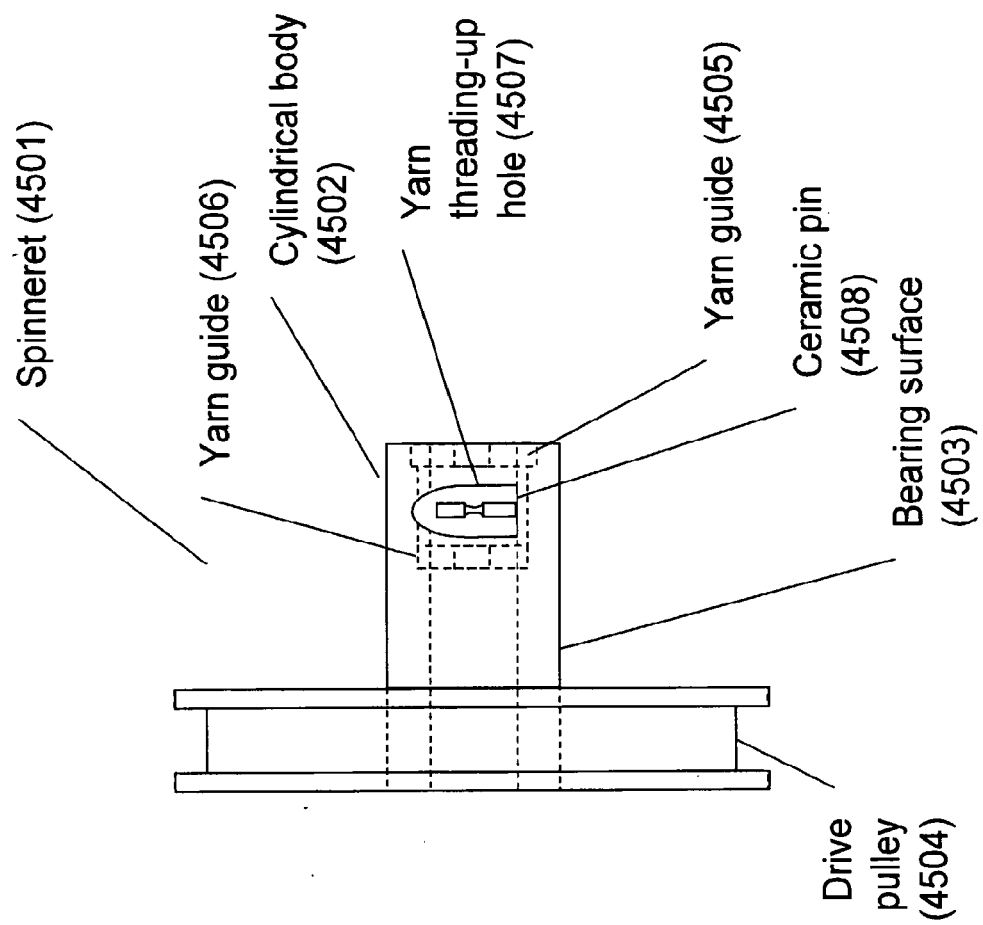
FIG. 45 provides details for the spinneret of FIG. 44 for introducing false twist.

The spinneret (4403) is shown in greater detail in FIG. 45. The spinneret 4501 comprises a cylindrical tube (4502), a section 4503 for locating a supporting bearing, and a pulley (4504) for driving the spinneret at high speed. Two toroidal ceramic yarn guides (4505 and 4506) are mounted at the opposite end of the cylinder 4502 to the pulley to support the yarn during passage through the spinneret. A hole (4507) with an appropriate cross-sectional shape is bored through the body of the cylinder 4502 perpendicular to the shaft. A ceramic pin 4508 is provided around which the yarn can be looped to provide effectively a crank for inserting twist. The pin is shaped to provide positive location of the yarn above the axis and generally uses a 'U' saddle shape in the plane containing the axis of the spinneret. An additional refinement is to locate a narrow waist on the pin located over the axis of the spinneret. The pin is open at one end to provide for easy threading up of the spinneret.

Figure 106:
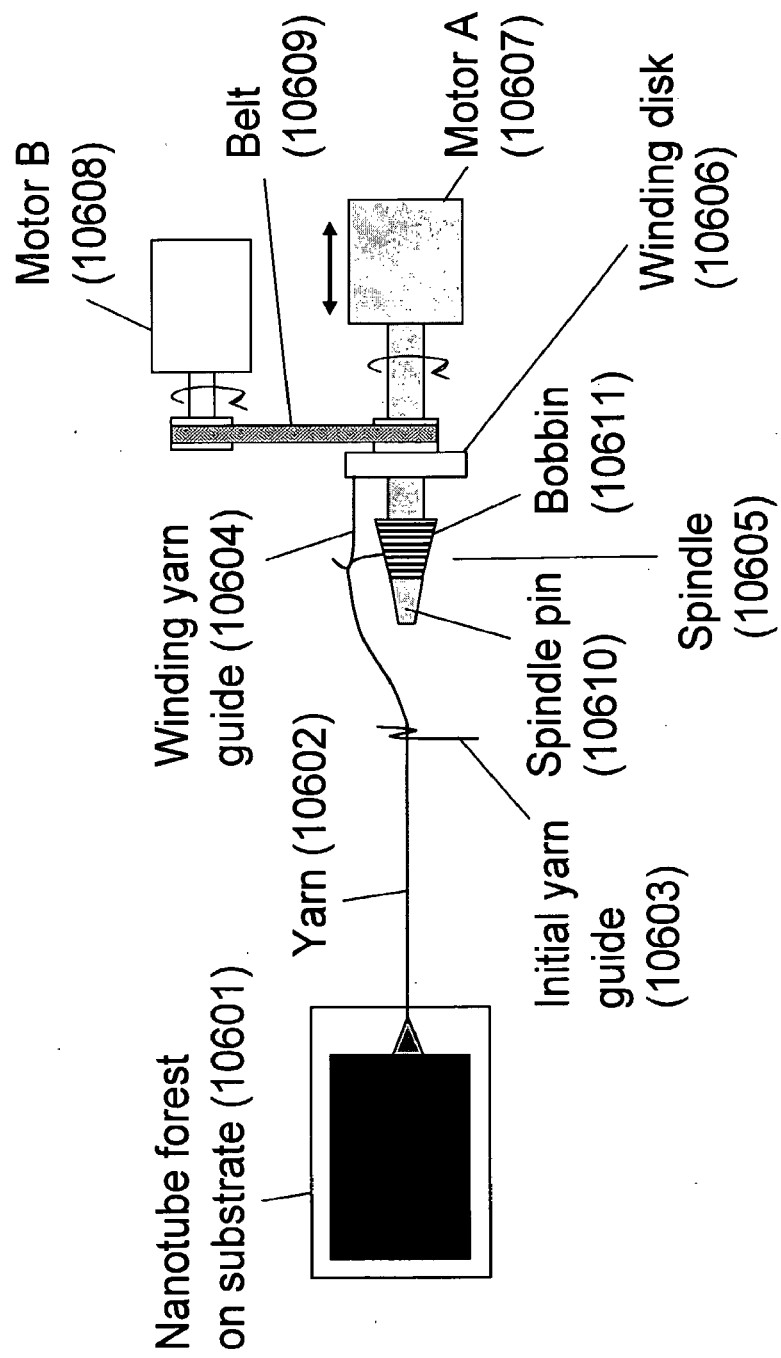
FIG. 106 schematically illustrates an apparatus for continuously spinning carbon nanotubes and other nanofibers into twisted yarns, wherein two motors are used to insert twist and wind the yarn on a bobbin and the relative rotation rates of these motors determines the inserted twist per yarn length.

Another method of continuous spinning carbon nanotubes and other nanofibers into yarns is to employ a direct spinning method that twists as it winds the spun yarn onto a bobbin. The apparatus is outlined schematically in FIG. 106. The fiber source is the nanotube forest on substrate (10601), though other nanofiber sources can be used. The produced yarn (10602) is passed through an initial yarn guide (10603). The spinning apparatus comprises a spindle (10605), a winding disk (10606) with an associated winding yarn guide (10604), a spinning motor (10607), and a winding motor (10608), which drives the winding disk through a belt (10609). On one end, the spindle (10605) is driven by a variable-speed motor (10607); on the opposite end there is a removable bobbin (10611) that takes up and stores the spun yarn. The spindle (10605) is attached to motor (10607) and the spindle pin (10610) passes through the centers of the winding disk (10606). A variable-speed motor (10607) rotates the spindle at angular speed $\omega_1$ and the winding motor (10608) rotates the winding disk at angular speed $\omega_2$. The rotation of the drafted nanofiber assembly about the axis of the spindle introduces twist, thereby forming the yarn, while the faster rotation of the winding disk winds the spun yarn onto the bobbin. The winding speed is determined by the speed difference between $\omega_1$ and $\omega_2$ [$\omega$(winding)=$\omega_2-\omega_1$], which can be continuously adjusted by varying the speed difference between the two motors. Advantageously, both twist level and spinning speed can be independently controlled by electronic interfaces to independently regulate motor speeds. This same apparatus can also be utilized to ply multiple single-strand yarns together to continuously make multi-strand yarns. In such case the nanotube forest is replaced by reels of unplied yarn or yarn having lower ply than desired in a product. Though not shown, provision can be added to the spinning apparatus of FIG. 106 to move the bobbin back and forth to collect the yarn.

Since surprising yarn, sheet, and ribbon strength enhancements result from liquid infiltration and subsequent evaporation, the inventors use these enhancements for processing steps. Example 38 shows the dramatic increases in yarn strength that result from infiltration of a suitable volatile liquid in the yarn and subsequent evaporation of this liquid. Tenacity also increases. These effects are apparently due to yarn densification due to evaporation of the volatile liquid. If no twist is applied and the yarns are used as drawn from the forest, the yarn mechanical strength was too low to be measured using our apparatus.

The most suitable liquids for such densification and improvements in mechanical strength and tenacity are those that have sufficiently low viscosity for penetration in nanofiber yarns, sheets, or ribbons and the ability to at wet the nanotubes. While the liquid used in Example 38 is ethanol, like volatile liquids having low viscosity and cohesive energy densities approximately matched to the nanofibers are also useful.

There are many systems in textile or sheet processing for adding liquids to yarns, such as spraying, padding, and vapor coating. All of these techniques can be used during spinning or sheet fabrication in order to obtain strength enhancements of the spun yarn or drawn sheets. A syringe pump is employed in FIG. 44, a solvent bath is used in Example 53, and condensation of a vapor is used in Example 54.

6. Storage of Ultra-Thin Drawn Nanofiber Sheets

Ultra-thin carbon nanotube sheets can be optionally drawn and then applied for device construction without the necessity of storage. However, in some cases it is desirable to fabricate rolls of such sheet and to subsequently apply these rolls for applications, such as device construction.

Figure 53:
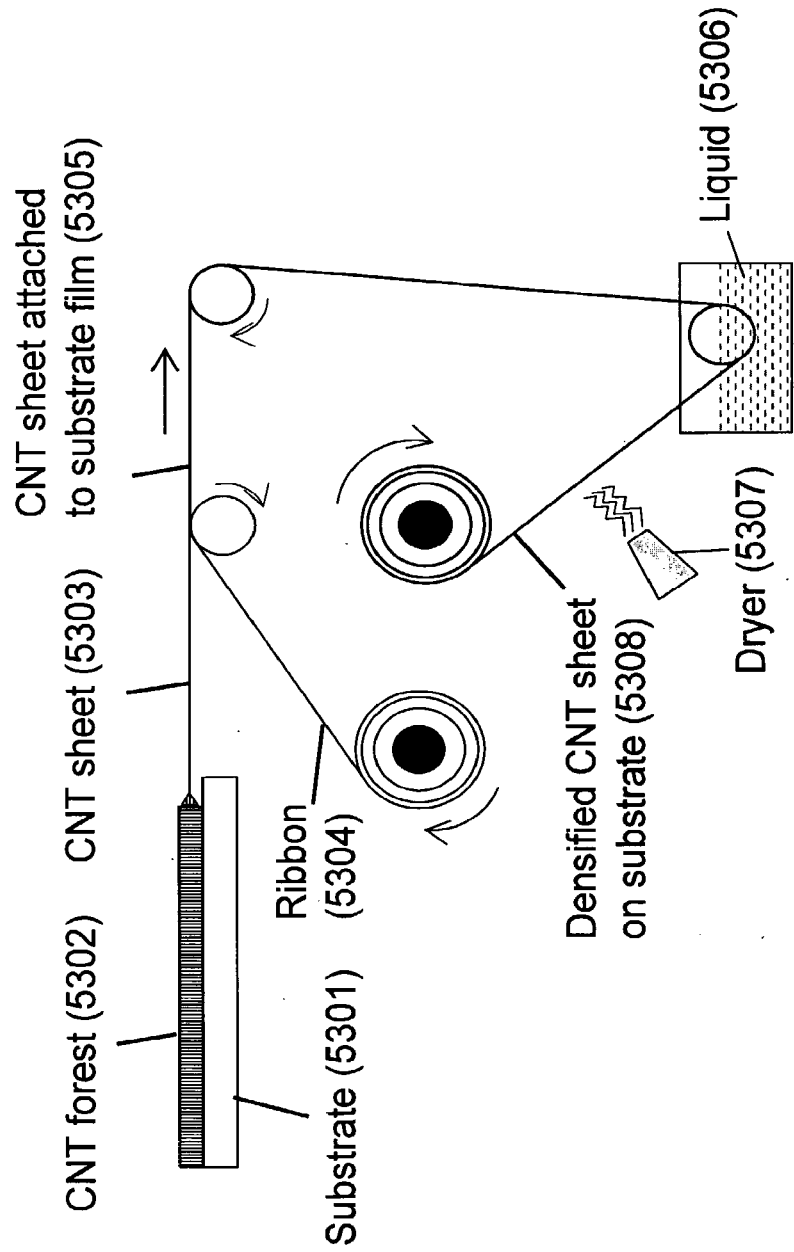
FIG. 53 shows a process in which nanotube sheets can be drawn, attached to a substrate film, densified by immersion in a liquid and evaporation of this liquid, and then wound onto a mandrel.
Figure 54:
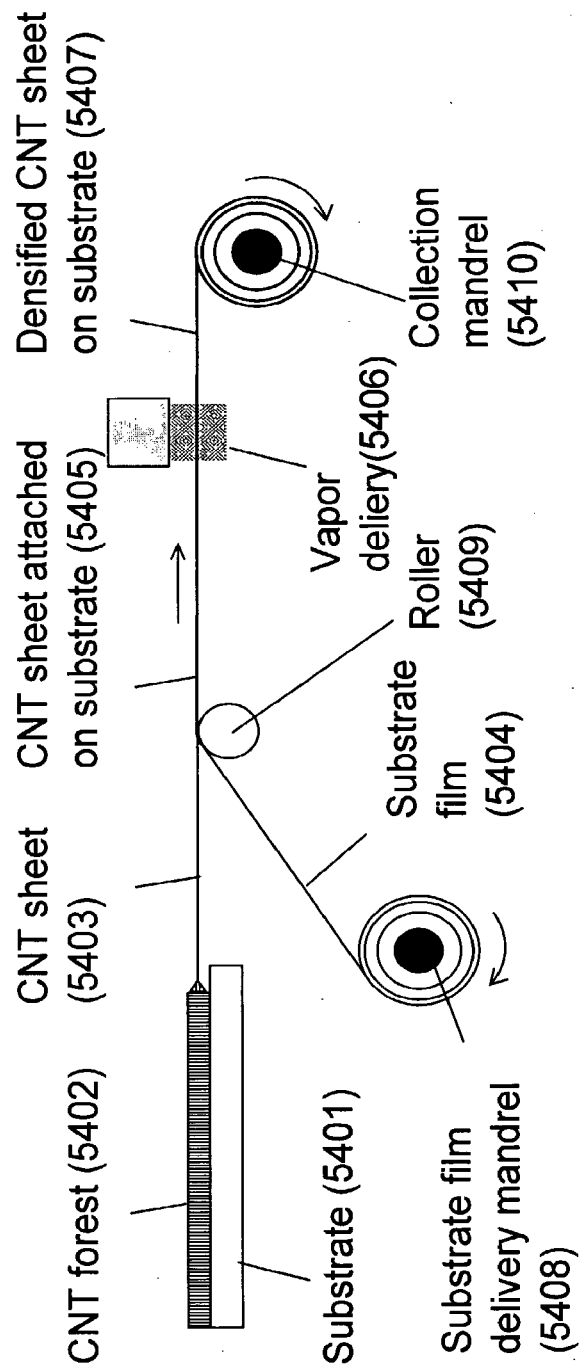
FIG. 54 shows a process in which nanotube sheets can be drawn, attached to a substrate film, densified using exposure to a vapor, and then collected on a mandrel.

Carbon nanotube (CNT) sheets can be drawn from a forest, attached to a substrate film (such as a plastic, metal foil, porous paper, or Teflon film), densified, and wound onto a mandrel. Demonstration of the feasibility of this process for adhesive-free, adhesive-coated, and elastomeric, and porous substrates is provided in Examples 23, 31, 32, and 45, respectively. FIG. 53 and FIG. 54 show schematic illustrations of such processes.

Example 45 shows that carbon nanotube sheets can be deposited on a contoured surface and densified on this surface, so that the shape of the contoured surface is retained in the shape of the nanotube sheet array. This mandrel can be a contoured storage mandrel. This application demonstration enables, for example, the deposition of carbon nanotube sheets as a layer in a contoured composite (such as an aircraft panel), as a contoured heating element for de-icing on an air vehicle, or a contoured supercapacitor that provides both an energy storage and structural component for a contoured car panel.

Element 5302 in FIG. 53 is a nanotube forest prepared as described in Example 1. Element 5301 is a growth substrate, element 5303 is a nanotube sheet drawn from the forest, element 5304 is the substrate film, and element 5305 is nanotube sheet attached to the substrate film. The attached nanotube sheet is densified using a liquid (element 5306), dried by a heater (element 5307), and then wound onto a mandrel. Here, rollers (two) are represented by open circles and mandrels (three) are represented by filled circles. By repeating the process, multilayer of nanotube sheets can be applied to the substrate film. A variation of the process is illustrated in FIG. 54. Instead of using liquid, liquid vapor (element 5406) is used to densify the collected sheet and the densified sheet (element 5407) is wound onto a mandrel. The elements are nanotube forest substrate (5401), nanotube forest (5402), CNT sheet (5403), substrate film (5404), CNT sheet attached to substrate film (5405), a heating system for delivery of vapor (5406), densified CNT sheet on substrate film (5407), substrate film delivery mandrel (5408), roller for consolidation of nanotube sheet and substrate film (5409), and collection mandrel (5410). Each of the rollers in FIGS. 53 and 54 can optionally be replaced by pairs of rollers, one on each side of laminated nanotube sheet and substrate film.

Importantly, the densified nanotube sheet produced by the apparatus of FIGS. 53 and 54 can be later unwound from the mandrel and separated from the substrate film for the twist-based spinning of yarn (see Example 37) to form free-standing densified sheets or for mechanical transfer of selected portions of nanotube sheets to other substrates (see Example 34). Also, the substrate can be an elastomeric film (or textile) that is stretched prior to attachment of the nanotube sheet (see example 32) or an adhesive coated substrate sheet (see Example 31). The stretching can be accomplished by controlling the relative rotation rates of substrate delivery and substrate film/nanotube sheet take-up mandrels and rollers (or roller pairs) between these mandrels.

Example 50 demonstrates that nanotube sheets can be deposited on a substrate, densified using by the liquid infiltration method, and then peeled from the substrate to provide a free-standing, densified sheet array. The importance of this demonstration is that it enables the storage of densified nanotube sheets on a mandrel, and subsequent retrieval of these densified sheets from the sheet substrate (typically a plastic film carrier) for applications. Either three, five, or eight layers of as-drawn, free-standing MWNT sheet (made as in Example 21) were placed onto a substrate (e.g., glass, plastic, or metal foil) and densified using a liquid (using a process of Example 23). A plastic carrier substrate, like Mylar film, was most conveniently used. A desired width (or the entire width) of the densified sheet was easily peeled from the substrate using an adhesive tape to start the sheet removal process. Unless the densified sheet thickness is greater than the 30 to 50 nm thickness obtained by liquid infiltration of the sheets made in Example 21 (for example, as a result of using a higher forest for the sheet draw), it is preferable to deposit a stack of more than one sheet on the carrier substrate, since a single 30-50 nm densified sheet can be easily damaged during removal from the substrate.

Example 37 shows that very thin densified carbon nanotube sheets stacks (less than 150 nm in thickness) can be rolled onto a mandrel for storage and possible shipment, and then subsequently unrolled for application without separating or supporting the nanotube sheets with a carrier sheet (like in the Mylar film in Example 50).

7. Chemical and Physical Modifications Before and after Fabrication of Yarns, Sheets, and Ribbons A variety of methods can be usefully employed in invention embodiments for the modification of nanofibers either before or after draw-twist spinning or sheet drawing. Various benefits can result from such modification, such as optimization of inter-fiber friction for twist spinning, the development of inter-fiber covalent bonding for either yarns or ribbons, and the electrical insulation of electrically conducting nanofiber yarns (such as by a post-spinning chemical derivatization process for MWNTs). Chemical derivatization, physical derivatization, surface coating, or dopant insertion can be practiced before or after spinning, or even during draw-twist spinning processes or after fabrication of the draw-twist yarns into articles or precursors to articles, like woven textiles. An especially preferred method for modifying carbon nanotubes while in nanotube forests is by gas phase reactions, plasma-induced reactions, or reactions and fluid extraction accomplished in supercritical phases, since these methods generally better preserve nanotube alignment within the nanotube forest than do solution or melt phase methods. Fluorination of carbon nanotubes with fluorine gas and plasma induced surface derivatization are more specifically useful. Though the utility of these processes for yarns of any type has not been previously recognized and they have not been applied to yarns, useful reaction conditions for carbon nanotube fluorination and plasma-induced derivation are provided, for example, by T. Nakajima, S. Kasamatsu, and Y. Matsuo in European Journal Solid State Inorganic Chemistry 33, 831 (1996); E. T. Mickelson et al. in Chem. Phys. Lett. 296, 188 (1998) and in J. Phys. Chem. B 103, 4318 (1999); and Q. Chen et al. in J. Phys. Chem. B 105, 618 (2001). Other useful methods that can be used for chemical derivatization of carbon nanotubes are described by V. N. Khabasheshu et al. in Accounts of Chemical Research 35, 1087-1095 (2002); by Y.-P. Sun et al. in Accounts of Chemical Research 35, 1096-1104 (2002); and by S. Niyogi et al. in Accounts of Chemical Research 35, 1087-1095 (2002). Since many of these methods decrease the length of single walled nanotubes, there are benefits of applying these methods to double walled and multiwalled carbon nanotubes.

For example, the nanofibers in the nanofiber forests used for draw-twist spinning nanofiber yarns can be optionally coated with a hydrophobic material, like poly(tetrafluoroethylene). One method for such coating on nanofibers is by the decomposition of hexafluoropropylene oxide at about 500° C. on heated filaments (by hot filament CVD) to produce $CF_2$ radicals, which polymerize to produce poly(tetrafluoroethylene) on the surface of individual nanofibers (see K. K. S. Lau et al. in Nano Letters 3, 1701 (2003)). Related hot-filament CVD methods can be used to provide coatings of other polymers, like organosilicones and fluorosilicones. The result of draw-twist spinning of these hydrophobic nanofibers from nanofiber forests is a super hydrophobic twisted nanofiber yarn that is useful for water repellent textiles and textiles for chemical protection clothing. Since the insulating poly(tetrafluoroethylene) coats the surfaces of the individual nanofibers (and thereby interrupts inter-fiber electronic transport), such coating using an electrically insulating polymer is useful for making poorly conducting twisted yarns from originally electrically conducting nanofibers.

Application of this and related coating methods to fibers that have already been draw-twist spun enables the retention of nanofiber electrical conductivity, since the inter-fiber contacts are made during the draw-twist spinning and the coating process can be accomplished without interruption of these contacts. Application of tensile stress to the draw-twist spun yarns can optionally and preferably be used during the coating of draw-twist spun fibers with insulators (including solid electrolytes), so as to minimize any decrease of the yarn's electrical conductivity caused by nanofiber coating with an insulator. A benefit of such coating of nanofibers in draw-twist yarns with an electrical insulator after the draw-twist process is that the yarn becomes an insulator-coated wire, which has high electrical conductivity in the yarn direction and is insulating in the lateral direction.

Various useful ways to chemically and non-chemically functionalize nanofibers for various applications have been described in the literature and these methods can be applied for the twisted nanofiber yarns of the present invention embodiments (see Y. Li, et al., J. Materials Chemistry 14, 527-541 (2004)). The application of these methods and like methods to the pre-primary states for the spinning process, the primary state for the spinning process, spun yarns, spun-twisted yarns, and yarn assemblies (such as in textiles).

Such insulator coated twisted yarns comprised of highly conducting nanofibers, like carbon nanotubes, are especially useful for diverse applications, such as wires in electronic textiles (which can be used for comfort control in clothing, via providing the possibility of electrically heating clothing articles), and insulated wires for transformers, magnets, and solenoids.

Since the nanofiber yarns of invention embodiments can be knotted without undergoing a reduction in strength, unknots that are slip knots can increase the yarn toughness as measured on a gravimetric basis. Slip knots are unknots that pull out when you pull an end.

The insertion of either individual slip knots or arrays of slip knots provide optionally preferred ways to increase gravimetric toughness of nanofiber yarns. Also, The insertion of either individual slip knots or arrays of slip knots provide optionally preferred ways to change in useful ways the stress-strain curve of a nanofiber yarn. Once all of the slip knots in a nanofiber array have been pulled out (thereby dissipating mechanical energy and contributing to yarn toughness), the stress-strain curve of the originally knotted yarn will approach that for the unknotted nanofiber yarn.

8. Composite Formation Using Nanofiber Yarns, Sheets, and Ribbons and Composite and Non-Composite Applications The nanofibers for nanotube spinning can be optionally coated with various inorganic and organic materials either prior to or after the twisting process. The purpose of this coating can be to provide a friction aid for enhancing the insertion of twist, for conferring special functionality to the twisted yarn, or for a combination of these goals. These nanofiber coating agents can optionally fill an arbitrarily large fraction of the volume of the yarn. However, if the filling factor is high and the materials used for filling have mechanical properties that interfere with the twisting process, high filling is preferably achieved after the initial insertion of twist.

(a) Nanofiber Yarn/Electrolyte Composites

Since the twisted yarns can be useful for electrochemical applications that utilize the extremely high surface area of nanofibers, a class of preferred invention embodiments provide steps in which the twisted nanotube yarns are infiltrated with solid or gel electrolytes. Examples of such applications are as electromechanical artificial muscle yarns, electrochromic yarns, yarn supercapacitors, and yarn batteries. Solid-state electrolytes can also be used advantageously, since such electrolytes enable all-solid-state yarn-based electrochemical devices.

Optional and more preferred organic-based solid-state electrolytes are polyacrylonitrile-based solid polymer electrolytes (with salts such as potassium, lithium, magnesium, or copper perchlorate, $LiAsF_6$, and $LiN(CF_3SO_2)_2$) and ionic liquids in polymer matrices (which can provide a wide redox stability range and high cycle life for electrochemical processes). Optional and preferred gel or elastomeric solid electrolytes include lithium salt-containing copolymers of polyethylene oxide (because of high redox stability windows, high electrical conductivities, and achievable elastomeric properties), electrolytes based on the random copolymer poly(epichloridrin-co-ethylene oxide), phosphoric acid containing nylons (such as nylon 6,10 or nylon 6), and hydrated poly(vinyl alcohol)/$H_3PO_4$. Other optional and preferred gel electrolytes include polyethylene oxide and polyacrylonitrile-based electrolytes with lithium salts (like $LiClO_4$) and ethylene and propylene carbonate plasticizers. The so-called "polymer in salt" elastomers (S. S. Zhang and C. A. Angell, J. Electrochem. Soc. 143, 4047 (1996)] are also optional and preferred for lithium-ion-based devices, since they provide very high lithium ion conductivities, elastomeric properties, and a wide redox stability window (4.5-5.5 V versus $Li^+$/Li).

Optionally preferred electrolytes for high temperature device applications include ionic glasses based on lithium ion conducting ceramics (superionic glasses), ion exchanged β-alumina (up to 1,000° C.), $CaF_2$, $La_2Mo_2O_9$ (above about 580° C.) and $ZrO_2/Y_2O_3$ (up to 2,000° C.). Other optional and preferred inorganic solid-state electrolytes are AgI, AgBr, and $Ag_4RbI_5$. Some of the proton-conducting electrolytes that are useful in invention embodiments as the solid-state electrolyte include, among other possibilities, Nafion, S-PEEK-1.6 (a sulfonated polyether ether ketone), S-PBI (a sulfonated polybenzimidazole), and phosphoric acid complexes of nylon, polyvinyl alcohol, polyacrylamide, and a polybenzimidazole (such as poly[2,2'-(m-phenylene)-5,5'-bibenzimidazole]).

(b) Composites and Additives for Enhancing Electrical Conductivities

Additives for enhancing the electrical conductivities of the nanofiber yarns of invention embodiments are especially important. Among the preferred materials for enhancing electrical conductivity are: (1) elemental metals and metal alloys, (2) electrically conducting organic polymers, and (3) conducting forms of carbon. These additives can be added to the nanofiber yarns by various known methods for synthesizing or processing these materials, such as by (a) chemical reaction (such as the chemically-induced polymerization of aniline or pyrrole to make, respectively conducting polyaniline or polypyrrole, the electrode-less plating of metals, and the pyrolysis of a polymer like polyacrylonitrile to make carbon), (b) electrochemical methods for conducting yarns (such as the electrochemical polymerization of aniline or pyrrole to make conducting polymers and the electroplating of metals), and physical deposition methods (such as the vapor deposition of metals, the infiltration of a soluble conducting polymer or a precursor therefore from solution, the infiltration of a colloidal solution of a metal or conducting polymer, or the melt infiltration of a metal). Conducting organic polymers that are preferred for infiltration into twisted nanofiber yarns include substituted and unsubstituted polyanilines, polypyrroles, polythiophenes, polyphenylenes, and polyarylvinylenes. The synthetic routes to conducting polymers suitable for the preferred embodiments is well known, and are described, for example, in the Handbook of Conducting Polymers, Second Edition, Eds. T. A. Skotheim et al. (Marcel Dekker, New York, 1998).

Diamond, diamond-like carbon and other insulating forms of carbon containing $sp^3$ hybridized carbons (possibly mixed with $sp^2$ and sp hybridized carbons) are usefully employed, since they can both insulate electrically conducting nanofiber yarns and substantially contribute to the mechanical properties of the yarn. Infiltration or coating of the electrically conducting nanofiber yarns with these insulating forms of carbon is optionally and preferably by CVD processes or by solid-state reaction of infiltrated precursors using thermal or thermal and pressure treatments. Typical methods that can be employed for formation of such forms of carbon on the yarn surface or interior are described in (a) A. E. Ringwood, Australian Patent WO8807409 (1988), (b) Y. S. Ko et al., J. of Materials Research 36, No. 2, 469-475 (2001) and (c) J. Qian et al., J. Mat. Sci. 17, 2153-2160 (2002).

For carbon nanofibers, palladium and palladium alloy deposition (chemically, electrochemically, or by evaporation or sputtering) is especially useful for making low resistance ohmic interconnection between nanofibers and between the nanofiber yarns and other materials. The use of this metal for enhancing electrical contacts in nanosize electronic devices is described by A. Javey, J. Guo, Q. Wang, M. Lunstrom, and H. J. Dai in Nature 424, 654-657 (2003). Palladium hydride formation by the absorption of hydrogen can be employed for tuning work functions so as to minimize contact resistances to and between carbon nanotubes.

(c) Structural Composites

Polymer additives for the twisted yarns and false-twist spun yarns that are especially preferred for making yarn composites include polyvinyl alcohol; poly(phenylene tetrapthalamide) type resins (examples Kevlar® and Twaron®); poly(p-phenylene benzobisoxazole) (PBO); nylon; poly(ethylene terephalate); poly(p-phenylene benzobisthiozole); polyacrylonitrile; poly(styrene); poly(ether ether ketone); and poly(vinyl pyrrolidone). Epoxies of such types that are useable for forming graphite-epoxy composites are also preferred for invention embodiments.

Polymers that are pyrolizable to produce strong or highly conductive components can optionally be pyrolyzed in the twisted, false-twisted, or liquid-state densified nanofiber yarn. Heat treatment and pyrolysis (such as the heat setting in an oxidative environment and further pyrolysis of polyacrylonitrile in an inert environment) is preferably accomplished while the twisted nanofiber yarn is under tension. This state of tension is preferably one that results in fiber draw during at least part of the pyrolysis process. Pitch is also an especially preferred yarn additive for stretch-facilitated pyrolysis processes that result in carbon matrix/nanotube yarns. The nanofiber yarn containing material that can be pyrolyzed to make carbon (like pitch or polyacrylonitrile) is preferably either false-twisted or liquid-state densified, since high twist can undesirably restrict the ability to obtain fiber draw during pyrolysis.

Because of the importance of draw for strengthening matrix polymers and the improving the properties of materials that are being pyrolized, and the observation that twist decreases the draw of nanofiber yarns, false-twist spun yarns are especially useful for optimizing the achievable properties of the yarn composites.

Structural materials used for friction generation, especially friction materials used for land vehicle and aircraft brakes, benefit from the employment of carbon nanotube yarns and sheets of invention embodiments. These structural composites are optionally and preferably carbon-carbon composites. These carbon-carbon composites are preferably made by in processes that involve either the pyrolysis of an organic material that has been infiltrated into the an array comprising nanofiber sheets, nanofiber yarns, or an array comprising both nanofiber sheets and nanofiber yarns.

When used for brakes, the nanofiber sheets are preferably oriented roughly parallel to the friction surface, such as the disk surface of land vehicle or aircraft brakes. Optionally and preferably, these nanotube sheets are transversed in an at least approximately orthogonal direction by reinforcing yarns or fibers (optionally and preferably comprising either graphitic fibers or yarns or nanotube yarns of invention embodiments). This stitching process can be done using methods well known in the art.

The formation of carbon-carbon composites using the nanotube sheets and yarns of the present invention can proceed similarly to the conventional technology for carbon-carbon brakes and can utilize similar additives, like those employed for oxidative protection. Optionally preferred materials for pyrolysis to form the matrix component of carbon-carbon brakes are phenolic resins, polyacrylonitrile, and like materials known in the art.

Gas phase pyrolysis steps can optionally be accomplished, such as those using natural gas as a gas component. Multiple resin and gas infiltration steps can be usefully employed in order to decrease void space and optimize performance.

(d) Composite and Non-Composite Applications

A variety of applications enabled by the high sheet and ribbon strengths described in Examples 6 and 27. The inventors provide here density-normalized strengths that are already comparable to or higher than the ~160 MPa/(g/cm$^3$) strength of the Mylar® and Kapton® films used for ultralight air vehicles and proposed for solar sails for space applications (see D. E. Edwards et al., High Performance Polymers 16, 277 (2004)) and those for ultra-high strength steel sheet (~125 MPa/(g/cm$^3$)) and aluminum alloys (~250 MPa/(g/cm$^3$)).

The high strength for the inventors nanofiber sheets, ribbons, and yarns indicate that the preferred applications modes include use for membranes, diaphragms, solar sails, tents and other habitable structures, ultralight air vehicles, micro and macro air vehicles, pneumatically supported fabrics (such as domes, balloons, other inflatable structures, parachutes, and ropes (such as those useful for marine vehicle mooring and tethering objects in space). As an alternative or a complement to using pneumatic support, the nanotube-based sheets and ribbons and nanotube-based textiles can be mechanically tensioned, using for example metal tensioning elements.

The utilized yarns and sheets can optionally be plied. For example, oriented nanofiber sheets of invention embodiments (See Example 28 and FIG. 27) can be optionally laminated together so as to produce a plied sheet structure in which all sheets do not have the same nanofiber orientation direction. In fact, nanofiber sheets in plied sheet structures can be plied to produce a plied sheet structure that has anisotropic strength for in-plane (i.e., in-sheet directions).

The nanofiber yarns or sheets can optionally contain a support another functional material. For example, an infiltrated or overcoated material is useful for reducing or eliminating gas permeability for membrane, diaphragm, inflatable structure, and pneumatically supported structures. These nanofiber-based structures that are coated or infiltrated include nanotube sheets, ribbons, and textiles incorporating nanofiber yarns, as well as other possibilities. Yarn, ribbon, and sheet infiltration with polymer, metal, and other binding agents and matrix materials are also especially useful for providing strength enhancements.

Since the mechanical gravimetric strength of the carbon nanotube sheets exceeds that of the Mylar that is being exploited for solar sails, these carbon nanotube sheets are especially promising for use as solar sails. While it is difficult to make ordinary polymer films sufficiently thin, the inventors have made nanofiber sheets that are so thin (50 nm thickness) that a four ounce sheet could cover an acre.

Such sheets or much thicker sheets of invention embodiments can optionally be plied for the purpose of making a solar sail that is strong in all in-plane directions. The extreme radiation and thermal stability of nanotube would be especially useful for the solar sail application, as would be the exceptionally high thermal diffusivity of these sheets (which would assist in temperature equilibration between differently thermally exposed sheet areas and sheet sides).

Petal configured solar sails comprising nanofibers sheets, nanofiber yarns, or combinations thereof are optionally preferred due to convenient deployability. Such petal configured solar sail are named for structural similarly of solar sail blade arrays to those of the open petal array of a flower. Teachings for the geometry of such solar sails are in the literature. One type (comprising metallized Mylar) was recently on a missile fired into space, but the launch into space was unsuccessful.

Optionally preferred configurations for petal configured solar sail are those comprising a plurality of at least approximately triangular petals that join at a triangle apex. The angle of the triangle at the apex where the triangles are joined is optionally preferably less than 120° and greater than 15°. Also the number of rectangular petals in the solar sail is preferably at least three.

While the nanotube sheets could be used for solar sail applications without being coated or laminated, it is optionally preferable to make the nanofiber sheets highly reflecting, which can be achieved by deposition of a thin metal overcoat or laminating the nanofiber sheet with a highly reflecting material. Such overcoating with a highly reflecting material can optionally be accomplished for an infiltrated nanotube sheet, such as a polymer infiltrated sheet.

The high strength of the carbon nanotube sheets and carbon-nanotube-based textiles, as well as the achievable toughness, means that they can be incorporated in tires as a tire-cord fabrics, which can optionally be used for providing a sensor responses indicating tire pressure and the operating conditions of the tire under use conditions. Methods for incorporating nanofiber sheets, nanofiber textiles, and nanofiber yarns into tires, such as rubber tires, can be like those used to incorporate conventional tire cords.

These mechanical properties can enable other applications, like incorporating into antiballistic composites (including antiballistic textiles), cut resistant gloves and other clothing, space suits, and protective clothing for moon or planetary missions. The high thermal conductivity and thermal diffusivity of nanotube yarns, sheets, and fabrics can be useful for the various applications, such as for temperature regulating clothing (such as for space suits and protective clothing for the exploration of moons, planets, and other bodies in outer space).

9. Assemblies of Twisted Nanofiber Yarns, Sheets, and Ribbons with Other Fibers

The twisted, false-twisted, and solution densified nanotube yarns of invention embodiments can optionally be combined with non-wovens to make structures that combine the cost benefits of non-wovens with the mechanical properties and electrical properties achievable for the twisted nanofiber yarns. Various combinations can be usefully employed. For example, the twisted nanotube yarns can be embedded within the body of the non-woven (such as a non-woven produced by electrostatic spinning) or the twisted nanofiber yarn can be used to stitch the non-woven, so as to improve mechanical properties of the assembly. A benefit of incorporating electrically conducting twisted nanofiber yarns into the body of electrically insulating non-wovens is that these non-wovens can insulate electrically conducting elements in twisted-nanofiber-based electronic circuitry. The non-woven can optionally be entangled, using such means as a water jet or transverse penetration with a bed of needles.

An electrically conducting nanofiber sheets of invention embodiments can optionally serve as either the receiving electrode for electrostatically spun yarns or an over laid material on this electrode. In either case the beneficial result is a product that is a laminate of the electrostatically spun yarn and a nanofiber sheet of invention embodiments.

Electrically insulating fibers and yarns can optionally be twisted in a spiral manner about the twisted electrically conducting nanofiber yarns, so as to provide electrical insulation and other desired properties. Also, the twisted nanofiber yarns can optionally be twisted about conventional fibers and yarns using equipment that is commonly used for making topologically analogous structures from conventional yarn and fiber structures. Such methods include core and wrap spinning adaptations to conventional ring spinning frames.

Example 53 demonstrates a twist-based method for making a fiber composite of two different fibrous materials, one comprising electronically conducting carbon nanotubes and the other comprising electronically insulating cellulose microfibers. Also, this example demonstrates a method that provides either the insulating microfibers or the conducting carbon nanofibers on the outer surface of the twisted yarn. In addition, this demonstration shows how a carbon nanotube yarn can be covered with an insulating layer. Also, by replacing the cellulose sheet with a similar sheet comprising fusible polymer microfibers (such as polypropylene or polyethylene-based non-woven paper), the method of Example 53 can be used to make polymer/nanotube composite yarns that are either twisted or false twisted prior to fusion of the polymer onto the nanofibers in the yarn by thermal or microwave heating. This demonstration uses the tissue paper/nanotube stack composite that has been contoured using the method of Example 45. Three millimeter width ribbons were cut parallel to the nanotube orientation direction from the composite stack, and twisted to provide a moderate strength yarn. Apparently because of the contouring on the oval mandrel (with the nanotube fiber direction in the circumferential direction), the inventors found that (depending upon the direction of twist) either the insulating cellulose microfibers or the electrically conducting carbon nanofibers would appear on the surface of the twisted yarn.

Woven structures used for diverse applications can include the twisted nanofiber yarns as either part of or the entire warp or part of or the entire weft. Insulating yarns or fibers can separate electrically conducting twisted nanofiber yarns in the warp, the weft, or both—so as to electrically separate the conducting twisted nanofiber yarns. These conducting yarns can optionally be separated (to avoid unwanted electrical contact associated with textile bending) by laminating insulating textiles or providing insulating coatings on textile sides where the conducting twisted nanofiber yarn is exposed. Alternatively, the conducting twisted nanofiber yarn can have such small diameter compared with the insulating yarns or fibers that separate these conducting yarns that insulation is provided by the conducting nanofiber yarns being buried in the bulk of the textile. For this purpose of hindering shorting between uninsulated electrically conducting nanofiber yarn wires, the electrically conducting nanofiber yarn wires are optionally and preferably configured in a woven textile with insulating yarns having at least five times the diameter of the electrically conducting nanofiber yarn wires.

Figure 40:
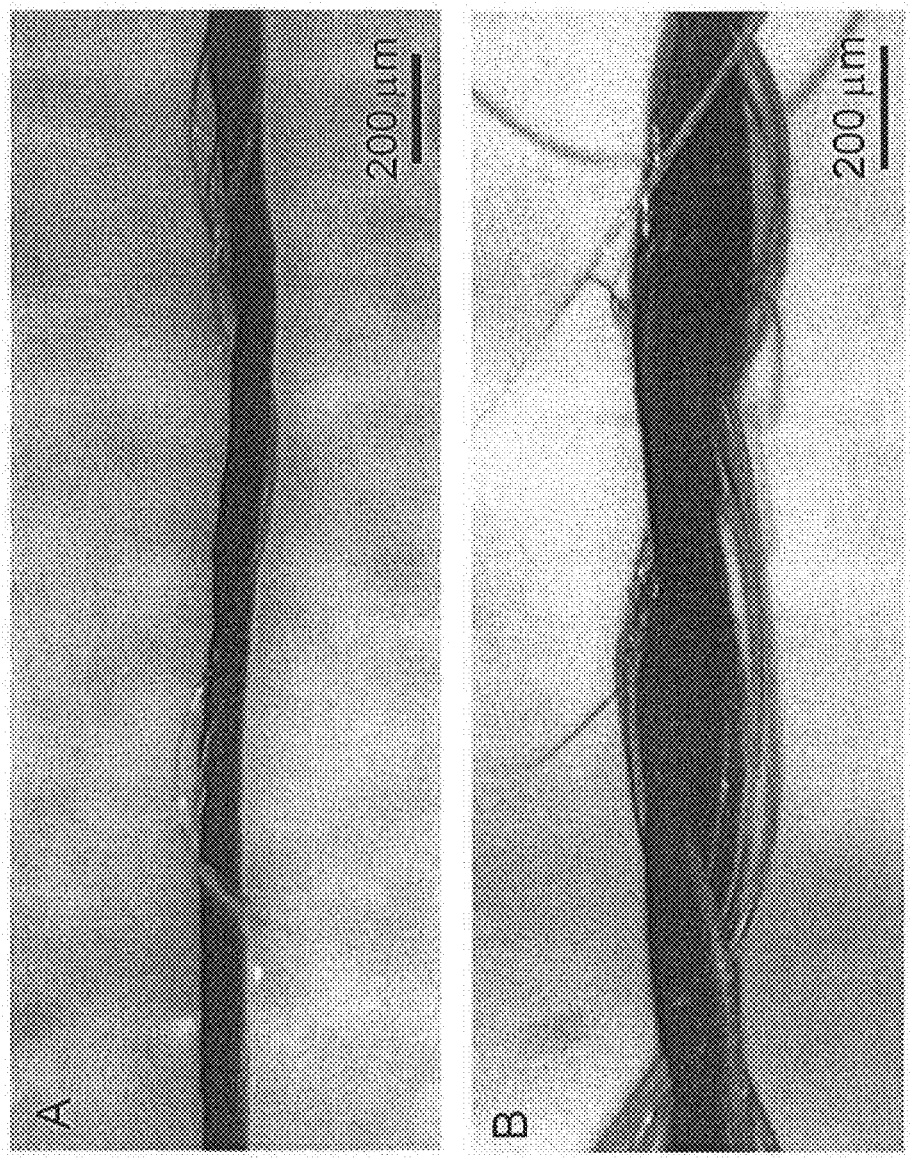
FIG. 40 shows two optical micrographs of a CNT-wool composite yarn in which CNT fibers and wool fibers were introduced during twist spinning.

FIG. 40 shows a yarn made in the laboratory that combines nanotube components with wool fibers in a twist-based process. The benefit of such assembly is to combine the attractive characteristics of wool with those of carbon nanotubes. For example, the carbon nanofiber component can provide the electrical conductivity needed for yarn application for electrical heating, and the wool component can provide the beneficial characteristics of wool, such as the ability to absorb sweat.

After initial nanofiber yarn, sheet, or ribbon fabrication by solid-state methods, additional carbon nanotubes or other nanofibers (called secondary nanofibers) can be optionally incorporated into solid-state spun nanofiber yarns, ribbons, and sheets by a variety of useful processes. One process is by adding catalyst to these prefabricated materials to enable CVD-based growth on this catalyst. Another method is to add catalyst by the thermal decomposition of a metallo-organic during CVD growth of the secondary nanofibers. These methods are especially useful for solid-state spun carbon nanotube sheets, ribbons, and yarns and it is especially useful for the CVD-grown, secondary nanofibers to be carbon nanotubes.

As a result of such additional addition of CVD grown nanotubes to preformed nanotube sheets, ribbons, and yarns a useful hierarchal structure can be formed, which usefully includes nanofibers grown from catalyst on nanofibers, nanofiber bundles, and larger nanofiber assemblies. Advantages can result from such secondary nanofibers to preformed yarns, sheets, and ribbons and these include enhancements in thermal and electrical conductivity.

Alternatively, secondary nanofibers can be added to preformed nanofiber sheets of present invention embodiments by filtration processes of the type typically used for the formation of nanotube sheets on a filter membrane. In effect, the nanofiber sheet is the filter membrane, although another conventional filter membrane can also be employed to support the preformed nanofiber sheet during filtration processes, and such support is especially useful when the preformed nanotube sheet is as thin as 30 nm.

10. Applications of Nanofiber Yarns, Ribbons, and Sheets (a) Textile Applications The surprising nanotube yarn properties resulting from the practice of invention embodiments are especially useful for application of the nanotube yarns as either a minority or majority component in two-dimensional or three-dimensional textiles, including electronic textiles. The inventors have discovered, surprisingly, that high thermal and electrical conductivities can be obtained in combination with high strength and high toughness by using processes of this invention. The small yarn diameters achieved (one micron) are over ten times lower than for conventional textile yarns and for previously reported continuous fibers or yarns comprising only nanotubes.

Highly conducting twisted nanofiber yarns are useful as antennas that can be woven into textiles employed for clothing and used to transmit voice communications and other data, such as information on the health status, location of the wearer, and her/his body motions, as well as information collected by the wearer or by sensor devices in the clothing. The configurations employed by such antennas can be essentially the same as for conventional antennas, except that the nanofiber yarn antennas can be woven or sewn into the clothing textile.

Additionally, electrically conducting twisted nanofiber yarns can usefully be employed to make clothing textiles (and textiles used for such applications as tents) into large area acoustic arrays for the detection and location of noise. The nanofiber yarns can connect microphones in a textile, which can be as simple as a poled ferroelectric polymer that is located at the cross-point between nanofiber yarns in a textile. These cross-points are optionally and preferably between nanofiber yarns that are at least approximately orthogonal, such as the warp yarn and the weft yarn of a textile, which are not necessarily both nanofiber yarns. The poling of the ferroelectric coating on a nanofiber yarn can be either before or after nanofiber yarn assembly into a textile. However, the poling direction of the ferroelectric is optionally and preferably orthogonal to the yarn length direction and the polling step is optionally and preferably accomplished after the textile has been fabricated. This poling direction can optionally be either within the plane of the nanofiber yarn or orthogonal to this plane. However, this poling direction is optionally and preferably orthogonal to the plane of the textile or the local plane of the textile if the textile is non-planar.

Replacing metal wires in electronic textiles with nanotube yarns can provide important new functionalities, like the ability to actuate as artificial muscles and to store energy as a fiber supercapacitor or battery. Polymer-free MWNT yarns of the present invention provide twice the strength of nanotube fibers used for artificial muscles (R. H. Baughman, A. A. Zakhidov, and W. A. de Heer, Science 297, 787-792 (2002)) and the polymer-intercalated MWNT yarns provide a hundred times higher electrical conductivity than for the coagulation-spun SWNT/PVA fibers used to make fiber supercapacitors (A. B. Dalton et al., Nature 423, 703 (2003)).

Reflecting the micron or thinner yarn and sheet thicknesses demonstrated in the invention embodiments and the low visibility observed for these thicknesses, as well as the high electrical conductivities demonstrated for specific compositions (like carbon nanotubes), the yarns and sheets of the present invention embodiments can be usefully employed as transparent and low visibility substrate materials for making electrical contact and interconnections. Resulting transparent conducting electrodes are important for such applications as liquid crystal displays, light emitting displays (both organic and inorganic), solar cells, switchable transparency windows, micro lasers, optical modulators, electron field emission devices, electronic switches, and optical polarizers. Inorganic electrodes, like ITO (indium tin oxide), degrade on bending and are costly to apply or repair. The present invention embodiments eliminate these problems.

The surprising mechanical strength, abrasion resistance, and resistance to any degradation of these properties due to knotting makes the twisted yarns of invention embodiments well suited for fabric keyboard switches for electronic textiles. Pressure-activated switches of invention embodiments comprise (a) a textile containing electrically conducting, twisted nanofiber yarns (like carbon nanotube twisted yarns) that provides a first switch contact, (b) a first electrical connection that is to the first switch contact, (c) a second electrical connection made to a material that is a second switch contact, (d) an insulating material that breaks direct or indirect electrical conduction between the first and second switch contact (and, thereby between the first and second electrical connection) unless suitable pressure is applied to the switch, and (e) means to form electrical conduction between the first and second switch contact when suitable pressure is applied.

In one preferred embodiment for such a keyboard switch, an electrically conducting twisted nanofiber yarn is woven into a first textile so that a surface region of this textile is electrically conducting. This textile with conducting surface region, which serves as a first switch contact, is separated from a second electrically conducting surface by an insulating spacer sheet (such as an insulating textile, or a suitably configured insulating textile fiber or yarn). This insulating material extends only part of the possible contact region between the first switch contact and the second electrically conducting surface, so that pressure applied approximately orthogonally to the switch surface provides electrical contact between the first switch contact and the second electrically conducting surface. This second electrically conducting surface can be the second switch contact. Alternatively, pressure-induced sheet or textile deflection can bring this second electrically conducting surface in joint electrical contact between the first and second switch contact, so as to provide an electrical path between these switch contacts. In this latter case, the second switch contact can be an electrically conducting region of the same textile that includes the first switch contact.

One or both of the electrically conducting textiles in the above switches can be replaced with an electronically conducting nanofiber sheet or sheet portion that has been fabricated by a solid-state draw process. The nanofibers in the nanofiber sheet of sheet portion are optionally and preferably carbon nanotubes, and these carbon nanotube sheets or sheet portions are optionally and preferably derived from a carbon nanotube forest. This electronically conducting nanofiber sheet or sheet portion can optionally be attached to the surface of another textile that is electronically insulating. The benefit of such attachment is to provide mechanical support for the electronically conducting nanofiber sheet, especially when the electronically conducting nanofiber sheet is so thin that it provides optical transparency. Such optical transparency is especially important for providing the greatest latitude for formulating textile appearance.

Because of the combination of surprising mechanical and electrical properties that are especially useful for electronic textile applications, the twisted nanofiber yarns can replace conventional wires in these textiles. For example, conducting twisted nanofiber yarns of this invention can be used as wires for sensors and for clothing that contains liquid crystal displays or light emitting elements (such as light emitting diodes). These twisted nanofiber yarns, and especially the twisted carbon nanotube yarns, can replace the conventional wires used for the electronic textile applications described in by E. R. Post et al. in IBM Systems Journal 39, 840-860 (2000), and similar methods can be employed for creating device structures from conventional wires and from these twisted nanofiber yarns.

The twisted yarns of invention embodiments can be employed to make a microdenier version of Velcro® that provides either permanent or easily reversible interconnections between opposite surfaces upon the application of pressure that brings these surfaces into intimate contact. In one invention embodiment, the twisted nanofiber yarns provide closed loops in a textile base that interconnect with hooks on a mating surface. These hooks on the mating surface can, for example, be arrow-like barbs, around which the nanofiber yarns loop when the nanofiber yarn containing textile is pressed upon the neighboring surface. Alternatively, the hooks can be cut loops of nanofiber yarn that are infiltrated by a rigid polymer, such as by infiltration of a polymer from a polymer solution or photopolymerization of an infiltrated polymer. Benefits of such use of twisted nanofiber yarns for this application are many. Using strong, tough carbon nanofiber yarns that mate with strong hooks (like lithographically-produced diamond hooks) extraordinarily strong and tough interconnections can be made between the mating surfaces, which provide very high thermal conductivity between the mating surfaces (as a consequence of the high thermal conductivities of both the carbon nanotubes and materials like diamond). If both sides of the mating surface are electrical conductors, mechanical connection between the two mating surfaces can provide electrical connection, which can be used, for example, for making electrical connections for electronic textiles. Furthermore, patterns of closed loops and hooks (or mechanical equivalents) can be provided on both of the mating surfaces, so that the mating process helps laterally align the two surfaces. Moreover, the extremely small presently demonstrated nanofiber yarn diameters implies that this means of connecting surfaces (textile or solid) can be applied on the hundred micron scale for microcircuit applications. For such application, for example, the yarn loops can be anchored in a solid polymer or in a metal, and the opposing barbs can be lithographically produced in any of various possible materials, like silicon, diamond or diamond-like carbon, a plastic, or a metal.

(b) Knot-Based Electronics and Other Methods for Forming Electronic Devices from Twisted and Untwisted Nanofiber Yarns Application of the twisted nanofiber yarns of this invention as electronic devices (especially those in electronic textiles) is enabled by (1) the demonstrated mechanical robustness and electrical conductivities and the retention of these conductivities when the yarn is infiltrated, (2) the ability to change electrical properties for yarn segments by chemical modification or doping, (3) the demonstrated absence of mechanical property degradation when the twisted nanofiber yarns are knotted, and (4) the variety of metallic, semiconducting, and metallic nanofibers available for the practice of invention embodiments.

Twisted nanofiber yarns made of superconductors, like nanofibers having the approximate composition $MoS_{9-x}I_x$ (where x between about 4.5 and 6) can be used as superconducting cables and as superconducting wires for magnets. Nanofibers of the $Nb_3Sn$ superconductor, the $MgB_2$ superconductor (which has a superconducting transition temperature of about 39 K), and the carbon doped $MgB_2$ superconductor are especially preferred as component nanofibers for twisted nanofiber yarns of invention embodiments that superconduct (see Y. Wu et al., Advanced Materials 13, 1487 (2001), where the growth of superconducting $MgB_2$ nanowires by the reaction of single crystal B nanowires with the vapor of Mg is described). Benefits of using the methods of invention embodiments are the high strength and high toughness of the twisted nanofiber yarns and the intimate electrical interconnections between nanofibers in these yarns.

Novel methods of invention embodiments have been above described that provide controllably patterned variation in electrical properties along a yarn length, which can be usefully employed for the fabrication of electronic devices based on nanofibers yarns. The inventors here describe other novel methods that can be employed for device fabrication using nanofiber yarns.

The inventors refer to the first category of invention embodiments as knot-based electronics, since knot structures are used for the fabrication of electronic devices. One strategy is knot-based lithography, which can utilize yarn densification at a knot (and, optionally, differences in densification at different places within a knot), to provide the capability of patterned deposition, reaction, or removal needed for the fabrication of electrical, fluidic, thermal, or mechanical circuits or circuit elements. These methods of patterned deposition, reaction, or removal can be applied to singles or folded yarns and to yarns that have been woven or otherwise assembled into a structure. Also, these methods of obtaining region-selective material deposition, reaction, or removal can include, among other useful options, exposing the knotted yarn or yarn assembly to a gas; vapor; plasma; liquid; solution; fluid dispersion; super critical liquid; melt; or conditions resulting in electrochemical deposition, electrochemical materials removal, or electrochemical polymerization.

Figure 6:
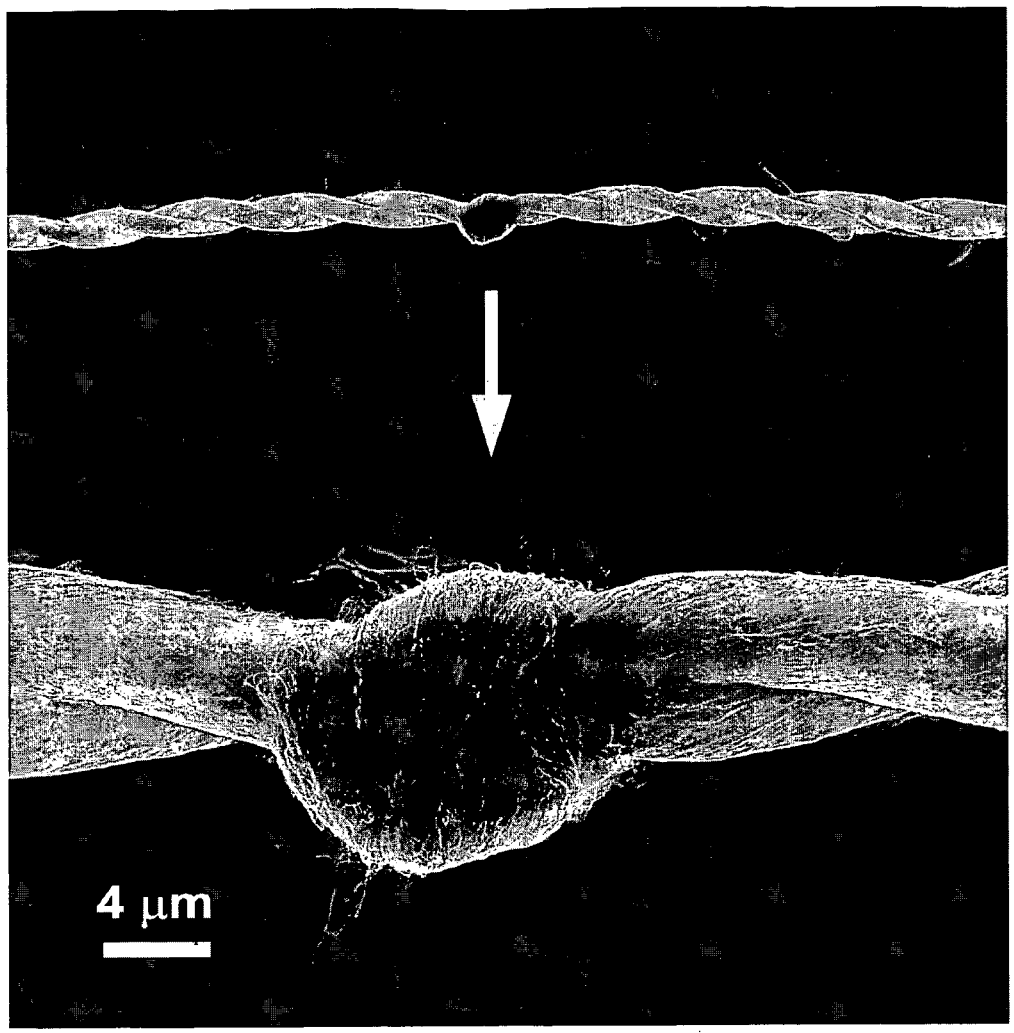
FIG. 6 shows SEM micrographs of an overhand knot in a twofold carbon multi-wall nanotube yarn that has about the same diameter as the yarn.
Figure 12:
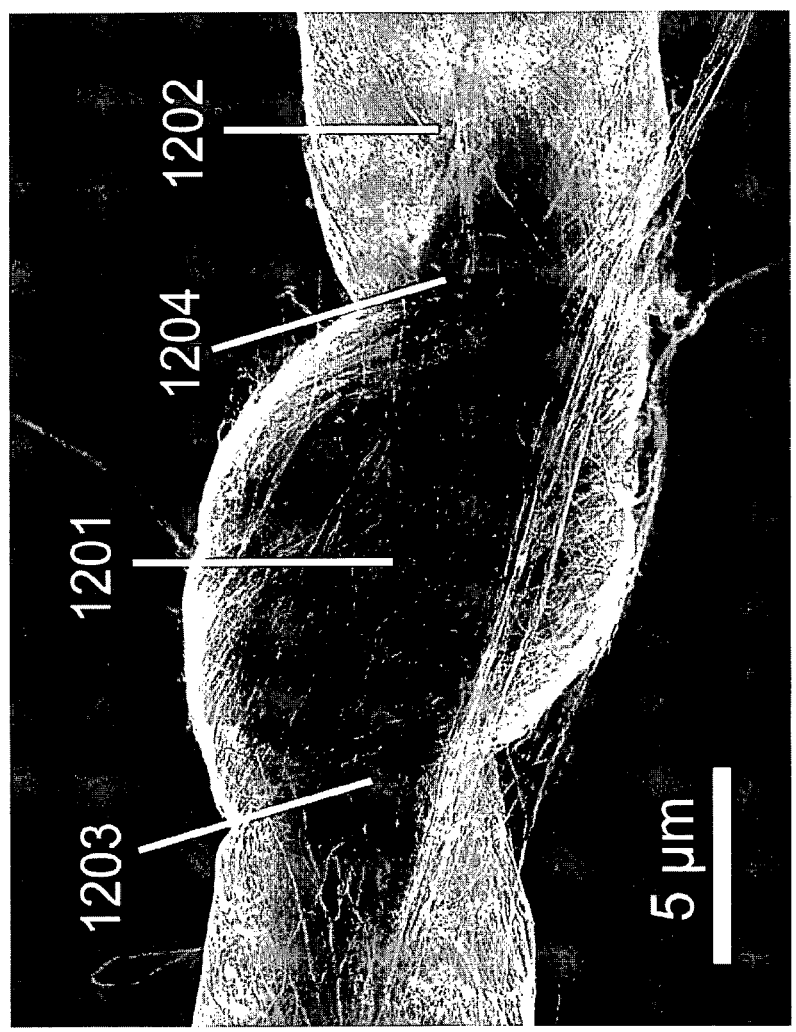
FIG. 12 shows an SEM micrograph of an overhand knot in a singles MWNT twisted yarn, wherein the relative yarn dimensions at places removed from the knot, at the knot entrance and exit, and in the body of the knot provide regional density differences that can be used for selective region infiltration and reaction, and wherein the pictured stray nanotubes that migrate from the knot and other regions of the knot can optionally be removed chemically (such as by passing the yarn through an open flame), and if desired for applications like electron field emission, the density of these stray nanotubes can be selectively increased in different regions of the yarn by mechanical treatments or chemical treatments, including chemical treatments that result in nanofiber rupture.

The simplest embodiment of these concepts can be understood by noting for the twofold yarn in FIG. 6, and the singles yarn in FIG. 12, that the region of the yarn that is tightly knotted has a much higher density than unknotted regions of the fiber. As a consequence of this density difference, the knotted region of the fiber will be much more difficult to infiltrate with a fluid, vapor, or plasma than is the case for unknotted yarn regions. For example, the selectively infiltrated agent can be a chemical that is used to transform the electrical properties of the infiltrated yarn region, or it can be a resist material that serves to protect the infiltrated region when electrical property transformations are accomplished for un-infiltrated yarn regions, such as by chemical or electrochemical doping or by liquid, gas, or plasma-induced chemical transformations. After this process, the resist material can be optionally removed.

Close inspection of FIG. 12 shows that relative yarn dimensions at yarn locations removed from the inserted overhand knot (1202), at the knot entrance (1203), and knot exit (1204), and in the body of the knot (1201) provide regional density differences that can be used for selective region infiltration and reaction. The pictured stray nanotubes that migrate from the knot and other regions of the knot can optionally be removed chemically (such as by passing the yarn through an open flame). If desired for applications like electron field emission, the density of these stray nanotubes can be selectively increased in different regions of the yarn by mechanical treatments or chemical treatments, including chemical treatments that result in nanofiber rupture. Examples of such mechanical treatments are, for example, abrasion between the twisted nanofiber yarns and a rough surface or orifice and the ultrasonication of a twisted nanofiber yarn (optionally and preferably while tension is applied to the yarn). Examples of such chemical processes are treatment in oxidizing acids, plasma oxidation, and oxidation in air during thermal annealing, and surface fluorination (which can be later reversed by thermal annealing).

Knots can be formed by all of the methods currently used in the textile industry. The type of knot formed depends on the size and nature of the particular construction required. Overhand knots are possible for compact applications when the knotted length is not too large and the yarn package is relatively small. In the case large-scale applications when more extended knotting is required, knots can be formed using all of the established technologies currently to form loops such as knitting, braiding, and embroidering, which can then be tightened to the degree required by the application.

Differences in electrical conductivity for knotted and unknotted fiber regions of electrically conductive yarns (like carbon nanotube yarns) can also be used for lithography. One approach is to apply a voltage pulse or sequence of well-separated voltage pulses in order to cause preferential thermal transformations or evaporation of electronic chemicals in the more resistive fiber region. Knotted regions of the yarn will generally have higher electrical conductivity than unknotted regions, so the unknotted regions will selectively increase temperature relative to knotted yarn regions when a voltage pulse is applied. On the other hand, the higher porosity of unknotted regions of the fiber can be used to reverse this effect, since the higher porosity of unknotted yarn regions means that the temperature increase during continuous electrical heating is reduced relative to that for knotted yarn regions.

Knotted twisted nanotube yarns are preferred for selected applications of these yarns, some of which are described above. Special types of knotted twisted nanofiber yarns are also preferred for selected applications, such as where independently tied knots (called knot factors) are assembled so that they partially or completely overlap on the twisted nanofiber yarn.

The nanofiber yarns of invention embodiments can be optionally patterned to provide semiconducting, metallic, or superconducting regions either before or after incorporation of these yarns into textiles. This patterning can be by any of various means, such as (a) application of well known lithographic or soft lithography methods, (b) ink jet printing, or (c) laser printing methods. These methods are optionally and preferably multi-step and can combine the various well-known methods of pattern formation, such as photopolymerization or electron-beam induced reactions of polymers; pressure-induced material transfer; and liquid, gas phase, or plasma treatments to deposit, remove, or transform materials.

Figure 16:
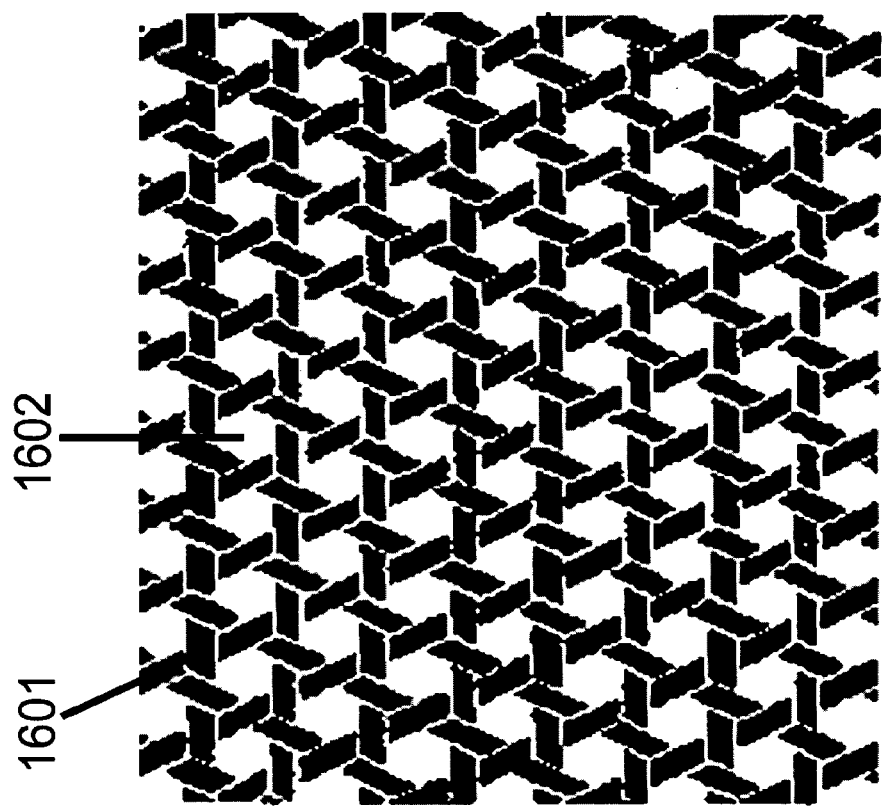
FIG. 16 is a schematic picture of a textile weave that provides docking sites for functional devices (such as substrate-released electronic chips).

Methods can be employed for using the conducting yarns as interconnects for self-assembled functional devices, like electronic chips. Such methods can utilize the extremely small diameter electrically conducting yarns that can be produced by the methods of invention embodiments, the ability to create woven structures containing patterns of precisely shaped depressions, and the ability to insulate different lengths of yarn in a textile with respect to one another. Using shape effects, patterned surface tension variations, or (most desirably) a combination of these effects and possibly other self-assembly effects, functional devices (such as transistor chips) can be self-assembled on a textile by depositing a fluid containing the chips on the textile. FIG. 16 provides a schematic picture of a textile weave that provides docking sites for functional devices (such as substrate-released electronic chips), which could be self-assembled onto the textile at these docking sites from a liquid-based dispersion of the particle-like devices. Element 1601 is an electrically conducting, twisted nanofiber yarn that is insulated from all pictured like elements. Element 1602 and all like-shaped holes are possible docking sites for the functional devices.

Related methods have been employed for self-assembling electronic chips on planar and curved substrates, like plastic sheets containing metal lines for interconnections (see K. D. Schatz, U.S. Pat. No. 6,780,696; T. D. Credelle et al., U.S. Pat. No. 6,731,353; J. S. Smith et al., U.S. Pat. No. 6,623,579 and U.S. Pat. No. 6,527,964; M. A. Hadley et al., U.S. Pat. No. 6,590,346; G. W. Gengel, U.S. Pat. No. 6,417,025). The teachings of this prior art can be used to provide useful variations on the present invention embodiment where the twisted nanofiber yarns in a textile are used together with other textile components for the fluid-based self-assembly of electronic chips in an electronic textile. The various methods described in this prior art show means for connecting metal lines, to the self-assembled electronic chips, and it will be obvious to one skilled in the prior art as to how these and related methods can be applied to provide interconnections between the nanofiber yarns and functional devices (like electronic chips and microfluidic circuit elements) that are self-assembled on textiles.

(c) Wire Applications

The nanofiber yarns can be used as wires, and wires capable of carrying high currents. Carbon nanotube twisted yarns, and especially such yarns containing a conductivity enhancement aid are especially useful for the transport of electrical currents. Advantages obtained for these twisted carbon nanotube yarns are high current carrying capacity, high temperature stability, and freedom from electro-migration effects that cause failure in small diameter copper wires. The low weight and high mechanical strength of these twisted nanofiber yarns can be especially useful for aerospace and space applications where weight is especially important, and for applications where it is useful to employ wiring to provide mechanical reinforcement. Other potential applications are, for example, as power cables and as the windings of magnets, transformers, solenoids, and motors, and for these devices that are incorporated into a textile.

The electrically-conductive connections between yarns, or between yarns and other materials, can be made by using conductive gels (such as sliver paints), knotting, or mounting.

(d) Electrochemical Device Applications—Supercapacitors, Batteries, Fuel Cells, Artificial Muscles and Electrochromic Articles Because of the high achievable porosity of the twisted nanofibers and the high electrical conductivity demonstrated herein for particular twisted yarns (such as twisted carbon nanotube yarns, both before and after infiltration with electrolyte) these twisted yarns are useful as electrodes for yarn-based electrochemical devices that use either electrochemical double-layer charge injection, faradaic charge injection, or a combination thereof. These devices could utilize either electrolytes that are liquid state, solid-state, or a combination thereof (see above discussion of electrolytes).

Examples of twisted yarn electrochemical devices of this invention include supercapacitors, which have giant capacitances in comparison with those of ordinary dielectric based capacitors, and electromechanical actuators that could be used as artificial muscles for robots. Like ordinary capacitors, carbon nanotube supercapacitors (A. B. Dalton et al., Nature 423, 703 (2003)) and electromechanical actuators (R. H. Baughman et al., Science 284, 1340 (1999)) comprise at least two electrodes separated by an electronically insulating material, which is ionically conducting in electrochemical devices. The capacitance for an ordinary planar sheet capacitor inversely depends on the inter-electrode separation. In contrast, the capacitance for an electrochemical device depends on the separation between the charge on the electrode and the countercharge in the electrolyte. Because this separation is about a nanometer for nanotubes in electrodes, as compared with the micrometer or larger separations in ordinary dielectric capacitors, very large capacitances result from the high nanotube surface area accessible to the electrolyte.

These capacitances (typically between 15 and 200 F/g, depending on the surface area of the nanotube array) result in large amounts of charge injection when only a few volts are applied. This charge injection is used for energy storage in nanotube supercapacitors and to provide electrode expansions and contractions that can do mechanical work in electromechanical actuators. Supercapacitors with carbon nanotube electrodes can be used for applications that require much higher power capabilities than batteries and much higher storage capacities than ordinary capacitors, such as hybrid electric vehicles that can provide rapid acceleration and store braking energy electrically.

The construction of a twisted yarn electrochemical device that can be used as a supercapacitor, an artificial muscle, or a battery is provided in Example 18. These twisted yarns can be incorporated as threads in textiles. While incorporation of coagulation spun nanofibers as supercapacitors in textiles has been previously shown (see A. B. Dalton et al., Nature 423, 703 (2003)), these threads have neither the degree of twist or the high ratio of nanofiber length to fiber circumference needed for enhancing the mechanical properties by insertion of twist. Also, these prior-art fibers have about an order of magnitude lower electrical conductivity than the highly twisted carbon nanotube yarns of invention embodiments.

Various methods can be employed for effectively employing the nanofiber yarns of invention embodiments in thermochromic devices, including those that are woven or otherwise arrayed in electronic textiles. One method is to use the twisted nanofiber yarns as heating elements to cause the color change of a thermochromic material, such as a liquid crystal, that is overcoated or otherwise incorporated into the nanofiber yarn.

Another method is to utilize electrochemically-induced color changes of an electrically conducting nanofiber-yarn electrode that is infiltrated with or coated with an electrolyte. For this method, the counter-electrode can be another twisted nanofiber that contacts the same electrolyte as for the working electrode, but other useful possibilities exist. For example, the counter-electrode can be an electrically conducting coating on the textile that is separated from the twisted nanofiber electrode by the ionically conducting electrolyte that is required to both avoid inter-electrode shorting and to provide an ion path. The electrochemically-induced chromatic change of the nanofiber yarn in either the infrared, visible, or ultraviolet regions can involve either faradaic processes or non-faradaic charge injection, or any combination thereof. Electrically conducting twisted nanofiber yarns overcoated with a conducting organic polymer (or twisted nanofiber yarns comprising conducting polymer nanofibers) are optionally preferred for color change applications, and especially as yarn electrodes that provide color changes in electronic textiles. Twisted carbon nanofiber yarns are optionally especially preferred as electrodes that change color when electrochemically charged either faradaically or non-faradaically. These chromatic changes occur for the carbon nanotube fibers in the useful region in the infrared where the atmosphere is transparent.

Using these chromic materials, electronic textiles that provide pixilated chromatic changes can be obtained. Methods for electronically addressing individual pixels are widely used for liquid crystal displays are well known and the same methods can be used here. For example, applying a suitable potential between the ends of orthogonal yarns in a textile will selectively heat a thermochromic material separating these yarns and that has a much lower electrical conductivity than the yarns.

Conducting twisted nanofiber yarns are especially useful as fuel cell electrodes that are filled with electrolyte and contain catalyst. Because of their strength, toughness, high electrical and thermal conductivities, and porosity, the twisted carbon nanotube yarns are included among preferred compositions for the fuel cell application. The fuel cell electrode can comprise a singles or folded yarn (together with a penetrating electrolyte and a catalyst such as Pt), or it can comprise an array of twisted yarns, especially including those that have been woven (or otherwise configured) into a textile.

Figure 104:
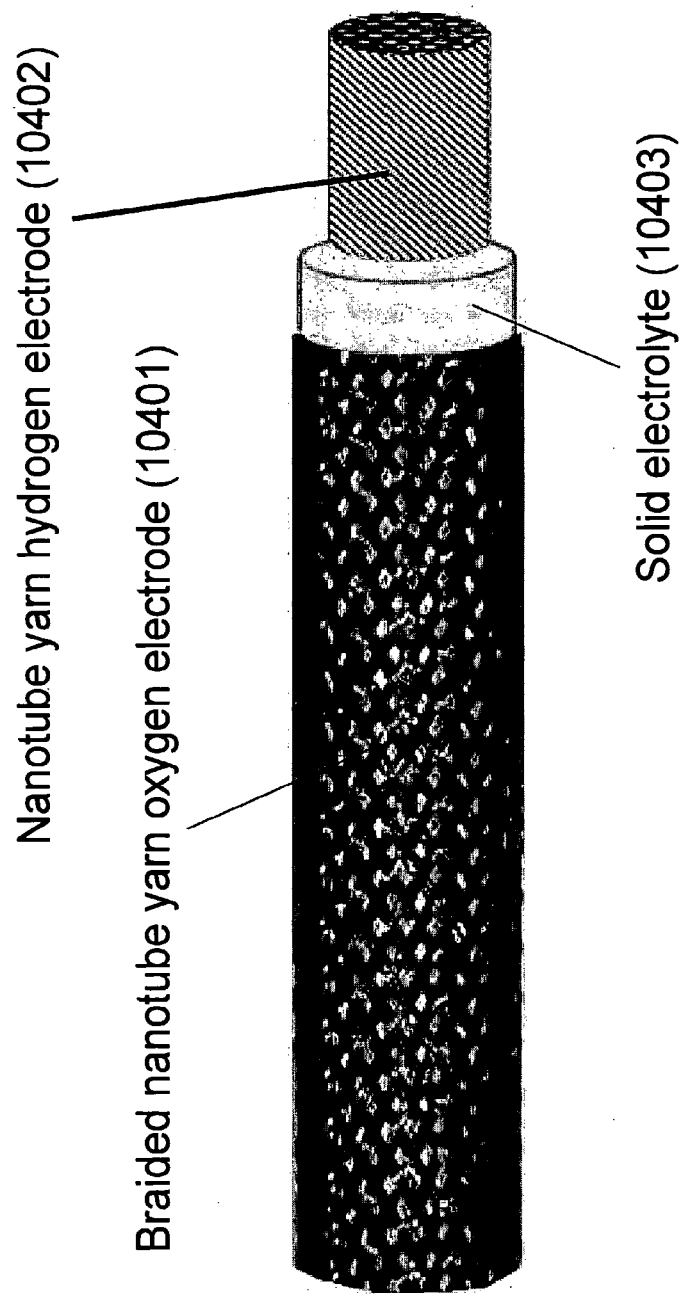
FIG. 104 schematically illustrates a carbon nanotube yarn based fuel cell.

FIG. 104 schematically illustrates a fuel cell of invention embodiments that can be configured in the form of a yarn-size and yarn-shape device that can be woven into a textile, or as a much larger diameter device. A carbon nanotube yarn hydrogen electrode (10402), which can be an assembly of nanotube yarns, is coated with solid electrolyte (10403) and in intimate contact with this electrolyte and the electrolyte is also in intimate contact with a surrounding braided nanotube yarn oxygen electrode (10401). Both 10401 and 10402 contain sufficient nanoporous void space that air (or oxygen) makes contact to 10401 and hydrogen can be transported through 10402. A catalyst, typically of Pt or a Pt alloy, is preferably in the contact region between these gases and these respective electrodes. The hydrogen fuel is transported through the porous regions of nanotube yarn electrode 10402 and oxygen (or air) is delivered to the oxygen electrode 10401. The hydrogen fuel can optionally be replaced by an alternative fuel, like hydrazine or methanol.

It is important to provide reliable access of fuel to electrode 10402. Several approaches can be used, internal fuel storage, external fuel storage, and intermittent internal and external fuel storage. The external storage approach is to have the fuel source (such as hydrogen) separate from the yarn fuel cell. The internal storage approach is to store the hydrogen producing fuel in the hydrogen electrode of the fuel cell yarn. In either case, fuel storage and access of the fuel to the electrode can be in and through hollow regions of a yarn electrode 10402 (such as the central region of a hollow braided yarn) or in and through the porosity of the MWNT yarns, which readily wicks liquids.

Such yarn fuel cells are particularly promising for application on micro air vehicles, as small as a dragon fly. Imagine a 30 micron or smaller MWNT yarn that is braided (like a shoe lace) to make a hollow braided tube that is the hydrogen electrode. This electrode can be overcoated with a $H^+$ transporting electrolyte layer on the surface of the braided structure, and wrapped on a sacrificial mandrel to make the first layer of the shell or wing of a micro air vehicle. The oxygen electrode yarn (which need not have a hollow construction) could then be wound over the top of the hydrogen electrode, imbibed with additional electrolyte, and chemically treated so as to remove electrolyte only from the yarn side that is on the surface of the vehicle (so that triple point contact involving air is insured).

As an alternative to this type of construction, a fuel cell yarn structure 30 microns or smaller in diameter could be made by imbibing an electrolyte into the outer surface of a 10 micron diameter MWNT yarn, twisting this hydrogen electrode MWNT yarn with a second yarn while the electrolyte is still sufficiently wet to provide partial infiltration on the electrolyte contacting side with the electrolyte. Wicking hydrazine into the hydrogen electrode yarn then makes the fuel cell operational (using the wicked hydrazine as one fuel component and air as the second fuel component). A catalyst like Pt or a Pt alloy is naturally useful for both fuel cell electrodes and, using methods of the prior art, such catalyst can be easily deposited in a region selective way in nanotube assemblies.

Twisted nanofiber yarns wrapped on a spindle are especially preferred for many of the above applications. This spindle can be one that is part of the final device, or it can be one that is used for arraying the twisted nanofiber yarn and then removed in following fabrication steps.

(e) Sensors

Twisted nanotube yarns of invention embodiments have special utility as chemical and mechanical sensors that can be optionally knitted or woven into textiles. These nanotube yarns can also be incorporated into composite structures to sense mechanical deformation of these structures and the occurrence of damage-causing events (before they result in catastrophic structure failure). The mechanical sensor application can use the change in yarn electrical conductivity that occurs when the yarn is deformed, or the interruption in electronic transport that occurs when the yarn is broken. For example, twisted nanotube yarns in a soldier's uniform could provide an electrically transmissible signal indicating that a soldier has been wounded in a particular location, thereby enabling effective triage. Also, the toughness of the nanotube yarns could provide some degree of protection against injury.

Chemical sensor applications of the twisted nanofibers yarns can utilize the sensitivity of electronic transport and thermal power to the absorption of chemical on the nanofibers, as well as the reaction of chemicals or biological agents with derivatized or non-derivatized surfaces. This sensitivity of carbon nanotube electrical conductivity and thermal power is well known (see P. G. Collins, K. Bradley, M. Ishigami, and A. Zettl, Science 287, 1801 (2000) and J. Kong et al., Science 287, 622 (2000)). The benefit that the nanofiber yarns provide is retention of the high surface area of the nanofibers in a mechanically robust structure that can be incorporated in a variety of configurations, including as chemical sensors in electronic textiles.

Changes in the electrochemical capacitance of nanofibers in a nanofiber yarn that comprises an electrolyte can also be usefully employed for providing the response of a nanofiber-yarn-based chemical sensor (including a biochemical sensor). In this invention embodiment two nanofiber yarns separated by electrolyte can optionally be used for the device configuration.

Examples 32 and 90 show methods for fabrication of elastomerically deformable carbon nanotube sheets. These elastically deformable nanotube sheets can be used as stress and strain sensors, wherein the sensor response is provides by a change in resistance of the nanotube sheet in response to an applied stress or strain. While the stress-strain sensitivity of resistance of the nanofiber sheets is low, which is highly desirable for most applications, the size or stretch-induced resistance changes are large enough to be usefully measurable. Moreover, the size of stress-induced resistance changes can be enhanced by coating either the nanotube forest (for forest-based spinning) with a material that provides a large strain dependence of resistivity (like a suitable selected conducting polymer), by coating or infiltrating the nanofiber sheet with such material, or by using a device based on two nanotube sheets, separated by a material having a high strain dependence of resistivity. In this latter case, the sensor response is determined by a change in inter-sheet resistivity (or a combination of inter-sheet and intra-sheet resistivity).

Piezoelectric and ferroelectric based stress, strain, or pyroelectric sensors can exploit the electronically conducting nanofiber sheets of invention embodiments as electrodes on one or both sides of a piezoelectric or ferroelectric sheet.

For pyroelectric sensors used for the detection of radiation (such as light or infrared radiation) the nanofiber sheet or sheet stack used for one or both electrodes can be chosen to be sufficiently thick to convert radiation to heat. Multiple nanotube sheets can be stacked to obtain appropriate electrode thickness for radiation absorption. These sheets can either be stacked to eliminate the effect of sheet anisotropy (for example by orthogonally aligning neighboring sheets) or these sheets can be aligned so that the orientation directions of the sheets are parallel. In the latter case, the pyroelectric device becomes sensitive to the polarization of neighboring sheets. Using the methods described in Section 10(k), pixel-sensitive responses can be obtained for a pyroelectric radiation detector.

Section 10(k) further elaborates of the use of carbon nanotube sheets and woven as sensors, and exploits the electrical anisotropy of these sheets for obtaining sensor responses that can be monitored for a pixel array.

Numerous publications on the application of nanotubes and other nanofibers as sensors have been published (see, for example, J. Li et al. Nano Letters 3, 929 (2003) and J. Kong et al., Science 287, 622 (2000)) and the teachings of this prior art will facilitate application of the present invention embodiments.

As alternative to using the nanotube sheets of invention embodiments as one or more electrodes for a piezoelectric sensor, the same type of device can be operated in reverse direction as a piezoelectric or ferroelectric loudspeaker. One benefit is the transparency obtainable for these strong nanotube sheets and the ease at which they can be flexed without loss of electrical conductivity. Using these transparent nanotubes sheets as electrode on both sides of a piezoelectric or ferroelectric sheet enables the fabrication of windows and pictures coatings that are transparent loud speakers.

The methods described in Section 10(l) can optionally be used for imbedding the nanotube electrodes in a ferroelectric sheet material. Poling of the ferroelectric can optionally be accomplished after the embedding process.

The nanofiber electrodes for these sensor and loudspeaker applications are optionally preferably densified, especially since this densification increases nanotube sheet strength.

(f) Incandescent Light Emission Devices

While it is well known that carbon nanotube yarns can be used as incandescent light sources, the nanotube assemblies of the prior art are untwisted (see K. Jiang et al. in Nature 419, 801 (2002) and in U.S. Patent Application Publication No. US 2004/0051432 A1 (Mar. 18, 2004); P. Li et al. in Applied Physics Letters 82, 1763-1765 (2003); and J. Wei et al. in Applied Physics Letters 84, 4869-4871 (2004)). The benefit of inserting twist to form nanofiber yarns of the present invention is that the spinning process confers mechanical robustness that translates to increases in the lifetime of the incandescent filament and to the degree of repeated mechanical shock that the incandescent filament can withstand without failure.

The absence of significant strength or toughness decrease due to knotting, as well as the low electrical resistance of knots used to tie separate nanofiber yarns together; can be employed for this and other device applications.

Additionally, the ability of the spun and twisted carbon nanofiber yarns to undergo knotting and the very small yarn diameters that can be spun by the methods of invention embodiments (ten times smaller than those of prior art yarns) enables localization of incandescent heating and electron beam emission either at knots or in regions between knots. The obtainable localization of incandescent electrical heating at knots can be usefully employed to provide an incandescent light source having micron and smaller diameter, corresponding to the knot dimension. Various methods can be employed for selectively increasing the electrical resistance at knots relative to unknotted regions of the yarn (such as selective chemical reaction at the knot).

Also the mechanical durability and resistance to strength degradation due to knotting can be employed in the fabrication of nets and textiles that can serve as incandescent heating structures.

Both multiwalled and single walled carbon nanotubes are especially useful for use as incandescent light sources. Unless the goal is to maximize the ratio or infrared light emission to visible light and ultraviolet light emission or to maximize lifetime, the nanofiber incandescent lamps are optionally preferably operated at above 1500° C. in order to enhance electrical to photonic light emission efficiency. Optionally and more preferably when visible light emission is the goal the nanotube-based incandescent light element can be operated at a temperature of above 2000° C. Optionally and more preferably, when lifetime maximization is not necessary the nanotube-based or other nanofiber-based incandescent light element is optionally preferably operated at a temperature of above 3000° C.

These nanofiber-based incandescent light sources are preferably ones in which either an inert gas (such as argon, krypton, or xenon) or a vacuum surround the nanofiber incandescent element.

Secondary nanofibers can be added to original nanofibers for the formation of incandescent light elements. For example, catalyst particles such as metal or metal alloy particles can be incorporated in the volume (or on the surface) of an electrically conducting nanotube yarn, ribbon, or sheet, either before, during, or after a draw process to make a nanotube yarn, ribbon, or sheets for incandescent light or other applications. Well known CVD methods can be used to grow nanotubes from these catalyst particles (see references below) that extend from the original nanotubes, so as to provide nanofiber comprising elements for incandescent lights (as well as field-emitting nanofibers yarns, sheets, or ribbons). These nanofibers for the original yarn, sheet, or ribbon are optionally and preferably carbon nanotubes.

Various variations can be made on these processes for adding secondary nanofibers to a primary nanofiber structure. These include, among others, (a) the growth of the nanofibers on a pre-primary or primary nanofiber array before formation of yarn, sheet, or ribbon, (b) the addition of the secondary nanofibers by solution-based infiltration of pre-formed secondary nanofibers, and (c) delivery of the catalyst grown from the gas phase for the growth of the secondary nanofibers.

Growth of nanofibers within or on the nanofiber yarns of invention embodiments has wider application than solely for the purpose of fabricating incandescent light elements or electron field emission element. These methods can be used for such purposes as (a) mechanical reinforcement of the nanofiber yarn, (b) enhancing the electrical or thermal conductivity of the yarn, and (c) providing nanofibers that extend from the yarn to thereby electrically, thermally, or mechanically interconnect the yarn with surrounding elements, such as other nanofiber yarns, other fibers, or a matrix material. These processes typically involve the steps of (1) incorporating active catalyst particles in a nanotube yarn or precursor nanofiber arrays, and (2) synthesizing nanofibers in a nanofiber yarn or on the surface of a nanofiber yarn by reaction catalyzed by catalyst particles introduced before, during, or after a twist process is applied for the yarn. If this nanofiber yarn is incorporated into a textile, this particle-catalyzed growth of nanofibers within or on the nanofiber yarn can be carried out either before or after the yarn is incorporated into a textile or other yarn array. This synthesis of nanofibers using catalyst particles can be by CVD, liquid phase synthesis, or other known means. Useful catalysts and carbon nanotube growth methods that can be employed are described, for instance, in R. G. Ding et al., Journal of Nanoscience and Nanotechnology 1, 7 (2001); J. Liu et al., MRS Bulletin 29, 244 (2004); and S. M. Bachilo et al. Journal of the American Chemical Society 125, 11186 (2003). Catalysts and growth methods for other nanofibers are described, for instance, in Y. Wu et al., Advanced Materials 13, 1487 (2001); R. Tenne, Angewandte Chemie Int. Ed. 42, 5124-5132 (2003); and X. Duan and C. M. Lieber, Advanced Materials 12, 298-302 (2000), where semiconductor nanofibers having high purity are made using laser-assisted catalytic growth.

Figure 31:
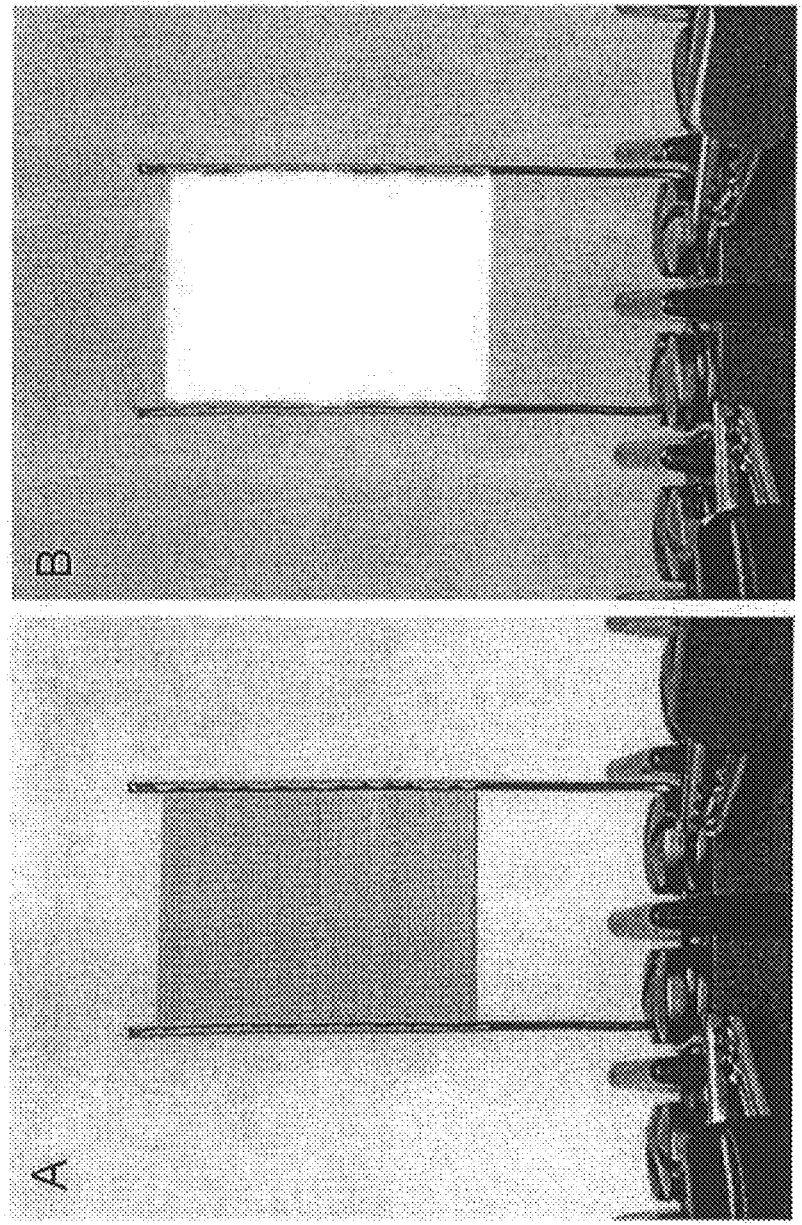
FIG. 31 is a photograph showing a free-standing, undensified MWNT sheet (16 mm×23 mm) used as a planar incandescent light source that emits polarized radiation, wherein the background color for the unheated sheet (A) and the incandescent sheet (B) differs because of reflected incandescent light from a white paper sheet that is behind the light source.
Figure 32:
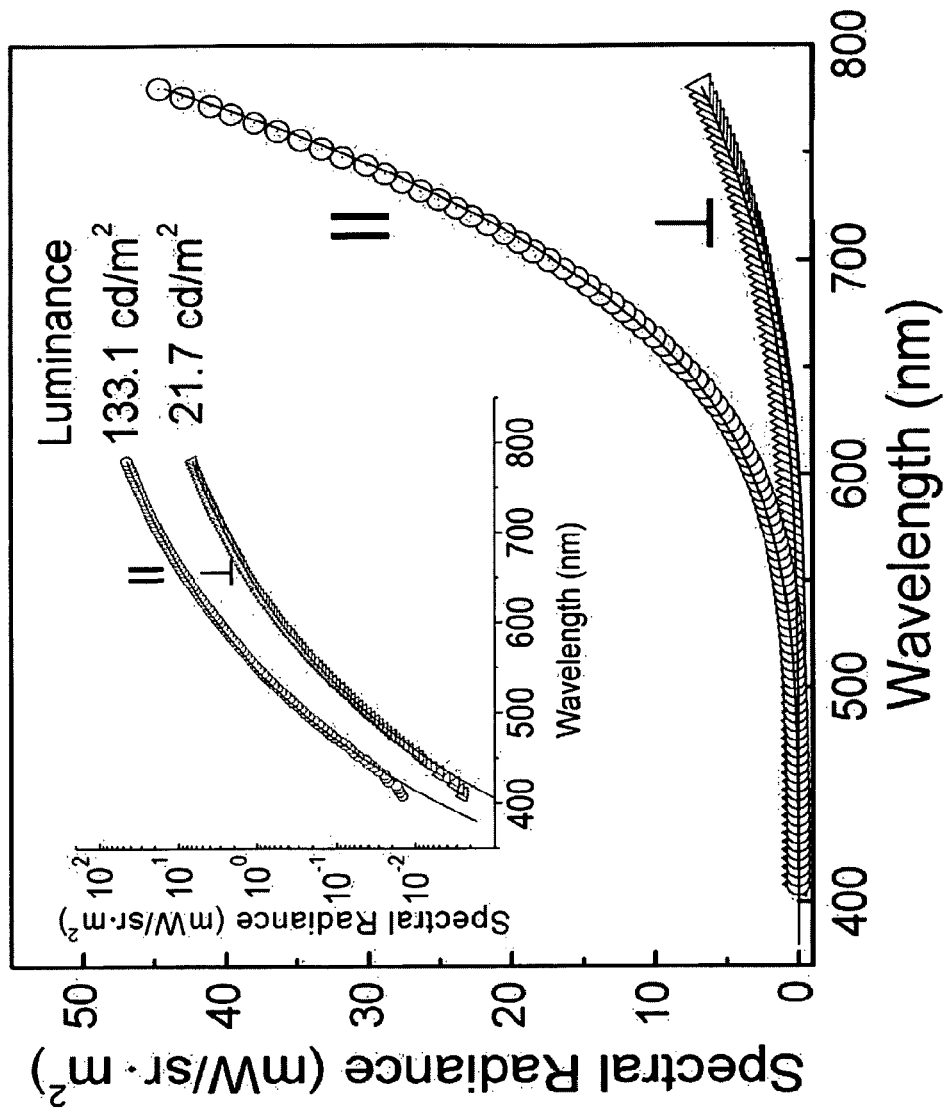
FIG. 32 shows spectral radiance in directions parallel to ($\parallel$) and perpendicular to ($\perp$) the draw direction of an as-drawn, undensified MWNT sheet after an added inelastic stretch in the initial draw direction of 2.5%. The inset shows this data on a semi-logarithmic scale. Underlying solid lines (largely obscured by coincidence with the data points) are data fits assuming black body radiation with T=1410 K.

Example 29 shows a stable, planar source of polarized ultraviolet, visible and infrared incandescent light (FIGS. 31, A and B) for sensors, infrared beacons, infrared imaging, and reference signals for device calibration. This nanotube sheet incandescent light has the advantage of providing highly polarized radiation (as shown in Example 29, the degree of polarization of emitted radiation increases from 0.71 at 500 nm to 0.74 at 780 nm (FIG. 32), which is substantially higher than the degree of polarization (0.33 for 500-900 nm) previously reported for a 600 μm long MWNT bundle with ~80 μm emitting length.

Cost and efficiency benefits result from decreasing or eliminating the need for a polarizer, and the MWNT sheet provides spatially uniform emission over a broad spectral range that is otherwise hard to achieve. The low heat capacity of these very low mass incandescent emitters means that they can turn on and off within the observed 0.1 ms or less in vacuum, and provide current modulated light output on a shorter time scale.

The polarized nature of the emitted light from nanotube sheets (and other oriented electrically conducting oriented nanofiber sheets) can be used for reducing glare. For this purpose the orientation of the nanofibers in the sheet are preferably oriented in at least an approximately vertical direction.

The combination of electrical conductivity and transparency for nanotube sheets and ribbons is also usefully employed for incandescent elements that should be transparent, such as electrically heated furnaces and ovens (where the benefit is to provide high visibility for the heated contents of the furnace or oven). Also, the transparent nanotube sheets of invention embodiments will be nearly invisible until electrically heated for the purpose of generating incandescent radiation.

The nanotube sheet incandescent elements of the present invention embodiments can be optionally plied to increase filament strength. This plying can be optionally by crossing the orientation direction of sheets, so that in-plane mechanical anisotropy is largely eliminated. Such plying can be used to convert a nanotube sheet incandescent light to one that emits largely unpolarized light.

(g) Protective and Temperature Regulating Clothing Applications

The surprisingly high yarn toughness demonstrated for the nanofiber yarns, as well as the extremely small demonstrated yarn diameters, indicates the utility of the twisted nanofiber yarns as textiles for protective clothing. Very tight yarn weaves, like those used for sail cloth, are especially useful for stab and puncture resistance. The high temperature stability of the draw-twist carbon nanotube yarns are especially useful for making hard armor that involves incorporating the nanofiber yarns in a matrix, like a ceramic, that is processed at high temperatures. While graphite fibers have as high a thermal stability, the toughness of the twisted carbon nanofiber yarns of invention embodiments (20 J/g and above) is higher than that for graphite fibers (about 15 J/g).

Electrically conducting nanofiber yarns of invention embodiments can be incorporated into textiles to provide the ability to heat the textile. Also, the electrically conducting nanofiber sheets of invention embodiments can be laminated between layers of ordinary textiles to provide the ability to heat the textile by passing electrical current through the nanofiber sheet. These nanofiber yarns and sheets absorb in the ultraviolet range, thereby providing protection to the effects of solar radiation exposure for those wearing otherwise ultraviolet-transmissive clothing.

Other means for moderating temperature changes for textiles is to use the porosity of nanofiber yarns and nanofiber sheets to store phase change materials, whose heat of fusion absorbs thermal energy when temperature is becoming too high and releases thermal energy when the textile temperature is too low. For use in textiles for clothing, the temperature range of heat absorption and release is preferably chosen to be within the comfort range of the wearer.

(h) Application as Absorptive Materials for Gases, Liquids, and Solids

The porosity, high surface area, small yarn diameters, and high mechanical strength of the nanofiber yarns, sheets, or ribbons of invention embodiments make them ideal materials for concentrating, separating, storing, or releasing gas and liquid components. They are also useful for concentrating, separating, and storing solids, such as particulate solids and solids that can be collected in solid form from a vapor or liquid and optionally subsequently either released or partially released in vapor, liquid, liquid component, reaction product, solid forms, and combinations thereof. Such solids include biological agents such as bacteria and viruses, which can optionally be at least partially pyrolized or otherwise modified during a release process.

Carbon nanofibers are a particular type of nanofiber that is useful for these applications. The gravimetric surface area of nanofibers for these collection, separation, storage, or release purposes is optionally preferably above 10 $m^2/g$ and more optionally preferably above 100 $m^2/g$. This surface area can be optionally measured using the well known BET method, The above nanofiber assemblies are especially important for concentration of analytes present in gases and liquids, and their subsequent release by heating, other means, or combinations thereof. Nanofibers assembled into yarns, sheets, ribbons, and combinations of these assembly methods are optionally preferable for applications for materials adsorption or absorption, materials separation, and materials release.

The high electrical conductivity for twisted yarns made of such materials as carbon nanofibers facilitate their use as a material for gas component separation, concentration, and analysis. In a typical process for the use of these conducting materials for this purpose, a carbon nanotube yarn, sheet, or ribbon is exposed to an analyte for a time enabling either separation or concentration by absorption on the high surface area of the nanotubes. This absorbed material can then be released by heating the nanofiber yarn electrically, by radiofrequency or microwave absorption, or by the absorption of radiation at ultraviolet, visible, or infrared wavelengths.

Materials collected on a nanofiber yarn, ribbon, or sheet (or a component derived there from) can be optionally subsequently analyzed while on these articles using spectroscopic or other means, or released as a gas from these articles and optionally analyzed by analyzing the gas. This gas can optionally be accomplished using such means as mass spectroscopy and gas chromatography. Materials collected on the nanofiber yarn, ribbon, or sheet (or a component derived there from) can optionally be released into a liquid media, and subsequently separated or analyzed using conventional liquid-based separation or analysis means.

The collection, separation, or release of solids, liquids, or gases from the nanofiber comprising yarns, ribbons, or sheets (or a component derived there from) can optionally be electrically enabled, such as by heating or capacitive charging in a capacitive device means that includes at least two electrodes. For instance, the capacitive charging in a device means can be by applying a potential between two electronically separated electrodes, wherein at least one of these electrodes comprises a nanofiber sheet, ribbon, or yarn (or a component derived from the same). Electrochemical charging can usefully be employed by incorporating an electrolyte into the inter-electrode region.

The nanofibers of these invention embodiments can optionally be reacted, surface derivatized, or surface coated to optimize the materials uptake and materials release processes of this section. The coating can optionally involve biological agents, such as proteins, antibodies, DNA, or aptamers.

Also, the uptake and release of materials by nanofibers in these embodiments can be optionally measured by measuring weigh uptake, such as by using a surface acoustic wave device or a scale, by measuring electrical conductivity, or by measuring thermopower.

The materials used for the embodiments of this section are optionally preferably nanofiber sheets, ribbons, and yarns fabricated by a solid-phase process. The nanofibers are optionally preferably carbon nanotubes.

(i) Applications as Channels of Microfluidic Circuits

The porosity of twisted nanofiber yarns can be usefully used as channels of microfluidic circuits. These microfluidic circuits can be employed, for example, to make a centimeter scale or smaller "fiber laboratory" for chemical and biochemical analysis or, more exclusively, for chemical synthesis.

The novel aspect is to use the wicking capability of twisted nanofiber yarns for the transport of chemicals for subsequent possible mixing and chemical reaction, separation (optionally along yarn lengths), and chemical analysis.

Figure 13:
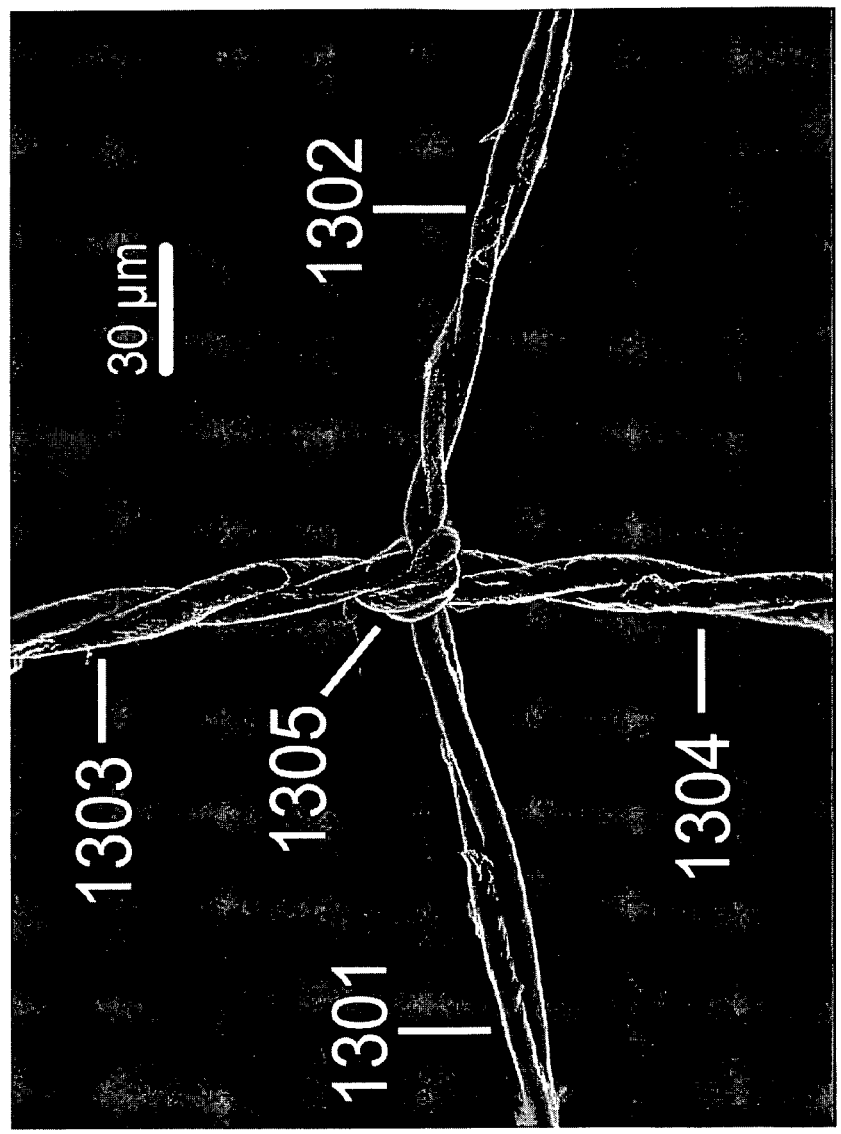
FIG. 13 shows an SEM micrograph of an overhand knot tied in one twofold MWNT yarn, so that the knot includes a second twofold MWNT yarn, wherein such intersections between initially independent yarns can be used as electrical junctions and as microfluidic junctions, and wherein the degree of interaction between the two yarns (electrical contact resistance and resistance to microfluidic mixing) can be varied by tightening the knot.

FIG. 13 shows a junction that could be used as a junction for microfluidic applications. This junction comprises an overhand knot (1305) tied in one twofold MWNT yarn (having fluid entrance along 1301 and fluid exit along 1302), so that the knot includes a second twofold MWNT yarn (with fluid entrance along 1303 and fluid exit along 1304). The nanofiber yarns in each of the twofold yarns can optionally differ and can optionally be different for the two twofold yarns. Depending upon the inserted tightness of knot 1305, optionally different fluids entering along 1301 and 1303 will mix to produce optionally different fluid mixtures exiting along 1302 and 1304. With increasing tightness of the knot, the fluid components entering at 1301 will increasingly exit along 1304 and the fluid components entering along 1303 will increasingly exit along 1302. Fluid transport along these yarns can optionally be varied by applying alternating or steady potentials between the entrance and exit portions of the twofold yarns and between component single yarns in each of the twofold yarns if the component singles yarns in each twofold yarns are electrically insulated with respect to each other and if these yarns are electrically conducting.

These and many other types of microfluidic circuits based on yarns can be optionally arrayed on a curved or linear surface to make the final device configuration. As another preferred configuration, these microfluidic yarns can be optionally woven, sewn, embroidered, or otherwise configured in a textile. To well define the microfluidic circuit, a fraction of the other yarns or fibers can be made substantially non-interacting with the microfluidic circuit, such as by appropriately choosing (or modifying) their hydrophobicity/hydrophilicity and/or porosity. These yarn-based microfluidic circuits can optionally comprise more than one textile layer, and microfluidic yarns in one textile layer can optionally traverse between textile layers. Also, the micro-fluidic nanofiber yarn structure (such as a yarn in a composite) can optionally provide mechanical reinforcement of a composite structure. Additionally, and optionally, said nanofiber yarn can contain a material, such as those known in the art, which mechanically reinforces a structure at the onset of yarn failure.

Such microfluidic circuits can optionally be used for various purposes, as for textiles in clothing that analyze biological products for health monitoring purposes. Also, microfluidic mixtures (like illustrated in FIG. 13 can be used for the mixture of fuel and oxidant for miniature fuel cells and combustion engines, which could be used for miniature robots or micro-air vehicles.

(j) Tissue Scaffold and Other Biological Applications

The spun yarns and sheets of invention embodiments can also be used as scaffolds for the growth of tissue in either culture media or in organisms, including humans. Examples of possible application include use of the nanotube yarns as scaffolds for neuron growth after brain or spinal cord injury. Recent work has shown (see H. Hu, Y. Ni, V. Montana, R. C. Haddon, V. Parpura, *Nano Letters* 4, 507 (2004); J. L. McKenzie et al., Biomaterials 25, 1309 (2004); and M P. Mattson et al., J. of Molecular Neuroscience 14, 175 (2000)) that functioning neurons readily grow from carbon nanotubes, and that carbon fibers having diameters of about 100 nm or less retard scar growth and facilitate desired cell growth. For the purposes of modifying biocompatibility, the spun nanotubes in the spun yarns and sheets can optionally be chemically derivatized or non-chemically derivatized, such as by wrapping with DNA, polypeptides, aptamers, other polymers, or with specific growth factors like 4-hydroxynonenal. The carbon nanotube yarns and sheets of invention embodiments can be produced free of any additives (but selected additives can be incorporated and the nanotube yarns can be derivatized if desired), are highly electrically conducting, and are very strong. Also advantageous for medical applications, and unlike other high performance fibers/yarns (like Kevlar® and Spectra® fibers used for antiballistic vests), these tough yarns are highly resistant to strength degradation due to either knotting or abrasion and have a controllable degree of substantial elasticity. These yarns can be woven into either two- or three-dimensional textiles that could serve as frameworks for the growth of blood vessels and nerves. The textiles could have virtually any desired topology: the inventors have made tubular structures from nanotube yarns and from wrapped spun ribbons that have the diameter of moderately small blood vessels (see Example 11). The nanofiber yarns of invention embodiments can be used as electrical connections to neurons in the brain, ear (for the detection of sound), or eye (for the detection of light), where functioning neurons are grown on the nanofiber yarn to make electrical connection to existing neurons. Neuron growth on the tip of nanofiber yarns having a diameter of less than 10 microns is optionally and preferably used for these applications.

One major problem in using scaffolds for tissue growth is in insuring appropriate elasticity of the scaffold both during tissue growth and after such growth has been largely accomplished. The situation is like the case of a broken bone—immobilization is desirable during the healing process, but it is desirable that normal mobility and elasticity returns after the healing process has satisfactorily progressed. The twisted nanofiber yarns provide this tunability of elasticity if the initial scaffold material is impregnated with a host material (such as relatively rigid bio-absorbable polymer), whose bio-regulated absorption frees the nanofiber yarn to have the elasticity associated with normal body function and mobility.

Because nanotube yarns are electrically conducting, mechanically strong, flexible, and chemically stable, they can be utilized for implantable biomedical devices such as implantable sensors and the inductor coils for implantable radio transmitters and transponders. Prior art technologies for using carbon nanotubes as biochemical sensors are well developed, as are demonstrated strategies for obtaining nanotube sensor selectivity and selectivity. Since it is also well known in the literature that functional neurons readily grow on carbon nanotubes, carbon nanotubes yarns and sheets could be used as a high-efficiency electronic interface to axons. The benefit of using carbon nanotube yarns and sheets for these applications, as opposed to other types of nanotube sheets and yarns, is in the combination of giant accessible surface area, high mechanical strength, high electrical conductivity, the absence of required binding agents, and the small obtainable yarn diameters and sheet thicknesses.

For some types of nanofiber synthesis and processing methods, which result in an undesired tendency for blood to clot on the nanofibers or nanofiber assembly, it is useful to coat the nanofibers with another material to prevent clotting. Amorphous carbon is one useful material that can be employed to prevent or reduce the clotting of blood. Other useful materials are proteins known in the prior art.

(k) Application of Nanofiber Sheets and Woven Textiles for Addressing Individual Elements in Two and Three-Dimensional Arrays The surprisingly high electrical anisotropy that the inventors observe for the electrical conductivity of nanotube sheets leads to another type of invention embodiment, wherein these sheets are used for addressing selected regions (or pixels) in two-dimensional or three-dimensional arrays. Example 23 shows that this electrical anisotropy varies from moderate values of typically 10-20 for densified carbon nanotube sheets, to higher values of about 50-70 for undensified sheets, to arbitrarily high values for either densified or undensified carbon nanotube sheets that have been appropriately pre-stretched orthogonal to the draw direction to increase the anisotropy of nanotube electrical conductivity.

In one type of such invention embodiments, two of these highly anisotropic sheets are placed parallel, with an orientation between the high conductivity directions in these sheets of $\Theta$. This angle between the orientation direction in the two sheets is optionally between about 30° and 90°, and optionally and more preferably about 90°. These sheets are separated by one or more coatings or layers providing an effective resistance between nanotube sheets that is much higher than for the current path along the nanotube sheets, so that the main reason for spreading of the current path in the sheets is due to deviation of sheet anisotropy from infinity.

The means to selectively provide a voltage at a desired position (pixel) in the material separating the nanotube sheets is provided by attaching electrical contacts along at least one lateral side of each sheet. These contacts are preferably spaced as a linear array that is at least approximately orthogonal to the nanotube orientation direction in each sheet. The spacing between electrical contacts on a lateral sheet side is measured by distance component orthogonal to the orientation.

This means for selectively addressing different pixels can be used for selectively addressing elements for various purposes, depending upon the nature of the resistive material that separates nanotube sheets.

The material at these different pixels, and separating the two nanotube sheets can be a sensor materials for (1) mechanical stresses (like a piezo-resistive material, a piezo-electric or polled ferroelectric, or a dielectric providing a charged inter-sheet capacitance depending upon intra-pixel stress and strain), (2) local temperature, (3) a photodetector material for local visible, infrared irradiation ultraviolet, or higher energy gamma or particle radiations (based, for example, for the material between the nanotube sheets, on photo-induced conductivity, resistance change due to heating, or (4) an artificial noise (for gas sensing) or artificial tongue (for liquid sensing) using intersheet pixel area materials that are responsive to materials that are in liquids or gases, especially including biological materials. Note that the materials of (1) can be used to provide computer screens and electronic textiles that enable data input using sensed changes in electrical conductivity or electrical signals generated by touch.

The material separating the nanotube sheets in the pixel region can be a material or material assembly that either emits light or changes color in direct or indirect response to a voltage applied to the pixel. Light emission at a pixel at visible, infrared, and/or infrared wavelengths can be achieved by various means, including fluorescence, phosphorescence, or incandescence. For example, the material separating the pixel region of the nanotube sheets can be the materials and material assemblies used in the prior art for light emitting displays. Alternatively, the material separating a pixel region of the two nanotube sheets can be a resistive material that emits incandescent light (or predominately incandescent light only in the infrared region as a result of low temperature heating). Emission of infra-red light by fluorescent or incandescent means can be used to help reduce the visibility of an article with respect to background for military applications.

In other useful embodiments the high resistance material or material assembly between the pixels of the two nanotube sheets can be one that provides a color change. Examples are those that provide a color change as a result of heating (such as a thermochromic organic polymer, a thermochromic inorganic material, or a thermochromic liquid crystal), a electrochromic material (like a liquid crystal), or an electrochemically chromatic material (like an electrochemically switchable conducting organic polymer containing electrode attached to the first nanotube sheet that is separated by an electrolyte from a counter electrode attached to the second nanotube sheet).

The responsive layer or coating between the sheets can be conveniently applied by various means, such as by coating the individual nanotube sheets with one or more layers before laminating the nanotube sheets. The material deposited as resistive material can vary in composition across the inter-sheet region, by deposition the inter-sheet material or materials in a spatially graduated manner, using the methods used to make elements for combinatorial chemistry. These methods are especially useful for making smart noses or smart tongues.

The space between two orthogonal sheets comprising oriented nanofibers can also be usefully separated by air, other gas, or vacuum. A novel matrix addressable bolometer using an air, other gas, or vacuum gap is illustrated in Example 54.

More than two nanotube sheets (or directly contacting nanotube sheets stacks) can be used to provide three-dimensional pixilation when the responsive material layer separates adjacent nanotube sheets (or neighboring nanotube sheet stacks). Each nanotube layer (or stack or identically oriented nanotube sheets) can then be independently addressed similarly to the case where there are only two nanotube sheet layers (or contacting stacks of identically oriented nanotube sheet stacks).

The methods of these embodiments can also be applied when the neighboring non-electronically contacting nanotube sheets are replaced by two textile sheets comprising carbon nanotube yarns that are electronically insulated with respect to intra-sheet or inter-sheet contact (except in regions where the responsive material or responsive material assembly is located). The responsive material between the textile layers can be provided by coating the responsive material or responsive material layers onto the yarns before or after assembly of the nanotube yarns into the textile. If nanofiber yarns in a textile layer go in more than one direction within a given textile layer, these yarns in different directions should be substantially electronically insulated with respect to each other than by mutual contact through a resistive responsive material or responsive material array.

These methods can also be applied to a single fabric sheet to obtain the desired pixilated behavior by placing the nanofiber yarns in two directions and insulating all yarns in the fabric by location or covering so that there is no direct contact. The lowest resistance contact between neighboring yarns should be through the electrically responsive material or material assembly. In such case the pixilated response is provided by individually addressing the individual nanotube yarns in the textile.

Such electrically anisotropic sheet and textile structures can optionally be used for information storage, by utilizing resistive response elements that undergo either permanent or reversible change in resistivity or capacitance as a consequence of ether an applied voltage (such as liquid crystal), a voltage-driven current flow (such as a conducting polymer electrochemical switch), or a combination thereof. For the permanent storage of information the responsive element can be simply and element that evaporates (opening the circuit) or carbonizes (closing the circuit) as a result of a pixel being addresses.

Alternatively, either permanent or reversible storage and retrieval of information (or permanent record of localized radiation exposure) can be obtained by writing and or removing the information using radiation (such as light) and reading this information, and/or switching pixel response in the opposite direction using the pixel addressing capabilities of the above sheet, textile, or optionally combined sheet and textile arrays.

These methods can optionally be applied to electronically conducting nanofiber yarns and electronically anisotropic nanofiber sheets that do not comprise carbon nanotubes or comprise carbon nanotubes in combinations with other nanofibers.

Figure 33:
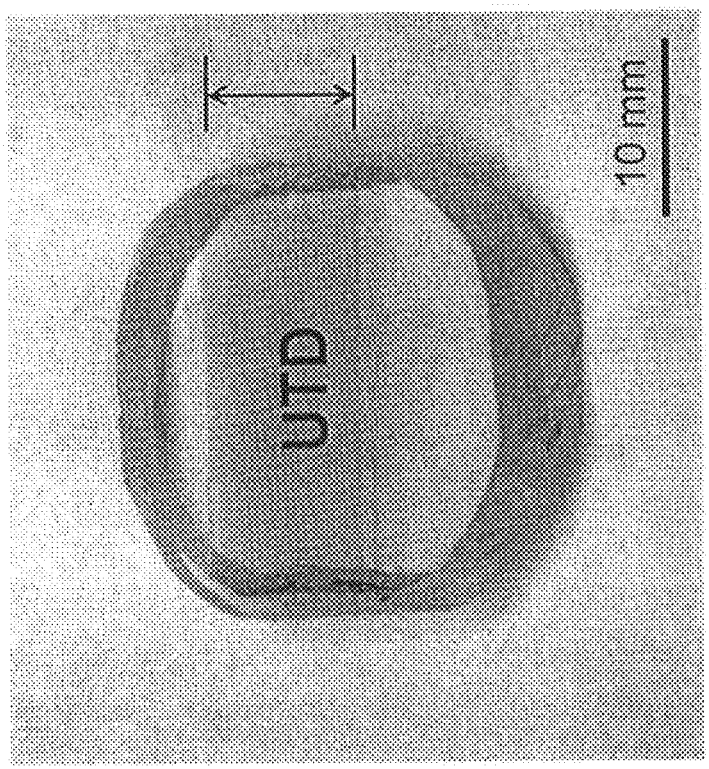
FIG. 33 is a photograph of two 5-mm thick Plexiglas plates that have been welded together by microwave-induced heating of an as-drawn MWNT sheet that was sandwiched between these plates, wherein this welding process maintains the electrical conductivity, nanotube orientation, and transparency of the nanotube sheet.

(l) Welding with Fusible Material and Surface Modification Using Selective Nanofiber Heating at Frequencies in the Microwave, Radio, Ultraviolet, Optical, and Infrared Regions and by Electrical Heating Example 30 shows polymer welding through heating of a transparent MWNT sheet that is sandwiched between plastic parts. The MWNT sheets strongly absorb microwave radiation, as evidenced by their use for this welding of plastic parts in a microwave oven. In this example, two 5-mm-thick Plexiglas® plates were firmly welded together using the heating of a sandwiched MWNT sheet to provide a strong, uniform, and highly transparent interface in which nanotube orientation and electrical conductivity are maintained. The microwave heating was in a 1.2 kilowatt microwave oven that operates at 2.45 GHz. FIG. 33 shows two 5-mm thick Plexiglas (polymethyl methacrylate) plates that were welded together using microwave heating of a sandwiched MWNT sheet to provide a strong, uniform, and transparent interface in which nanotube orientation and sheet electrical conductivity is little changed. The combination of high transparency and ultra-high thermal stability provide advantages not found for the conducting polymers previously used for microwave-based welding. Among other applications, this microwave heating process can be used to make polymer composites from stacks of polymer sheets that are separated by nanotube sheets, car windows that are electrically heated, and antennas in car window that have high transparency.

Welding of contacting fusible materials by selective heating of nanofiber sheets can be similarly accomplished using selective absorption of the nanofiber sheets at radio frequencies, infrared frequencies, optical frequencies, infrared frequencies, ultraviolet frequencies, and combinations thereof and combinations with microwave heating. Also, selective heating of a nanofiber sheet for welding nanofibers with a fusible material can be accomplished by electrical contact heating of the nanofiber sheet. The intensity and duration of the radiation-induced heating or the electrically induced heating processes should be sufficient for at least partial fusion of the contacted fusible material with the nanofibers. The intensity of the radiation and the electrical power delivered by electrical contact heating is preferably sufficiently high that liquidification of the fusible material occurs only locally in the contact region with the nanofiber sheet. Using region selective radiation delivery or region selective electrical contact heating, or a combination thereof, for the nanofiber sheet, the degree of welding with fusible material or materials can be arbitrarily provided in an area selected manner.

The choice of fusible materials for these processes is little constrained. However, it is preferable that the fusible material has sufficiently low viscosity at the fusion temperature that it is able to flow on the desired time scale needed for rapid processing. For the case where the fusible material is an organic polymer, the upper temperature of the fusion temperature is usually limited by the thermal degradation temperature of the polymer. However, the fusible materials for welding processes are preferably those that do not have significant absorption at the wavelengths used for heating. If the heating process is by electrical contact to the nanofiber sheet, the fusible material should be substantially electronically insulating.

The fusible polymers polycarbonate, polyvinylbutyral (marketed, for example, under the trade name Salflex®), polymethyl methacrylate, and polystyrene are especially preferred for the above described processes of inter-layer welding and the below described processes of surface welding. Also, inorganic and organic glasses are preferred.

For the case of welding using polyvinylbutyral, this polymer is optionally and preferably sandwiched between panes of glass. For processing using radiation induces heating of polyvinylbutyral, a glass/polyvinylbutyral/nanofiber/ glass stack or a glass/nanofiber sheet/polyvinylbuttral/nanofiber sheet/glass stack is preferably heated by microwave of other means.

The above-described electrical heating means and heating means by the absorption of radiation can be used to weld together sheets of fusible polymers and layers of fusible textiles (or a fusible sheet with a fusible textile) at an overlap region of these yarns and textiles, where a nanofiber sheet of invention embodiments is located.

Nanofiber sheets can be conveniently attached to the surface of a plastic or other fusible material by a related process, by sandwiching the nanofiber sheet between a low melting polymer and a high melting polymer, selected so that only the low melting polymer melts as a result of the temperature increase caused by radiation absorption or electrical contact heating of the nanofiber sheet.

These surface and interlayer bonding methods enable the incorporation of nanofiber-based antennas and heating elements in either the surface region of a fusible material or between layers of fusible materials, such as layers of a window.

Other benefits of such surface bonding processes are desirable mechanical properties enhancements for the surface region and the electrical conductivity provided by the nanofiber sheet. The surface energy of the nanofiber-incorporated surface region depends on the degree of heating generated infiltration of the nanofiber sheet.

When the degree of infiltration of the nanofiber surface area is incomplete, so that carbon nanofibers protrude from the surface, the result of this surface treatment process can be to provide a highly hydrophobic surface. Such a highly hydrophobic surface can be useful for avoiding water droplet condensation, which can be employed for avoiding fogging for optical elements.

The surface energy, and therefore the degree of hydrophobicity will be influenced by absorbed gases. This dependency can be eliminated and the surface can be made either hydrophobic or hydrophilic by intentionally absorbing either hydrophilic or hydrophobic materials (or materials having mixed hydrophobic and hydrophilic character) on the nanofibers or bundles of nanofibers that protrude from the substrate.

In addition, the surface can be reversibly electrically tuned between hydrophobic and hydrophilic by placing two parallel, non-contacting nanofiber sheets in the surface region, so that one of these sheets in completely imbedded and separated from the nanofiber sheet on the surface by an ionically conducting layer. Application of a potential between the two nanofiber sheets results in electrochemical charging of the nanofiber sheets and corresponding changes in sheet surface energy, which determines wetability. A suitable assembly for this purpose of obtaining tunable charges is wetability can be made by placing a nanofiber sheet upon the surface of a fusible material (or attaching it be other means if the surface material is not usefully fusible), layering upon this nanotube sheet a fusible solid-state electrolyte and then a nanofiber sheet (which then becomes the outer surface layer). Compression of this stack with a another material (that does not cause fusion or undesirable absorption of the actinic radiation used for radiation-based nanofiber heating or an electrical conductivity that interferes with electrical contact based welding) enables fabrication of the targeted two electrode outer layer separated by electrolyte when the actinic radiation or electrical contact heating is applied to cause fusion.

(m) Use of Substrate-Supported Nanofiber Sheets for the Patterned Deposition of Oriented Nanofibers Applicants find that localized mechanical stress can be used to transfer 30 nm or thinner layers of oriented nanofibers from one substrate (the transfer substrate) to another (the receiving substrate) as a patterned array that maintains nanofiber orientation.

Figure 37:
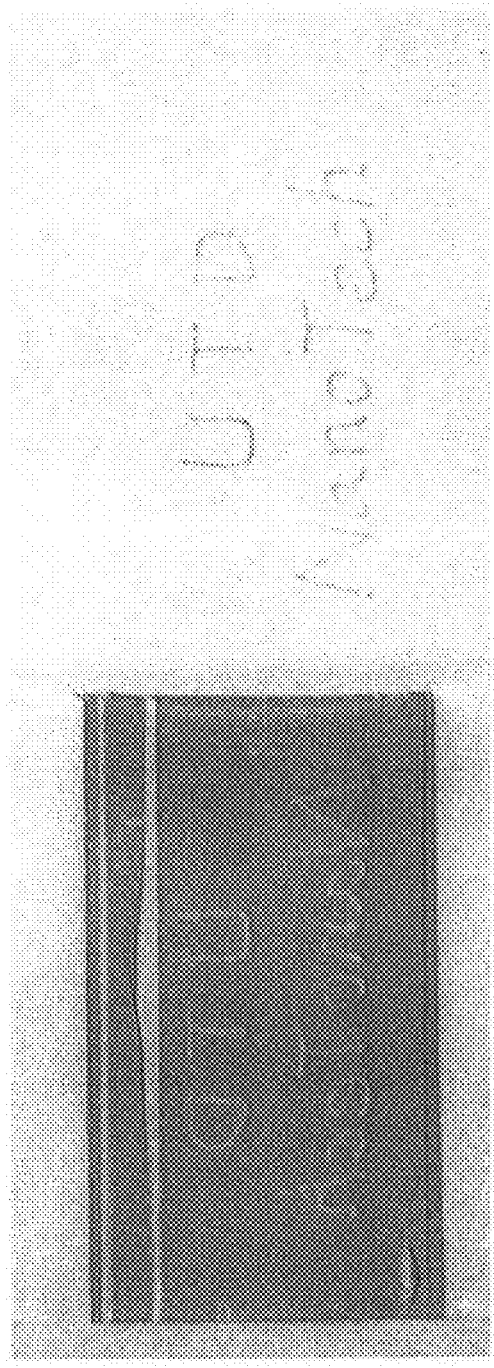
FIG. 37 shows that MWNTs in a MWNT sheet on one substrate can be mechanically transferred to produce a printed image ("UTD NanoTech") on another substrate. This transfer occurs without substantial loss of nanotube orientation. The picture on the left shows the MWNT sheet attached to the substrate (non-porous paper) after the transfer process and the picture on the right shows ordinary writing paper with the transferred image.

For instance, Example 34 and FIG. 37 show that substrate-supported carbon nanotubes in a 30 to 50 nm thick carbon nanotube sheet on one substrate can be mechanically transferred to produce a printed image having about the same thickness on another substrate. This transfer occurs without substantial loss of nanotube orientation. Placing the substrate-supported nanofiber sheet face down on standard writing paper and writing on the supporting non-porous paper using a sharp object, the nanotube sheet was transferred from the surface of a non-porous paper to the regular paper. The picture on the left in FIG. 37 shows the nanotube sheet attached to the substrate (non-porous paper) after the transfer process and the picture on the right shows ordinary writing paper with the transferred image.

Most important, optical microscopy on the transferred nanotube sheet regions shows that the nanotube alignment present on the original nanotube coated sheet is maintained in the nanotube pattern transferred to the porous paper. Hence, the orientation of nanotubes in transferred circuit patterns can be controlled at will by varying the relative orientation between the image producing sheet (the transfer substrate) and image receiving sheet (receiving substrate).

In the results of FIG. 37, the nanofiber sheet has been densified by the liquid treatment densification method of Example 23 before the nanotube transfer step. Other results in Example 34 indicate that an undensified nanotube sheet can similarly be used for printing patterned arrays of oriented nanofibers that have not been densified. This process is less attractive than the one using densified sheets, since the nanotubes where transferred to portions of porous paper that were not under the writing instrument. Nevertheless, the nanotubes that were transferred were much more firmly bound to the porous paper than those that were accidentally transferred, so the later could be easily brushed away without disturbing the intentionally transferred nanotubes.

This process has general applicability for nanofiber sheets that are oriented with respect to nanofiber direction. These results show that either densified or undensified nanofiber sheets can be used for depositing patterned arrays of oriented nanofibers.

As an alternative to using locally applied stress to provide patterned deposition of nanotubes from a nanotube sheet onto another substrate (the receiving substrate), the receiving substrate can be patterned (such as by lithographic or mechanical means) to have raised and lowered surface regions. Application of a uniform stress to the transfer sheet or other transfer substrate can then be used to transfer the nanotubes to the raised surface regions of the receiving substrate.

In another invention embodiment, selective area transfer (i.e., patterned transfer) of nanotubes from the transfer substrate to the receiving substrate can be achieved by depositing a patterned array of fusible material (such as polymer) on the receiving substrate. Contact of the transfer substrate with the receiving substrate, followed by heating to the fusion point and subsequent cooling, transfers the nanotubes from the transfer substrate to the receiving substrate. This heating can be optionally accomplished by microwave or radiofrequency heating of the nanotube sheet.

Such patterned arrays of deposited oriented nanofibers can be used for nanofiber circuit element fabrication, such as electronic wires and inter-connects, antennas, resistors, capacitors and supercapacitors.

Also, such transfer of nanotubes from the transfer substrate to the receiving substrate can optionally be repeated more than one time, such as to increase the thickness of deposited nanotubes in selected areas. Also, additional transfer, processes between transfer and receiving substrates can be used for reducing part of all of the anisotropy of a region of transferred material. For instance, this can be done by changing the orientation between transfer and receiving substrates during successive printing processes. In addition, a first deposition process can be followed by a coating process of the entire receiving substrate (or any portion of it) with another material (such as a solid state electrolyte for a film supercapacitor or a dielectric for an ordinary capacitor). This second coating process can then be followed by additional transfer of nanotubes from the transfer substrate (or a second transfer substrate) on top of the material provided by the second coating process. Such methods can be repeated at will to develop multilayer structures.

(n) Nanofiber Sheet Appliqués

Example 31 shows that a transparent carbon nanotube sheet can be attached to an adhesive film as an electrically conducting layer providing microwave absorption and the electrical conductivity needed for resistive heating. In addition, this example shows that the adhesive on adhesive films can extrude though the nanotube sheet to provide high adhesion of the laminated adhesive film/nanotube sheet to metal, glass, plastic, and other surfaces. When attached to a flexible substrate (such as a polymer film), this example (and FIG. 34) shows that the tape/nanotube sheet/plastic sheet can be repeatedly bent to high angles without causing a significant change in the in-plane resistance of the nanotube sheet.

Example 42 describes equipment for the manufacture of nanotube sheets attached to adhesive tape. Examples 50, 51, and 52 show means for storing nanotube sheets after fabrication and these means can be used for subsequent attachment of the nanotube sheets to adhesive sheets.

(o) Nanofiber Sheet Filters

Simultaneously achieving high filtration rate and the ability to filter very small particles, such as viruses, bacteria, and nanometer scale colloidal particles, is ordinarily problematic for filtration of both gaseous and liquid media. The problem is that small pore sizes provide low filtration rates, especially if the filter is thick. While filtration rate can be increased by decreasing filter thickness, the pressure differential between opposite sides of the filter must then be reduced because of possible rupture of the filter when the filter thickness is small—which partially eliminates the rate advantage of using a thin filter membrane.

The solid-state drawn nanofiber sheets of invention embodiments can help solve this problem by providing filtration membranes that are so strong that filter membrane rupture is less of a problem even when the nanofiber filter is very thin.

The present invention embodiments provide a filter structure comprising a solid-state drawn nanofiber sheet or sheet laminate having small pore size is attached on at least one size by a thicker membrane having larger pore size. The average pore of the thicker membrane is chosen to be at least two times smaller in largest dimension than the typical nanofiber length.

If the nanofiber sheets are highly oriented, two or more sheets can be optionally laminated with crossed directions of nanofiber orientation so that low lateral strength orthogonal to the orientation direction in one sheet is reinforced by the high strength in the orientation direction for a laminated sheet.

A greatly enhanced effective load-carrying capability of the nanofiber membrane preferably results from the spanning of individual nanotubes across the contacting pores in the supporting filter structure. The benefit of this arrangement is that the resistance to filter rupture is determined by the strength of the individual nanofibers, which are generally much higher than that of the sheet. Hence, the filtration rate benefit of using very thin sheet thicknesses can be achieved without incurring the risk of membrane rupture when a high pressure drop is applied across the filtration membrane.

The porous material supporting the nanofiber sheet membrane should be on the low pressure side of this membrane, and can optionally be chosen to trap larger size particles. For purposes of membrane cleaning by application of a reversely directed pressure difference across the membrane, the nanofiber sheet membrane can optionally be supported on both sides by a thicker membrane having much smaller pore size.

The supporting membrane or membrane with larger pore size can be any of the various conventional membrane types, and can optionally comprise fibers or nanofibers. Alternatively, the supporting membranes can be a sheet material that contains holes or channels, such as a metal wire grid, metal plate containing holes, or a sheet of anodized aluminum.

The nanofiber membrane preferably comprises carbon nanotubes and these at least one membrane in a possible membrane stack is preferably assembled by a processing step of this invention that involves solid-state assembly (such as the processes of Example 21, 50, and 52). The solid-state fabricated sheets are preferably densified, such as by the liquid-based densification process of Example 23. However, especially for the purpose of gas filtration, such as air filtration, the nanofiber sheet can optionally comprise undensified nanofiber sheets.

It should be understood that this invention embodiment is applicable to both planar and non-planar filters. A particularly preferred non-planar membrane is a cylindrical or conical membrane. Also, nanofiber based membranes can be conveniently used for cross flow filtration, which minimizes filter clogging by passing the liquid to be filtered tangentially to the filter membrane.

(p) Additional Applications of Nanofiber Sheets and Ribbons as Transparent Conductors The applications of solid-state drawn carbon nanotube sheets (and ribbons) as transparent conductors are diverse, and are in some cases facilitated by nanofiber sheet strength, toughness, microwave absorption capability, polarized emission and polarized absorption capability, tunable work function, extreme flexibility without degradation of electrical and thermal conductivity, and nanotube sheet porosity.

Some of these are applications modes described in the Examples: Example 14 on transparent substrates and electrodes for optically monitorable cell growth, Example 25 for transparent sensors having low noise and a low temperature dependence of electrical conductivity, Example 29 on a transparent source of polarized incandescent light, Example 30 on a transparent layer for microwave welding of plastic and for microwave bonded transparent coating layers (for EMI shielding, antennas, and heating elements), Example 31 on transparent appliqués, Example 32 on transparent elastomeric electrodes, Example 33 for transparent organic light emitting diodes, and Example 34 for transparent printed circuit elements.

The transparency in combination with electrical conductivity is also especially useful for making transparent and low visibility supercapacitors, such as planar sheet supercapacitors of those that are conformal to a surface. Such transparent or low visibility supercapacitors preferably comprise two nanotube sheets that are separated by an electrolyte.

Sheet transparency is also useful for using carbon nanotube sheets and ribbons for electromagnetic interference (EMI) shielding. For instance, the transparent nanotube sheets can be used to provide EMI shielding for optical displays, such as computer screens.

Also, both transparent nanotube ribbons and non-transparent nanofiber ribbons (optionally helically wrapped) can be used for the outer EMI shielding covering for coaxial wires and cables, wherein the interior regions of the wire of cable contains the signal or power transporting component and the nanotube EMI covering is separated from this inner signal or power transporting component by an electronically insulating layer. EMI shielded wires of such type are especially useful for application in electronic textiles (where they can provide the combination of low visibility and structural reinforcement of the coaxial wire).

The combination of electrical conductivity and transparency for nanotube sheets and ribbons is also usefully employed for heating elements that are transparent. These heating elements can be employed in electronic textiles for clothing applications, in automotive and aerospace vehicle windows, and for electrically heated furnaces and ovens (where the benefit is to provide high visibility for the heated contents of the furnace or oven). A substrate can be usefully and optionally employed for such transparent electrical heater for furnace or oven and said substrate is optionally a glass or quartz substrate.

Emitted light from the heating element of high temperature ovens can obscure the view of the furnace contents. This problem can be mitigated by using the polarized nature of light emission from oriented nanotube sheet or yarn heating elements (see Example 29). By placing a polarizing sheet or material with polarization dependent reflectivity between the viewer and the incandescent nanotube emitter, the visibility of furnace contents can be improved. The direction of preferential light absorption or reflection should optionally and preferably be parallel to the major polarization direction of the light emission from the nanotube sheet heating element (which is parallel to the nanotube orientation direction). The benefit of using a polarizing element that accomplishes polarization by largely non-absorptive means by reflecting light and infrared radiation back into the oven or furnace is to increase oven or furnace efficiency.

Transparent carbon nanotube sheet or ribbon coatings on windows, eyeglasses, and like devices (such as binoculars) can optionally be oriented so that the polarizing effect of the nanotube sheet minimizes glare. This can be done by orienting the nanotube alignment direction of the nanotube sheet so that it is at least approximately horizontal.

The use of transparent nanofiber sheets as one or more electrodes for newspaper-like displays, and other related displays, is also important. In such applications the nanotube sheets of invention embodiments provide the advantages of flexibility without loosing conductivity and transparency. The substrate for these potentially single-sheet newspapers can optionally be sheet materials like those for ordinary newspapers (or materials having similar properties), and updating the pages of these pages can potentially be based on currently available information, which could be transmitted wirelessly.

The chromatic change used for these newspapers can be those of a nanofibers sheet electrode in the newspaper, a liquid crystal based color change, a thermally driven color charge of a thermochromic material, an electrowetting driven color change, an electrochemical color change of a component in one of the electrodes (including electrochromic nanoparticles or an electrochromic coating contacting the nanofiber electrode), inter-electrode particles that rotate in response to an inter-electrode field to provide the color change, inter-electrode particles that rise or fall to provide the needed color change in response to an inter-electrode field, or by other means known on the art. An example of the use of electrowetting for an electronic paper display is provided by R. A. Hayes and B. J. Feenstra in Nature 425, 383 (2003).

The chromatic display of invention embodiments can optionally comprise a white, a near white, or a suitably colored first substrate upon which an electronically conducting, an optically transparent electrode that is either directly or indirectly attached to the first substrate, a second transparent electrode, and a material or material system that either directly or indirectly provides an electrically driven chromatic response, wherein at least one of the said transparent electrodes is a nanofiber electrode. This nanofiber electrode is optionally preferably a nanotube comprising electrode.

A nanofiber electrode in electronic newspaper and like chromatic displays can be optionally comprised or nanofiber sheets, ribbons, yarns, woven and non-woven yarns. These electrodes can optionally provide the major mechanical support for the display, such as an electronic newspaper, or can be a layer that is supported by another material or material assembly.

The details of the transmission of information to the newspaper (typically by wireless communication) are not the subject of this invention, and means are known in the art. However, the inventors demonstrate herein transparent nanofiber sheet electrode properties that are usefully employed for such electronic newspaper.

These electronically conducting, transparent nanofiber sheets can replace the brittle metal oxide sheets of the prior art for electrochemically provided text described, for example, by U. Back et al. in Advanced Materials 14, 845 (2002). These transparent, electrically conducting sheets can also replace the electrodes used for the tunable-wetting based displays described by R. A. Hayes and B. J. Feenstra in Nature 425, 383 (2003).

Example 52 describes means wherein nanofiber sheets can be attached to cellulose-based papers and sheets, and these methods are generically applicable for these invention embodiments.

(q) Elastomerically Deformable Nanofiber Sheets

Examples 32 and 90 demonstrate a method wherein transparent carbon nanotube sheets can be transformed into highly elastically deformable electrodes, which can be used as electrodes for high-strain artificial muscles and for conversion of high strain mechanical deformations to electrical energy, and for the tunable dampening of large amplitude mechanical vibrations. The illustrative actuator material is a silicone rubber.

Figure 35:
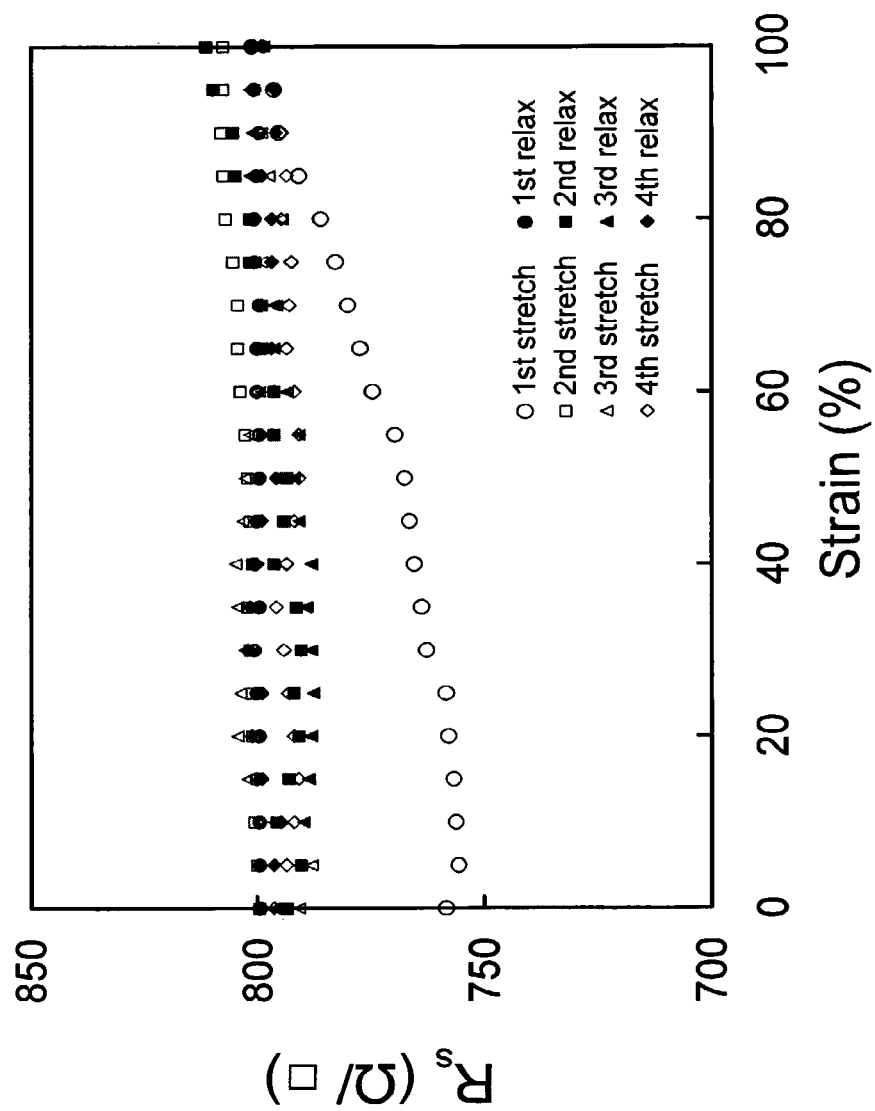
FIG. 35 shows that 100% elongation of a silicone rubber sheet with attached MWNT sheet causes little change in the sheet resistance of the MWNT sheet (uncorrected for geometry change in going from stretched to contracted state).

These elastomeric nanotube sheets can undergo over 100% change in dimension will substantially maintaining in-plane resistance. As shown in FIG. 35, the initial sheet resistance of the obtained unloaded silicone rubber/MWNT sheet composite was 755 ohms/square. However, after an initial increase in resistance by ~6%, the resistance changed less than 3% during the subsequent four strain cycles to 100% strain.

Ordinary conductors cannot undergo nearly such large strains without losing electrical contact with the actuating material. While conducting greases are used to maintain electrical contact to electrostrictive actuator materials that generate 100% or higher strains (R. Pelrine, R. Kornbluh, Q. Pei, and J. Joseph, Science 287, 836 (2000)), these greases are not suitable for use as electrodes for stacks of electrostrictive sheets that can generate large forces and high strains without requiring several thousand volt applied potentials.

Further experimentation (see Example 32) has shown the general applicability of this method of providing highly elastomeric electrodes on an elastically stretchable textile substrate. For example, attachment of an undensified nanotube sheet (prepared as in Example 22) to a 120% elongated elastomeric Spandex® fabric (by pressing and by subsequently applying the liquid-based densification process of Example 23) results in a nanotube electrode materials that can be elastically relaxed and re-stretched repeatedly to the initial elongation without undergoing a substantial resistance change. Suitable Spandex® fibers and/or textiles are made by DuPont (and called Lycra® fibers and Spandura® textiles), Dorlastan Fibers LLC, INVESTA, and RadiciSpandex Corporation.

For applications requiring a large range of elastic deformability for a nanofiber sheet or ribbon, the stretch of the elastomeric sheet before nanofiber deposition is preferably at least 4%, more preferably at least 10%, and most preferably at least 100%.

Woven textiles that are suitable as elastomerically deformable material substrates for elastic deformable nanotube sheets include those that are highly elastically deformable in one in-plane direction (like Spandura®) and those that are highly elastomerically deformable in two in-plane directions (like Tru-Stretch®, which is a Lycra® and Nylon® blend). The difference between these different elastomerically deformable textiles is well known in the art and is largely due to the ways that these textiles are woven and/or the chemical formulations of the component fibers or yarns.

This method of converting poorly elastically deformable sheets and ribbons to highly elastically deformable sheets and ribbons can be practiced for various sheets and ribbons comprising a host of different types of nanofibers and nanoribbons, some of which are described in Section 2. It is optionally preferable that these nanofibers and ribbons have a length of above about 10 microns, and more optionally preferably above 100 microns. Also, the ratio of nanofiber or nanoribbon length to nanofiber or nanoribbon thickness in the thickest lateral dimension is optionally preferably above 100, more optionally preferably above 1000, and most optionally preferably above 10, 000.

This described method of making nanofiber sheets and ribbons elastically deformable by attaching the nanofibers to an elastomerically stretched substrate can also be used for nanofiber and nanoribbon sheets that have little or no nanotube alignment in an in-plane direction.

Also, the initial stretch of the elastomerically deformable (or quasi-elastomerically deformable) substrate can be a biaxial stretch.

In addition to being applicable to porous elastomeric textiles (see Example 32), these methods for making nanofiber sheets and ribbons elastomerically deformable can be practiced for porous elastomer sheets (like porous silicone rubber sheets).

The nanofibers can optionally be directly formed as a sheet on a pre-stretched porous elastomeric sheet by filtration of nanofibers dispersed in a solution or super critical fluid. In such process a prestretched porous elastomeric sheet can optionally serve as a filter for nanofiber deposition. In such case, well known methods of forming aligned or unaligned nanofibers as sheets can be optionally employed.

The nanofiber sheets or ribbons suitable for the practice of these invention embodiments include the various methods of the prior art (see references in the Section on Description of the Background Art) for making sheet-shaped nanofiber arrays. These methods include various physical methods, such as solution filtration or magnetically assisted filtration methods, deposition from a volatizable liquid (such as by spin coating), coagulation of nanofibers dispersed in solution, deposition of nanofibers at a liquid-gas interface (such as by a Langmuir-Blodgett deposition process), deposition of nanofibers from a liquid crystal assembly in a liquid, deposition by centrifugation of a nanofibers dispersed in a liquid, shear deposition of nanofibers dispersed in a liquid, deposition of a nanofiber aerogel sheet (including such aerogel sheets formed directly or indirectly by CVD), and by deposition from a nanofiber dispersion in an acid or super acid.

The nanofibers or nanoribbons can be formed on a pre-stretched elastomeric substrate by any chemical methods known to produce nanofibers or nanoribbons, including, for example, CVD or plasma assisted CVD.

The nanotubes grown on or laminated with an elastomeric substrate can be a nanofiber forest. In such case the nanofiber forests can be grown on or laminated with an elastomeric substrate while the elastomeric substrate is either stretched or unstretched. Such application or nanotube forests on elastomeric substrates enables the controllable deformation of the elastomeric substrate so that an unspinable forest becomes spinable.

Example 90 shows that an elastomerically deformable nanotube sheet can be made by the process of Example 32 and then overcoated with a second elastomeric silicone rubber sheet, while retaining the ability of the nanotube sheet to be elastomerically deformed without producing a significant dependence of nanotube sheet resistance on elongation of the nanotube sheet. The importance of this demonstration is that it enables the fabrication of high strain actuator stacks comprising more that one layer of actuator material (such as an electrostrictive rubber like silicone rubber) and more than two electrodes.

This process can be conveniently extended to produce elastomerically deformable stacks comprising one or more nanotube electrode sheets that are laminated between sheets of elastomer, wherein the number of alternating nanotube sheet electrodes and elastomer sheet electrodes is arbitrarily large.

The method of this example and Example 90 can be used to produce inflatable balloons containing one or more layers of conducting nanotube sheets. To start the process of conducting balloon formation, the initial inner balloon layer can optionally be inflated using a gas or liquid or formed on a mandrel will in non-inflated state, and subsequently un-expanded before application of the first nanotube sheet.

(r) Elaboration on Artificial Muscle Applications

Electronically conducting nanofibers in yarns of invention embodiments can be used as either (a) a material whose dimensional changes provides actuation, (b) a material that delivers the electrical energy and other electrical effects that causes actuation-producing dimensional changes of another material, and (c) any combination of (a) and (b).

According to these differing natures of the origin of actuation, the nature of the nanofiber yarn used for actuation preferably changes. More specifically, highly twisted or highly coiled nanofiber yarns are preferred for applications in which the material providing the dimensional changes is not the nanofiber yarn.

A first example is a nanotube yarn in which the function of the nanotubes in a twisted yarn is to provide electric heating that causes another material to produce actuation. In this case, the twisted nanofiber yarn should optionally and preferably be highly twisted so that it provides a reduced contribution to yarn stiffness in the yarn direction and the possibility of long reversible dimensional changes in the yarn direction. In this case the helix angle of twist (measured with respect to the yarn direction) is preferably above 50° and more preferably above 70°.

As an alternative to using a yarn that is highly twisted in order reduce the effects of yarn mechanical stiffness on displacements caused by an actuating material, the nanofiber yarn can be suitably plied so that the orientation of the nanofibers in the plied yarn is at a large angle with respect to the direction of the yarn. FIG. 3A shows this achieved effect of yarn plying on providing such large angle orientation.

Materials suitable for undergoing large dimensional changes when heated are well known in the art. These include, for instance, the Veriflx™ polymer of Cornerstone Research Group Inc. (see E. Havens et al., Polymer Preprints 46, 556 (2005)), thermoplastic polyurethanes, such as the aromatic polyester based thermoplastic polyurethane called Morthane that is available from Huntsman Polyurethanes (see H. Koerner et al., Polymer 46, 4405 (2005), H. Koerner et al., Nature Materials 3, 115 (2004), H. M. Jeong et al., 37, 2245 (2001), and H. Tobushi et al. 5, 483 (1996)), liquid crystal elastomers (see J. Naciri et al., Macromolecules 36, 8499 (2003), D. K. Shenoy et al., Sensors and Actuators A 98, 184 (2002), and D. L. Thomsen, et al., Macromolecules 34, 5868 (2001)), biodegradable shape memory polymers (see A. Lendlein and R. Langer, Science 296, 1673 (2002)), shape memory polymer networks based on oligo(∈-caprolactone) (see A. Lendlein et al., Proceeding of the National Academy of Sciences, 98, 842 (2001)), shape memory polymers based on cross-linked polycyclooctene (see C. Li et al., Macromolecules 35, 9868 (2002)), and hydrogels that display shape memory behavior (see, for example, the poly(vinyl methyl ether) hydrogels in R. Kishi et al., Journal of Intelligent Material Systems and Structures 4, 533 (1993)).

The highly twisted electrically conducting nanofiber yarns of invention embodiments provide a means for electrically heating such shape memory polymers to obtain actuation of the shape memory material while at the same time insuring by using a high yarn twist that the yarn does not excessively interfere with yarn direction actuation. The shape memory polymers are preferably infiltrated in the nanofiber yarns or overcoated on them, or both infiltrated and overcoated.

The shape memory polymer contacting the nanofiber yarn can optionally include other conducting aids, such as conducting nanofibers or particles (like carbon black), or combinations or conducting particles and nanofibers. These optionally used conducting nanofibers, nanoparticles, or combination of conducting nanofibers and nanoparticles is preferably electrically percolated and electrically contacting the twisted nanofiber yarn.

The elastomerically deformable nanotube sheets of Section 10(q) can also be used to provide electrical heating that causes actuation of shape memory polymers. The elastomerically-deformable nanotube sheets are optionally and preferentially attached on opposite sides of a shape memory polymer sheet. Electrically heating these two nanofiber sheets to provide at least approximately the same level of power dissipation (per unit area) for both sheets is usefully employed for obtaining uniform changes in the length (or length and width) of a shape memory sheet. On the other hand, electrically heating the two nanofiber sheets on opposite sides of the shape memory polymer sheet to different extents (or electrically heating only one of these sheets can be used to provide cantilever type bending of the shape memory sheet.

As an alternative to using a highly twisted nanofiber yarn as an electrode for such actuators in which yarn direction as the actuation direction, the nanofiber yarns of the present invention embodiments can be helically wrapped around the actuating material. Optionally, the actuating material can be infiltrated into such helically wrapped nanofiber yarn. The benefit of helical wrapping, and especially high twist helical wrapping, is to limit the mechanical effect of the nanofiber yarn on the actuation direction stroke of the actuating material.

The electrically conducting highly twisted nanofiber yarns of invention embodiments and the elastomerically deformable nanotube sheets of Section 10(q) can also serve as electrode materials for artificial muscles in which gel actuator materials or conducting organic polymers predominantly provide actuation. This gel actuator response can, for example, be caused by electrochemically generated pH changes of a liquid electrolyte that causes the expansion or contraction of the gel in part because of changing degree of gel hydration. Polyacrylonitrile is an optionally preferred material for the gel actuators. Methods for using this polymer are described by H. B. Schreyer in Biomacromolecules 1, 642 (2000). Suitable conducting polymers as the predominately actuating material are described by R. H. Baughman in Synthetic Metals 78, 339 (1996) and in numerous other literature reports.

(s) Applications as a Heat Pipe

The nanofiber yarns can be braided or more simply configured as high performance heat pipes that combine high strength and high toughness with high effective thermal conductivity.

These heat pipes will function like conventional heat pipes, in that heat transport is largely a result of evaporation of the working fluid at the hot end of the heat pipe to absorb thermal energy and the condensation of the working liquid at the cold end of the heat pipe to release thermal energy. The nanofiber yarn functions to wick the working fluid between the hot and cold ends of the heat pipe.

Figure 105:
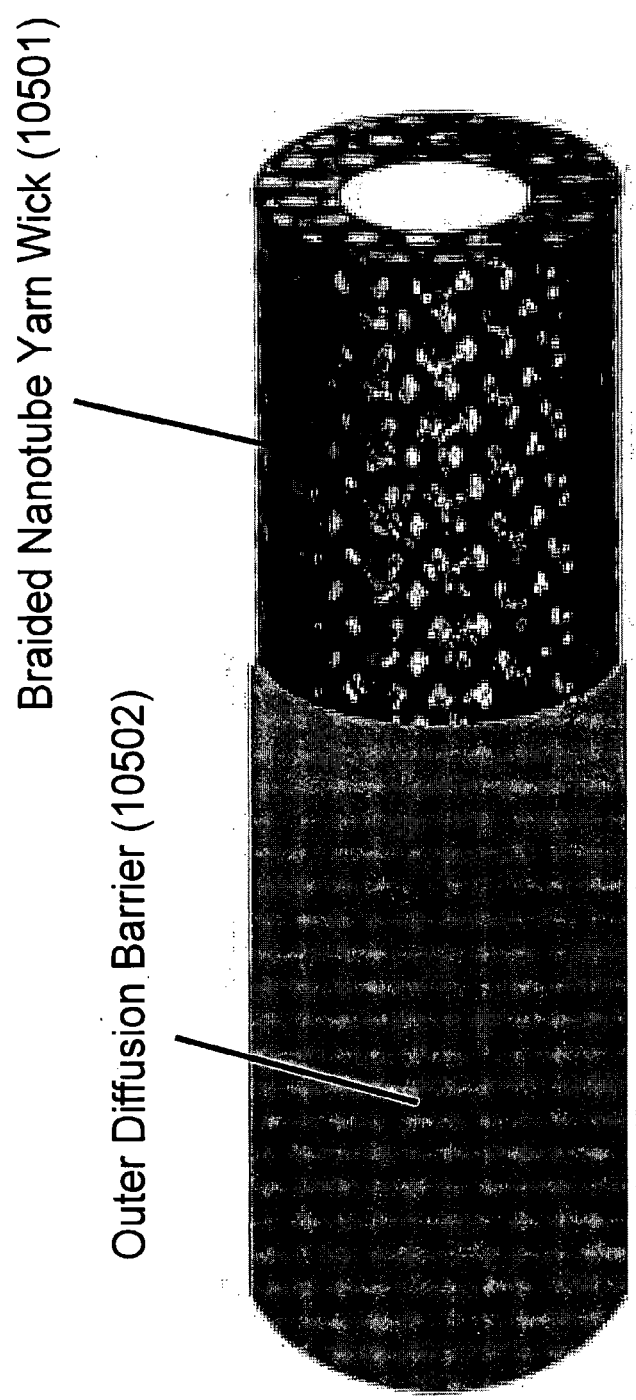
FIG. 105 schematically illustrates a carbon nanotube yarn based heat pipe.

FIG. 105 schematically illustrates a heat pipe that uses a hollow braided carbon nanotube yarn wick (10501), which is sealed with respect to loss of the working fluid using an overcoat (polymer or ceramic) that serves as an outer diffusion barrier (10502) or by incorporation of the yarn heat pipe into a matrix.

The nanofiber wick material can be optionally chemically or physically treated so that wetting occurs for the working liquid of the heat pipe, or so as to enable wetting of only the outer region of the nanofiber wick, and thereby enabling the inner region to function as a gas transport region. Using this strategy, plied nanofiber yarns can be conveniently used as the wick. The result is that one component of the nanofiber wick provides wicking and a second component of the wick (and space external to unwetted yarn components) provides the vapor path. The fluid and vapor transporting yarn components in a nanofiber heat pipe can optionally be fundamentally different yarns, like MWNT yarns and Kevlar® or Spectra® fibers.

Various well known working fluids like water and methanol can be used, which have a useful working range of −5 to 230° C. and −45 to 120° C., respectively. For very high temperature application materials like potassium or sodium as the working liquid, which have working ranges of 400 to 800° C. and 500 to 900° C., respectively.

Less than 20 µm diameter heat pipes can be made using these approaches, although much larger diameter heat piper are more conveniently used for most applications. The smaller diameter yarn heat pipes could be woven into structural textiles, and could be incorporated into a structural textile or as individual yarn fibers into a resin to make a yarn heat pipe/polymer matrix composite.

(t) Nanofiber Sheets and Yarns as Highly Anisotropic Thermal and Electrical Conductors and Sensor Arrays The nanofiber yarns, sheets, and ribbons of invention embodiments can provide high electrical conductivity, high thermal conductivity, and high thermal diffusivity, as well as high anisotropy for these transport properties. These properties provide important applications embodiments.

For example, carbon nanotube sheets of invention embodiments can provide the following unique properties and unique property combinations useful for conductors of heat, temperature and electrical current: (1) high strength and toughness; (2) high electrical and thermal conductivities; (3) high absorption of electromagnetic energy that occurs reversibly; (4) low temperature coefficient of resistance; (5) very low 1/f noise, where f is the frequency of AC current, which makes such conductors very good transmission lines; (6) high resistance to creep; (7) retention of strength even when heated in air at 450° C. for one hour; and (8) very high radiation resistance even when irradiated in air.

Example 11 provides measurement results showing the high electrical conductivity of the carbon nanofiber yarns. The high electrical conductivity and high anisotropy of carbon nanotube sheets of invention embodiments is shown by the results in Example 23, where it is also shown that sheet resistance changes little as a result of liquid-based densification of a nanofiber sheet by a factor of over 300, though the electrical conductivity changes by about this factor of over 300 as a result of the decreased cross-section that results from densification.

An extremely high thermal diffusivity (D of above 0.1 m$^2$/s) and a high thermal conductivity of solid-state drawn MWNT nanofiber sheets (K=50 W/mK) of the present invention (see preparation in Example 21) allows for rapid highly anisotropic transfer of temperature fluctuations to column and/or row electrodes of a matrix addressable sensor with minimal energy dissipation (see Example 54).

The low thickness and density of free-standing carbon MWNT sheets of invention embodiments make the very attractive for bolometric materials, as shown in Examples 54 and FIG. 54. The main advantages of a MWNT sheet as a bolometric material are: (1) an extremely low heat capacity (low inertia); (2) a high absorbance coefficient over a wide wavelength range, i.e., 0.2-20 µm; (3) an emissivity coefficient close to unity (as for graphite); (4) a high degree of flexibility; (5) resistance to radiation damage; and (6) suitability for use in high magnetic fields. At the same time, the low thermal coefficient of resistivity (TCR), $\alpha$=−7.5×10−4 K−1 is a limiting factor for thermal sensitivity in such materials. It is, however, an advantage for other sensor applications and for resistors with low temperature dependence.

For a position sensitive bolometer, an array of highly aligned nanofiber sheets can be fabricated by various means (for details see Example 54). For example, this can be done by (a) drawing highly-aligned nanotube sheets from the side of a carbon nanotube forest and (b) attaching the nanotube sheets to two sides of a substrate, wherein such a substrate is a solid or flexible substrate comprising an array of metallic electrodes having a rectangular opening in a central region so as to form orthogonally-oriented suspended sheets on opposite sides. Each of these side electrodes can be covered with a temperature-sensitive thin film. In one embodiment, a semiconductor film, e.g., $VO_2$ or other material with high temperature coefficient of resistivity is deposited on metallic electrode pads so as to form serial resistance with a carbon nanotube interconnected network. The serial resistance of the carbon nanotube network and semiconductor films between column and row electrodes is measured in order to create a thermal image of a radiating object. In other embodiments, the metallic pads are covered with complimentary pairs of thermoelectric materials, e.g., iron on one side and constantan alloy on the other.

The application of high nanofiber sheet thermal conductivity and diffusivity for electronic part cooling is described in Example 59.

Section 10(k) has shown how the high electrical anisotropy of nanofiber sheets of invention embodiments can be used for various applications, including pixilated sensors.

(u) Nanofiber Yarns and Textiles for Application as Cold Electron Cathodes for Field Emission of Electrons Nanofibers, and in particular carbon nanofibers, are well known to be useful as electron field emission sources for flat panel displays, lamps, gas discharge tubes providing surge protection, and x-ray and microwave generators (see W. A. de Heer, A. Châtelain, D. Ugarte, Science 270, 1179 (1995); A. G. Rinzler et al., Science 269, 1550 (1995); N. S. Lee et al., Diamond and Related Materials 10, 265 (2001); Y. Saito, S. Uemura, Carbon 38, 169 (2000); R. Rosen et al., Appl. Phys. Lett. 76, 1668 (2000); and H. Sugie et al., Appl. Phys. Lett. 78, 2578 (2001)). A potential applied between a carbon nanotube-containing electrode and an anode produces high local fields as a result of the small radius of the nanofiber tip and the length of the nanofiber. These local fields cause electrons to tunnel from the nanotube tip into the vacuum. Electric fields direct the field-emitted electrons toward the anode, where a selected phosphor produces light for a flat panel display application and (for higher applied voltages) collision with a metal target produces x-rays for the x-ray tube application.

Cold electron cathodes that rely on electric field emission from carbon nanofibers of either SWNTs or MWNTs are well known and have already found commercial applications (Carbon Nanotubes: Synthesis, Structure, Properties, and Applications. Topics in Applied Physics, 80, Springer-Verlag, Heidelberg, 2000, pp. 391-425]. The threshold emission voltage for CNT cold cathodes is quite low: 1-3 V/µm (J.-M. Bonard, et al., Appl. Phys. A 69, 245 (1999)), particularly when compared to Si- or Mo-micro-tip cathodes (50-100 V/µm (C. A. Spindt J. Appl. Phys. 39, 3504 (1968))). Additionally, current densities of such CNT cold cathodes can be as high as $10^8$ A/cm$^2$ for SWNT cold cathodes, and comparably high for MWNTs cold cathodes (Y. Cheng, O. Zhou, C. R. Physique 4, (2003)). The prospects for applications of CNT field emitters in displays are very bright (R. H. Baughman, A. A. Zakhidov, and W. A. de Heer, Science 297, 787-792 (2002)), and several prototype devices comprising this unique material have already been fabricated. Namely, CNT-based electron source have been used in fluorescent lamps (A. K. Silzars, R. W. Springer, PCT/US96/13091, J.-M. Bonard, et al., Appl. Phys. Lett. 78, 2775 (2001), N. Obraztsov et al., Appl. Surf. Sci. 215, 214 (2003)), X-ray tubes based on CNT-cathodes (G. Z. Yue, et al., Appl. Phys. Lett. 81(2), 355 (2002)), and flat panel displays (N. S. Lee, et. al., Diamond and Related Mater. 10, 265, (2001), W. B. Choi et. al., Technol. Dig. SID. (2000)). Motorola recently developed a CNT-TV and Nano Proprietary Inc. announced a CNT cathode-based TV of 25 inches. Also, CNTs may find application in high-resolution electron microscopy as very bright point electron sources with low energy spread (de Jonge et al., Nature, 420, 393 (2002)).

For applications requiring low threshold voltages and high current densities from large area cathodes materials, the lifetime of existing cold cathodes is relatively short and the homogeneity is insufficient for high resolution display applications.

A critical problem hindering applications of these carbon nanotubes (CNT) cold cathodes is the need for methods of assembling these nanotubes into the framework of a macroscopic mounting system that is sufficiently strong and suitably shaped such that the properties of the CNTs for field emission can be effectively utilized.

Figure 77:
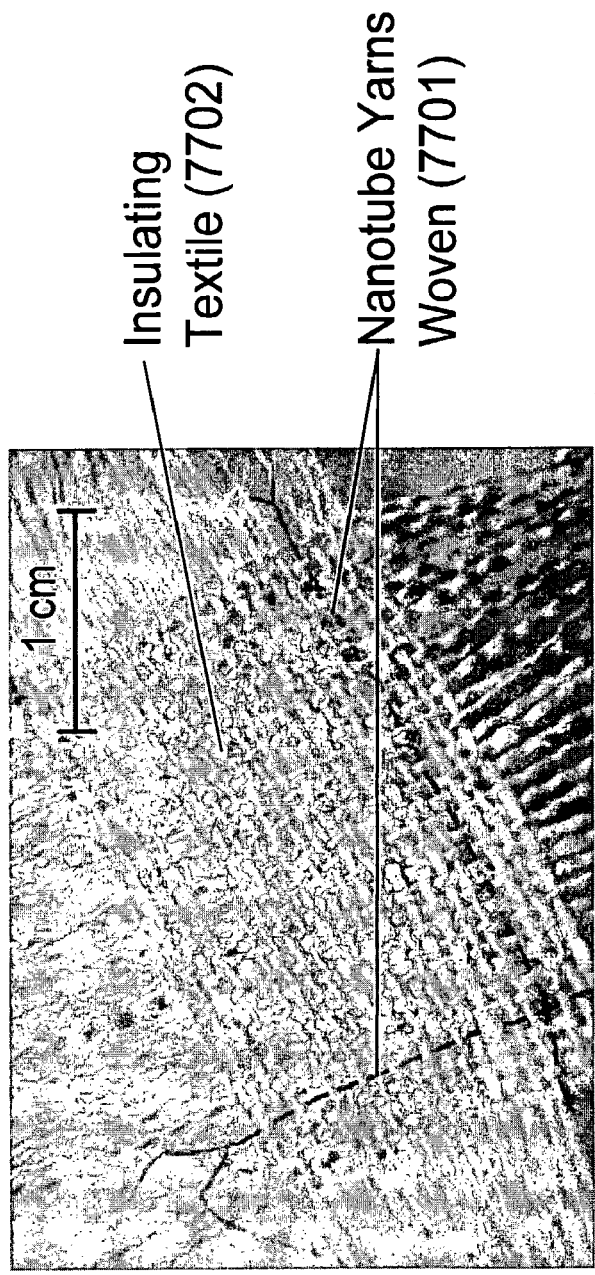
FIG. 77 illustrates the concept of using a textile for supporting electron emitting nanofiber yarns, wherein two electrically conducting nanofiber yarns are woven orthogonally into an otherwise substantially non-electron-emitting textile. This insulating textile (or one comprising electrically conducting nanofiber-free wires) provides a flexible support for the electron emitting nanofibers and enables their placement in a patterned manner within the textile for electron emission purposes. The textile and any of the components in the textile can serve for dissipation of generated heat, and the current density can be tuned by varying the density and topology of the woven structure.

Addressing many of the above-described limitations of the prior art, in some embodiments, the present invention is directed to nanofiber yarn cold cathodes, methods of making said yarn cathodes, and to applications of said yarn cathodes. Additional embodiments provide for making patterned structures of yarns, such as alpha numeric code and special symbols (shown in FIG. 71) and weaving yarns into "cathode textiles" (shown in FIG. 77). The yarns for use as cold cathodes can be made of not only multiwall carbon nanotubes, but also of single-wall carbon nanotubes and other diverse nanofiber material (such as conducting nanofibers and nanoribbons described in Section 2).

Figure 66:
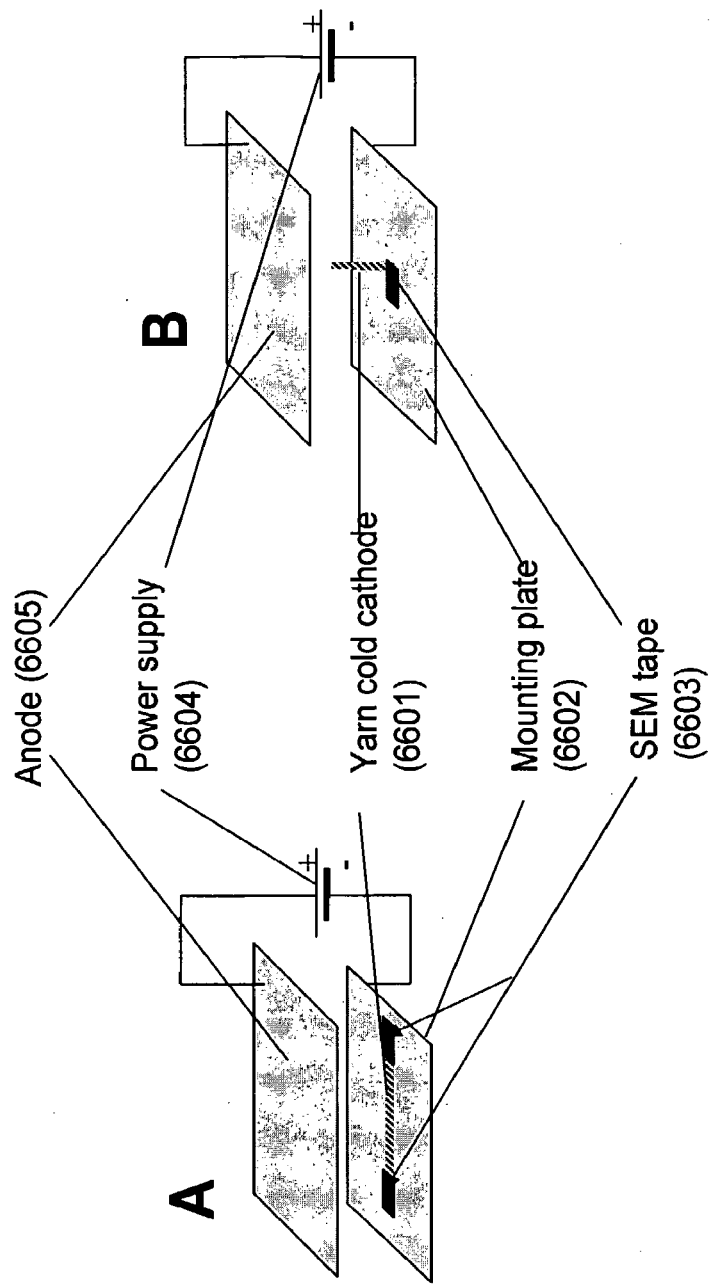
FIGS. 66 A and 66 B schematically illustrate (A) the geometries of lateral planar cathode and (B) a vertical single-end cathode for field emission from MWNT twisted yarns., respectively.
Figure 68:
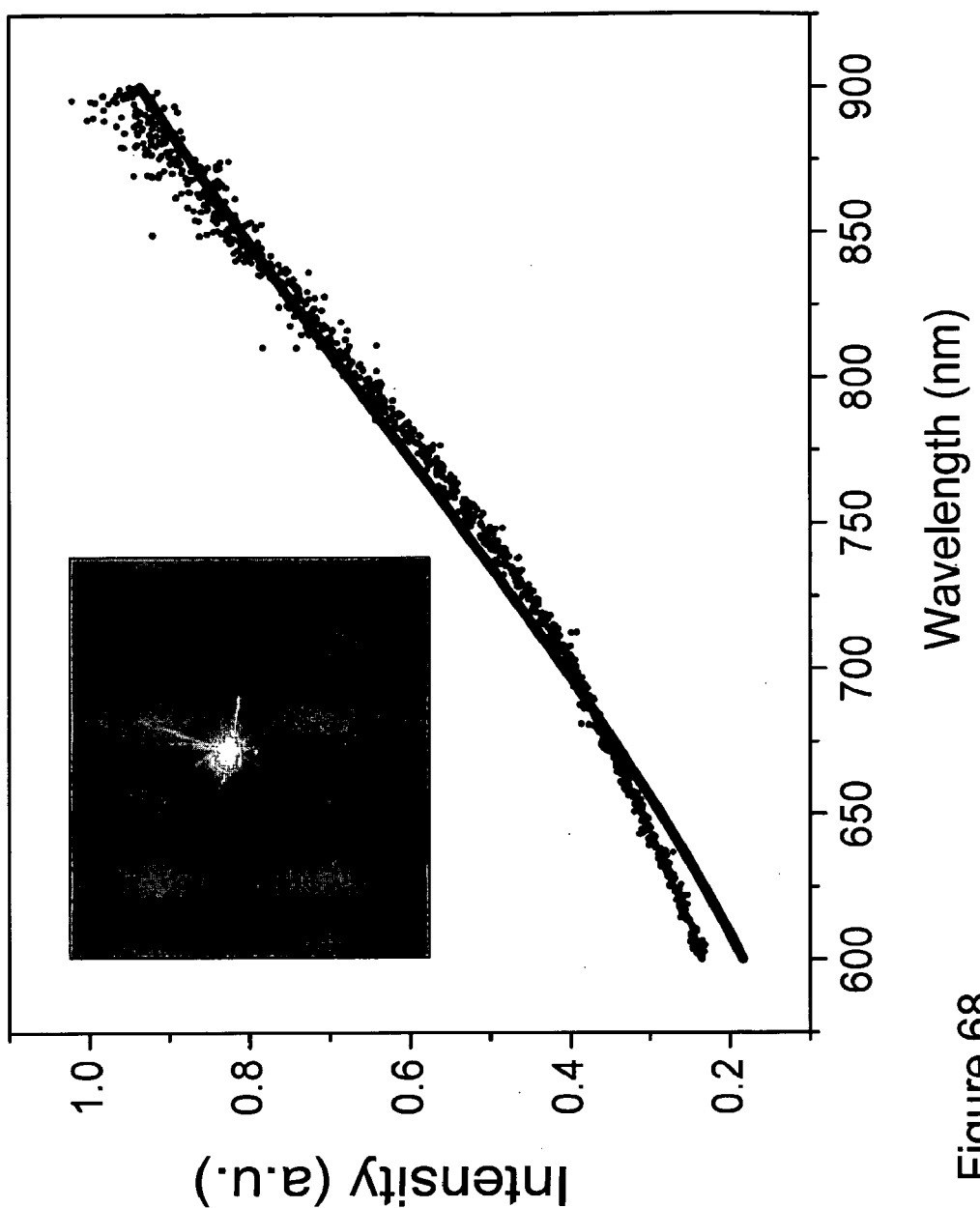
FIG. 68 shows the spectrum of light emitted from a single twisted MWNT yarn end, and the fit of this spectrum to Planck's black body radiation law (solid line). At high currents, this light emission from the nanotube yarn accompanies electron emission. The Inset shows a photograph of the incandescent light source that appears on the tip of the carbon nanotube yarn when using high current.

Most importantly, the yarn cathodes are easy to assemble in various architectures such as a single approximately vertical yarn tip (or an array of yarn tips) emitting from the end tip (FIGS. 66 B and 73). In such geometry the yarn (7301) is raised approximately vertically by the strong electric field lines (7303) which are concentrated on the tips of free ends of nanofibers (7302) at the cross section of the yarn. When very high voltages are applied, currents emitted by such numerous tips is so high, that light is emitted by an overheated yarn end, as shown in FIG. 68.

Figure 72:
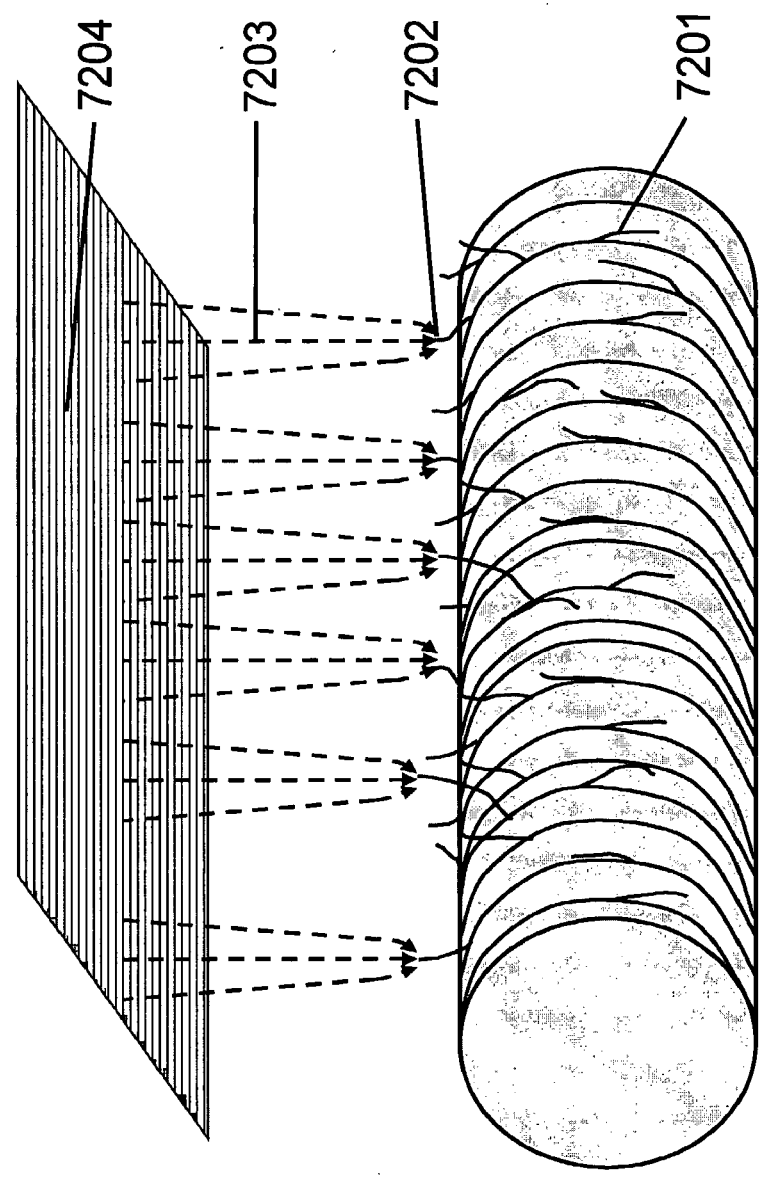
FIG. 72 schematically illustrates a twisted nanofiber yarn, in accordance with some embodiments of the present invention, wherein electron field emission occurs predominately from the sides of the nanofiber yarn. Nanotubes and nanotube bundles extend laterally from the yarn sides and thereby provide amplified field emission through concentration of field lines. Such lateral nanotubes and nanotube bundles concentrate the electric field lines (shown as arrows coming from the anode), thereby enhancing field emission.
Figure 73:
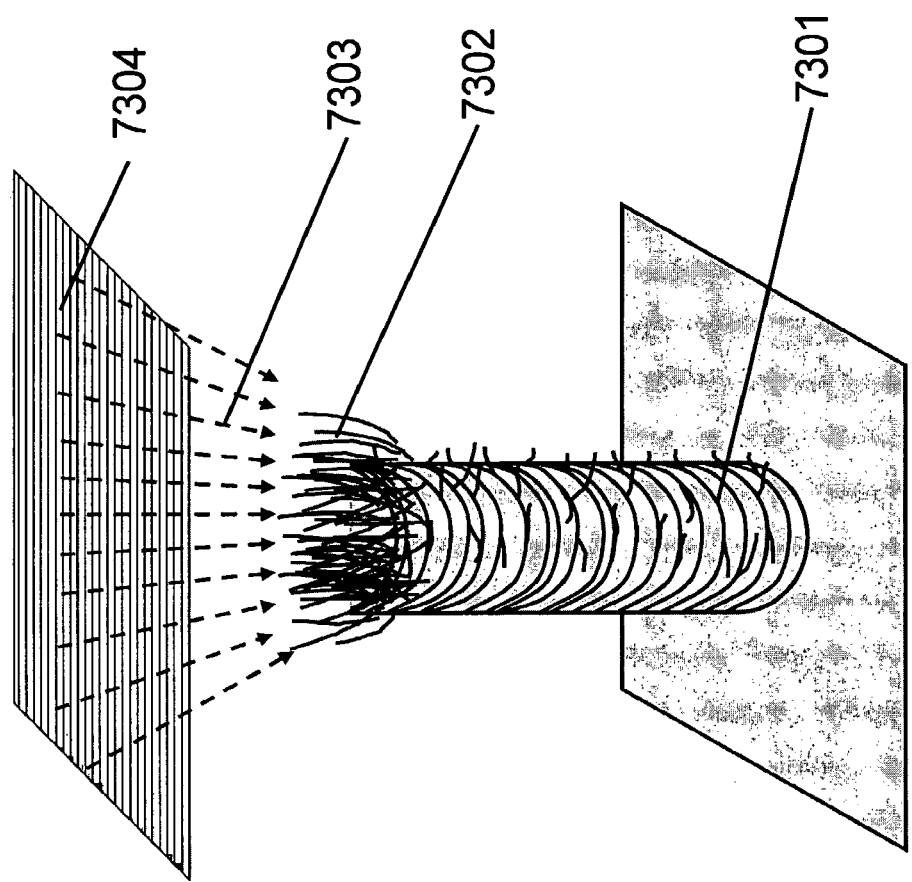
FIG. 73 schematically illustrates field emission from the end of an electrically conducting nanofiber yarn, enhanced by untwisting of an end of the twisted nanofiber yarn in high electric field, in accordance with some embodiments of the present invention. This type of nanofiber yarn-end emission can be particularly suitable for use as a point type electron source.

Another geometry for cold field emission from yarn is to place the yarn horizontally on a planar surface, so that emission occurs from the side of the yarn (FIGS. 66 A, 70 and 72). In FIG. 72, the nanofibers on the side of the yarn (7201) which is closest to an anode (7204) protrude their free ends (7202) raised by the force from the lines of electric field (7203) coming from the anode and concentrated by the tips at the ends (7202).

Moreover, the sides of yarn can be engineered to have an extended "hairy" structure, in which individual nanofibers and larger assemblies of nanofiber (nanofiber bundles and assemblies of bundles) extend from yarn sides (such as the sides of a twisted yarn).

The Inventors find that such hairy structure can be produced by mechanical treatments, chemically based or physically based chemical treatments, plasma treatments, thermal treatments, and electrical field treatments.

Electric field treatments are especially useful for providing hairy nanofiber yarns which can be specially engineered with numerous nanofibers and small diameter assemblies of nanofibers whose free ends extend out of the yarn. Data shows the effects of such electric field treatment on improving electron emission characteristics (see current curves in FIGS. 69 and 76 and the SEM micrographs and schematic illustrations in FIG. 74).

Figure 74:
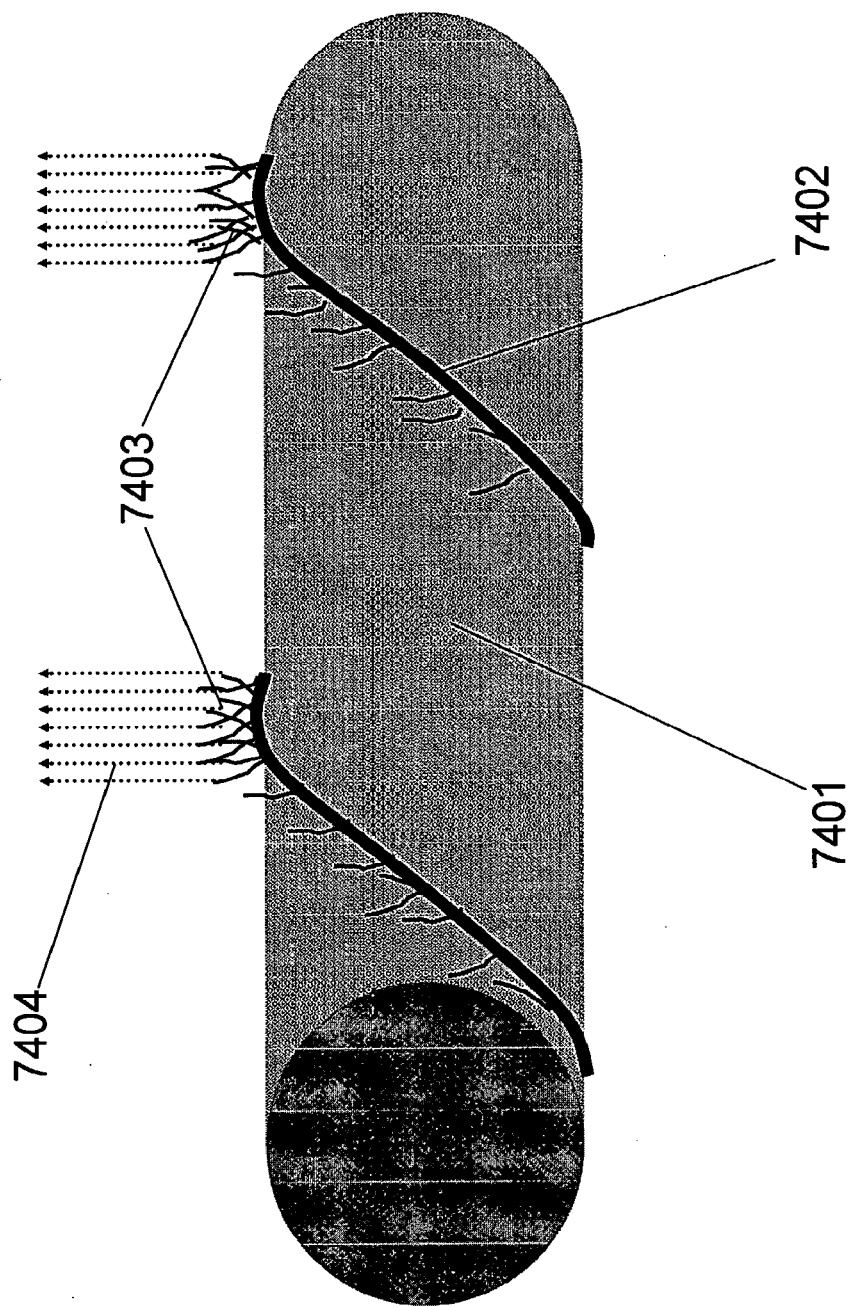
FIGS. 74 A and B show SEM micrographs, at two different magnifications (A and B), of the unwrapping of a yarn during field emission, which creates a "hairy" yarn with multiple nanofiber end tips, such tips being particularly suitable for enhanced field emission of electrons.

The desired hairy yarn structure develops during operation of the cathodes in a high electrical field, due to forces created by strong electric field which eventually pull the ends out of the yarn body and eventually partially unwrap the yarn (shown schematically in FIG. 74 C and the SEM micrographs of FIGS. 74 A and 74 B).

Figure 64:
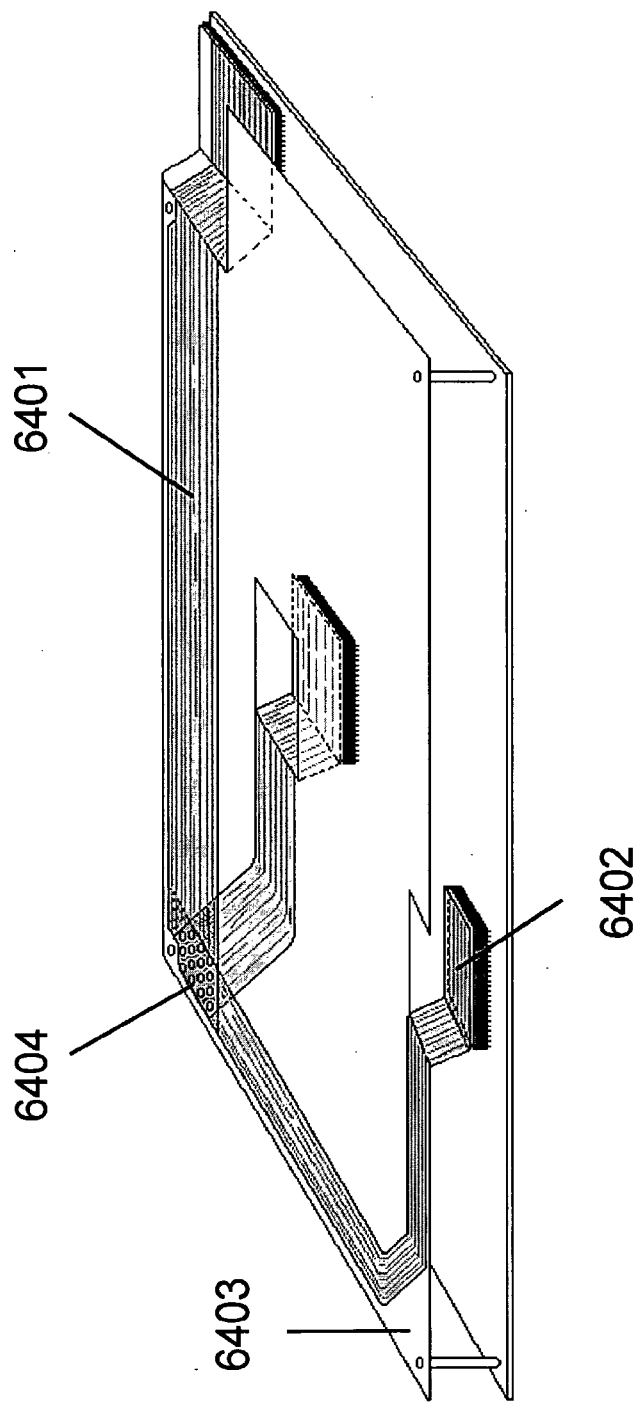
Figure 75:
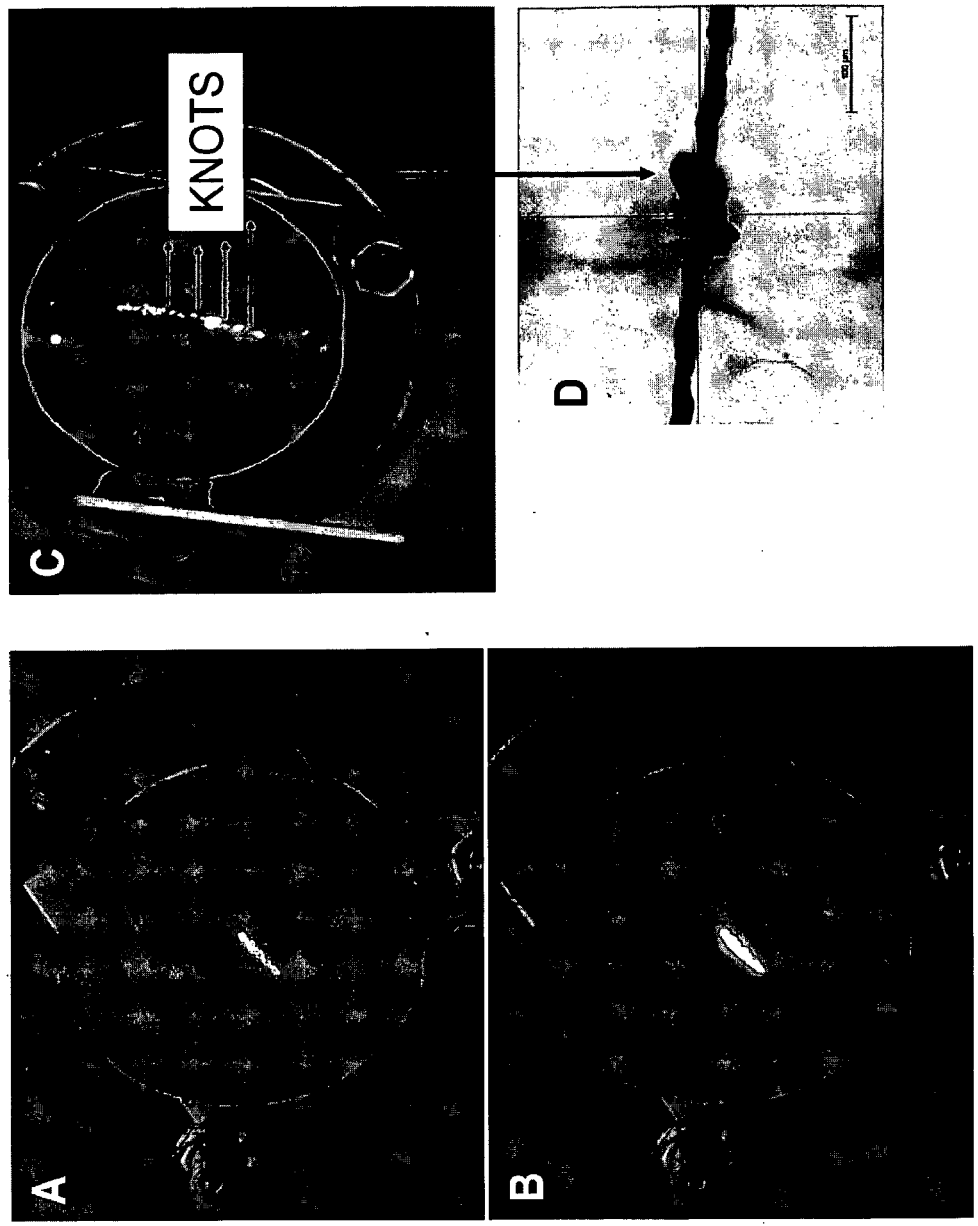
FIGS. 75 A-D are images on phosphorescent screen depicting light emission from a nanofiber-yarn-based cathode in a lateral geometry both without (A and B) and with (C-D) knots. In the pictured case, the knotted part of the yarn cathode shows suppressed of field-induced emission, which can be used for patterning electron emission from nanofiber yarn cathodes.

Other sub-architectures can be envisioned, such as making multi-yarn plies, and singles yarns and plied yarns with various knots along the yarn having the ability to modulate electron emissive properties in the knot region (as shown at FIGS. 64 and 75). It has been demonstrated that, at least in some cases, the knotted regions of yarn cold cathodes emit fewer electrons (see FIG. 75 and examples herein).

Figure 69:
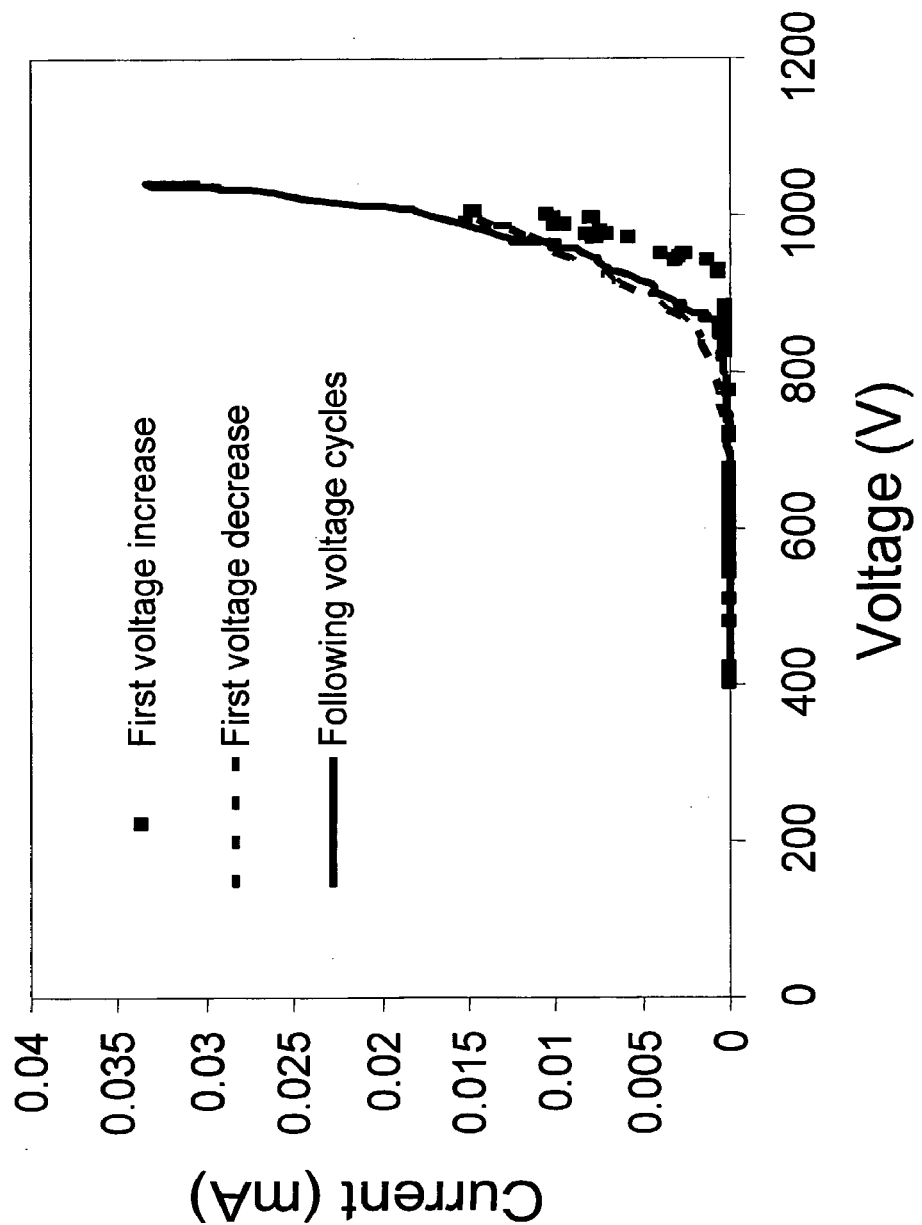
FIG. 69 shows current versus applied voltage for electron emission from a side of a twisted multiwall carbon nanotube yarn. A decrease in onset voltage as a result of hysteresis behavior during the first voltage cycle can be seen, indicating that this initial cycle improves electron emission.
Figure 76:
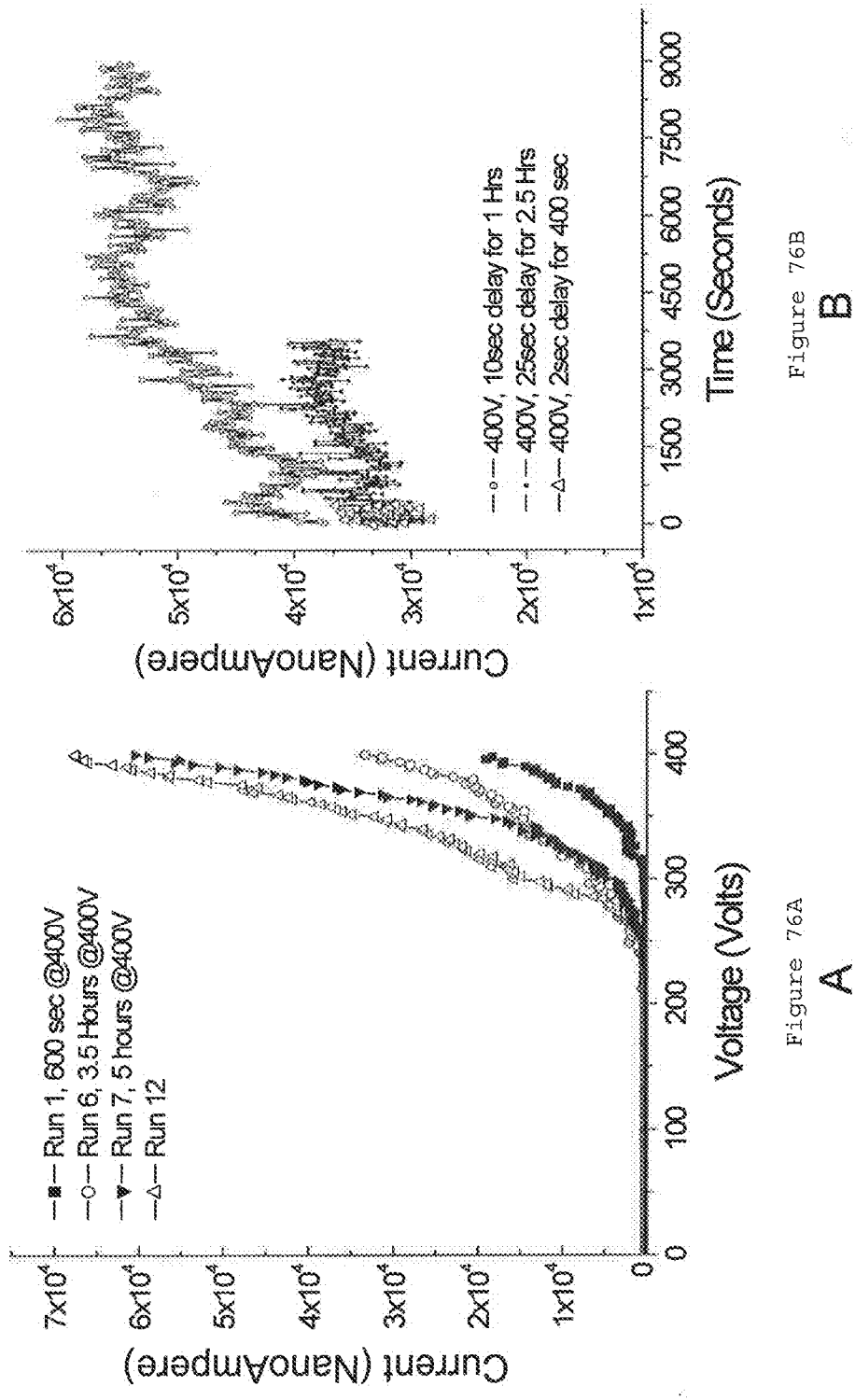
FIGS. 76 A and 76 B are current versus voltage (A) and current versus time (B) curves of self-improving yarn cold cathodes, showing an increase of the current density and a lowering of the threshold and operation voltage upon increasing the time of operation.

Some invention embodiments described herein provide novel fabrication methods, compositions of matter, and applications of nanofiber yarns as cold cathodes having quite useful properties. For example, carbon nanotube yarns of the present invention provide the following unique properties and unique property combinations for cold field emission cold cathodes: (1) high current density that can be controlled by the number of twists in the yarn and by the number of singles yarns in a plied yarn cathode; (2) very low threshold electric field, in the range below 0.5. V/micron, which may self-improve with operation time (FIGS. 69 and 76); (3) low operational voltage, which is below 300 V at the distance of 400 micron between cathode and anode; (4) self-improvement of cathodes in terms of current and voltage performance increase with cycling (FIGS. 69 and 75); (5) high thermal stability; (6) high mechanical strength and vibration stability; (7) the possibility to pattern cathodes by knotting them (FIG. 75) and by other methods, including patterning of the original nanofiber forest, from which the yarns are twist spun; and (8) very high radiation resistance, including electron beam and UV radiation stability).

Figure 65:
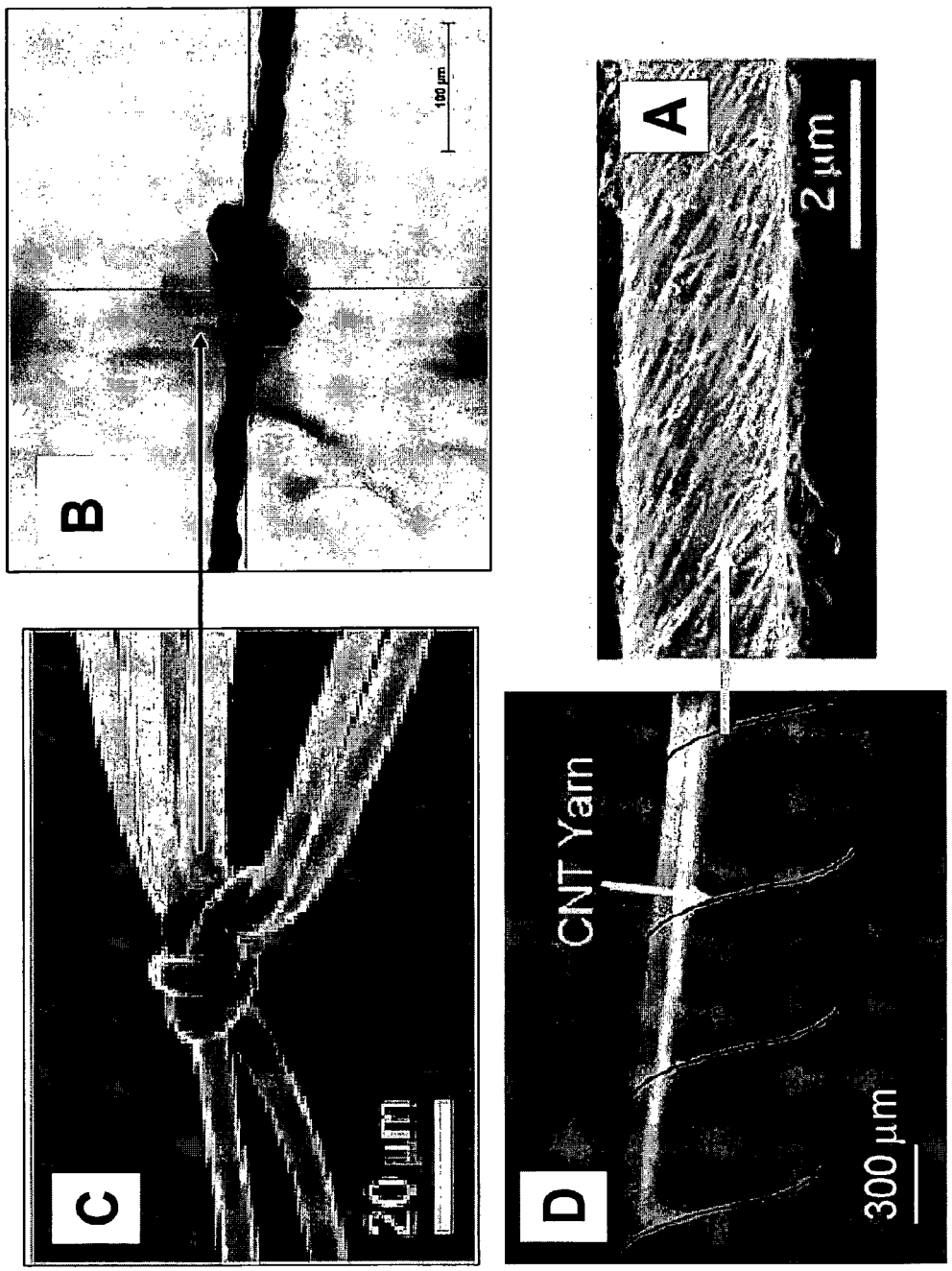
FIGS. 65 A-D are SEM images depicting different types of carbon nanotube yarn cathodes that were fabricated by using an initial draw process from a carbon nanotube forest: (A) a twisted singles yarn, (B) a knotted two-ply yarn, (C) multiple yarns that are knotted together, and (D) a singles yarn helically wrapped on a glass capillary.

In order to increase the number of nanotube fibers on the yarn surface that are available for field-enhanced electron emission, the nanofibers in the convergence zone for spinning can optionally be perturbed by the application of electric or magnetic fields, air flows, sonic or ultra sonic waves, and combinations thereof. As a result of this perturbation, some of the nanofibers are incompletely incorporated in the yarn during twist, so that they extend laterally from the yarn surface (FIGS. 65 and 74). The hairy part 7403 in FIG. 74 has additional free ends of nanotubes, which are protruded from the body of a twisted yarn (7402), wrapped around a wire 7401. The result is a "hairy yarn" in which the nanotube hairs that extend from the yarn provide enhanced field emission of electrons (7404) due to field emission form ends (as shown in FIGS. 69 and 76).

Hairy yarns for field emission of electrons can also be produced by application of false twist (i.e., a twist that is counterbalanced by an equal and opposite twist), which disturbs the nanofibers in the spun yarn. Additionally, the nanotube yarn surface can be intentionally abraded after spinning has been completed by mechanical or chemical processes or a combination thereof. The nanofiber yarns of the invention embodiments can also be usefully employed as electron thermal emission sources (known as hot cathodes), which differ from the cold cathode electrode emission sources in that resistive heating is used to enhance electron emission.

One further way to produce a "hairy yarn" cold cathodes for enhanced field emission is to feed nanofibers from a subsidiary forest into the convergence point (where twist is produced during yarn spinning) so that the nanofibers from the subsidiary forest tend to be incorporated normal to the yarn surface. With more ends available for field emission, such treatment would increase the intensity of electron emission.

Figure 78:
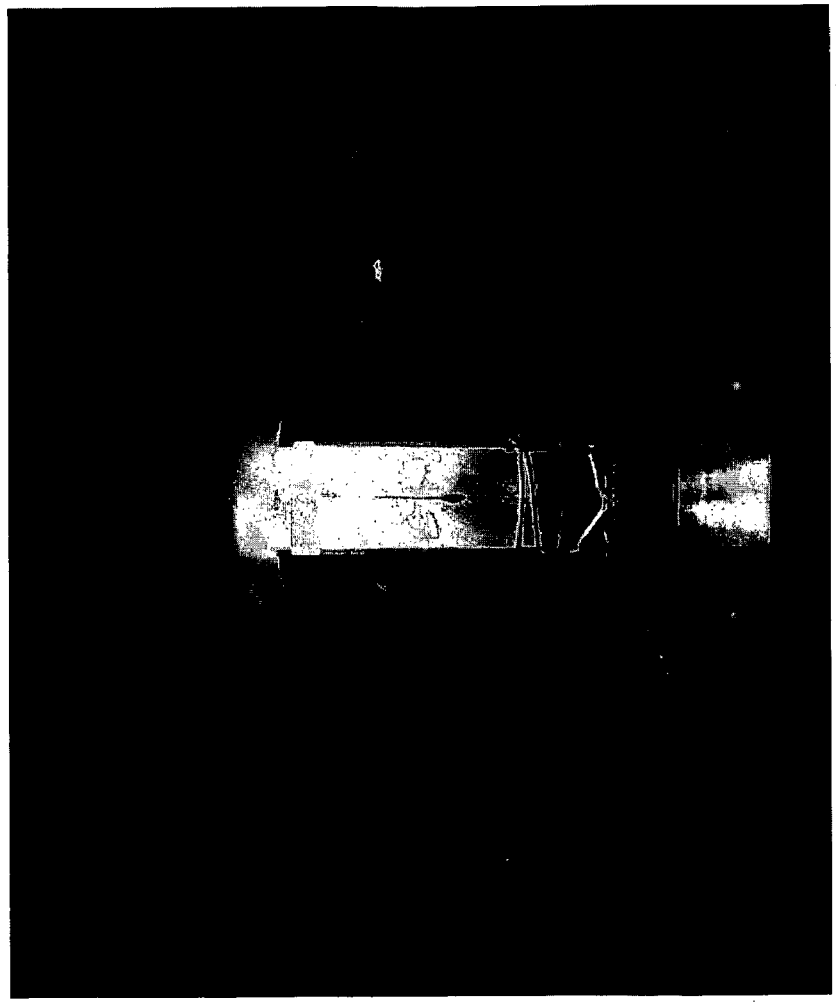
FIG. 78 is a picture showing an operating phosphorescent lamp in which the electron emitting element is a twisted carbon MWNT yarn. This nanofiber yarn cathode is wrapped about a copper wire located at center of a glass cylinder.

The herein demonstrated mechanical robustness of the twisted carbon nanotube yarns, the small yarn diameter, and the yarn geometry, which permits a useable fraction of the nanotube fibers to extend from the fiber surface, so as to provide field enhancement effects, provides advantages of the twisted nanotube yarns for this application. For example, the yarn geometry can be usefully employed as the electron emitting element for an x-ray endoscope for medical exploration or as a central electron emission element for a cylindrically shaped high-intensity light source, where the emission phosphor is on a cylinder that is external to and optionally approximately coaxial with the central nanofiber singles yarn or plied yarn (as shown at FIG. 78 of a prototype phosphorescent lamp with yarn cathode). Carbon nanotubes are optionally and especially preferred for nanofiber yarns applied for this field emission application.

(v) Optically Transparent Cold Electron Cathodes Comprising Nanofiber Sheets for Use in Displays and Lamps Carbon nanotube cathodes are essentially cold cathodes, which may be extensively used in applications where low power consumption and narrow energy spread of emitted electrons are required. The carbon nanotube emitters rank among the best electron field emitters currently available. Additionally, carbon nanotubes are very robust, chemically inert, and may be successfully used in such devices under the requisite vacuum or inert gas conditions. Relevant for applications needing low threshold voltages and high current densities from large area cathodes, impressive current densities have been obtained.

All such prior art cold cathodes are not optically transparent, since they are made either of micro-tips of metals like Mo (see C. A. Spindt J. Appl. Phys. 39, 3504 (1968)), semiconductors or conventional carbon fibers/nanostructures, all of which are used as thick materials that are optically opaque.

Figure 81:
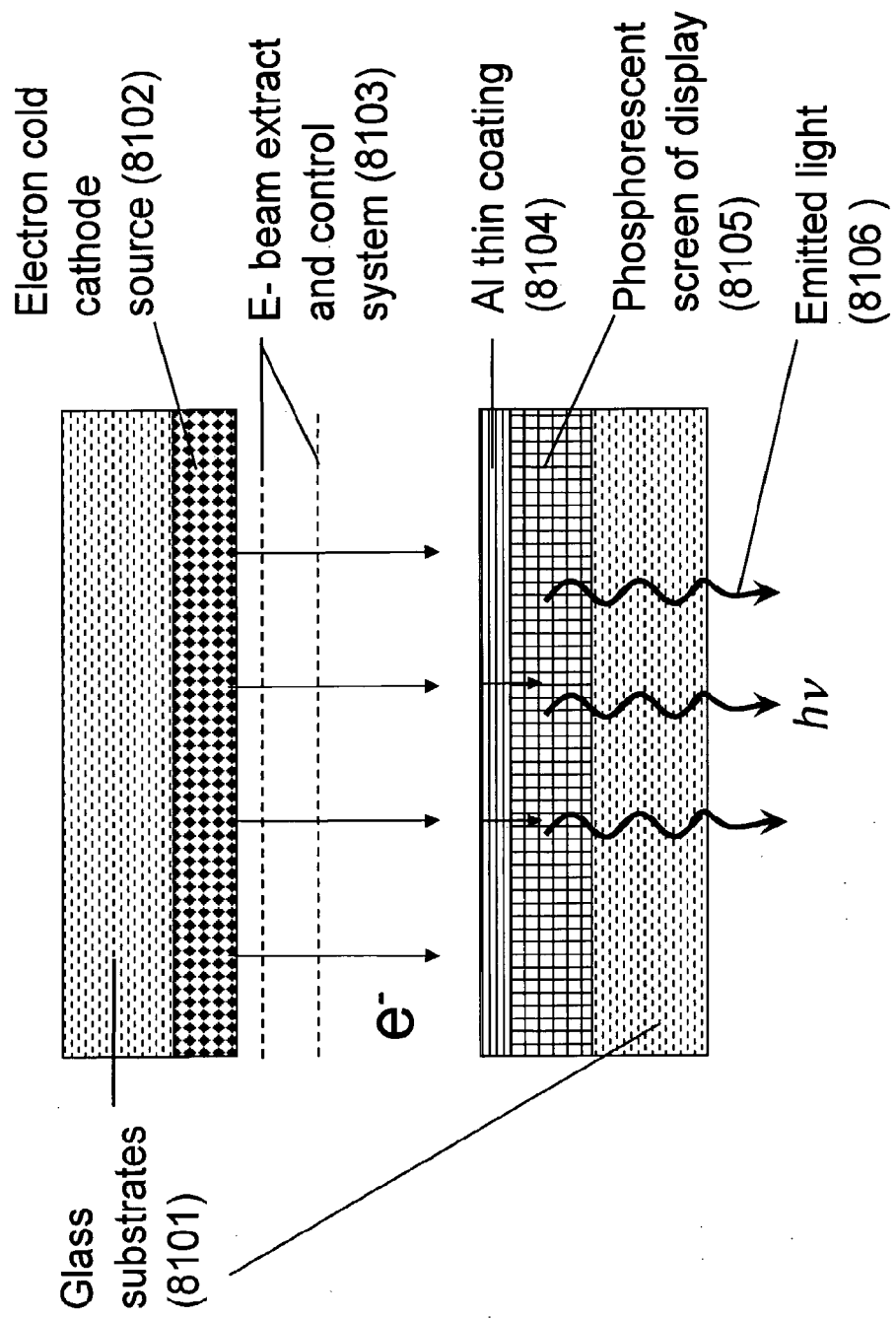
FIG. 81 schematically depicts a non-transparent electron emitter used in conventional configuration for a phosphorescent display or lamp, wherein the cathode (8102 electron emitter) is on the back side of the display or lamp and light is exclusively provided in the frontal direction from the phosphorescent screen (8105) that is on the front side of the display or lamp.
Figure 82:
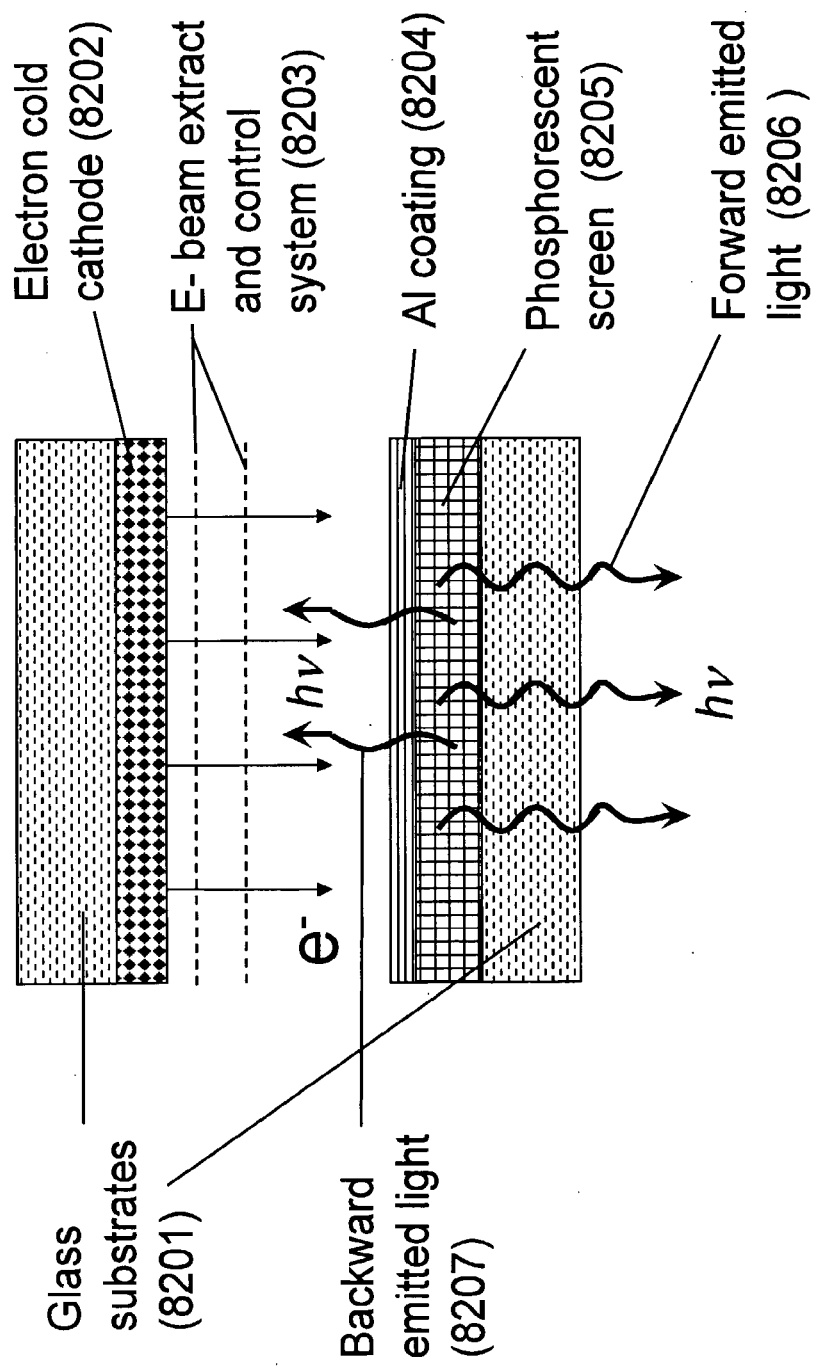
FIG. 82 schematically depicts an electron emitter used in another conventional configuration for a phosphorescent display, wherein the cathode (8202 electron emitter) is on the back side of the display (i.e., behind the phosphorescent screen 8205) and the charge collector is a transparent ITO film (8204). In this geometry some light is radiated backwards. Resulting reflection from the back part of the display creates various problems, such as decrease of display contrast and resolution.

However, most applications of cold electrons involve the production of light which needs to be able to escape the device, be it a display or a cathodoluminescent light source. For example, in conventional field emission flat panel displays (N. S. Lee, et. al., Diamond and Related Mater. 10, 265, (2001), W. B. Choi et. al., Technol. Dig. SID (2000)), light emanates from a phosphor screen that is coated by Al to collect the charge. Thus, some of the electrons are absorbed by the Al layer, which significantly erodes the efficiency of the display (which is shown in FIG. 81). Also, high voltage must generally be applied to allow electrons to penetrate the Al layer, which is also problematic. A possible solution is to use a screen glass with ITO and a low voltage phosphor coating. This way, a lower bias voltage may be applied. In this case, however, almost half of the light is emitted back to the cathode and lost (as shown in FIG. 82). Hence, the efficiency of this type of display is also not high.

With the transparent carbon nanotube (CNT) sheets of the present invention, another display configuration becomes possible. It utilizes a carbon nanotube transparent sheet as the cathode, glass coated with metal having a high optical reflectance (e.g., Al), and a phosphor material, shown in FIG. 83. Thus, almost all light emitted by the phosphor layer upon electron impact from the nanotube cold cathode will be guided back (e.g., by an Al mirror) towards the transparent cathode and the efficiency will be considerably improved. In the meantime, a low voltage regime will be utilized, due to nanoscale field emission.

The above-described transparent carbon nanotube sheets may be used in either flat panel field emission displays (FEDs), such as those extensively developed by Motorola and Samsung, or in a new type of high efficient, low power consumption, flat backlight light sources for liquid crystal displays (LCDs). In the latter case, shown schematically in FIG. 84, it is particularly important that the light, which passes through the transparent carbon nanotube sheets, is partially polarized in a direction perpendicular to the carbon nanotube orientation (as described in M. Zhang, S. Fang, A. Zakhidov, S B. Lee, A. Aliev, K. Atkinson, R. H. Baughman, Science, 309, 1215 (2005)). This may be an additional technological advantage because, once developed, no additional polarizer will be needed in front of the thin film transistor (TFT) matrix.

It has also has been suggested recently in the art that field emission displays with transparent cold cathodes (if such devices could be created) would provide additional advantages such as increased brightness, increased efficiency, and lower field voltages (U.S. Pat. Nos. 5,646,479; 6,611,093; 6,777,869; 6,933,674; 6,943,493; 6,914,381; and 6,803,708). Images formed by such displays can be viewed from both sides of the field emission display panel and multiple displays can be stacked together. However, in the above-referenced patents, the hypothetical emitting material is opaque and the light is able to transfer through the cathode only by means of a specially-designed optical system and a special electrode with a plurality of holes. In contrast, embodiments of the present invention allow for the creation of nanofiber-based highly optically transparent cold cathodes which do not have the above-described disadvantages.

As described previously, methods are known for growing both single-wall and multi-walled nanotubes as forests of parallel aligned fibers on a solid substrate and for utilizing MWNT forests as electron cold cathodes. However, the resulting forest assemblies have various instabilities at large current loads, one such instability being the flash evaporation of the catalyst and carbon (discovered recently by present inventors: A. A. Zakhidov et al., J. Appl. Phys. (submitted)), followed by spark emission of light and transfer of CNTs from the cathode to the anode, which thereby destroys the cathode.

Advances have been made in creating robust forests of oriented CNTs on glass substrates (Motorola, Samsung). Other methods of making cold cathodes from CNTs include formation of a composite with polymeric binder in which CNTs are not oriented, but random. Nevertheless, impressive emissive properties have been obtained for polymer-binder SWNTs. A problem with polymer binder, however, is that the nanotubes are not present in sufficient quantities in the polymer to effectively contribute to electron field emission and also to such properties as thermal and electrical conductivities. Additionally, the unique electrical properties of the individual nanotubes are diluted, since the major component of the cathode is by far the polymer binder.

In some embodiments, the present invention is directed to optically transparent nanofiber sheet cold cathodes, methods of making said nanotube sheet cathodes, and to applications of said nanotube sheet cathodes. Importantly, the yarn spinning and the sheet and ribbon fabrication technology described herein is applicable for producing yarns, ribbons, and sheets of various nanofibers and nanoribbons of diverse materials (e.g., $WS_2$, $WO_2$, etc.) for use in a variety of electron field emission applications.

As described above, processes for making carbon nanotube sheets for cold cathodes comprising nanofibers generally comprise the steps of: (a) arranging nanofibers in an array selected from the group consisting of (i) an aligned array; and (ii) an array that is converging towards alignment, so as to provide a primary assembly (known as a forest); (b) drawing the free-standing self supporting sheet of nanofibers from a forest or other manifold (see above description of non-forest spinning); and (c) depositing the said nanofiber sheet on the transparent support. In some embodiments, the nanotube sheets comprise carbon nanotubes.

Such carbon nanotube sheets and ribbons of the present invention provide unique properties and property combinations favorable for field emission by large area transparent cathodes, such as tunability by doping or chemical modification to provide a tunable work function; flexibility, strength, and toughness; resistance to failure; high electrical and thermal conductivities; high absorption of energy that occurs reversibly; very high resistance to creep, retention of strength even when heated in vacuum at above 1000° C. for long periods, and very high radiation and UV resistance (particularly in vacuum where cold cathodes mostly operate). In some embodiments, the nanofibers are nanoscrolls. In some embodiments, the nanofibers are chemically and/or physically modified before or after a fabrication of the nanofiber ribbons or sheets.

Figure 79:
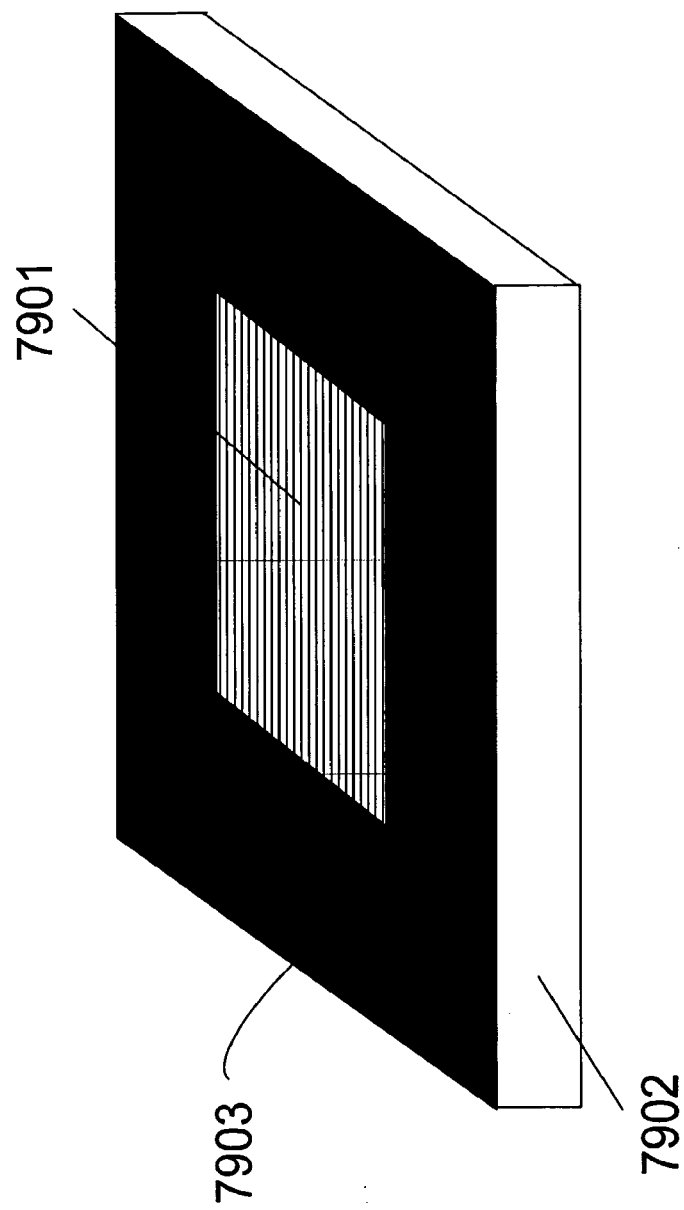
FIG. 79 schematically illustrates a transparent cold cathode electron emitter comprising a carbon nanotube sheet (7901) supported by either a transparent insulating substrate (7902) or a substrate coated with a transparent electrically conducting film. For the case where the contacting substrate is insulating, the transparent nanotube sheet is contacted with an electrical contact material, which can be an electrically conducting tape (7903).

Densification of a CNT sheet of the present invention, which can enhance the adhesion of cold nanofiber sheet cathodes to substrates, can be done by dipping a substrate comprising a CNT sheet (or other nanofiber sheet) into inorganic or organic liquids, such as ethanol, methanol, or acetone, and then permitting drying. Such densification is useful for preventing the CNTs from flying off the substrate in a strong electric field. In some embodiments, after densification, all of the CNT sheet's borders were covered with a carbon-conducting tape (e.g., such as that used for SEM samples) to provide electrical contact to the nanofiber sheet, avoid side effects, provide mechanical attachment, and for other purposes, as shown in FIG. 79. The carbon nanotube transparent sheet (7901) is placed on glass substrate (7902), pristine or coated with a layer of ITO. The edges of the sheet are covered with SEM tape (7903) with the aim to avoid edge effects. The typical emitting area is 50 mm².

These unfavorable side effects can include strong electron emission from the nanofibers mechanically raised at sides, protrusion at the ends, elevation by high electrical field, and such side effects strongly influence the emission uniformity because of a large field enhancement factor on the protruded edges.

Figure 80:
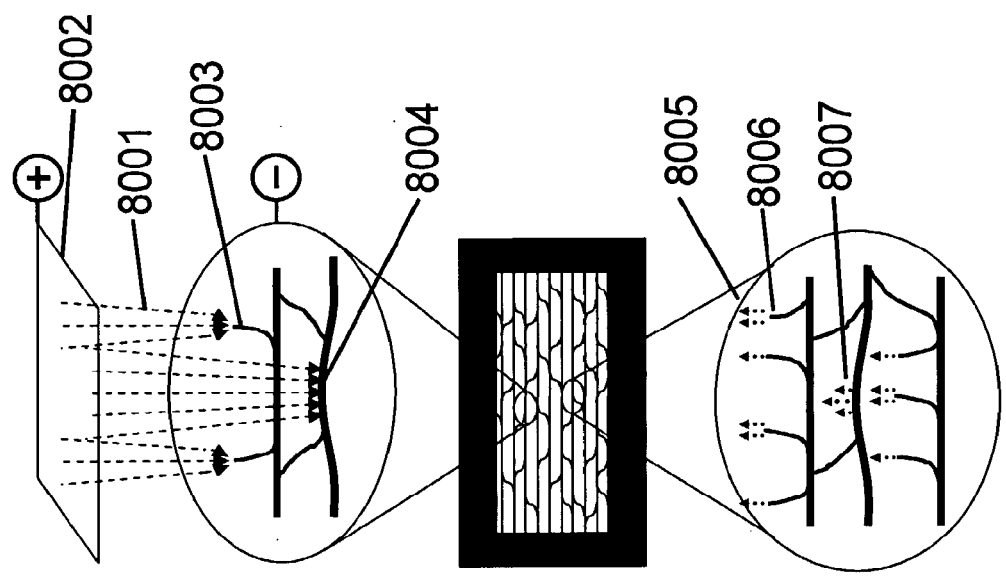
FIG. 80 schematically depicts two electron emission pathways from nanotube sheets: (top portion) electron emission due to field enhancement at the ends and sides of nanofibers and (bottom portion) electron emission from tips (free ends extended from the sheet) and from the sides of nanofibers within the sheet.

In some embodiments, in order to increase the number of nanotube fibers on the transparent cathode sheet surface that are available for field-enhanced electron emission, the nanofibers in the convergence zone (of the drawing process) can be optionally perturbed by the application of electric or magnetic fields, air flows, or sonic or ultrasonic waves. As a result of this perturbation, some of the nanofibers are incompletely incorporated into the sheet during the drawing process such that they extend laterally from the sheet surface. The result is a "hairy surface" of the sheet, as shown schematically in FIG. 80 (top and bottom portions), in which the nanotube hairs that extend from the sheet provide increased electric field and hence enhanced field emission, as described in the caption to FIG. 80. In FIG. 80 (top portion) the electric field lines (8001) go from the anode (8002) to the ends of tips (8003) and sides (8004) of single nanofibers within the sheet. FIG. 80 (bottom portion) shows the schematics of field electron emission from tips (free ends extended from the sheet) and from sides of nanofibers (within the sheet). Electrons are shown as dots (8005) emitted from tips (8006) and sides (8007) of single nanofibers within carbon nanotube sheet.

Hairy sheets for the field emission of electrons exist to some extent in the originally-drawn nanofiber sheets, while a number of free ends of nanofibers or nanofiber bundles, making up a hairy surface, can be additionally enhanced by application of a plasma which disturbs the nanofibers in the drawn sheets. Additionally, the nanotube sheet surface can be intentionally abraded after drawing has been completed, wherein such abrasion is carried out by mechanical and/or chemical processes. The field emission from sides of nanofibers, also contribute a lot in the total current of sheet cold cathode (as depicted in FIG. 80). Although the threshold field is larger for side emission, the total current density from the sides can be significantly larger than from the ends of hairy sheets. The nanofiber sheets of the invention embodiments can also be usefully employed as hot cathodes, i.e., thermionic electron emission sources, which differ from the cold electrode emission sources in that resistive heating is used to enhance electron emission, even in small electric fields.

The transparent nanofiber sheet cathodes are particularly suitable for use in various phosphorescent displays, since they permit various types of architectures for such displays, as shown at FIGS. 81-84. FIG. 81 shows, schematically, a non-transparent cold cathode in a conventional geometry having the cathode (8102) on the glass or other substrate (8101) placed on the back side of the display, i.e., behind the phosphorescent screen (8105). Since the charge collector is an Al mirror film (8104) on the back side of the phosphorescent screen, wherein some emitted electrons are lost while penetrating through the Al thin coating, before creating light in the screen (8105) In this architecture all light is radiated forward (8106) (since it is reflected from Al).

On the other hand FIG. 82 shows, schematically, a cold nanofiber cathode in another conventional geometry having a cold cathode (8202) on the back of the display, i.e., behind the phosphorescent screen (8205). Charge collector is a transparent ITO film (8204) and in this geometry some light is radiated backwards (8207) from the phosphorescent layer and it is captured inside the device and cannot escape from the display, therefore creating various problems, such as decreasing the contrast and resolution, causing photoelectrons and similar problems.

Figure 83:
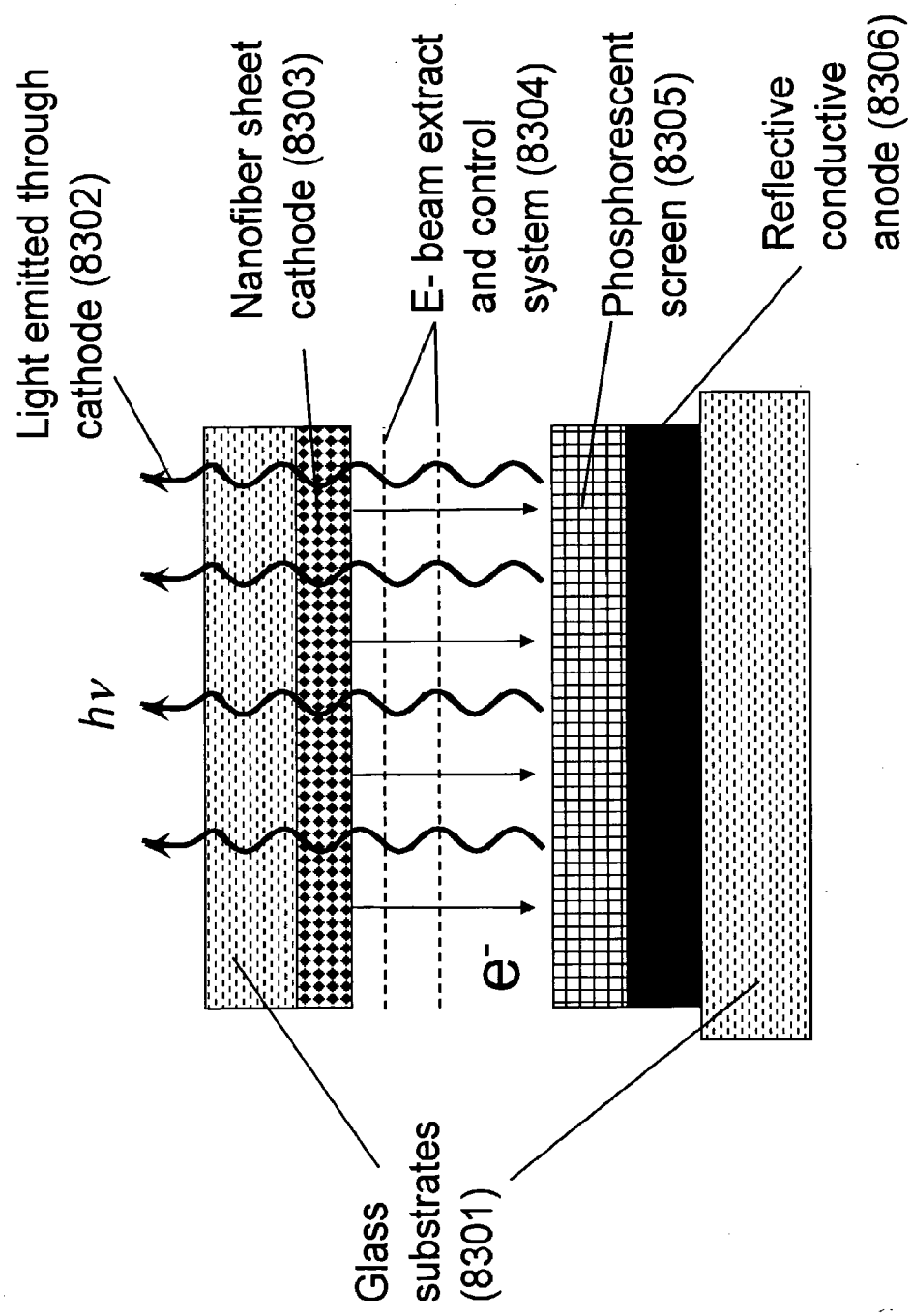
FIG. 83 schematically illustrates a display architecture of the present invention where a transparent nanofiber sheet electron emitter (8303) is on the front of the display, light emitted by the phosphor screen (8305) is reflected by the back anode plate (8306) and reaches the viewer after passing through the transparent nanofiber sheet cathode (8303).

Another favorable and promising architecture is shown in FIG. 83 which schematically illustrates a new transparent nanofiber cold cathode device design of present invention. In this novel architecture the transparent cathode (8303) is in the front of the display and electrons are emitted backwards from the viewer and towards the phosphorescent screen (8305) on the back of the display. The light emitted by screen 8305 and reflected by back anode plate (8306) is all transferred toward (8302) to the viewer after passing through the transparent cathode (8303). And because nanotubes in the cathode are all aligned, the light that passes through the aligned nanotubes is polarized normal to the orientation direction of the nanotubes of the transparent cathode.

Figure 84:
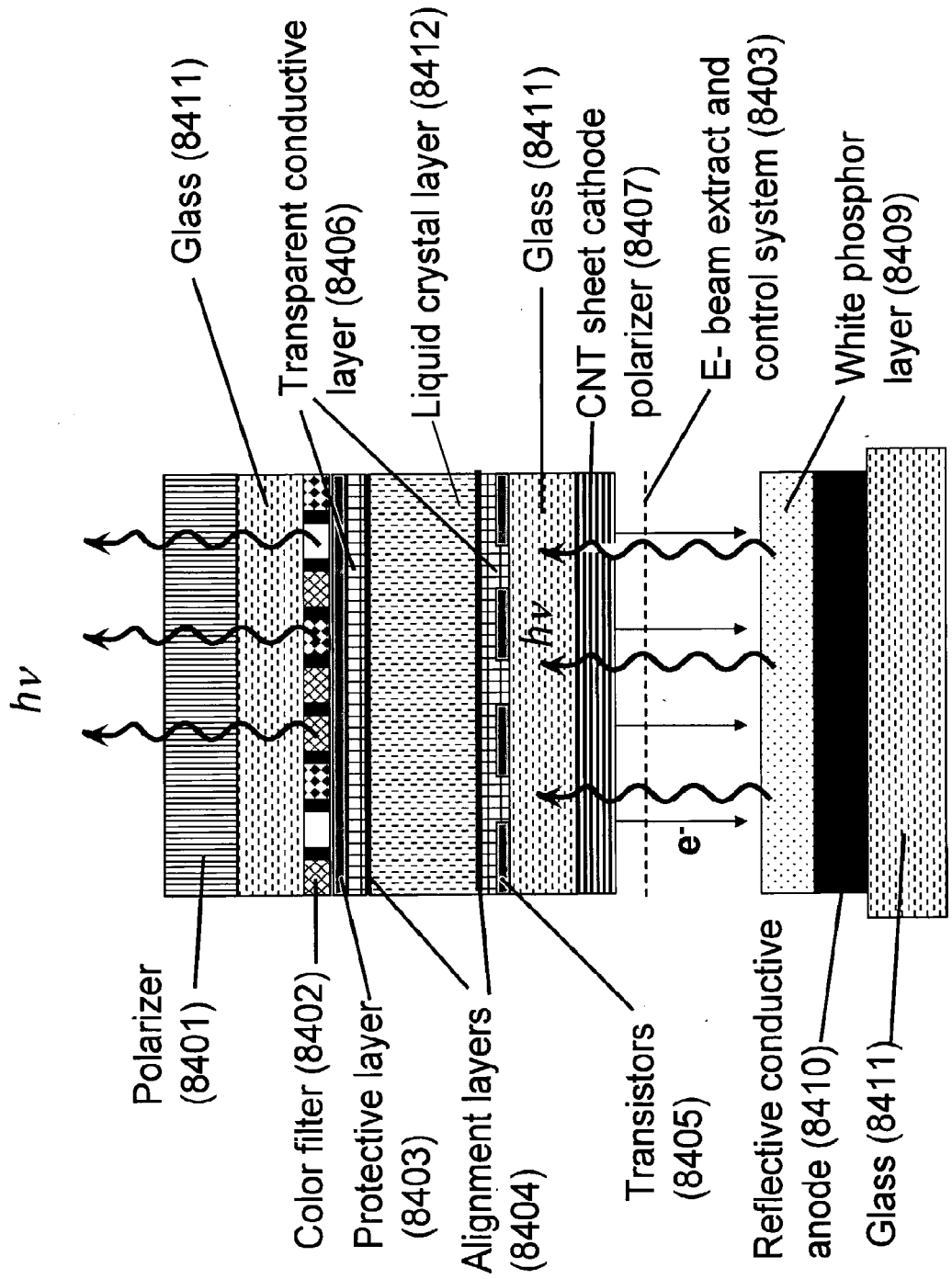
FIG. 84 schematically illustrates how a transparent nanotube sheet electron-emitting cathode can be used for generating an effective back-light source for a conventional liquid crystal display (LCD). The back source light is polarized (which is desirable for LCD operation), since the transparent cold cathode acts as a polarizer due to the existence of highly oriented nanotubes in the nanotube sheet.

The new type of a polarized back-light source is possible, as shown in FIG. 84, which schematically illustrates how the transparent nanotube cathode can be used for generating polarized light for a conventional liquid crystal display (LCD). The flat light source of the design of FIG. 83, is placed on the back of the LCD display in such a way, that light passes through the transparent nanotube cathode into the LCD. In FIG. 84, the nanotube cathode 8407 on glass support 8411 emits electrons through vacuum toward the white phosphorescent screen (8409) placed on another glass substrate (8411) coated with anode (8410). The generated light is polarized (which is desirable for LCD operation), since the transparent cold cathode acts as a polarization filter due to highly oriented nanotubes. This light passes through components of LCD: the alignment layers (8404), thin film transistors (8405), the liquid crystal layer (8412), color filters (8402) and second polarizer (8401). Such design eliminates a polarizer in the LCD part, since it is incorporated in the back-light source.

The herein demonstrated electrical and structural robustness of the transparent carbon nanotube ribbons and sheets permits one to deposit sheets on flexible and elastomeric substrates, such as plastics, rubber, very thin glass, metallic foils and similar, in such a way that this creates flexible cold cathodes which can be further processed in desired device geometries by changing their shape in accordance with the needed geometry. The flexibility of sheet cold cathodes still permits a useable fraction of the nanotube fibers within the sheets to extend from the sheet surface so as to provide field enhancement effects and provides advantages of the nanotube sheets for this application as flexible, elastomeric, and other shape tunable cold cathodes.

For example, the flexible sheet cold cathode geometry can be usefully employed as the electron emitting element for a flexible x-ray endoscope for medical exploration or as a flexible transparent electron emission element for a flexible screen high-intensity light source, where the emission phosphor is optionally on another flexible surface that is external to and optionally conformal with the flexible nanofiber sheet cathode, so that vacuum spacing exists between these two flexible surfaces. Carbon nanotubes are particularly suitable as nanofibers for nanofiber sheets on flexible substrates for this field emission application.

(w) Flexible Organic and Polymeric Light Emitting Devices (OLED and PLED) Using Optically Transparent Nanofiber Sheets as Charge Injectors Organic optoelectronic devices, such as organic light emitting devices (OLEDs) similarly to organic photovoltaic cells (OPV), such as plastic solar cells based on P3HT (poly-(3-hexylthiophene)) with fullerene derivative PCBM ([6,6]-phenyl-C61 butyric acid methyl ester), need a transparent hole-collecting or hole injecting electrode to replace the presently used ITO (indium-tin-oxide) and other transparent conductive oxide (TCO). Such TCOs are widely used in various applications where the optical transparency is needed along with high electrical conductivity. However, these TCOs are brittle and easily damaged when bent, even when in the form of very thin coatings.

The prospects for applications of CNTs as charge injectors for OLEDs has been previously discussed, but no reports exist on the use of nanotubes as transparent hole injectors. Recently, however, Rinzler and co-workers have reported on the application of transparent single-wall nanotube electrodes as electrodes in inorganic, p-type GaP light emitting devices (A. G. Rinzler, S. Pearton, Semiconductor Device and Method Using Nanotube Contacts, PCT Patent Publication No. WO2005083751). Nanofibers and nanotubes have been used as a component of a composite layer in OLEDs by others with the aim of increasing the conductivity of the layers, but not as a transparent electrode. Prior art electron injectors are not optically transparent, since they are made either of micro-tips of metals (e.g., Mo), semiconductors (e.g., Si), or non-optically-transmissive carbon nanostructures. Since most applications involving charge injection are for the production of light, such light must be able to escape the device, be it a display or a lamp.

A critical problem hindering applications of these CNT transparent charge injectors and collectors is the need for methods for assembling these nanotubes into macroscopic and mechanically strong structures and shaped articles that effectively utilize the properties of the nanotube charge injection or collection.

Methods are known for making both single-wall and multi-walled nanotubes as mats and films and also for making carbon nanotube sheets by solution infiltration methods, and for utilizing such non-transparent MWNT as electrodes for charge collectors in optoelectronics. However, the resulting nanotube films and sheets are nontransparent and the efficiency of devices based on such films is poor (as in photovoltaic cells, described by H. Ago et al., Adv. Mat. 11, 1281 (1999)).

Accordingly, in some embodiments, the present invention is directed to transparent nanofiber sheet charge injectors for light emitting devices, methods of making said nanofiber sheet charge injectors, both anodes and cathodes, and to applications of said nanofiber sheet charge injectors in light emission devices. Additional embodiments provide for the drawing of nanofiber sheets and ribbons having very high internal interfaces and a three-dimensional network of nanofibers, and their incorporation with a light emissive material component of an OLED.

Importantly, this technology of sheet and ribbon drawing is applicable for making sheets and ribbons of diverse nanofibers and nanoribbons of diverse materials for use in a variety of LED applications. Relevant for applications needing low threshold voltages and high current densities from a large area, suitable devices have been generated for a variety of architectures for OLEDs and PLEDs.

In some embodiments, the nanofiber sheets comprise carbon nanotubes. Optionally preferred sheet compositions comprise either carbon single walled nanotubes, carbon multiwalled nanotubes, doped versions of these nanotubes, or combinations of these nanotube materials.

Figure 85:
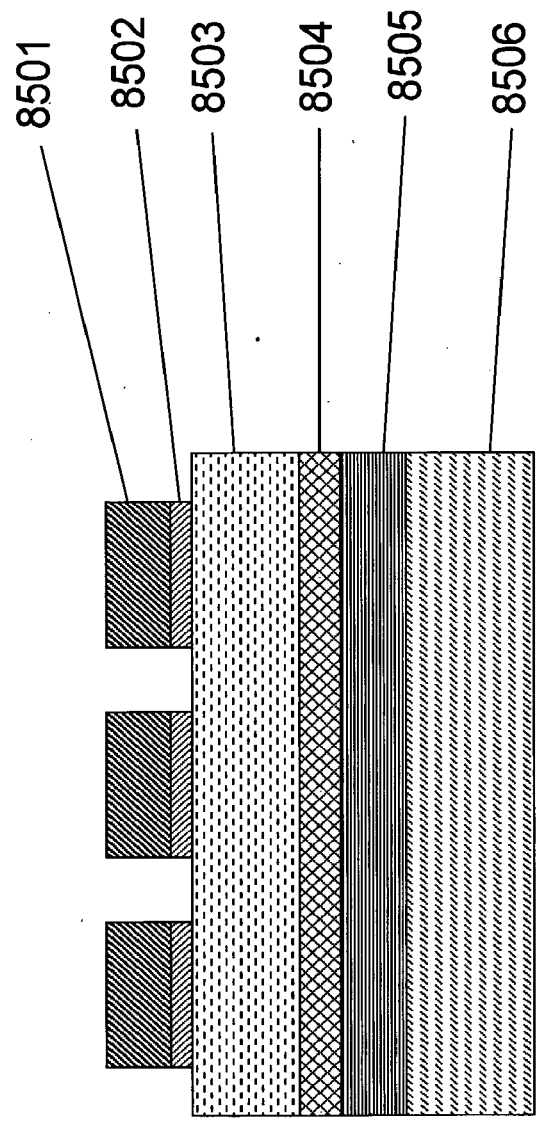
FIG. 85 depicts a polymeric light-emitting diode (PLED) which uses a densified transparent carbon nanotube (CNT) sheet as the anode, in place of the typically used indium tin oxide (ITO). Due to the flexibility of the carbon nanotube sheets, this PLED can be highly flexible if the substrate is a flexible.

FIG. 85 describes an optionally preferred architecture for a polymeric LED that uses a transparent carbon nanotube (CNT) electrode made by the solid-state draw process of Example 21. The CNT sheet (8505) was placed on a substrate (8506) of high-quality display glass (Corning 1737 used for active-matrix liquid crystal displays) and densified using a polar solvent (either ethanol or methanol) and the method of Example 23. Polymeric films were deposited from solution using spin-casting. Multiple layers (8505) of the hole-injection layer PEDOT:PSS were deposited from an aqueous solution and baked at 120° C. for 30 minutes after each layer deposition. The first layer was deposited at a high spin rate (6100 rpm) with high acceleration (21000 rpm/s). This is believed to "flatten" the nanotubes. Subsequent layers were also deposited at 6100 rpm, but with a slow acceleration—so that thicker layers were obtained. Layer 8503 of emissive polymer (MEH-PPV) was spun from a chloroform solution (~0.2 wt % polymer in chloroform) at a speed of ~3000 rpm. Cathodes (thin metallic layers, patterned as desired pixels) were deposited using thermal evaporation of calcium (8502) and aluminum (8501) under a vacuum $<2 \times 10^{-6}$ Torr.

The inventors found that light emission was suppressed when the PEDOT:PSS was eliminated in the above, suggesting that excitons can be quenched on the nanotubes.

Figure 86:
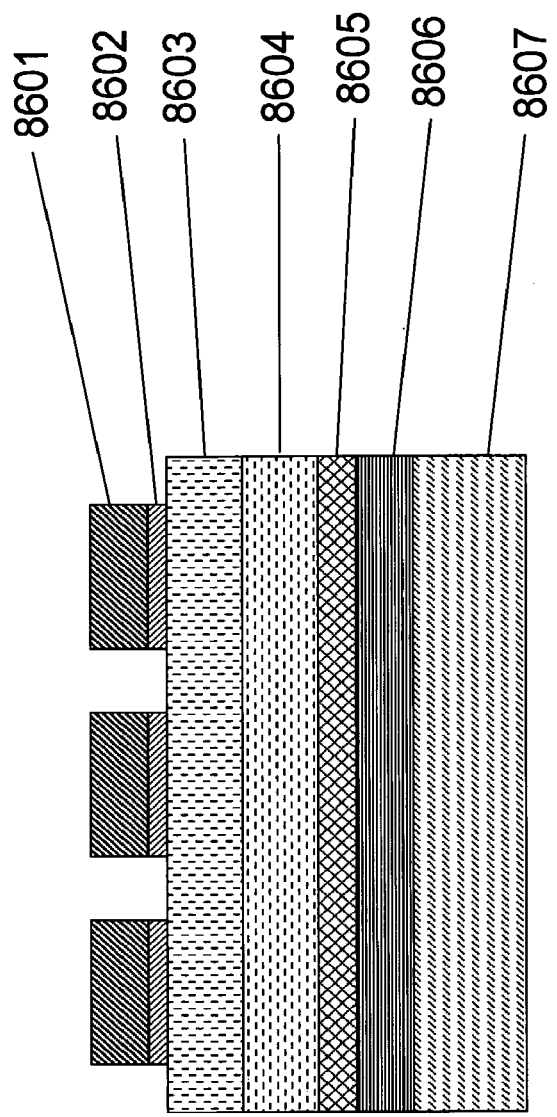
FIG. 86 depicts an organic light-emitting diode (OLED) which uses a carbon nanotube sheet as an anode. Similar to the PLED, this device has the active low molecular weight organic layers deposited on top of a densified transparent nanotube sheet. Due to the flexibility of the carbon nanotube sheets, this PLED can be highly flexible if the substrate is a flexible.

FIG. 86A shows another type of organic LED that uses a transparent nanofiber sheet electrode (8606) made by the process of Example 21 and employs vacuum deposition of low-molecular weight organic molecules. The PEDOT:PSS hole transport layer (8605) was again deposited from an aqueous solution on top of nanotube layer (8606) that was densified on a glass substrate (8607) using the method of Example 23. The remaining organic layers (hole-transport layer, α-NPD (8604) and emissive/electron transport layer Alq$_3$ (8603) were deposited under vacuum using thermal evaporation. Both materials were deposited a rate of 1 Å/s and at a pressure below 2×10$^{-6}$ Torr. The layer thickness was 700 Å for the α-NPD and 500 Å for Alq$_3$. A bilayer cathode (10 Å lithium fluoride (8602) under 1200 Å aluminum film (8601)) was deposited on top of the organic layers using thermal evaporation.

Figure 87:
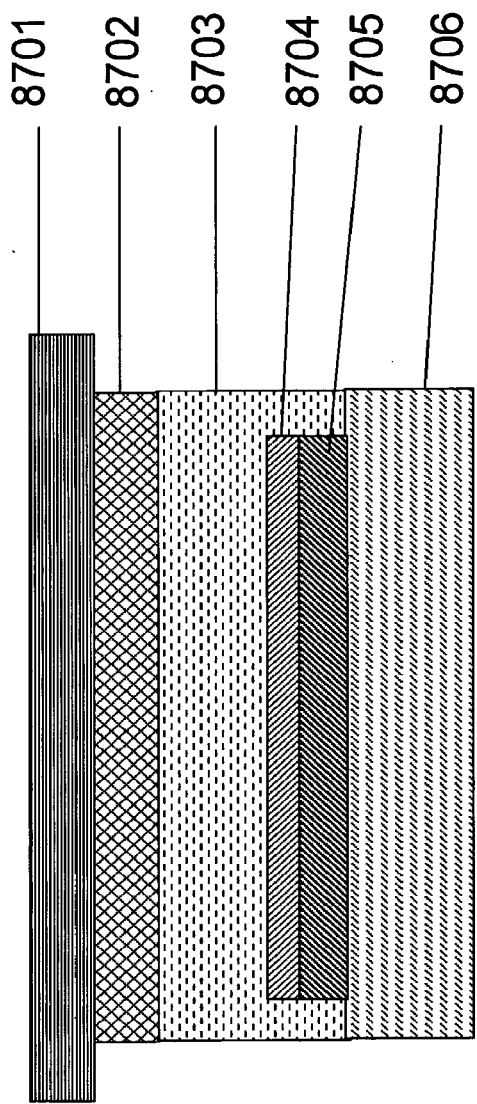
FIG. 87 depicts a PLED with a bottom-up construction, starting with the cathode layer and subsequent deposition of the organic/polymeric functional layers. The final layer, the carbon nanotube sheet (anode), is placed on the device by means of stamping from another substrate, or by laying a free-standing nanotube sheet over the device.

FIG. 87 shows a novel type of OLED/PLED architecture that uses the transparent nanofiber electrode of Example 21. This device employs a bottom-up construction, which is possible due to availability of free-standing transparent nanofiber sheets of the present invention. Since this nanofiber sheet is transparent, the OLED/PLED light emission can be through this sheet. Hence, the last element in this bottom-up deposition process can be the carbon nanotube sheet electrode.

The device fabrication process involves first depositing a non-transparent cathode layer (a double metal cathode: 8705/8704) on a substrate and subsequent deposition of the polymeric layers (such as a MEH-PPV type emissive layer (8703) and a PEDOT:PSS hole transport layer (8702)). The final deposited layer, the transparent carbon nanotube sheet anode (8701), was placed on the device either by means of pressure-induced process (stamping, which transfers the nanofiber sheet from an original substrate to the device) from another substrate or by laying a free-standing nanotube sheet.

Such bottom-up construction is necessary for certain applications, specifically those which incorporate drive electronics on a silicon wafer (e.g., active matrix and thin-film transistor displays). In such cases, the cathode layer cannot be deposited on an existing PLED or OLED. The deposition of a transparent hole injector, such as indium-tin-oxide as the last deposited layer requires high temperatures, which can damage the predeposited polymeric or molecular device layers. Therefore, a low-temperature or room-temperature process is desired to prevent damage or morphological changes in the organic layer. The described mechanical transfer of transparent nanotube sheet meets this need and can provide an ideal solution for such display applications.

Figure 89:
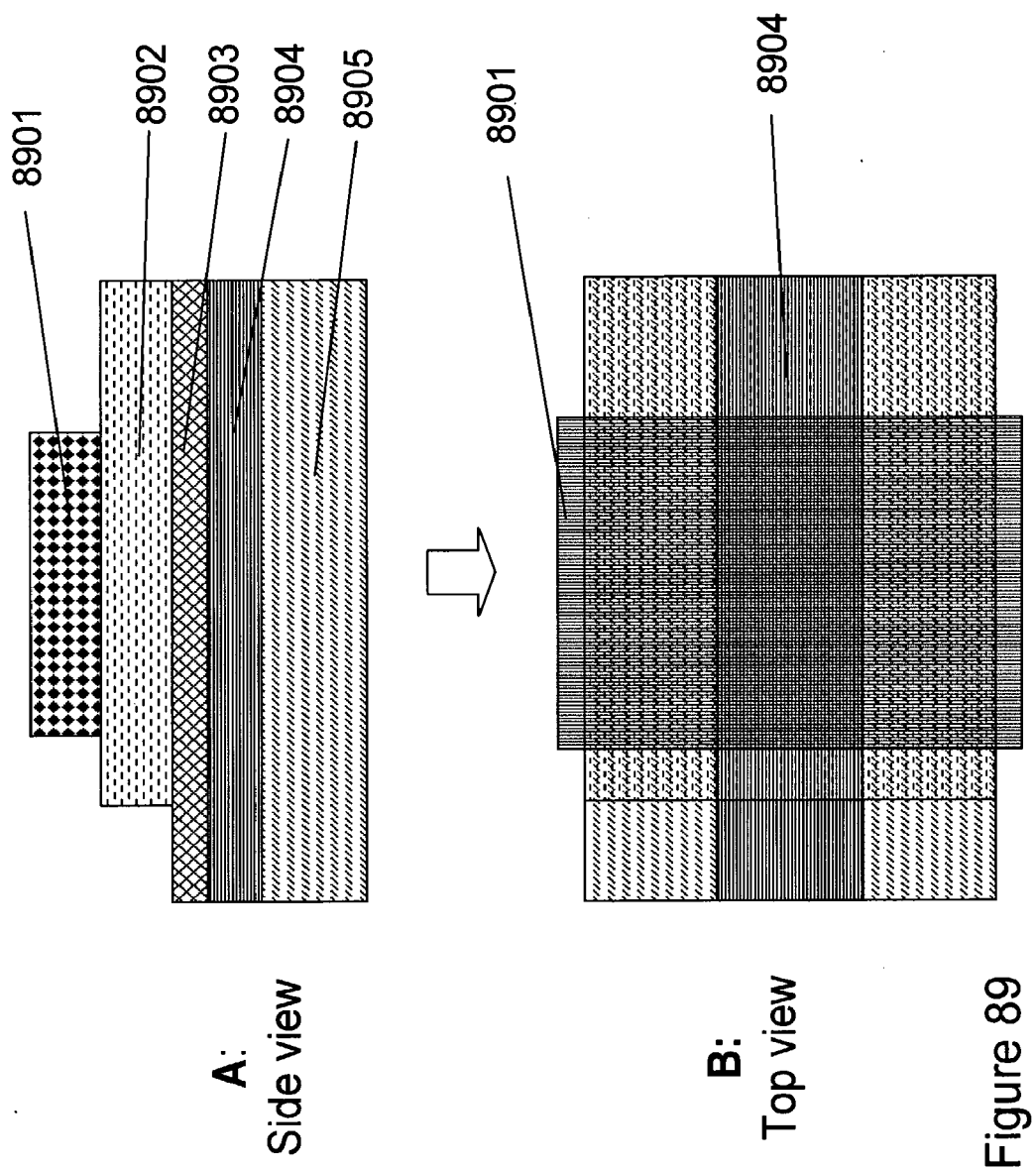
FIG. 89 depicts a transparent PLED which uses a carbon nanotube sheet as both the anode and the cathode. As a result, both electrodes and the device itself are transparent. The device can be built on a flexible/elastomeric substrate, thereby realizing the ultimate goal of a flexible transparent display.

In another invention embodiment using the transparent nanotube sheets of Example 21, the OLED is made completely transparent so that light can pass through the entire device. FIG. 89 shows such a transparent PLED which uses a carbon nanotube sheet as both the anode (8904) and the cathode (8901). As a result, both electrodes and the device itself are transparent.

The above device can be built on a flexible/elastomeric substrate (8905), thereby realizing the ultimate goal of a flexible/elastomeric display in which several OLEDs can be stacked on top of each other. The device structure comprises a liquid-densified nanotube sheet (8904) on substrate (8905) and subsequent polymeric layers (8903 and 8902) deposited by spin-casting. The patterned nanotube cathode (8901) is then placed on the structure, either by stamping or other transferring methods of invention embodiments. This last nanotube sheet cathode should be coated with a low work function material (for example calcium or a bilayer of calcium/aluminum). A low work function metal is needed at the interface for creating efficient electron injection.

An alternative, and possibly more efficient, process for placing the cathode sheet on the device involves drop-casting the MEH-PPV film, rather than spin-casting it. The corresponding solution with dissolved polymer is placed on the substrate, which is then turned upright so that excess solution runs off. The free-standing nanotube sheet (8901) is immediately placed on the wet film (8902). The film is then allowed to dry in an inert atmosphere. This procedure produces an improved interface between the MEH-PPV and the transparent nanotube sheet.

Transparent carbon nanotube sheets of the present invention provide unique properties and property combinations for charge injection electrodes, such as high work function combined with extreme toughness, resistance to failure of bended parts, high electrical and thermal conductivities, and very high radiation and UV resistance, even when irradiated in air. Furthermore these nanotube sheets can be drawn as very wide, free-standing self-supporting sheets and films that can be laminated by various methods on the top of OLED architectures, changing the existing bottom-up fabrication methods to inverse top-to-bottom type methods.

The nanofiber sheets of the present invention can therefore be used in a variety of diverse optoelectronic applications. In some embodiments, the drawing of transparent electrodes as free standing films is extended for producing sheet and ribbon electrodes of nanofibers and nanoribbons of diverse materials, such as WO$_3$ or MoO$_3$ or MoS$_2$ nanofibers. This expands the range of LED applications.

Applications of the nanofiber sheet and ribbon electrodes of the present invention include an entire family of optoelectronic devices, OLEDs, PLEDs, OFETs, field effect transistors (FETs) with transparent gates, electrochemical devices such as nanofiber-based batteries, fuel cells, artificial, and electrochromic displays.

In some embodiments, the present invention provides novel fabrication methods, compositions of matter, and applications of nanofiber sheets and ribbons having quite useful properties for application as light emitting devices, e.g., OLEDs and PLEDs. For example, carbon nanotube yarns of the invention embodiments provide the following unique properties and unique property combinations useful for OLEDs: (1) high work function, preferable for hole injection into hole transport layer of OLED, (2) high internal surface and porosity for interfacing with other functional materials of the device, (3) high mechanical strength, toughness, and resistance to damage by bending, permitting use in flexible devices and electronic textiles, and (6) very high radiation and UV resistance, even when irradiated in air.

(x) Transparent Nanofiber Sheets and Yarns as Charge Collectors and Separation Layers for Photovoltaic Cells and Photodetectors Transparent electrically conducting electrodes are needed that are mechanically strong, highly flexible, and self-supporting. Also, it is useful for these electrode materials to have extended internal surface, so that they can most effectively interface on the nanoscale with other functional materials, such as organic electronic materials and nanoparticles (such as quantum dots and rods).

It is also beneficial for the transparent electrically conducting electrode materials to have tunable work functions. Also, the availability of electrode fabrication means for obtaining either isotropic or highly anisotropic electrode properties is useful, especially when the highly anisotropic properties are electrical conductivity, thermal conductivity, and optical transparency.

Some embodiments of the present invention feature an electrode that comprises nanofiber sheets of invention embodiments, such as the solid-state fabricated transparent carbon nanotube sheets of Example 21. The transparent nanofiber sheet electrode (TNSE) can be designed for use in an optoelectronic device, such as photovoltaic cell.

In other embodiments, the present invention provides a solid film photovoltaic cell that includes the TNSE electrode as part of its functional architecture, thereby contributing to photogeneration of charge carriers.

In some embodiments, the present invention provides a photovoltaic cell which includes the TNSE electrode, a second electrode and an organic semiconductor or conjugated polymer or a composite between the electrodes.

In additional embodiments, the present invention provides a multijunction or tandem photovoltaic cell, which includes several TNSE electrodes separating the single junction parts as transparent separation layers (also known as charge recombination layers, or interconnect layers) placed between each separate single junction photocell part.

The present invention is also directed to the application of transparent carbon nanotubes and nanofibers, in combination with nanofiber yarns woven into textiles, as either effective three-dimensional or two-dimensional charge collection and charge recombination layers in organic (i.e., plastic, excitonic, or hybrid) solar cells and tandem (i.e., multi-junction) solar cells. The TNSE electrodes can be anodes and/or cathodes as top electrodes and as charge recombination layers in tandem.

Charge collecting electrodes of the present invention are in some instances anodes (i.e., hole or plus charge collectors), which have many advantages over prior art TCOs: they are flexible, mechanically strong, have anisotropy of optical and electrical properties, and have a structure of a three-dimensional network, being especially favorable for collecting charge in bulk heterojunction solar cells. Moreover, pristine CNT transparent electrodes have large work functions (5.1-5.3 eV), which is higher than the work function (w.f.) of ITO (4.7 eV), but which is favorable for collection of plus charges or holes.

Applicants also put forth methods to use the transparent carbon nanotubes sheets and ribbons as electron collectors or cathodes (by using special coatings and chemical modification methods). Also described herein are methods of making said transparent carbon nanotube sheets, ribbons and twist spun yarns as parts of a photovoltaic solar cell architecture, contributing to photogeneration of charge carriers. Additional embodiments provide for the spinning of free-standing nanofiber ribbons having arbitrarily large widths. Importantly, the technology of these flexible transparent electrodes for solar cells can be extended to produce various sheets and ribbons from nanofibers and nanoribbons of diverse materials for use in a variety of solar cell types and applications.

Applications for nanofiber sheet and ribbon electrodes of the present invention include various solar energy harvesting textiles, solar cells for hydrogen production, and combined solar energy harvesting with fuel cell batteries (as described in examples herein).

Invention embodiments described herein provide novel architectures, processing and fabrication methods, compositions of matter, and applications of transparent nanofiber sheets and ribbons having properties and functionalities useful for solar cell design. For example, nanofiber sheets, and particularly carbon nanotube sheets of invention embodiments provide the following unique properties and unique property combinations, particularly useful for solar cells: (1) high optical transparency, (2) low electrical sheet resistance, (3) three-dimensional topology of the mesh-like CNT network, which allows charge collection from a large volume, and not only from a planar interface, like for usual ITO electrodes, (4) an extended interface of the three-dimensional network, which enhances charge separation and collection, (5) high thermal conductivities and thermal diffusivities, which provide heat dissipation in solar cells, (6) high work function required for collection of plus charges, holes in solar cells, (7) high flexibility as opposed to the brittle character of ITO and other inorganic TCOs, (8) very high resistance to creep, (7) interpenetrating continuous morphology of the nanofiber network, as opposed to cermet type non-percolated morphology of nanoparticle electrodes, which is favorable for collection of charge carriers from the bulk heterojunction types of architectures, (8) retention of strength even when heated in air at 450° C. for one hour, and (9) very high radiation and UV resistance—even when irradiated in air.

In some embodiments, nanofiber electrodes are coated first from a free-standing sheet on a flexible or other substrate (as the anode or plus collecting electrode) and then covered or impregnated by photoactive layers, which are bulk heterojunctions of organic semiconductors with donor-acceptor interfaces favorable for charge separation. Then, the cathode is deposited on the top to finalize a device.

In another architecture, first the non-transparent cathode electrode is deposited on a substrate. Then, the photoactive layer or layers or bulk heterojunction interpenetrating network is coated from a liquid phase by dipping, spin coating, ink jet printing, screen printing, or by vacuum deposition. Finally, the transparent nanofiber electrode is placed on the photoactive layer from a free-standing, self-supporting sheet state into a deposited sheet state by placing the sheet onto the surface and then pressing by stamping methods described below in more detail. Alternatively, the nanofiber sheet of ribbon can be placed on the device by transfer from another surface, such as a carrier tape.

The TNSEs can be highly transparent or semi-transparent depending on the number of sheets and their thickness. The light absorption properties of TNSEs can be adjusted by the length of individual nanofibers within the self-assembled nanostructure, based on the antenna-effect of quarter wavelength and properties of a directional radiation. Additionally, the strength of light absorption in the photoactive part that is impregnated into the three-dimensional nanofiber electrode can be increased by an effect of an enhancement of local electric field of a photon in the vicinity of nanofibers by coating them with appropriate metal or semiconductor nanoparticles or by creating core-shell structures in which plasmonic effects are additionally enhanced In some embodiments, the TNSE can further include at least one organic functional polymer, such as poly-alkylthiophene (PAT) or PEDOT-PSS, in combination with other material, such as fullerene derivative PCBM. The TNSE can be a composite of several nanofibers, such as a composite of multiwall and single wall nanotubes, added together in order to increase functionality, such as through increased electrical conductivity, increased light absorption, and enhanced photoseparation of charge carriers.

Processes for making transparent electrodes for solar cells comprise the steps of: (a) arranging nanofibers to provide a substantially parallel nanofiber array having a degree of inter-fiber connectivity within the nanofiber array; and (b) drawing said nanofibers from the nanofiber array as a ribbon or sheet without substantially twisting the ribbon or sheet, wherein the ribbon or sheet is at least about one millimeter in width.

In some embodiments, the present invention is directed to applications of transparent nanofiber sheets and ribbons for charge collection and charge recombination layers in organic (also referred to as plastic, excitonic, or hybrid) solar cells and photodetectors and tandem (i.e., multijunction) solar cells, and also in inorganic thin film solar cells such as solar cells based on $CuInSe_2$, CdTe, GaAs, or GaP.

Charge collecting electrodes of the present invention are optionally preferably anodes (i.e., hole collectors). These nanofiber sheet electrodes have many advantages, compared to prior-art transparent conducting oxide electrodes: the nanofiber sheets are flexible, mechanically strong, and tough; they can have anisotropy of optical and electrical properties (or this anisotropy can be tuned or eliminated by sheet plying), and they have a porous network structure that is especially favorable for collecting charge in bulk heterojunction solar cells. Moreover, CNT transparent electrodes have large work functions (5.1-5.3 eV), which is larger than the work function of ITO (4.7 eV) and is favorable for collection of plus charges or holes.

In some embodiments, the present invention provides methods of making said transparent carbon nanotube sheets and ribbons into flexible textiles as parts of larger solar cell structure. This can be done, for instance, by including the step of filling the pores of a nanofiber electrode sheet with conductive polymer or other semiconducting polymer. Importantly, invention embodiments for transparent nanofiber sheet and ribbon electrodes are applicable for diverse types of electronically conducting nanofibers and nanoribbons, such as those described in Section 2.

In many embodiments, the nanotube sheets comprise carbon nanotubes. Such carbon nanotube sheets of the present invention provide unique properties and property combinations such as high optical transparency in a very broad spectral range, from UV to infrared (300 nm-10 µm), a high degree of alignment, toughness, high electrical and thermal conductivities, high absorption of microwave energy in certain frequency domains, substantial retention of strength even when heated in air at 450° C. for one hour, and very high radiation and UV resistance, even when irradiated in air. Furthermore, these nanotube sheets can be drawn with varying thickness and widths so as to increase their linear density (i.e., the weight per yarn length)

In some embodiments, the fibers or ribbons are chemically and/or physically modified before or after the draw process or spinning process. In some embodiments, the nanofiber yarns are used to form composites with other materials useful for solar cells operation, such as hole transporting and electron transporting molecules and polymers.

(y) Doping of CNT Electrodes: Electrical Conductivity Tuning

It is well known that doping of SWNTs, with either donors or acceptors, shifts the Fermi energy ($E_F$) in the electronic band structure and can change the electronic conduction mechanism of SWNTs. Vapor exposure with alkaline metals and electrochemical doping using liquid electrolyte also provides important increases of electrical conductivity for the thereby doped CNTs.

Herein, Applicants describe improvement of the transparent electrode conductivity and match the work function of charge-collecting CNTs with those of impregnated polymer or monomer structures by creating a double layer structure on highly developed CNT surfaces.

Applicants have demonstrated that an extremely high surface area of CNT sheets and ribbons allows one to obtain superior capacitance and density of charge injection. The electrochemical capacitance can exceed 100 F/g, and nanofiber, sheets, and yarns having such large capacitance are optionally preferred. This large electrochemical capacitance enables tuning the electrical conductivity of CNT in a very broad range. CNT sheets charged in liquid electrolytes retains double layer ions on the nanotube surface—even when removed from electrolyte, washed in deionized water, and dried in vacuum as described in detail in PCT/US2005/007084, filed Mar. 4, 2005.

Because aqueous electrochemistry is limited by a narrow potential window, Applicants use non-aqueous electrochemistry for heavy electrochemical doping. One good candidate is the electrolyte solution of $LiClO_4$ in acetonitrile. Another very promising candidate is 1-methyl-3-butylimidazolium tetrafluoroborate, which has an extremely broad window (−2.4 V to 1.7 V vs. $Fc/Fc^+$) of electrochemical stability (L. Kavan, L. Dunsch, Chem. Phys. Chem. 4, 9, 944-950 (2003)).

Applicants describe herein a procedure comprising forming a transparent CNT sheet, doping of said sheet by charge injection in liquid electrolyte, removal of the CNT sheet from the liquid electrolyte, and integration of said doped sheet with polymer composite for use in a solar cell. In the first step, a thin transparent CNT film with a thickness of optionally preferably less than 200 nm is deposited on any substrate as a free-standing sheet. Either SWNTs, MWNTs, or combinations thereof can be used for this process. In the next step, the CNT sheet is electrochemically charged from liquid electrolyte to enhance conductivity of the CNT sheet and tune its work function. Then the CNT sheet can optionally be removed from the electrolyte, dried, an incorporated in a device that is dependent upon the level of charge injection, such as a solar cell.

The Applicants have reduced the work function of the CNT electrode by doping, for example, with alkaline cations. The commonly-assigned co-pending patent application PCT/US2005/007084 on double layer charge injection describes in detail the charge injection process into a SWNT material by electrochemical methods. To increase the charge density, an increased applied potential (measured with respect to the potential of zero charge injection) is needed. To achieve a high density of injected, the Applicants optionally prefer use of an electrolyte that has high redox stability with respect to either oxidation or reduction (depending upon the sign of the desired injected charge). The optionally preferred type of injected charge are holes (positive charge), since this type of charge injection generally confers the highest stability for the injected charge.

Applicants optionally prefer that the electrolyte used for charge injection has high stability of electrochemical hole injection. One such preferred electrolyte is tetra-n-butylammoniumhexafluorophosphate ($TBAPF_6$) in acetonitrile.

The following is a typical process of the Applicants invention embodiments. After electrochemical charge injection in the nanotube sheet or ribbon, the charged electrode is removed from electrolyte and carefully washed using solvent that is stable with respect to charge injected into the nanotube sheet or ribbon (which in some cases can be deionized water). The nanotube electrode material is dried in an inert atmosphere, wherein such drying can optionally be at an elevated temperature (optionally preferably above 50° C.), and then covered by a conjugated polymer thin layer using dip-coating method in two steps (see PCT/US2005/007084). First of all, a very thin (20-30 nm) electron-blocking layer (such as PEDOT-PSS) is dip-coated from a very dilute aqueous solution. Heat treatment at about 100° C. is desired to remove water. In the next step, a suspension/ mixture of regio-regular P3HT polymer with very short SWNTs (preferably semiconducting) and $C_{60}$ powder in the ratio 3:1 is prepared by dip-coating on the charge injected transparent CNT electrode. The concentration of shortened SWNT in polymer should be below the percolation threshold. In the last stage, the heat treated "sandwich" is covered with an Al electrode and encapsulated. In an alternative procedure, the deposited CNT thin film can be covered with PEDOT-PSS from a liquid phase. Subsequent steps can vary depending on electrolyte, sign of the injected charge, and the polymer types.

As an alternative to electrochemical charge injection, charge injection to modify the conductivity and work function of nanotube sheet electrodes (and other useful nanofiber electrodes) can be by chemical processes by using either electron donating or electron accepting agents. Such methods are well known in the art, and are widely used for graphite, carbon nanotubes, and conjugated polymers.

(z) Electrochemical doping of CNT Electrodes: Work Function Tuning

Both chemical and electrochemical doping of carbon nanotubes is a very attractive method for tuning the Fermi level by changing the population of electronic states. For example, it has been shown that semiconducting CNTs can be doped amphoterically; p- and n-type. Optical and electrical measurements have confirmed that upon p-type doping, the Fermi level can be moved down by depleting the filled valence-bands or moved up by filling empty conduction bands. The concentration of charge carriers increases drastically when the Fermi level reaches valence and conduction band van Hove singularities. The Applicants show the modulation of field emission I-V curves of SWNT films upon doping, which demonstrates the tuning of the work function. A downshift of the Fermi level ($E_F$) by about 0.4 eV has been demonstrated earlier for electrochemical doping MWNTs. Larger negative work function shifts of ca. −1.0 eV have also been observed (see PCT/US2005/007084).

(aa) Nitrogen and Boron Doped Carbon Nanotubes for Transparent Nanofiber Electrodes Recently, B- and N-doping within the graphene layers of both SWNTs and MWNTs has attracted great interest, since the electronic properties of $C-N_x$ and $C-B_x$ tubes have been found to be quite sensitive to small amounts of intralayer dopants: nitrogen as the n-dopant and boron as the p-dopant in C-planes. Summarizing the basic results, B and N are well known to influence not only properties but, via the synthesis, also the structure of the doped nanotubes. So, N involved in chemical vapor deposition (CVD) synthesis creates bamboo-type tubes, B in CVD synthesis makes longer tubes (being concentrated at the tips of tubes, B inhibits the closing of tubes). The capped walls have also been observed, thus making interesting topologies possible where walls have smooth capped endings. It has already been shown by computations, and partly by experiment, that during the synthesis of MWNTs, the B atoms not only inhibit closing of tube caps and thus strongly enhance the length, but also make favorable the growth of zig-zag type tubes of specific chirality, all of them being metallic.

Combined doping, electrochemical or chemical non-covalent doping combined with intralayer doping, can be usefully applied. Applicants have demonstrated that charge injection into tubes by chemical or electrochemical doping is an important process that can change the properties of tubes: i.e., conductivity, electron emission properties (via work function modulation), optical and IR reflectivity, thermal properties, etc. Most importantly, the electrochemically injected charge is stable even in the absence of an electrolyte.

The utility of combined doping is illustrated by the example of nanotubes doped intra-sheet with nitrogen to produce $C-N_x$ nanotubes. $C-N_x$ nanotubes have electronic defect levels inside the gap, so charge injected chemically or electrochemically into such preformed $C-N_x$ tubes by non-covalent processes will have increased stability.

Even less than 1% molar intrasheet doping of SWNTs or MWNTs with N, B, or combinations thereof can be usefully applied for modifying work function, electron emission, electrical conductivity, and thermoelectric power for the nanotube sheets, ribbons, and yarns of invention embodiments. The level of intrasheet doping with N, B, or combinations is optionally preferably above 0.5% for the nanotube sheets, ribbons, and yarns of invention embodiments. This intra-level doping is preferably achieved before fabrication of the nanotube sheets, ribbons, and yarns. However, it is also useful to fabricate nanotube sheets, ribbons, and yarns from preformed nanotubes, and then add other optionally N or B doped nanotubes to these articles by a secondary synthesis or infiltration process.

Figure 95:
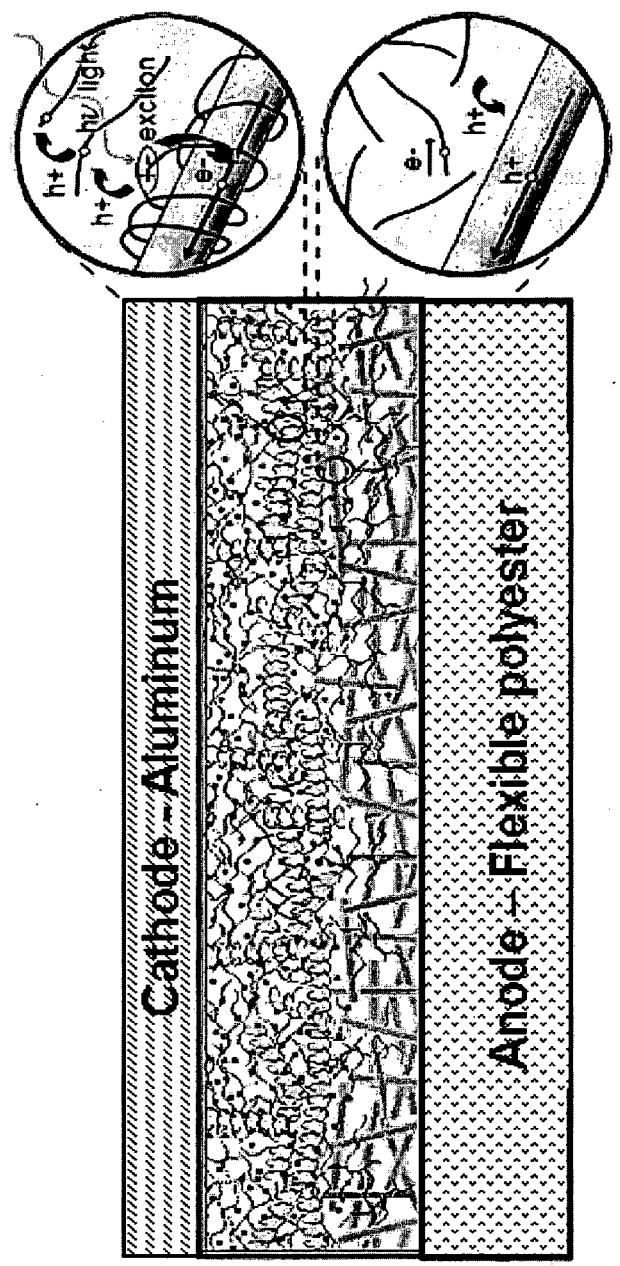
FIG. 95 depicts, schematically, a plastic solar cell based on conjugated polymer/fullerene photoactive bulk donor-acceptor heterojunction with transparent nanotube sheet anode (hole collector) and polymer/nanotube wires nanointegrated as photoactive electron collectors. Insets show the hole transfer from conducting polymer chains into the nanotubes of the transparent nanotube sheet anode, and also an electron transfer, upon exciton dissociation in a polymer/single wall nanotube system.
Figure 96:
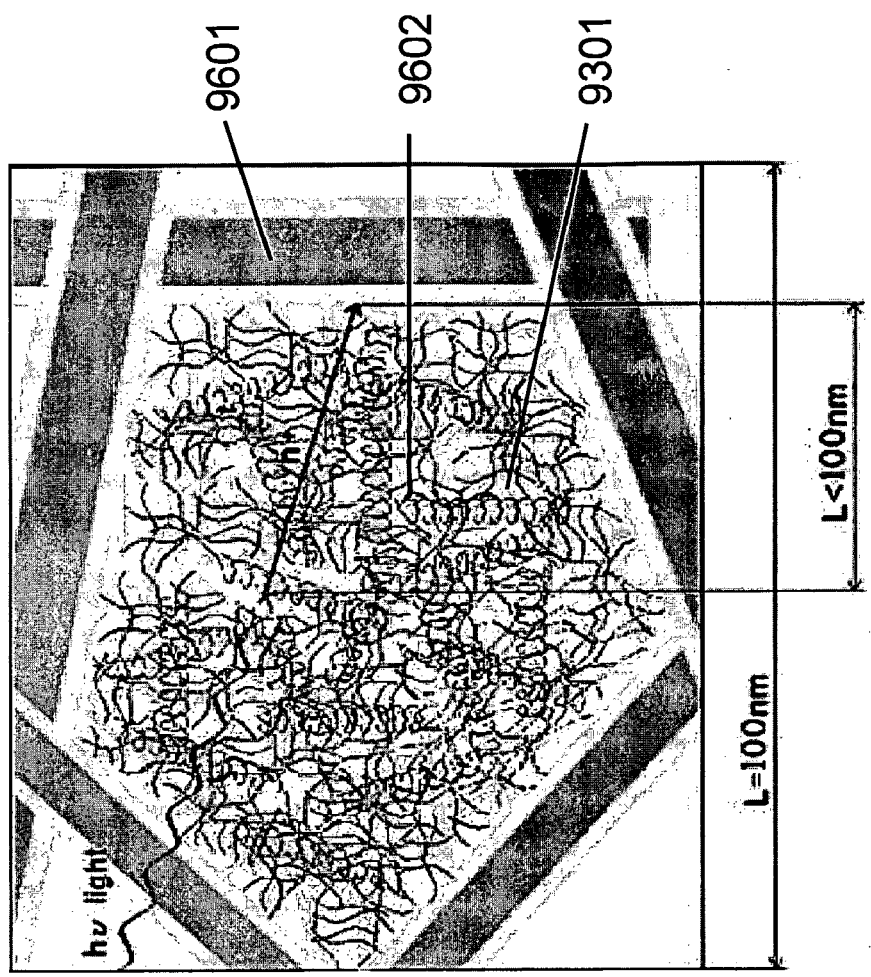
FIG. 96 schematically depicts conjugated polymer/nanotube composite integrated on the nanoscale inside 100 nm scale (on average) pores within the porous structure of a transparent nanotube sheet. Holes photogenerated in the filled pores are collected on sheet nanotubes within the charge collection length of the polymer (about 100 nm), as shown by arrows.

(bb) Three-Dimensional Electronic Textiles of Nanofibers and Nanofiber Yarns Incorporated into Nanofiber Sheets and Ribbons FIGS. 95 and 96 illustrate nanofiber sheet or ribbon electrodes in which nanofibers and other electronically functional materials are incorporated in the pore volume of the nanofiber sheets or ribbons in order to enhance photocharge generation capability.

FIG. 95 illustrates schematically a solar cell, based on nanoscale integration of a conducting polymer (CP) and $C_{60}$ in a carbon nanotube sheet to provide a photoactive donor-acceptor heterojunction within a porous transparent CNT anode (hole collector). The CP/CNT wires are within the pores of the CNT sheet, and the intra-pore nanofibers serve as photo electron collectors.

FIG. 96 indicates more reliably the relative dimensions for the pore volume in the nanotube sheet and intra-pore elements. The insets show the hole transfer from CP chains into the transparent CNT sheet anode, and electron transfer, upon exciton dissociation in the intra-pore CP/CNT system. Holes photogenerated within the approximately 100 nm diameter pores will be collected on the MWNTs of the sheet, since the charge collection length of the polymer is about 100 nm.

Semiconducting nanofibers, such as chiral single wall carbon nanotubes or nanofibers of $WS_2$, $MoSe_2$, and the like, can be similarly used for formation of intrasheet heterojunctions that enhance charge collection efficiency.

(cc) Photoelectrochemical Cell with Transparent Nanofiber Sheet and Yarn Electrodes as Charge Collectors and Recombination/Separation Layers in Tandem Cells In some embodiments, the present invention relates to specific types of electrodes for photoelectrochemical cells, and more precisely for dye- or quantum dot-sensitized solar cells. Some such invention embodiments also relate to specific types of conductive electrodes for dye-sensitized and quantum dot-sensitized solar cells: hole collecting counter-electrodes and transparent separation layers, in multi-junction solar cells, also known as tandem cells. Methods, processes and architectures are described for application of transparent carbon nanotube and other nanofiber sheets, ribbons and yarns both as charge collector transparent electrodes in dye-sensitized and quantum dot-sensitized electrochemical solar cells, and as transparent separation layers (also called charge recombination layers) in multijunction (also called as tandem) dye solar cells. Additional functionality of carbon nanotube charge collectors for enhancement of light absorption and charge generation due to a nano-antenna effect in solar cells, and other advantages are also described herein.

In some embodiments, the present invention relates to a regenerative photoelectrochemical cell (PEC) and, more particularly, to a cell of this type that uses transparent, mechanically strong, flexible nanofiber yarns, ribbons, or sheets. A PEC is a electrochemical device which, upon absorption of light, generates charge carriers and, as a result of such photogeneration, creates an electrical voltage (potential difference) between its two electrodes: cathode and anode.

One representative type of PEC is a dye-sensitized solar cell (DSC), first developed by Michael Gräetzel and colleagues in Switzerland at EPFL in 1991 (see U.S. Pat. Nos. 5,350,644; 5,441,827; and 5,728,487, and Nature 353, 737 (1991), and Nature 395 583 (1998)). DSCs are analogs of photosynthetic natural systems and therefore are intrinsically environmentally-friendly and are very attractive since their production cost is relatively low compared to silicon-based and other inorganic semiconductor p/n junction solar cells.

DSC has achieved a high certified conversion efficiency of 10.4%. Although providing a high efficiency, this cell nonetheless has several disadvantages. Present DSCs cannot be made lightweight and flexible. There are, however, numerous applications for which it would be preferable or even essential that the cell is solid-state, mechanically-strong and at the same time, light-weight and flexible. The major problem in the development of lightweight flexible DSCs is replacement of glass substrates. Glass substrates are fragile, heavy, not very impact-resistant, and have form and shape limitations.

Counter electrode (reduction electrodes) in DSCs are usually constructed of expensive transparent conducting glass substrates coated with Pt catalyst films (about 60% of the total cost of DSCs). Therefore, in order to reduce the cost of DSCs and broaden their applications, it is necessary to develop transparent, flexible, and mechanically-strong electrodes on substrates other than glass. Efficiency can be increased in tandem DSCs by using multiple junction architectures. The first tandem DSC comprising two compartment cells connected in parallel has been demonstrated recently (see M. Dürr et al., Appl. Phys. Lett. 84, 3397 (2004) and W. Kubo et al., J. Photochem. Photobiology A 164, 33-39 (2004)).

In some embodiments, the present invention is directed to application of transparent carbon nanotube sheets and ribbons as charge collection and charge recombination layers in photoelectrochemical (also called Gräetzel or dye-sensitized) solar cells and tandem (i.e., multi-junction) versions of such solar cells. Charge collecting electrodes of some invention embodiments are preferably anodes, i.e., hole or positive charge collectors, which have many advantages over the prior art: they are flexible, mechanically strong, have anisotropy of optical and electrical properties, and have a structure of three-dimensional networks, especially favorable for collecting charge in bulk heterojunction solar cells. Moreover, CNT transparent electrodes have large work functions (5.1-5.3 eV), which is larger than the work function of ITO (4.7 eV), which is favorable for collection of positive charge or holes.

Figure 100:
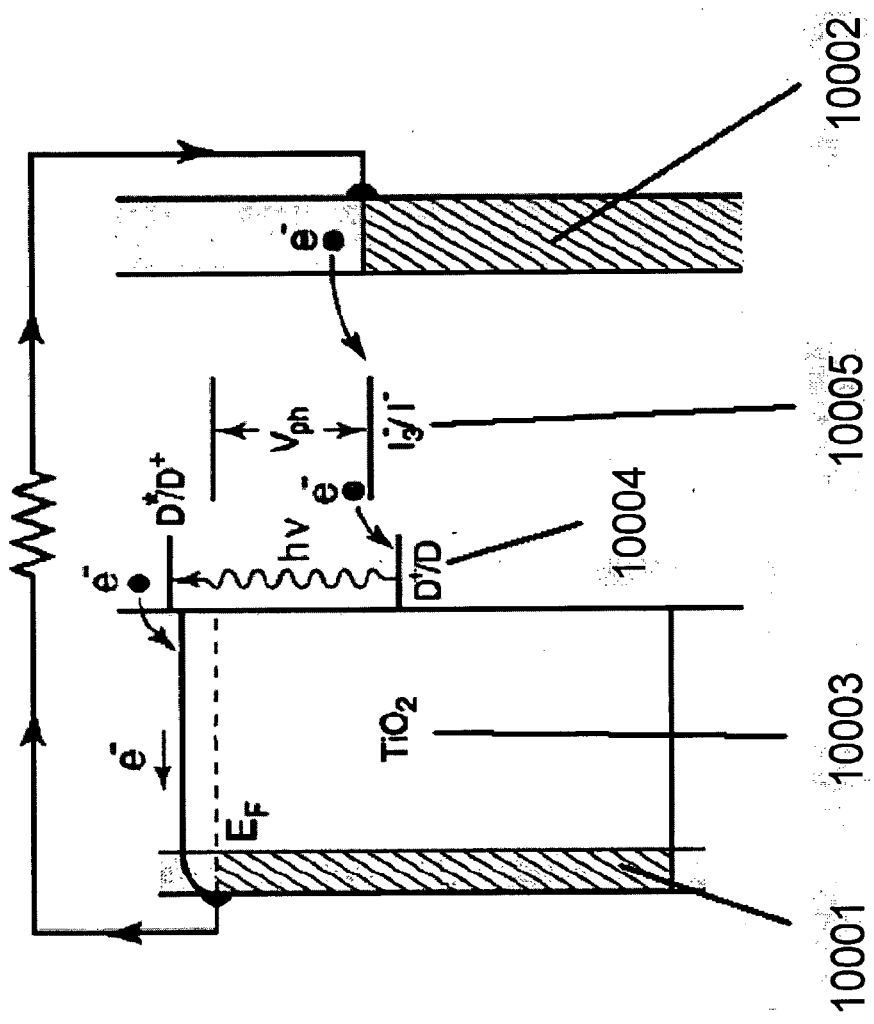
FIG. 100 is a schematic diagram showing the basic structure of a prior art dye-sensitized solar cell, in which nanofiber sheets can be used as an anode.

FIG. 100 is a schematic diagram showing the basic structure of the prior-art dye-sensitized solar cell. The DSC comprises: (1) a first transparent substrate having respective transparent electrode 10001, (2) a second non-transparent conducting electrode 10002, preferably reflective (for simplicity, electrodes 10001 and 10002 are designated first electrode and second electrode), (3) the first electrode 10001 has a photoelectrochemically active semiconductor oxide made in the form of a porous nanostructure formed of sintered colloidal particles 10003, and (4) the photo-electrochemically active semiconductor oxide is coated with a monolayer of dye molecules or quantum dots 10004. Both of said electrodes are arranged in such manner that electrode 10003 and 10002 face each other, the sides are sealed with rubber, resin, or the like, and the space between 10003 and 10002 is filled with an electrolyte 10005 which comprises a redox couple in a conventional manner, and which impregnates the porous structure of semiconductor oxide 10003 in such manner that the interface between electrolyte 10005 and dye- or quantum-dot-coated oxide has a very large effective interface. In some embodiments of the present invention, the transparent substrate of electrode 10001 is covered with a transparent nanofiber sheet or ribbon.

Invention embodiments described herein provide novel architectures, processing and fabrication methods, compositions of matter, and applications of transparent nanofiber sheets having properties and functionalities useful for photoelectrochemical solar cells design. For example, carbon nanotube sheets of invention embodiments provide the following unique properties and unique property combinations, particularly useful for photoelectrochemical solar cells: (1) high optical transparency (80-90%); (2) low electrical sheet resistance, (3) high thermal conductivities and thermal diffusivities, (4) high work function required for collection of plus charges, holes in solar cells, (5) high flexibility opposed to brittle ITO and other inorganic TCOs, (6) very high resistance to creep, (7) three dimensional morphology, which is favorable for collection of charge carriers from the bulk heterojunction types of architectures, (8) high electrochemical activity in terms of efficient and fast charge transfer between electrolyte and nanofibers due to high surface area and matched energetics, and (9) very high radiation and UV resistance—even when irradiated an electrolyte.

Figure 101:
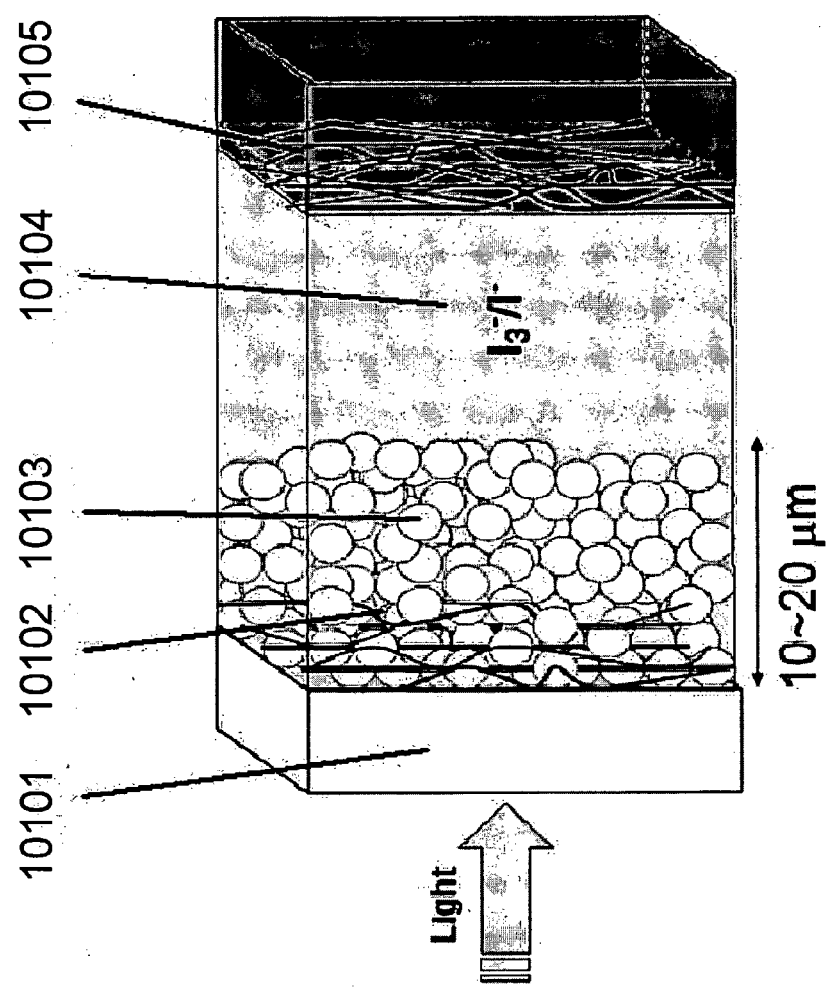
FIG. 101 schematically illustrates novel architecture for a dye-sensitized solar cell (DSC), wherein a conventional anode of a DSC is replaced by transparent nanofiber sheets, ribbons, or yarns of present invention embodiments. The cathode can also use transparent nanofiber sheets, ribbons, or yarns (instead of traditional ITO) coated by nanoporous titania.

Such a new photoelectrochemical cell as described above, for example, is shown in FIG. 101. FIG. 101 is a schematic view of an embodiment of a photoelectrochemical cell of the present invention. The photoelectrochemical cell includes a wide bandgap semiconductor electrode having a transparent porous nanofiber electrode 10102, wherein said nanofiber electrode is impregnated within its inter-fiber pores with an active material 10103 selected from the group consisting of titanium oxide, zinc oxide, tungsten oxide, and mixtures thereof, a reduction electrode having a transparent porous nanofiber electrode 10105 on glass or plastic substrate, and an oxidation-reduction electrolyte 10104.

As a transparent substrate 10101, for example, a glass substrate or plastic substrate such as polyethylene naphthalate (PEN) or polyethylene teraphthalate (PET) can be used. As a transparent electrode 10102, formed on the surface of the transparent substrate 10101, a transparent porous nanofiber sheet electrode is formed instead of a conventional transparent conducting oxide such as indium-doped tin oxide or fluorine-doped tin oxide or fluorine-doped indium oxide. The thickness of the transparent electrode is preferably in the range of 50 to 200 nm. The solar light transmittance of the transparent electrode 10102 is preferably not less than 50%.

A semiconductor photoelectrode 10103 containing the metal oxide nanoparticles (for example, 10-20 nm $TiO_2$ nanoparticles) can be coated on the surface of the transparent porous nanofiber electrode 10102 by a printing method or sol-gel method to form a film of approximately 10-20 μm thickness. Rapid sintering and anatase phase formation can be performed by a multi-mode microwave heating at a frequency chosen from the range varying from 2 to 30 GHz and power of about 1 kW for 5 minutes. After sintering, the layer exhibits a porosity of 0.5-0.65. A specific surface area of the highly porous semiconductor electrode is in the preferable range from 20 to 300 m$^2$/g. The average pore diameter of the semiconductor film is preferably in the range of preferably 5 to 250 nm. If the average pore diameter is less than about 10 nm or higher than about 250 nm, the adsorbed amount of optionally used quantum dot sensitizer is lower than that required for high photoelectric conversion efficiency.

In one embodiment, a monolayer of red dye molecules is attached to the surface of the highly porous nanofiber-metal oxide electrode by impregnation, for example, with an absolute ethanol solution of the ruthenium dye-II cis-dithiocyanato-N,N'-bis(2,2'-bipyridyl-4,4'-dicarboxylic acid)-(H$_2$)(TBA)$_2$RuL$_2$(NCS)$_2$(H$_2$O)$_4$ sensitizer at a concentration of 20 mg of dye per 100 ml of solution. The impregnation process can be optionally done at room temperature overnight. The electrode was rinsed with ethanol and then dried. The coating solution can be applied by a number of methods, such as dipping, spin-coating, spraying, ink jet printing and screen printing. The coating step may be repeated, as necessary.

In another embodiment a similar dipping step can be applied so as to adsorb quantum dot sensitizers such as PbS and PbSe.

In contrast to conventional photoelectrochemical cell design, the dispersion of a binder component with metal oxide particles is not necessary. The mechanically strong 3-dimensional nature of the transparent nanofiber sheet electrode of the present invention provides a supporting grid for porous metal oxide structure, taking into account a high adhesion of metal oxides to nanofibers (K.-H. Jung, J. S. Hong, R. Vittal, K.-J. Kim, Chemistry Letters 864-865 (2002)).

In one embodiment of this invention, the transparent porous nanofiber reduction electrode 10105 in FIG. 101 is fabricated in accordance with methods described herein. No platinization of counter-electrode is needed because such nanofibers can operate both as a charge collecting electrode and as a catalyst for enhancing the electrochemical charge transfer processes. Catalytic activity of the reduction electrode 10105 can be improved by coating the surface of electrode 10105 with a thin layer of single-wall carbon nanotubes, as shown by SEM image in FIG. 102. Both of said electrodes being arranged in such manner, shown in FIG. 101, such that electrodes 10103 and 10102 face each other, the sides are sealed with rubber, resin, or the like.

The space between the transparent photoactive front electrode and the reduction back electrode is filled with an electrolyte which comprises a redox couple in a conventional manner, and which impregnates the porous structure of semiconductor electrode in such manner that the interface between electrolyte and dye- or QD-coated oxide has a very large effective interface. The spacer particles may be interposed between the front and the back electrodes in order to prevent electrical shorting.

The MWNT nanofiber sheets possess another unique physical property. The MWNT sheets strongly absorb microwave radiation, as evidenced by their use for this welding of plastic parts in a microwave oven: two 5-mm-thick plexiglass plates were welded together using the heating of a sandwiched MWNT sheet to provide a strong, uniform, and highly transparent interface in which nanotube orientation and electrical conductivity are maintained. The microwave heating was in a 1.2 kilowatt microwave oven that operates at 2.45 GHz. Thus, microwave processing offer an attractive and very promising method of selective heating of composite films. This technique was earlier applied to the preparation of nanosize TiO$_2$ powder with a high degree of crystallinity and monodispersed particle sizes (C. Feldman and H. O. Jungk, Angew. Chem. Int. Ed. 359 (2001) and T. Yamamoto et al., Chem. Lett. 964 (2002))

In one embodiment of the present invention, involving preparation of nanofiber electrochemical electrodes, Applicants have used a microwave sintering method, wherein a carbon nanotube-metal oxide composite photoelectrode can be prepared by new low-temperature sintering methods of highly porous and conducting metal oxide film by using microwave irradiation. The metal oxide (such as TiO$_2$, WO$_3$ and ZnO) exhibits moderate coupling to microwaves because of low electrical conductivity and low magnetic induction losses. However, carbon nanotubes absorb microwaves very efficiently and can be heated very rapidly. Such highly efficient CNT-microwave coupling correlates with high conductivity and the nanosize of the carbon nanotubes leads to high induction losses. The temperature can reach 1000° C. after microwave irradiation within minutes or less.

Keeping in mind that the generalized energy loss equation is written as follows:

$$P=2\pi f \in_o \in_r \tan \sigma E^2 V_s \Theta,$$

where f and $\in_o$ are the frequency and dielectric constant; tan σ is the dielectric and magnetic loss factor, E, V$_s$, Θ are the electric field values inside the sample, volume factor, and shape factor, respectively) the absorption of microwaves occurs very effectively. Therefore the microwave heating of a MWNT sheet within a metal oxide matrix provides a strong, uniform, and transparent interface in which nanotube orientation and sheet electrical conductivity is changed relatively little.

A counter (reduction) electrode is usually constructed of expensive transparent conducting glass substrates coated with Pt catalyst films (about 60% of the total cost of DSC) which are fragile, heavy and not impact resistant and have form and shape limitations. Therefore, in order to simplify the manufacturing process and reduce the cost of DSCs and broaden their applications without significant deterioration of their performance, the transparent photoelectrode can be manufactured using transparent or non-transparent nanofiber sheets, ribbons, or yarns.

The following examples are presented to more particularly illustrate the invention, and should not be construed as limiting the scope of the invention.

Example 1

This example describes a typical method for growing nanotube forests used for selected invention embodiments. Aligned MWNT arrays (nanotube forests) were synthesized by atmospheric pressure CVD (Chemical Vapor Deposition) in a 45 mm diameter quartz tube using 5 molar percent C$_2$H$_2$ in He at 680° C., at a total flow rate of 580 sccm for 10 minutes. The catalyst was a 5 nm thick iron film that was deposited on a Si wafer substrate or glass substrate by electron beam evaporation. Based on SEM and thermal gravimetric measurements, the purity of the spun yarns was very high (~96-98% C in the form of MWNTs), with 2-4% Fe and amorphous carbon and no observed carbon particles.

Example 2

This example describes a method of invention embodiments for the introduction of twist during the spinning of carbon nanotubes from a nanotube forest. Previous attempts to draw yarns from nanotube forests resulted in extremely weak assemblies (see K. Jiang, Q. Li, and S. Fan in Nature 419, 801 (2002) and in U.S. Patent Application Publication No. 20040053780 (Mar. 18, 2004)). The present inventors find that simultaneously applied draw and twist processes increase the mechanical strength by a factor of over a thousand. The present inventors also show that the present spin-twist process is able to produce yarns even smaller than one micron in diameter. The fibers of this example were hand drawn during twisting by attaching nanotubes from the side of the nanotube forest of Example 1 to a probe tip that is coaxially attached to the axis of a variable speed motor that was typically operated at about 2000 rpm. In this example, illustrated by the photograph in FIG. 1, attachment was achieved by wrapping a yarn drawn from the nanotube forest about a miniature wooden spindle, which was attached to the center of a motor shaft. The fibers were simultaneously twisted and drawn by pulling this rotating spindle and attached nanotube yarn away from the nanotube forest. The motor was mounted on a platform (FIG. 1) and the platform was moved by hand along a tabletop to accomplish the drawing while the motor operated at approximately 2000 rpm to provide twisting. FIG. 2 is a scanning electron microscope (SEM) picture showing nanotube assembly into yarn during the spinning process of the present inventors, in which the nanotubes are simultaneously drawn from the nanotube forest and twisted. The direction of drawing was orthogonal to the original nanotube direction and parallel to the plane of the substrate, although the spinning process is sufficiently robust that the angle between the nanotube direction in the forest, perpendicular to the substrate, and the draw direction can be decreased from 90° to almost 0°. The obtained combination of yarn diameters that are hundreds of times smaller than the nanotube length (~300 μm) and nanotube twist resulted in yarns having the attractive properties that will be described in other examples.

Example 3

This example shows that extremely small diameter yarns can be spun using the method of Example 2. The yarn diameter was determined by controlling the width of the MWNT forest array that was pulled to generate the initial wedge-shaped untwisted ribbon that converged from a thickness of about the height of the forest to the width of the yarn at the wedge apex (FIG. 2). The array width ranged from below 150 μm to about 3 mm to produce singles yarn diameters of between about one and ten microns. A 200 μm wide forest array segment produced about a 2 μm diameter twisted yarn and a forest area of 1 cm² could generate an estimated 50 m of this yarn. The inserted twist was typically about 80,000 turn/m, versus about 1000 turns/m for a conventional weaving textile yarn having 80 times larger diameter. The twist resulted in densities for the MWNT yarns of about 0.8 g/cm³, based on direct measurements of yarn mass, length, and yarn diameter, the latter being measured by SEM. The linear density of the singles yarn was typically about 10 μg/m, compared with values of 10 mg/m and 20-100 mg/m for cotton and wool yarns, respectively. About a hundred thousand individual nanofibers pass through the cross-section of a 5 μm diameter nanotube yarn, as compared with the 40-100 fibers in the cross-section of typical commercial wool (worsted) and cotton yarns.

Example 4

Figure 3:
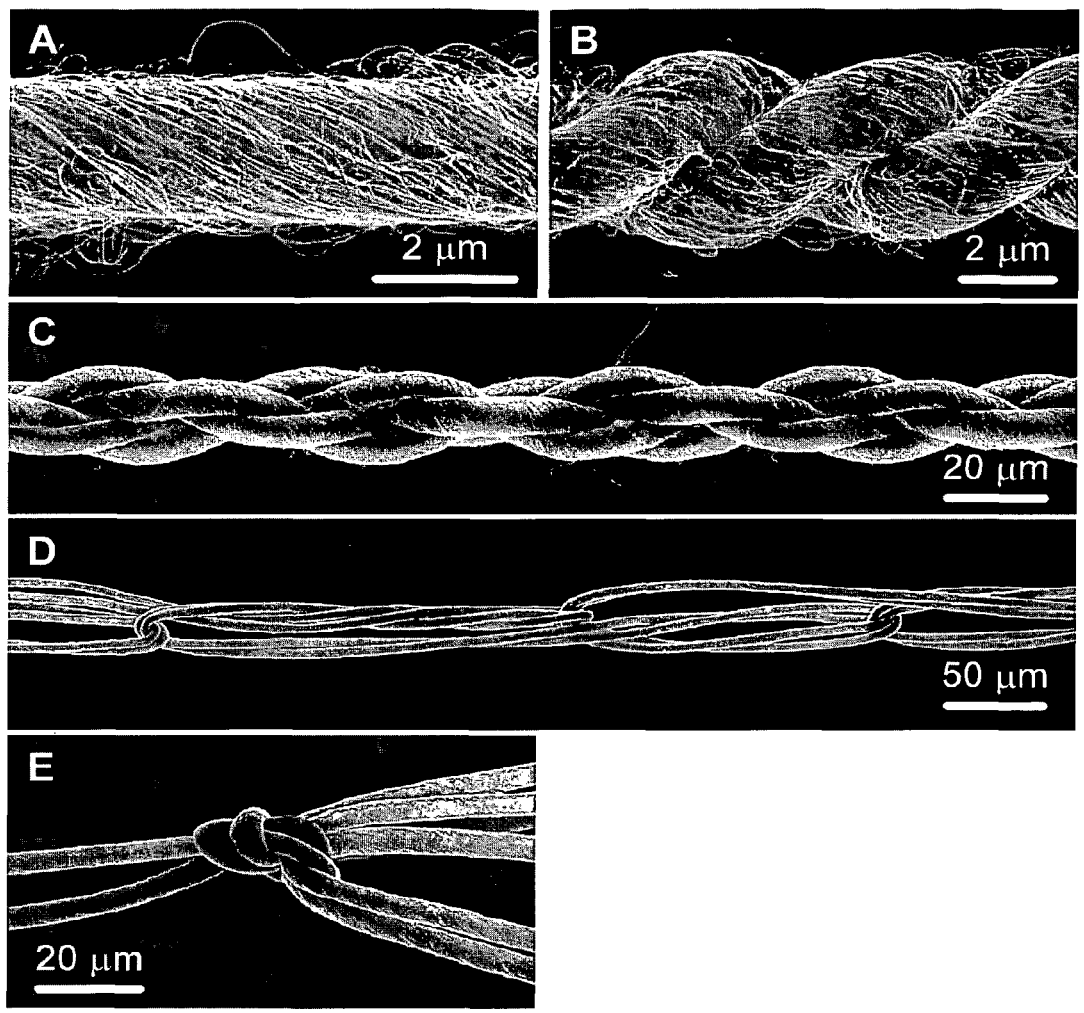
FIG. 3 shows SEM pictures of (A) singles, (B) twofold, and (C) fourfold carbon MWNT yarns, as well as (D) knitted and (E) knotted carbon MWNT singles yarns.
Figure 58:
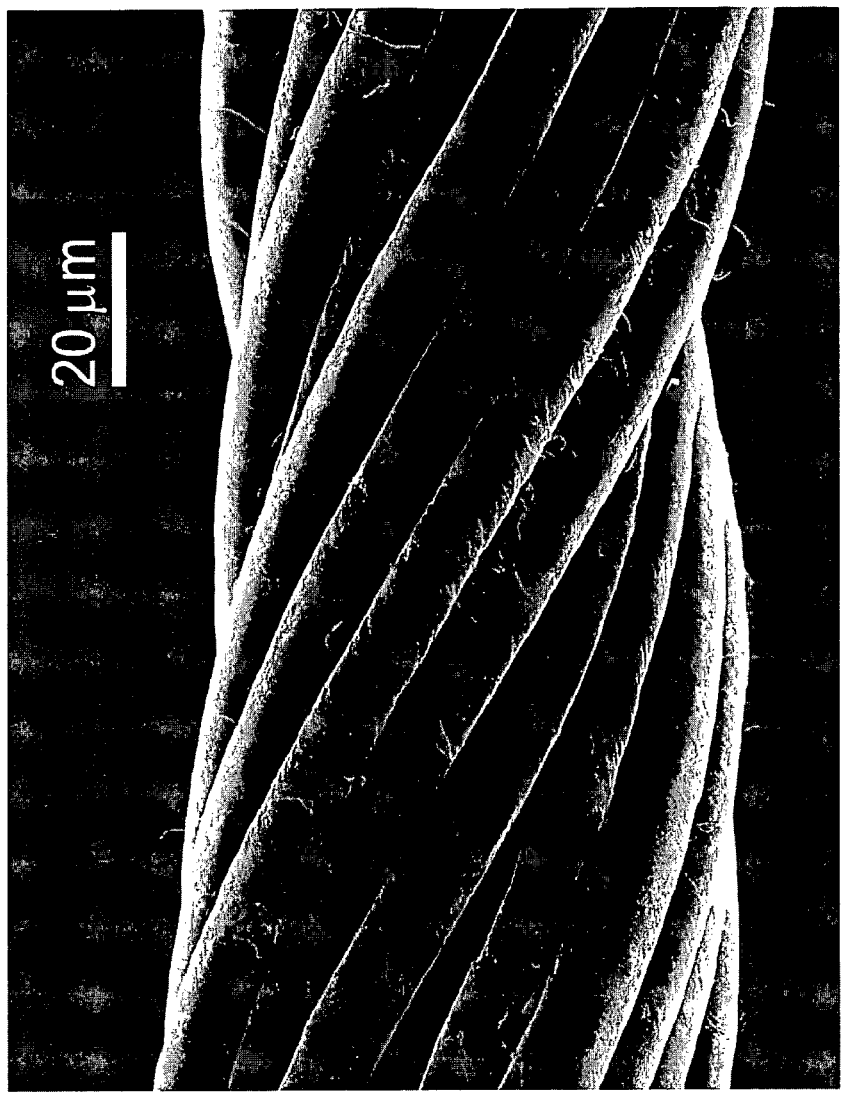
FIG. 58 is a SEM micrograph showing about twenty MWNT singles yarns that have been plied together to make a twenty-fold yarn having a diameter about equal to that of a human hair.

This example shows that the twisted fibers of Example 2 have the mechanical robustness needed for plying, and that such plying can improve the mechanical strength of the yarns. FIGS. 3 A, B, and C show SEM images of singles, twofold and fourfold MWNT yarns, respectively. The twofold yarns were obtained by over-twisting a singles yarn and subsequently allowing it to twist relax around itself until it reached a torque balanced state. The alignment of the individual MWNTs along the axis of the twofold yarn visually confirms that the twofold structure was torque balanced. This procedure was repeated for the twofold yarn (using an opposite twist direction) to produce fourfold yarns. FIG. 58 is a SEM micrograph showing about twenty MWNT singles yarns that have been plied together to make a yarn having a diameter about equal to a human hair.

Example 5

Figure 4:
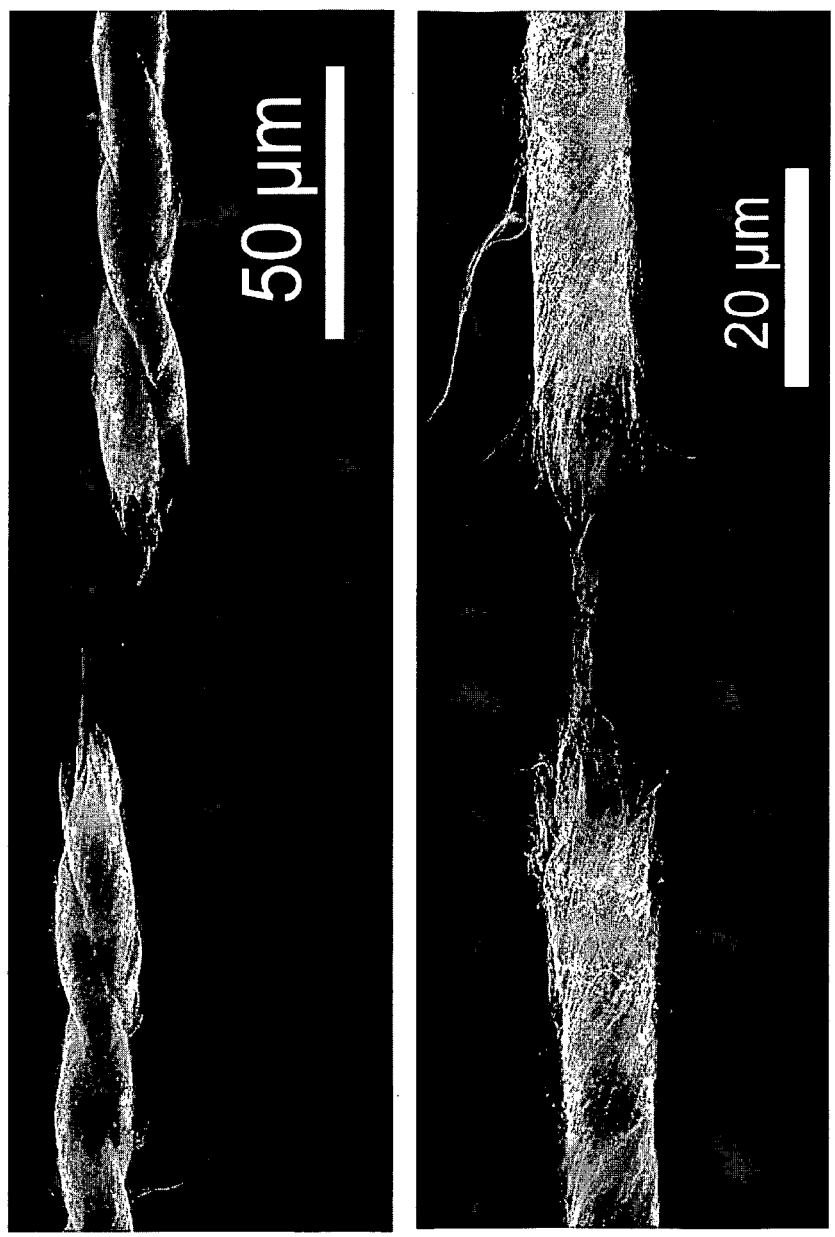
FIG. 4 provides SEM pictures showing that twisted carbon MWNT singles yarn (bottom) and twofold yarn (top) retain twist up to the point where fracture has occurred due to tensile failure.

This example (using twisted yarns and plied yarns prepared as in Examples 2 and 4) describes twist retention in knitted singles and multiple ply yarns of carbon nanotube fibers. Unlike singles yarns of conventional textiles, highly twisted MWNT singles yarns largely retain twist when the yarn ends are released (FIG. 4, top). This enhanced locking of twist likely reflects the stronger interactions between nanotubes than between the microscopic fibers in such textiles as cotton and wool. Particularly surprising, twist is retained up to the location of the break point for singles and twofold yarns that have been broken by tensile extension (FIG. 4).

Example 6

Figure 5:
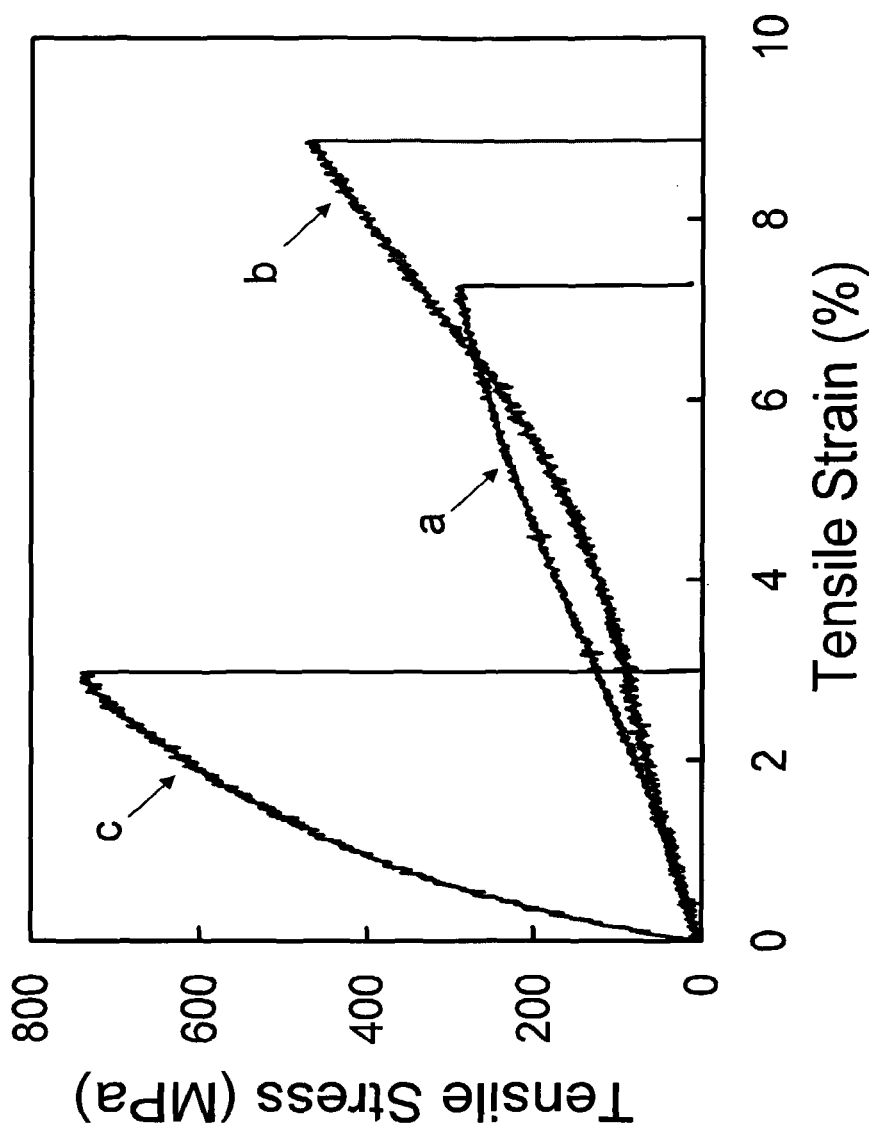
FIG. 5 shows engineering stress-strain curves up to fracture for (a) carbon MWNT singles yarn, (b) a twofold MWNT carbon nanotube yarn, and (c) a PVA-infiltrated MWNT singles yarn.

This example (using twisted yarns and plied yarns prepared as in Examples 2 and 4) shows that a draw-twist method of invention embodiments causes a thousand-fold increase in mechanical strength compared with prior-art results for nanotube yarns spun from nanotube forests. While the untwisted yarns were so weak that they broke when pulled away from surfaces that they accidentally contacted, the singles yarns had measured tensile strengths between 150 and 300 MPa. Possibly reflecting the above mentioned increase in nanofiber orientation with respect to the yarn axis as a result of folding (i.e., plying), higher strengths of between 250 and 460 MPa were observed for twofold MWNT yarns. Typical stress-strain curves for these singles and twofold yarns are shown in FIG. 5, wherein the curves correspond to (a) carbon MWNT singles yarn, (b) twofold yarn, and (c) PVA-infiltrated singles yarn. The stresses on the y-axis in this figure are engineering stresses, based on cross-sectional area measured by SEM for the unstressed yarn. As a result of a giant Poisson's ratio effect (described below in Example 14), the true stress at close to break (normalized to the true cross-sectional area at close to break) is about 30% larger. For space and aerospace applications, density-normalized strength is important. Using the maximum observed density of 0.8 g/cm³, the density-normalized failure stress of the twofold yarns is between 310 and 575 MPa/gcm$^{-3}$.

Example 7

This example shows that the singles and plied nanotube yarns of Examples 2, 3 and 4 have toughness comparable to that of high performance polymers used for antiballistic vests. The pure nanotube yarns had a much larger strain-to-failure (up to 13%) than for graphite fibers (~1%). This high failure strain, combined with high failure strength, meant that the work needed to break the yarns (called toughness) was also high: about 14 J/g for the singles yarn, 20 J/g for the twofold yarn and 11 J/g for the PVA infiltrated singles yarns, which combined their higher strength with a lower strain-to-failure (about 3-4%). While the toughness for the twofold yarn (20 J/g) is above that of graphite fibers (12 J/g) and approaches that of commercial fibers used for antiballistic vests (~33 J/g for Kevlar® fibers), far greater toughness has been demonstrated for solution spun SWNT/PVA composite fibers (600 J/g). However, this latter energy absorption is largely due to irreversible plastic deformation over large strains, so large deformations are needed and such large energy absorption can occur only once.

Example 8

This example shows that the carbon nanotube yarns can be easily knitted (see FIG. 3E) and tied into tight knots (FIG. 6). While abrasion and knotting, especially with an overhand knot, seriously degrades the strength of most polymer fibers and yarns (including the Kevlar® and Spectra® fibers and yarns used for antiballistic vests, conventional textile yarns, and even single polymer chains—causing rupture at the entrance to the knot) this is not the case for the investigated singles and twofold nanotube yarns, where tensile failure has only been observed far from an inserted overhand knot. High abrasion resistance is suggested by the absence of ultimate tensile failure in a long yarn loop that was pulled through a very tight overhand knot.

Example 9

This example, for comparison with Example 2, 37, and 52, shows that twisting nanotube sheet strip (cut parallel to the orientation direction) does not provide desired mechanical properties enhancements unless the processes and nanotube characteristics described in the invention embodiments are utilized. The oriented films from which the sheet strips were cut were magnetically oriented assemblies of micron length nanotubes (see J. E. Fischer et al., J. Applied Phys. 93, 2157 (2003)). Also, the inventors were not able to pull continuous nanotube yarns from the sides or tops of these magnetically oriented nanotube sheets or sheet strips by using draw directions that result is drawable and twistable yarns for the much longer nanotubes of invention embodiments.

Example 10

Figure 57:
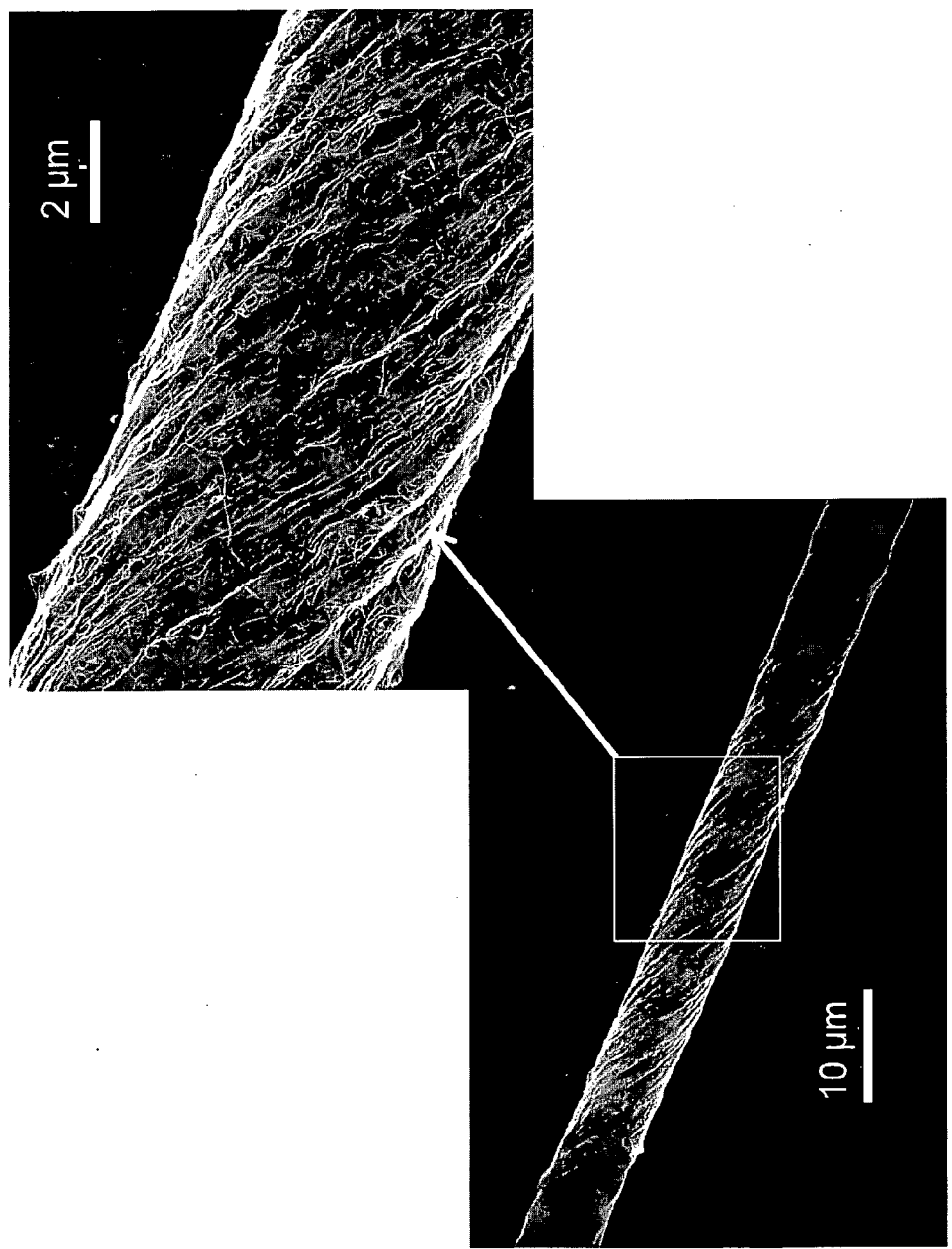
FIG. 57 provides SEM micrographs showing that the PVA infiltration has not disrupted the twist-based structure of a MWNT singles yarn.

This example shows that the mechanical properties of twisted yarns can be increased by infiltration of a polymer, polyvinyl alcohol (PVA). The yarns utilized were made by the process of Example 2. MWNT/PVA composite yarns were made either by soaking a singles yarn for 15 hours in 5 wt % aqueous PVA solution or by passing a singles yarn through a drop of this solution during spinning, and then drying. The molecular weight of the PVA was in the range 77000-79000 and it was 99.0-99.8% hydrolyzed. Infiltration with PVA increased the observed strengths of singles yarns to 850 MPa. A typical stress-strain curve for the PVA-infiltrated nanotube yarn of this example is shown in FIG. 5c. FIG. 57 provides SEM micrographs showing that the PVA infiltration has not disrupted the twist-based structure of the MWNT yarn.

Example 11

This example shows that the twisted nanotube-based yarns have high electrical conductivity both before and after the twisted nanotube yarn is converted into a nanotube/poly (vinyl alcohol) composite yarn (using the method of Example 10). The investigated yarns (diameters from 2 μm to 10 μm) had a four-probe electrical conductivity at room temperature of about 300 S/cm and a negative temperature dependence on resistance (about −0.1% per ° K between 77 and 300 K). PVA infiltration decreased the electrical conductivity of the yarns by only about 30%, leading to nanotube/PVA composite yarns that have over 150 times higher electrical conductivity than observed for nanotube composite fibers containing insulating polymers.

Example 12

Figure 7:
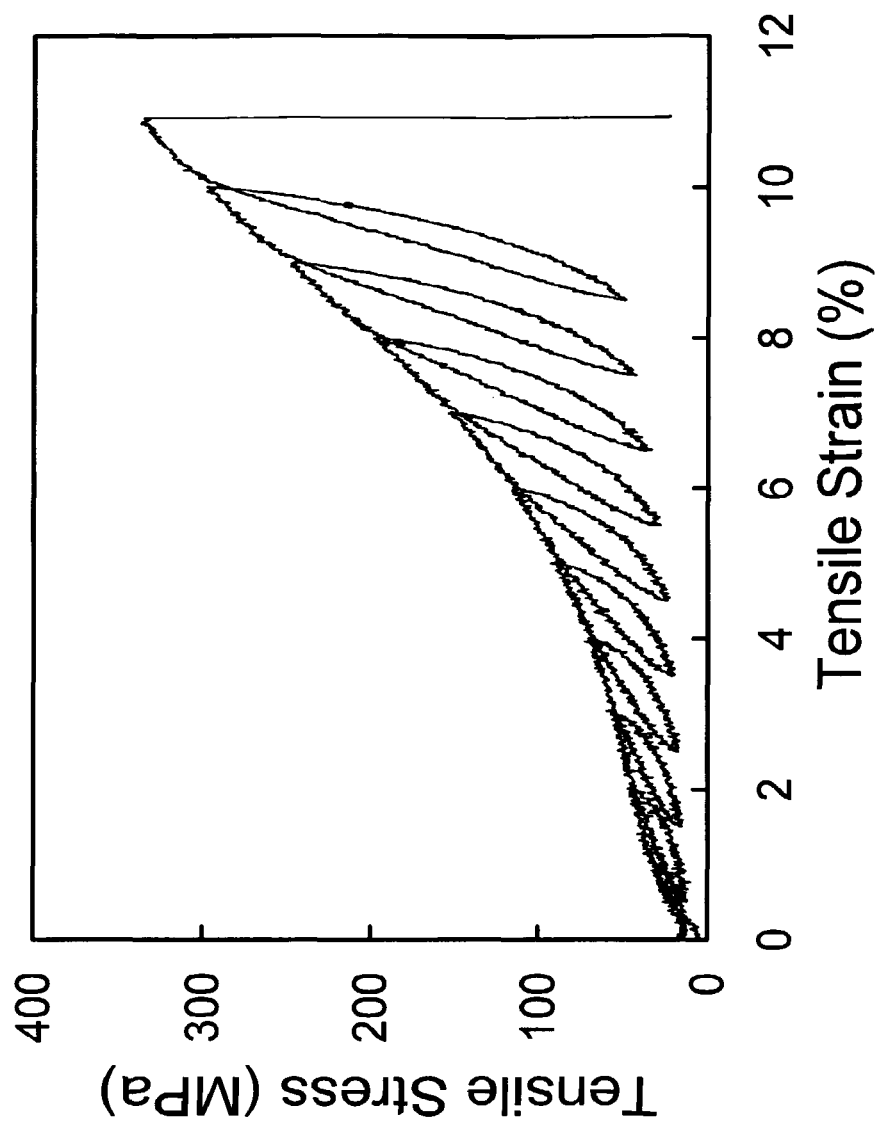
FIG. 7 shows the hysteretic stress-strain curves (1%/min strain rate) observed on unloading and reloading a twofold carbon MWNT yarn over a 1.5% strain range after prior mechanical conditioning.
Figure 8:
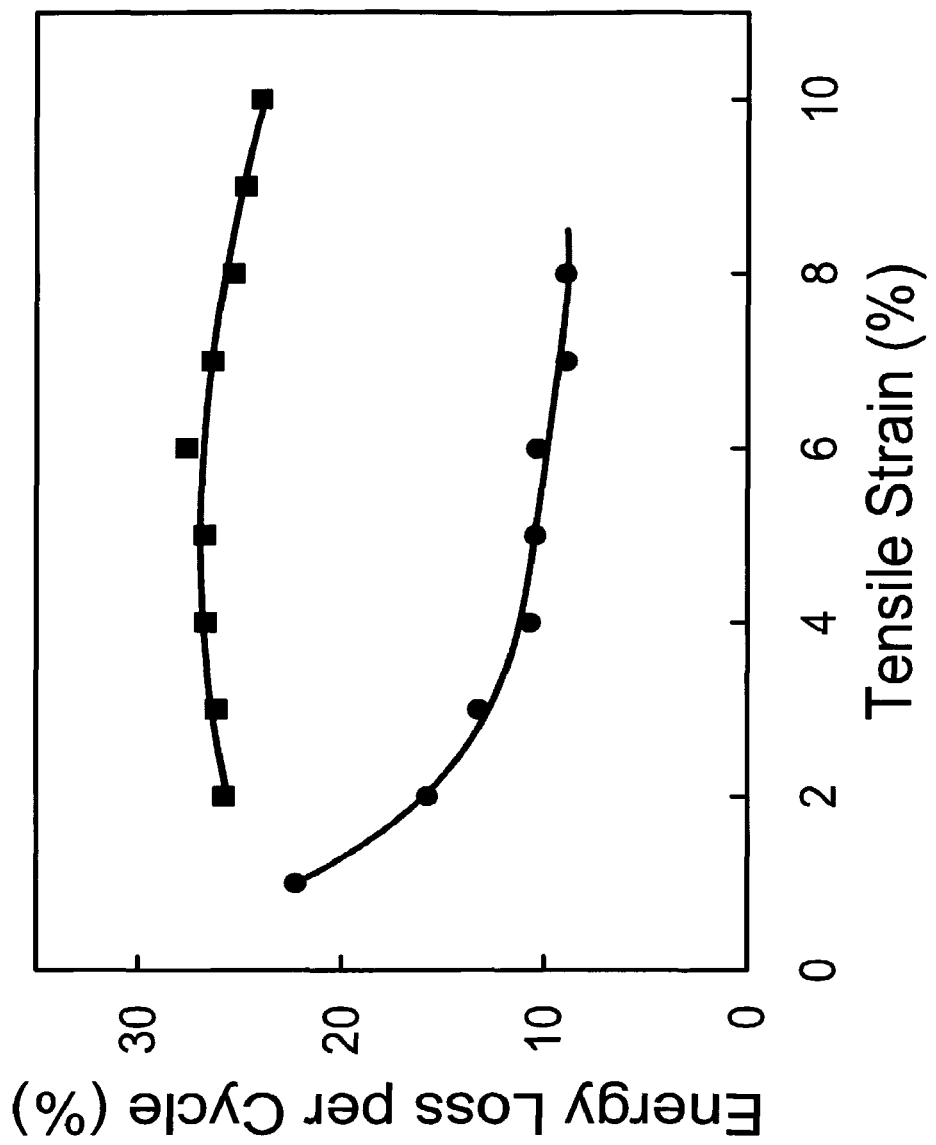
FIG. 8 shows, for the stress-strain loops in FIG. 7, the energy loss per cycle versus the initial strain on unloading for cycles of 1.5% in strain (squares) and a 0.5% in strain (circles).
Figure 9:
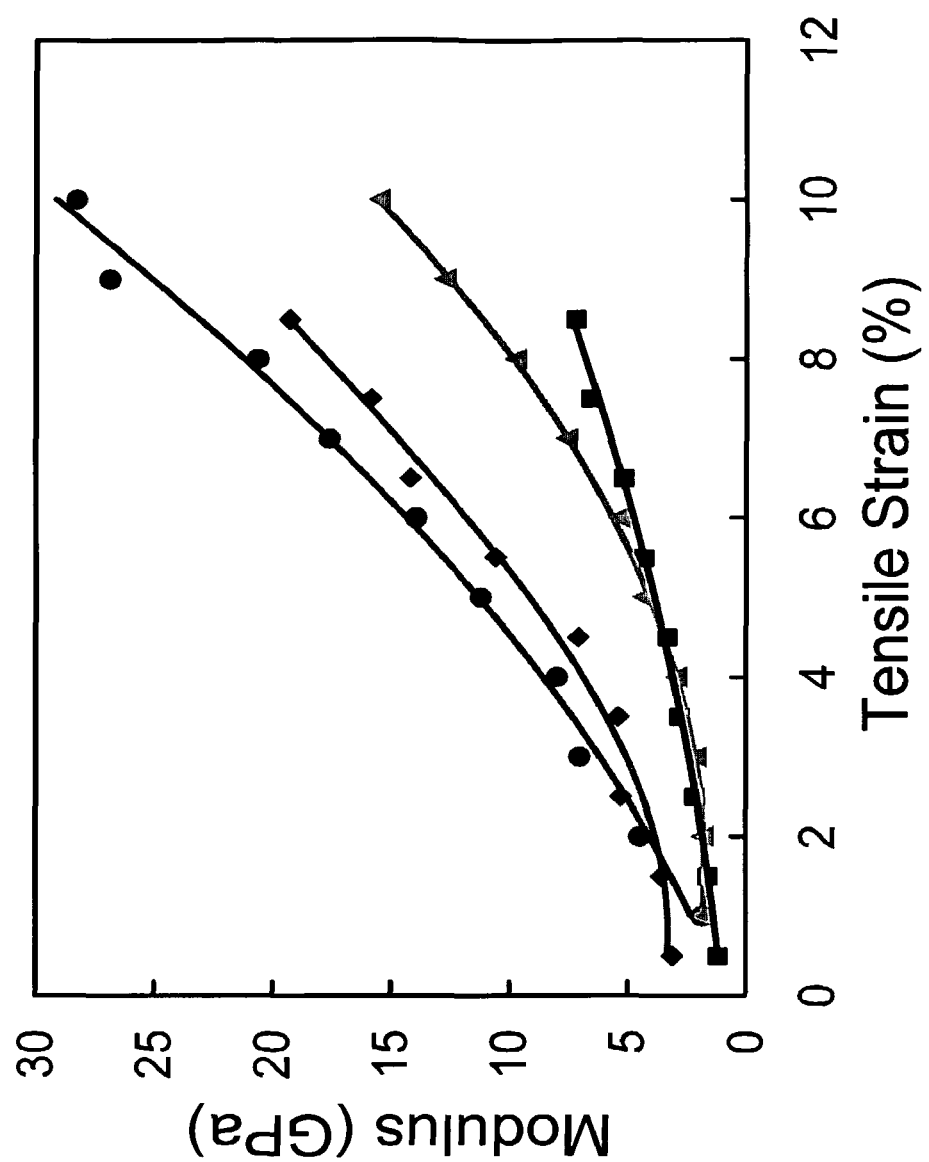
FIG. 9 shows the effective Young's modulus of a twofold carbon MWNT yarn as a function of the stage of the hysteresis cycle, wherein the effective yarn modulii calculated for the stress-strain loops shown in FIG. 7 are plotted versus total tensile strain, and wherein the circles and squares are the effective modulii for the beginning and end of unloading, respectively, and the diamonds and triangles are those for the beginning and end of reloading, respectively.

This example shows that (a) the twisted carbon nanotube yarns have a dramatically increased elastic strain region compared with that of the prior-art, high strength carbon nanotube yarns, (b) this long elastic region provides a high elastically recoverable component to yarn toughness, and (c) the reversible deformation of the yarn is hysteretic. The nanotube yarns show hysteretic stress-strain curves when subjected to load-unload cycles (FIG. 7). While complete unloading from the initial load does not return the yarn to its original length, the initial hysteresis loop is essentially unshifted on subsequent cycling. Depending upon the initial strain, the observed energy loss per stress-strain cycle of a twofold MWNT yarn is in the 9% -22% range for 0.5% cycle strain, the 24% -28% range for 1.5% cycle strain (FIG. 8), and the 39% -48% range for the maximum reversible cycle strain (2% -3% for total strains up to 8%). Within a hysteresis loop, the effective modulus on initial unloading and initial reloading is much larger than for the final parts of the unloading and reloading steps (FIG. 9). Also relevant for applications, the failure strength of nanotube yarn (singles and doubles) was unaffected by 50 loading-unloading cycles over a stress range of 50% of the failure stress. Unlike nanotube sheets made by filtration of nanotube solutions, the nanotube yarns are resistant to creep and associated stress relaxation—the stress relaxed no more than 15% when a twofold nanotube yarn was held for 20 hours at 6% strain (170 MPa initial stress), and this small stress relaxation occurred within the first 20 minutes and was largely viscoelastic (i.e., reversible).

Example 13

This example demonstrates the extreme stability of the mechanical properties of twisted nanotube yarns in air at high temperatures, as well as retention of properties at cryogenic temperatures. These yarns were made by the method of Example 2. The failure strength of a twofold yarn (300 MPa) was essentially unchanged after heating in air at 450° C. for an hour. Although evidence of air-oxidation was evident in SEM micrographs, a nanotube yarn held at 450° C. for 10 hours was sufficiently strong and flexible to be tightly knotted. Tight knot tying was also possible while the nanotube yarn was immersed in liquid nitrogen.

Example 14

Figure 10:
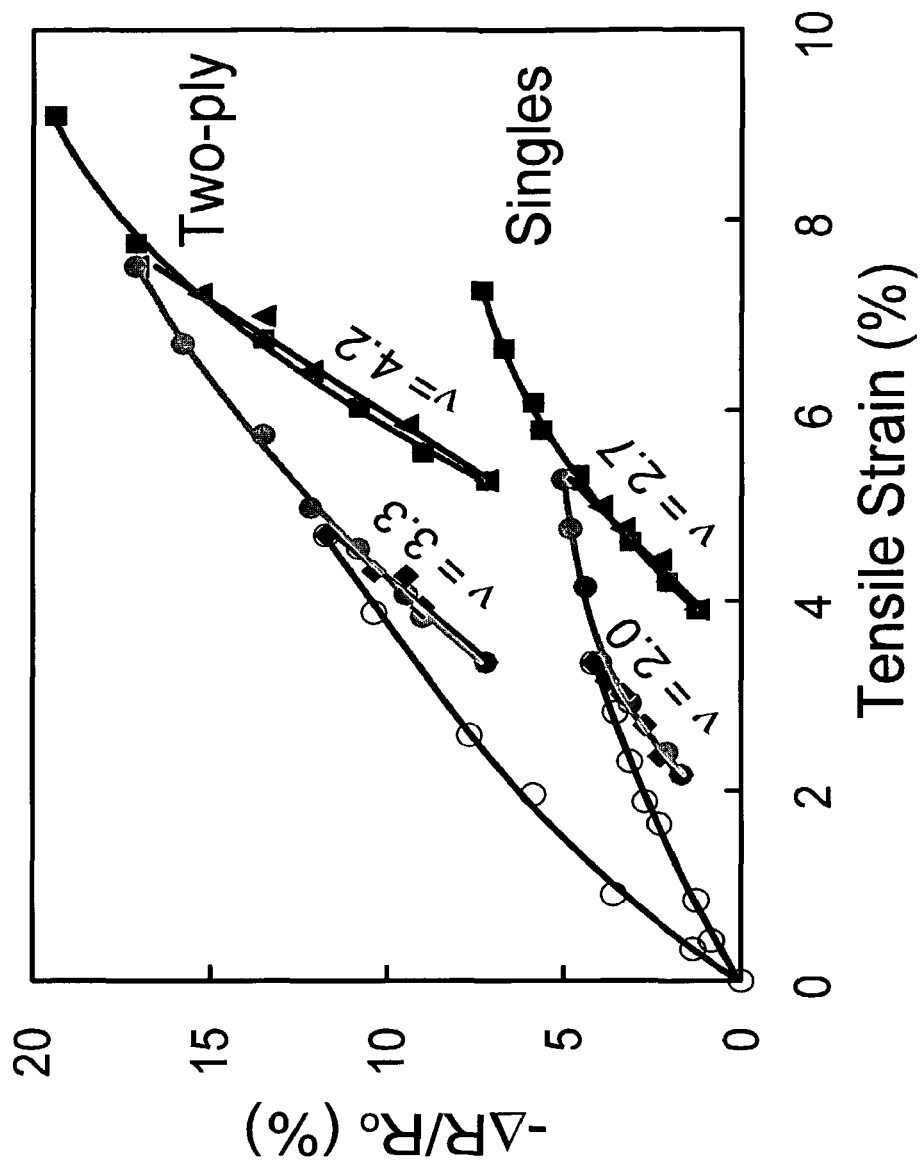
FIG. 10 shows the relationship between percent change in diameter and percent change in length during stretching a twofold MWNT yarn (top) and a singles MWNT yarn (bottom), wherein the symbols used are: open circles (initial stretch), solid diamonds (the first stress decrease), solid closed circles (second stress increase), solid triangles (second stress decrease), and solid squares (stress increase until yarn rupture), wherein the curves are guides for the eye.

This example demonstrates that the inventors have achieved giant Poisson's ratios for the carbon nanotube yarns spun by the process of Example 2. They observe giant Poisson's ratios for the nanotube yarns, which increases with increasing strain from 2.0 to 27 for MWNT singles yarn and from 3.3 to 4.2 for twofold yarn (FIG. 10). These Poisson's ratios, measured while stretching the yarn in a SEM, are up to 12 times larger than observed in orthogonal directions for ordinary solids. A Poisson's ratio of 4.2 means that elongating the yarn by a strain $\in$ provides a 4.2 times larger strain in each of the lateral dimensions and a fractional volume decrease of 7.4$\in$, versus the fractional volume increase of about 0.4$\in$ for ordinary solids. Hence, the nanotube yarns are stretch-densified, which is quite a rare property for solids. Out of 500 crystal phases investigated in a global search of the literature, only 13 were found to be stretch densified (see R. H. Baughman, S. Stafström, C. Cui, S. O. Dantas, Science 279, 1522 (1998)). A stretch-densified material must have a negative linear compressibility, meaning in the present case that the yarn length increases when the yarn is hydrostatically compressed with a non-penetrating hydrostatic media. These giant Poisson's ratios and the associated stretch-induced volume decrease of up to 7.4$\in$ might be used for tuning the absorption and permeability of nanotube yarns and textiles by applying small applied strains in the yarn direction (or directions). The inventors above describe the application of this stretch densification for the fabrication of electronic devices (using their novel knottronics approach for obtaining the patterning capabilities that are ordinarily obtained for electronic devices using photo lithography).

Example 15

Figure 18:
FIG. 18 is a picture of a twofold twisted MWNT yarn that has been electrically heated to incandescence in an inert atmosphere chamber.

This example demonstrates the application of a nanotube yarn spun by the twist-draw process (Example 2) and plied (Example 4) for the filament of an incandescent light. FIG. 18 is a picture of a twofold twisted multiwalled nanotube yarn that has been electrically heated to incandescence in an inert atmosphere chamber. The yarn is wound between two metal leads that are spaced apart by about 20 mm and silver paste is applied to the yarn at the junctions with the metal leads to lower resistance. The filament so formed emits light when a voltage is applied. While it has been well known from the time of Thomas Edison, this is the first example of the application of a twisted, high toughness yarn for this application (see Example 7 for the measurement results for the toughness of the twisted yarns). The existence of this toughness can enable the fabrication of incandescent light bulbs that are more resistant to filament failure by mechanical damage than are conventional incandescent light bulbs.

Example 16

Figure 11:
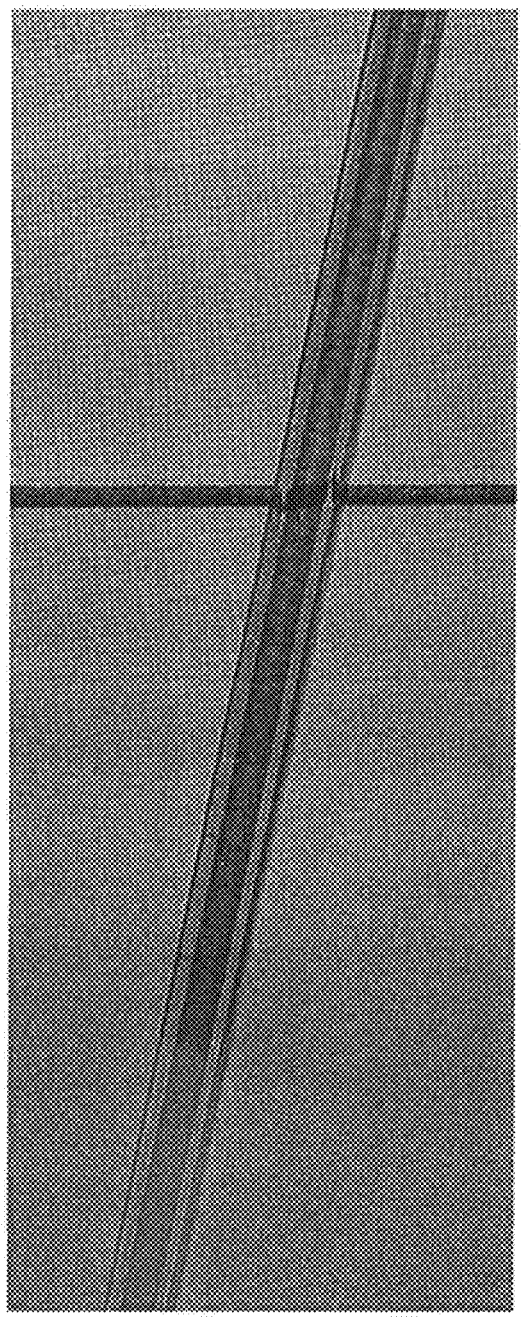
FIG. 11 shows a photograph of a spun carbon MWNT ribbon that is helically wrapped on a 1 mm diameter hollow capillary tube, wherein the high transparency (resulting from a wrap thickness that provides a low layer resistively) is indicated by the legibility of a ¾ point line that is on paper sheet behind the nanotube ribbon-wrapped capillary tube.

This example demonstrates the drawing of carbon nanotubes from a multi-wall carbon nanotube forest to form a transparent nanotube ribbon, as well as the wrapping of this nanotube ribbon about a mandrel (a hollow capillary tube), to produce the transparent article of FIG. 11. Using the nanotube forest of Example 1, the inventors surprisingly found that nanotube ribbons having arbitrarily wide widths could be drawn from the forest and that these ribbons are optically transparent. The width of the obtained ribbon essentially equaled the width of the nanotube forest sidewall that was pulled (without twisting) from the forest. These ribbons were sufficiently mechanically robust that they could be easily manipulated without breaking. FIG. 11 shows an approximately millimeter-width nanotube ribbon that was helically wrapped on a millimeter diameter glass capillary tube. The transparency of the ribbon is indicated by the visibility of the printed line on the sheet of paper that is beneath the nanotube-ribbon-wrapped glass capillary tube.

Example 17

The method of Example 16 can be used for the fabrication of hollow tubes that can be employed for cell growth, such as neurons. This capability is important, since while the suitability of nanotubes for cell growth is well established in the prior art, methods have not be described for the fabrication of suitably shaped nanotube assemblies for this purpose. A hollow tube comprising nanotube ribbon can be prepared as in Example 16. The choice of mandrel is made to facilitate subsequent removal of the wrapped ribbon from the cylindrical mandrel. Sufficient layers of nanotube ribbon to provide needed mechanical strength can be wrapped either as a helix or as two oppositely wrapped helices. The mechanical strength of the helically wrapped ribbons can be optionally enhanced using the liquid-based densification process of Example 23. The mandrel wrapped nanotube ribbon can then be removed from the mandrel to provide a hollow tube that is suitable as a substrate for cell growth. This removal from the mandrel can be accomplished is various ways. One method is by using a mandrel that is a polymer that depolymerizes and evaporates at low temperatures. Another method is by coating a glass capillary tube with an easily solubilized coating, whose dissolution enables the hollow tube comprising nanotube ribbon to be slipped from the mandrel.

Example 18

Figure 17:
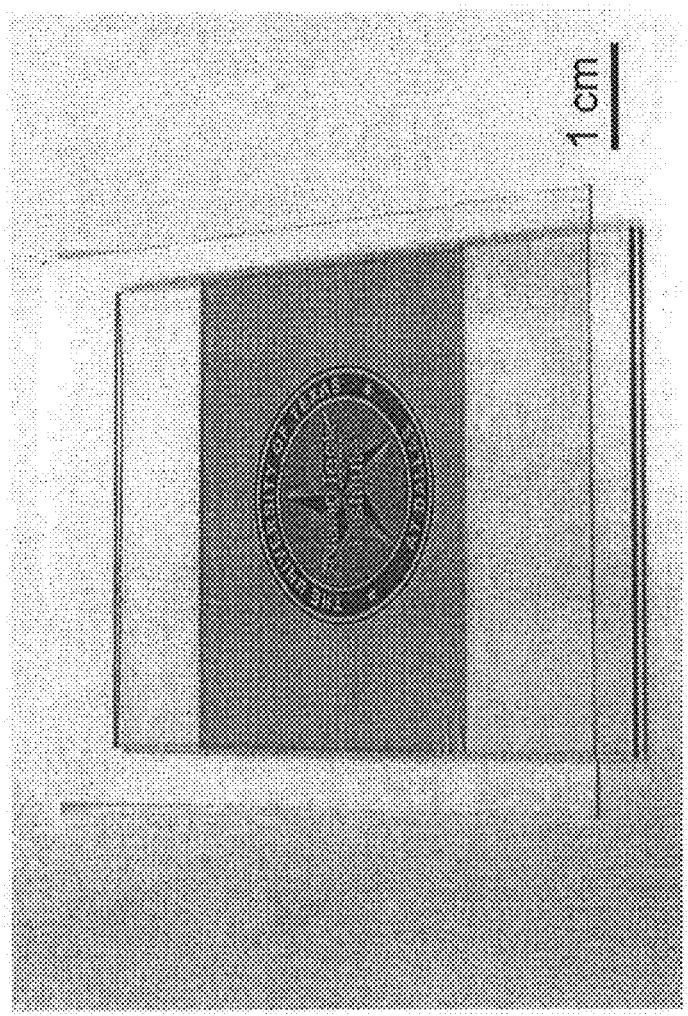
FIG. 17 is a photograph of a spun MWNT ribbon that is deposited on one side of a glass microscope slide to make a transparent conducting sheet, wherein the printing of a logo is on a sheet of white paper that is beneath the electrically conducting layer.

This example demonstrates fabrication and deposition of a very wide MWNT ribbon on a glass substrate to provide a transparent electrically conducting layer. This very wide ribbon was drawn from the nanotube forest of Example 1 by pulling a forest sidewall section that approximately equals the ribbon width. Details on the various ways that the inventors were able to conduct this draw are provided in Examples 21 and 46. FIG. 17 pictures the nanotube sheet, after it was mechanically pressed onto the glass substrate. Because the nanotubes are well aligned in the sheet, the electrical and optical properties are anisotropic. The printing is on a sheet of white paper that is beneath the electrically conducting layer. The visibility of the printing indicates the transparency of this electrically conducting sheet.

Example 19

This example describes a method for fabricating a twisted yarn that is an electrochemical device, such as a supercapacitor or a battery. A carbon nanotube singles yarn (Example 2) is over twisted to the amount sufficient to form a twofold yarn (as in Example 4). While held at the tension used for the twist process, the twisted yarn is exposed to an aqueous solution comprising polyvinyl alcohol and phosphoric acid, or other well-known media suitable as an electrolyte. This exposure results in imbibing this electrolyte precursor into the yarn and overcoating it. Residual liquid is then optionally removed by evaporation to form a solid electrolyte or a gel electrolyte. The opposite ends of the electrolyte coated fiber are then brought together to permit twist-relaxation to form a twofold yarn in which the electrolyte coating prevents direct lateral electrical contact between the two component singles yarns that comprise the twofold yarn. If the electrolyte is too mechanically resistant for this plying to automatically occur, the two yarn segments can be mechanically wound together in another twist process. This twofold yarn is then optionally overcoated with additional electrolyte. The loop end of the twofold yarn is then cut so that the two fibers are then electronically isolated with respect to one another, being in contact only through the electrolyte gel. The two electronically separated electrolyte-filled singles yarns within the twofold yarn can potentially serve as opposite electrodes for a fiber supercapacitor. As an alternative to the above fabrication method, two twisted singles yarns could be coated and imbibed with electrolyte, optionally partially dried, and then twisted together or otherwise combined in side-by-side contact prior to an optional step of over coating the fiber pair with electrolyte. The practice of this latter method for untwisted nanotube fibers is described by A. B. Dalton et al. in Nature 423, 703 (2003). Analogous methods can be used to make a fiber battery. However, in order to achieve high energy storage density for such fiber supercapacitor, the electrolyte used for the above processes is optimally selected to have a high redox stability range and the salt component in the electrolyte is preferably selected to be a lithium salt of a type conventionally selected for lithium batteries.

Example 20

This example shows that nanotube yarns can be optionally densified prior to twisting using the surface tension effects of an imbibed liquid. After the nanotube yarn is pulled from the forest, it is then passed through a liquid bath or exposed to a liquid vapor. Suitable liquids for such densification of yarns pulled from the forest of Example 1 include methanol, isopropyl alcohol, and acetone. The evaporation of the liquid absorbed in the yarn causes shrinkage in the lateral direction, leading to densification. The inventors show in Example 38 that densification of drawn ribbons prior to twist made it possible to obtain uniformly twisted yarn even when the applied twist is very low (corresponding to a helix angle of 5°). Application of such low twist in the absence of pre-applied liquid-based yarn densification resulted in non-uniform twist and yarn diameter.

Example 21

Figure 21:
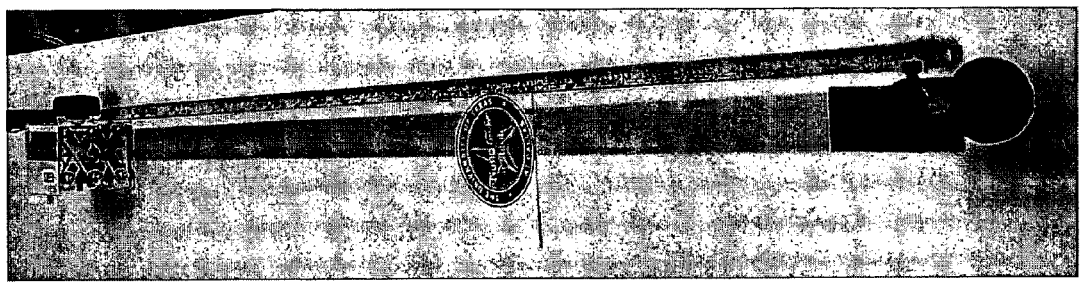
FIG. 21 is a photograph of a self-supporting 3.4-cm-wide meter-long MWNT sheet that has been hand drawn from a nanotube forest at an average rate of 1 m/min, wherein sheet transparency is illustrated by the visibility of the NanoTech Institute logo that is behind the MWNT sheet.

This example shows that a continuous, transparent nanotube sheet having high strength can be drawn from a sidewall of multiwalled nanotube (MWNT) forest of Example 1. The MWNTs were ~10 nm in diameter and the range of investigated forest heights was 50 to 300 μm. Draw was initiated using an adhesive strip to contact MWNTs teased from the forest sidewall. Meter-long sheets, up to 5 cm wide, were then made at a meter/minute by hand drawing (FIG. 21). Sheet transparency is illustrated by the visibility of the NanoTech Institute logo that is behind the MWNT sheet. Despite a measured areal density of only ~2.7 μg/cm², these 500 cm² sheets are self-supporting during draw. A one centimeter length of 245 μm high forest converted to about a three-meter-long free-standing MWNT sheet. The sheet production rate was increased to 5 m/min by using an automated linear translation stage to accomplish draw at up to 10 m/min by winding the sheet on a rotating cm-diameter plastic cylinder. The sheet fabrication process is quite robust and no fundamental limitations on sheet width and length are apparent: the obtained 5 cm sheet width equaled the forest width when the draw rate was about 5 m/min or lower. The nanotubes are highly aligned in the draw direction, as indicated by the striations in the SEM micrograph of FIG. 22. This draw process does not work for most types of MWNT forests and the maximum allowable draw rate depends on the structure of the forest. Intermittent bundling within the forest is useful, wherein individual nanotubes migrate from one bundle of a few nanotubes to another. Bundled nanotubes are simultaneously pulled from different elevations in the forest sidewall, so that they join with bundled nanotubes that have reached the top and bottom of the forest, thereby minimizing breaks in the resulting fibrils (FIGS. 22 and 23). Disordered regions exist at the top and bottom of the forests, where a fraction of the nanotubes form loops, which might help maintain continuity. For forests having similar topology and nanotube lengths in the 50 to 300 micron range for different forests, the longer nanotubes (corresponding to the higher forests) were easiest to draw into sheets—likely because increasing nanotube length increases inter-fibril mechanical coupling within the sheets.

Example 22

Figure 41:
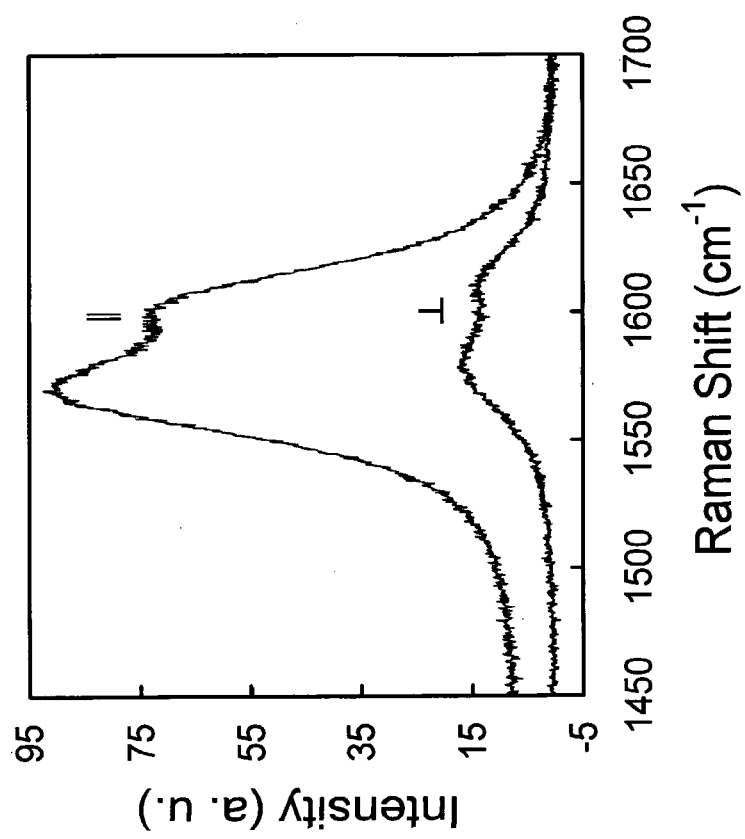
FIG. 41 The high degree of nanotube orientation in the nanotube sheet is demonstrated by this Raman data for an as-drawn four-sheet stack in which all sheets have the same orientation. A VV configuration (parallel polarization for incident light and Raman signal) was used, with polarization parallel to ($\parallel$) or perpendicular to ($\perp$) the draw direction of the nanotube sheets.

This example shows that the solid state drawn nanotube sheet of Example 21 comprises a novel, useful state of matter that was previously unknown: an aerogel comprising highly oriented carbon nanotubes. From the measured areal density of about 2.7 μg/cm² and the sheet thickness of about 18 μm, the volumetric density is approximately 0.0015 g/cm³. Hence, the as-produced sheets are an electronically conducting, highly anisotropic aerogel that is transparent and strong. The high degree of nanotube orientation in the nanotube sheet is demonstrated by the Raman spectra of FIG. 41 of an as-drawn four-sheet stack in which all sheets have the same orientation. A VV configuration (parallel polarization for incident light and Raman signal) was used, with polarization parallel to ($\parallel$) or perpendicular to ($\perp$) the draw direction of the nanotube sheets. The ratio of Raman intensity (632.8 nm excitation) of the G band for polarization parallel and perpendicular to the draw direction is between 5.5 and 7.0 for the VV configuration (parallel polarization for incident light and Raman signal), which correspond to polarization degrees of 0.69 and 0.75, respectively, for the investigated four-sheet stacks (FIG. 41). The anisotropy of light absorption (FIG. 25) also indicated the high anisotropy of the nanotube sheets. Ignoring the effect of light scattering, the ratio of absorption coefficient for parallel and perpendicular polarizations for the as-drawn single sheet was 4.1 at 633 nm, and monotonically increased to 6.1 at 2.2 μm. The striations parallel to the draw direction in the SEM micrograph of FIG. 22 provides more evidence for the high degree of nanotube orientation for the as-drawn nanotube sheets.

Example 23

Figure 24:
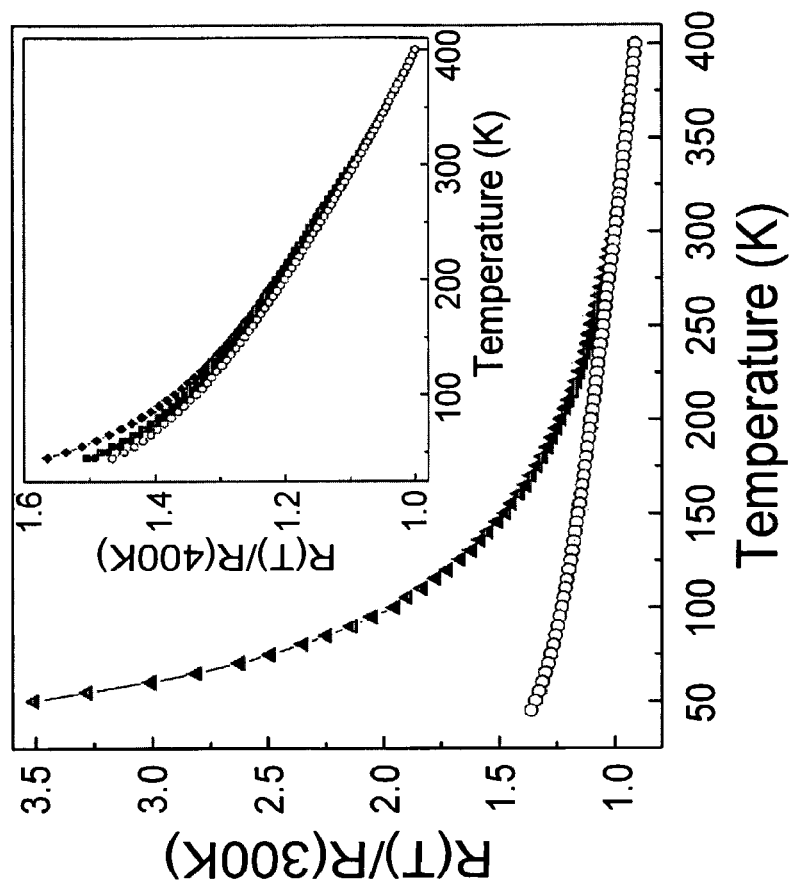
FIG. 24 shows sheet resistance R(T) measured in vacuum, normalized with respect to R(300 K), versus temperature. The inset shows the nearly identical temperature dependence of sheet resistance in the draw direction for forest-drawn sheets before (solid rectangles) and after densification (open circles), in the orthogonal direction for the densified forest-drawn sheet (diamonds), and for a filtration-fabricated sheet of forest-grown MWNTs (solid circles).
Figure 25:
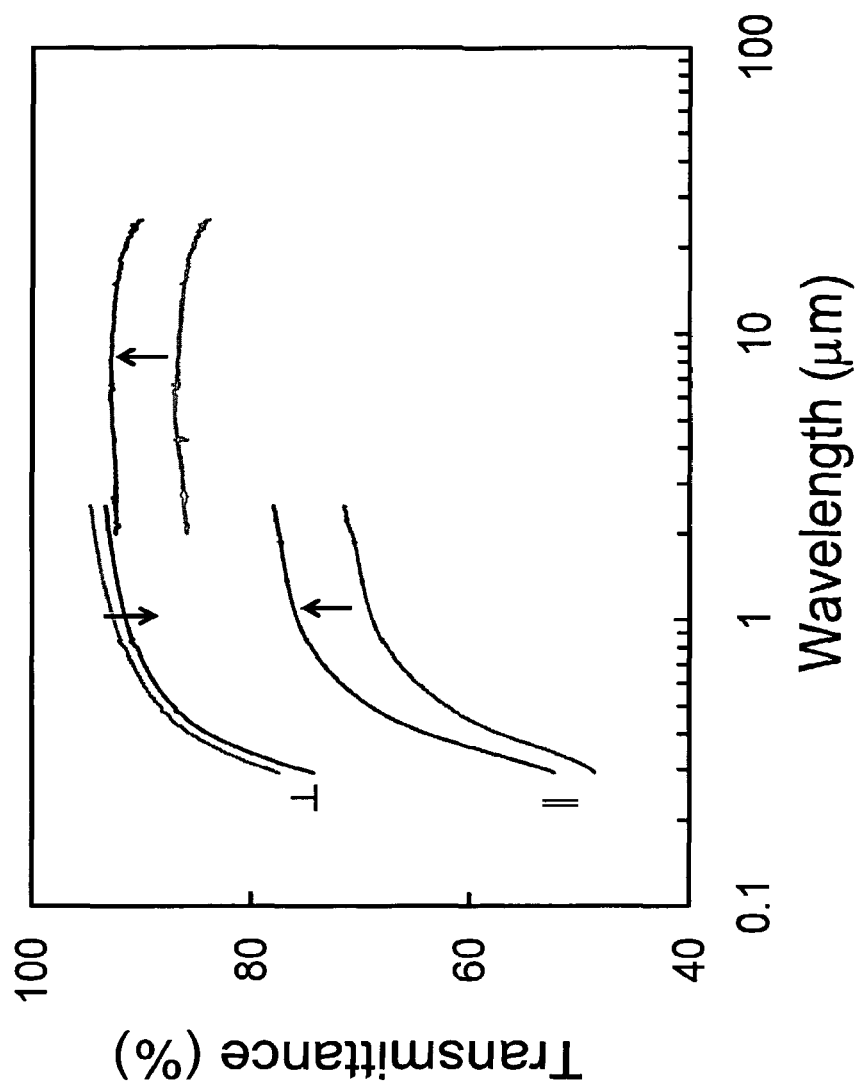
FIG. 25 shows optical transmittance versus wavelength for a single MWNT sheet, before and after densification, for both polarized and unpolarized light, where the arrow points from the data for the undensified sample to that for the densified sample.

This example shows that the inventors can easily densify these highly anisotropic aerogel sheets into highly oriented, transparent, electrically conducting sheets having a thickness of 30-50 nm and a density of ~0.5 g/cm³. The inventors obtain this 360-fold density increase by simply adhering by contact the as-produced sheet to a planar substrate (e.g., glass, many plastics, silicon, gold, copper, aluminum, and steel), immersing the substrate with attached MWNT sheet into a liquid (e.g. ethanol), retracting the substrate from the liquid, and then retracting the substrate from the liquid, and then permitting evaporation. Densification of the entire sheet, or selected areas within the sheet, can also be similarly obtained by dropping or otherwise injecting such a liquid onto the sheet area where densification is desired, and allowing evaporation. Surface tension effects during ethanol evaporation shrink the aerogel sheet thickness to ~50 nm for the MWNT sheet prepared as described in Example 1. SEM micrographs taken normal to the sheet plane suggest a small decrease in nanotube orientation as a result of densification. However, this observation is deceptive, as the collapse of ~20 μm sheets to ~50 nm sheets without changes in lateral sheet dimensions means that out-of-plane deviations in nanotube orientation become in-plane deviations that are noticeable in the SEM micrographs. The aerogel sheets can be effectively glued to a substrate by contacting selected regions with ethanol, and allowing evaporation to densify the aerogel sheet. Adhesion increases because the collapse of aerogel thickness increases contact area between the nanotubes and the substrate. The performance of liquids that do not perform well for liquid-based sheet, ribbon, or yarn densification for a particular type of nanotube can be enhanced by adding a suitable surfactant. For example, water does not perform satisfactorily for densifying the nanotube sheets prepared using the method of Example 21 from the nanotube forests of Example 1. However, a surfactant/water mixture (either 0.7 weight percent Triton X-100 in water or 1.2 weight percent lithium dodecyl sulfonated in water) was a satisfactory densification agent. Other considerations for the choice of liquid for densification are liquid viscosity (which affects the rate of the liquid infiltration process) and the ease at which this liquid can be volatilized during subsequent processing. Quite surprisingly, the sheet resistance (FIG. 24) in the draw direction changes by <10% upon sheet densification by a factor of ~360, which increases sheet transparency (FIG. 25). While the anisotropy ratio for sheet resistance decreases from 50-70 for the undensified sheets to 10-20 for the densified sheets, this anisotropy ratio for the densified sheets is nearly temperature invariant.

Example 24

For comparison purposes with the nanotube sheets made by the present technologies, this example shows the application of conventional filtration-based processes for the fabrication of SWNT and MWNT sheets. In other examples, the inventors will compare the properties of these conventionally prepared sheets with those of the present technologies. The forest-grown MWNTs of Example 1 were used for the filtration-based sheet fabrication process. The latter sheets made by the filtration route utilized an ultrasonically dispersed mixture of 0.07 wt % MWNTs in an aqueous solution containing 0.7 wt % Triton® X-100 as surfactant. The SWNT sheets were analogously made using carbon monoxide synthesize nanotubes (HiPco) obtained from Carbon Nanotechnologies, Inc. Prior to measurements, residual surfactant was removed from these MWNT and SWNT sheets by thermal annealing at temperatures up to 1000° C. in argon. Thermal gravimetric analysis of forest-derived MWNTs in oxygen shows that they contain at most 4% non-combustible weight, which is likely due to catalyst particles. The wt % catalyst in the HiPco nanotubes is ~30%.

Example 25

Figure 26:
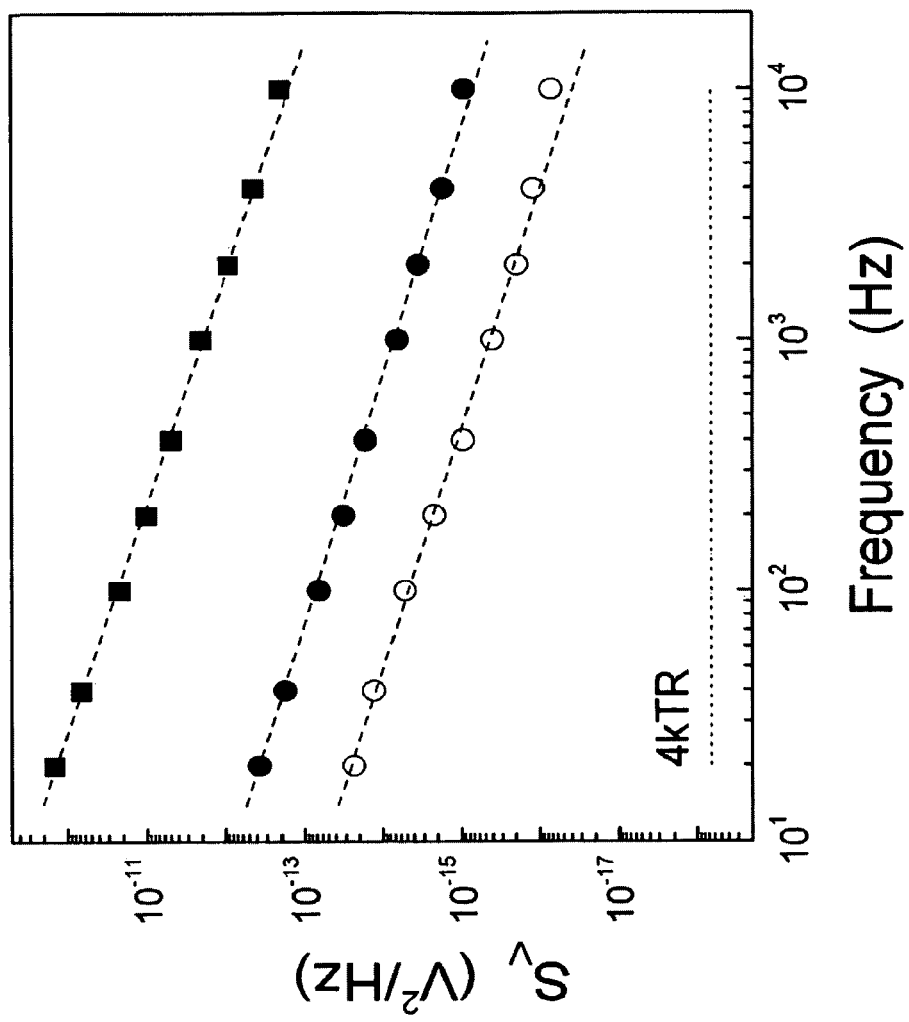
FIG. 26 shows noise power density (measured in air for 10 mA biasing) versus frequency for a densified forest-drawn MWNT sheet (open circles), compared with that for ordinary filtration-produced MWNT sheets (solid circles) and SWNT sheets (solid rectangles) having the same 40 ohm resistance. The dashed lines are data fits for a $1/f^\alpha$ dependence on frequency (f), where $\alpha$ is 0.98±0.04, 0.97±0.02, and 1.20±0.02, respectively. The lower-limit noise power at temperature T (the product of 4 $k_B T$ and the sample resistance R, where $k_B$ is Boltzmann's constant) is indicated by the horizontal dotted line.

This example shows that both the as-drawn and densified MWNT sheets have a very small temperature dependence of resistivity and low noise power density, which indicates that these MWNT sheets are highly suitable for use for sensor applications. In fact, the temperature dependence of sheet resistivity is nearly the same for the forest-drawn densified nanotube sheets and sheets made by the filtration route using the same forest-grown MWNTs, and much smaller than for single-walled nanotube sheets fabricated by filtration (FIG. 24). In addition, the low frequency (f) noise power density in the draw direction for a densified forest-drawn sheet is $10^4$ and 10 times lower than for ordinary filtration-produced sheets of SWNTs and MWNTs, respectively (FIG. 26).

Example 26

Figure 27:
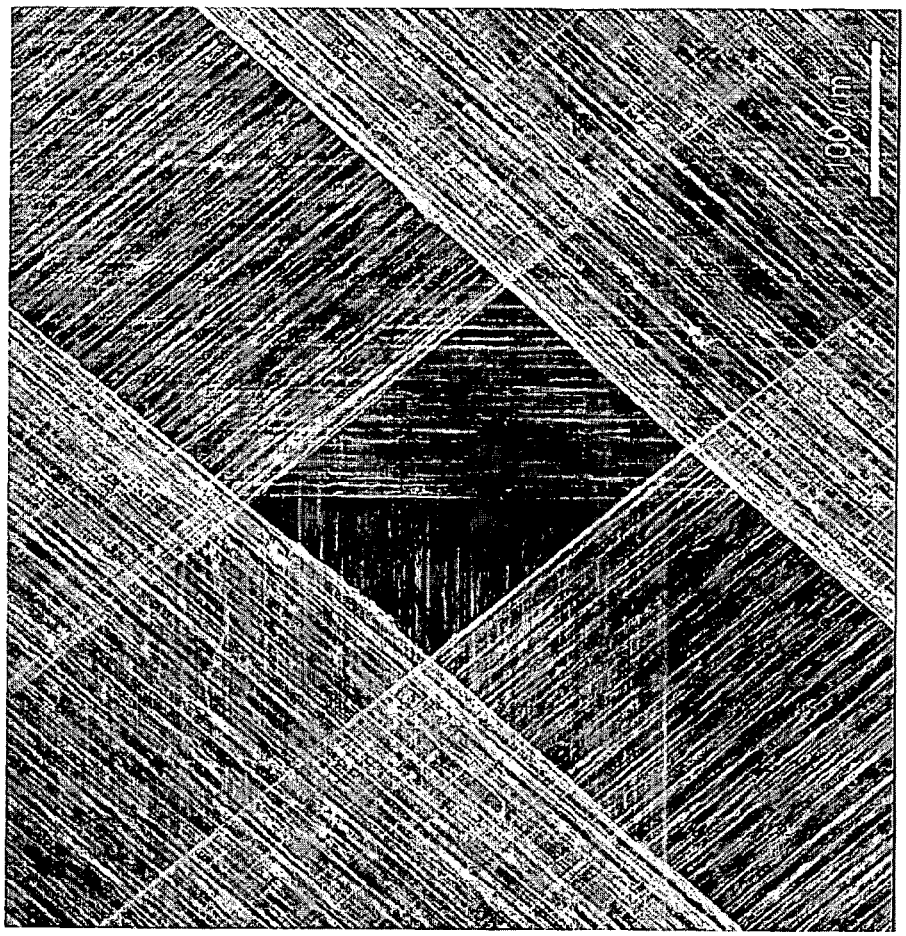
FIG. 27 is a SEM micrograph of a two-dimensionally re-reinforced structure fabricated by overlaying four nanotube sheets with a 45° shift in orientation between successive sheets.

This example shows the forest-drawn MWNT sheets can be conveniently assembled into biaxially reinforced sheet arrays. These sheets were prepared using the method of Example 21. A four ply biaxially reinforced sheet array is shown in FIG. 27. Chiral structures, which will likely be optically active for long infrared and for microwave wavelengths, can be made by stacking parallel sheets so that the orientation direction varies helically along the stack thickness and then densifying the stacked array so that the individual sheet thickness is about 50 nm.

Example 27

Figure 29:
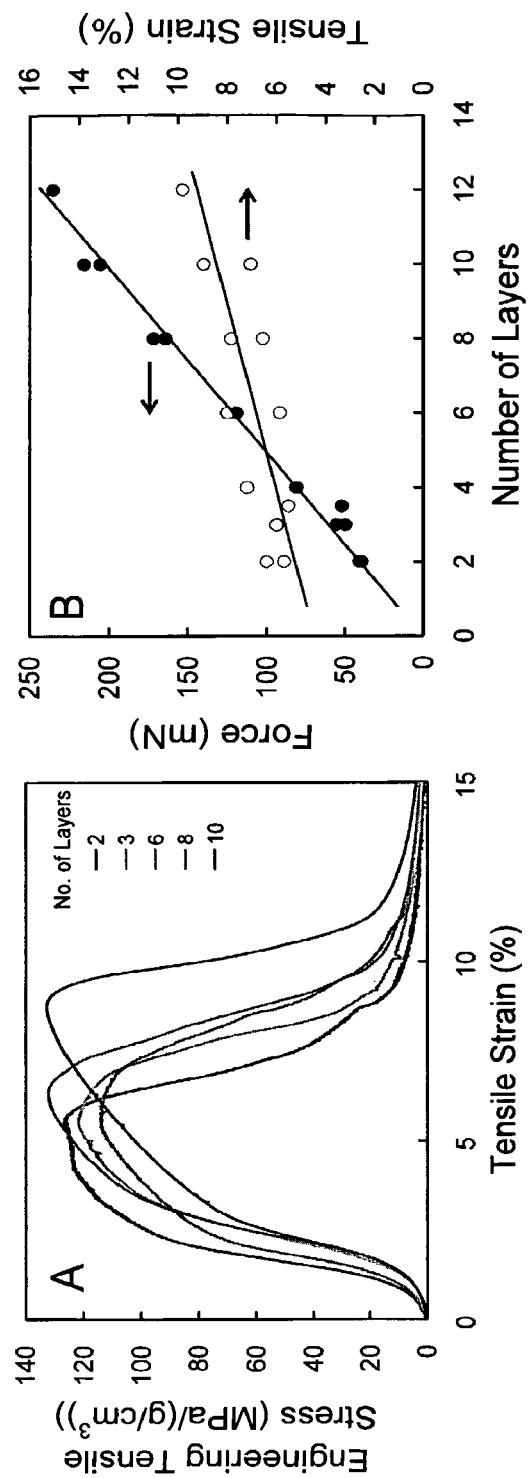
FIG. 29 shows mechanical property measurements for as-drawn MWNT sheets cut from one original sheet and stacked together so that they have a common nanotube orientation direction. (A) Engineering stress versus strain, showing surprisingly small variation in maximum stress for samples containing different numbers of sheets that are stacked together. (B) The maximum force and the corresponding strain as a function of number of stacked sheets for the sample runs of (A).

This example shows that the mechanical properties of the aerogel-like and densified MWNT sheets are unexpectedly high, even though these sheets are free of binder material. The density-normalized mechanical strength is much more accurately determined than mechanical strength, because the sheet thickness is less reliably measured than the ratio of maximum force to mass-per-length in the stretch direction. Stacks of undensified sheets have an observed tensile strength of between 120 and 144 MPa/(g/cm$^3$). Mechanical property measurements for as-drawn MWNT sheet strips cut from one original sheet and stacked together so that they have a common nanotube orientation direction are shown in FIG. 29, parts A and B. Part A shows engineering stress versus strain, and indicates the surprisingly small variation in maximum stress for samples containing different numbers of sheet strips that are stacked together. The true failure stress for these samples, obtained by multiplying the engineering failure stress by the ratio of length-at-failure to initial length, varied between 120 and 144 MPa/(g/cm$^3$). Part B of FIG. 29 shows the maximum force and the corresponding strain as a function of number of stacked sheet strips for the experiment of part A. A densified stack containing 18 identically oriented sheets had a strength of 465 MPa/(g/cm$^3$), which decreased to 175 MPa/(g/cm$^3$) when neighboring sheets in the stack were orthogonally oriented to make a densified biaxial structure. These density-normalized strengths are already comparable to or higher than the ~160 MPa/(g/cm$^3$) strength of the Mylar® and Kapton® films used for ultra-light air vehicles and proposed for solar sails for space applications (see D. E. Edwards et al., High Performance Polymers 16, 277 (2004)) and those for ultra-high strength steel sheet (~125 MPa/(g/cm$^3$)) and aluminum alloys (~250 MPa/(g/cm$^3$)).

Example 28

Figure 30:
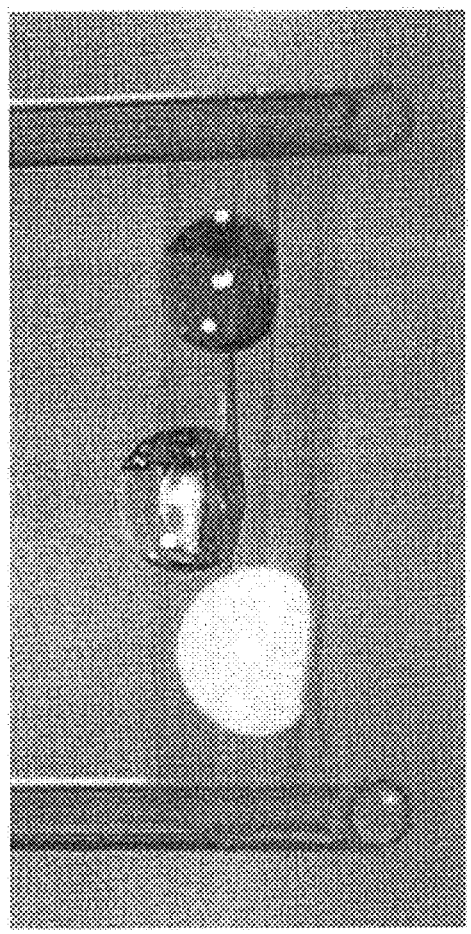
FIG. 30 is a photograph showing an as-drawn nanotube sheets supporting millimeter scale droplets of water, orange juice, and grape juice where the mass of the millimeter size droplets is up to 50,000 times that of the contacting nanotube sheets.

This example is also illustrates the high mechanical properties of the carbon nanotube sheets. FIG. 30 shows an as-drawn nanotube sheet supporting droplets of water (~2.5 mm diameter), orange juice, and grape juice, where the mass of the droplet is up to 50,000 times that of the contacting nanotube sheets. The aerogel sheet regions under the aqueous droplets are densified during water evaporation.

Example 29

This example shows a stable, planar source of polarized ultraviolet, visible and infrared incandescent light (FIGS. 31, A and B) for sensors, infrared beacons, infrared imaging, and reference signals for device calibration. The degree of polarization of emitted radiation for 2.5% stretched as-drawn sheets increases from 0.71 at 500 nm to 0.74 at 780 nm (FIG. 32), which is substantially higher than the degree of polarization (0.33 for 500-900 nm) previously reported for a 600 μM long MWNT bundle with ~80 μm emitting length. The wavelength dependence of light intensity for both polarizations fit the functional form expected for black body radiation and the degree of polarization does not significantly depend upon sheet temperature for the observed temperature range between 1000 K and 1600 K. Cost and efficiency benefits result from decreasing or eliminating the need for a polarizer, and the MWNT sheet provides spatially uniform emission over a broad spectral range that is otherwise hard to achieve. The low heat capacity of these very low mass incandescent emitters means that they can turn on and off within the observed 0.1 ms or less in vacuum, and provide current modulated light output on a shorter time scale.

Example 30

This example shows polymer welding through heating of a transparent MWNT sheet that is sandwiched between plastic parts. The MWNT sheets strongly absorb microwave radiation, as evidenced by their use for this welding of plastic parts in a microwave oven. Two 5-mm-thick Plexiglas plates (FIG. 33) were welded together using the heating of a sandwiched MWNT sheet to provide a strong, uniform, and highly transparent interface in which nanotube orientation and electrical conductivity are maintained. The microwave heating was in a 1.2 kilowatt microwave oven that operates at 2.45 GHz. Input power was controlled using a water reference by linearly ramping the water temperature to 100° C. in 3 minutes, maintaining this water temperature for one minute, and cooling the sample outside the furnace to ambient. FIG. 33 shows two 5-mm thick Plexiglas (polymethyl methacrylate) plates that were welded together using microwave heating of a sandwiched MWNT sheet to provide a strong, uniform, and transparent interface in which nanotube orientation and sheet electrical conductivity is little changed. The combination of high transparency and ultra-high thermal stability provide advantages not found for the conducting polymers previously used for microwave-based welding. This microwave heating process could be used to make polymer composites from stacks of polymer sheets that are separated by nanotube sheets, car windows that are electrically heated, and antennas in car windows that have high transparency. Nanotube sheets can be conveniently attached to the surface of a plastic by a related process, and in plastic by sandwiching the nanotube sheet between a low melting polymer and a high melting polymer, selected so that only the low melting polymer is melted as a result of the temperature increase caused by microwave absorption in the nanotube sheet. In these processes the plastics are chosen so that they do not provide significant microwave absorption in the utilized microwave frequency range.

Example 31

Figure 34:
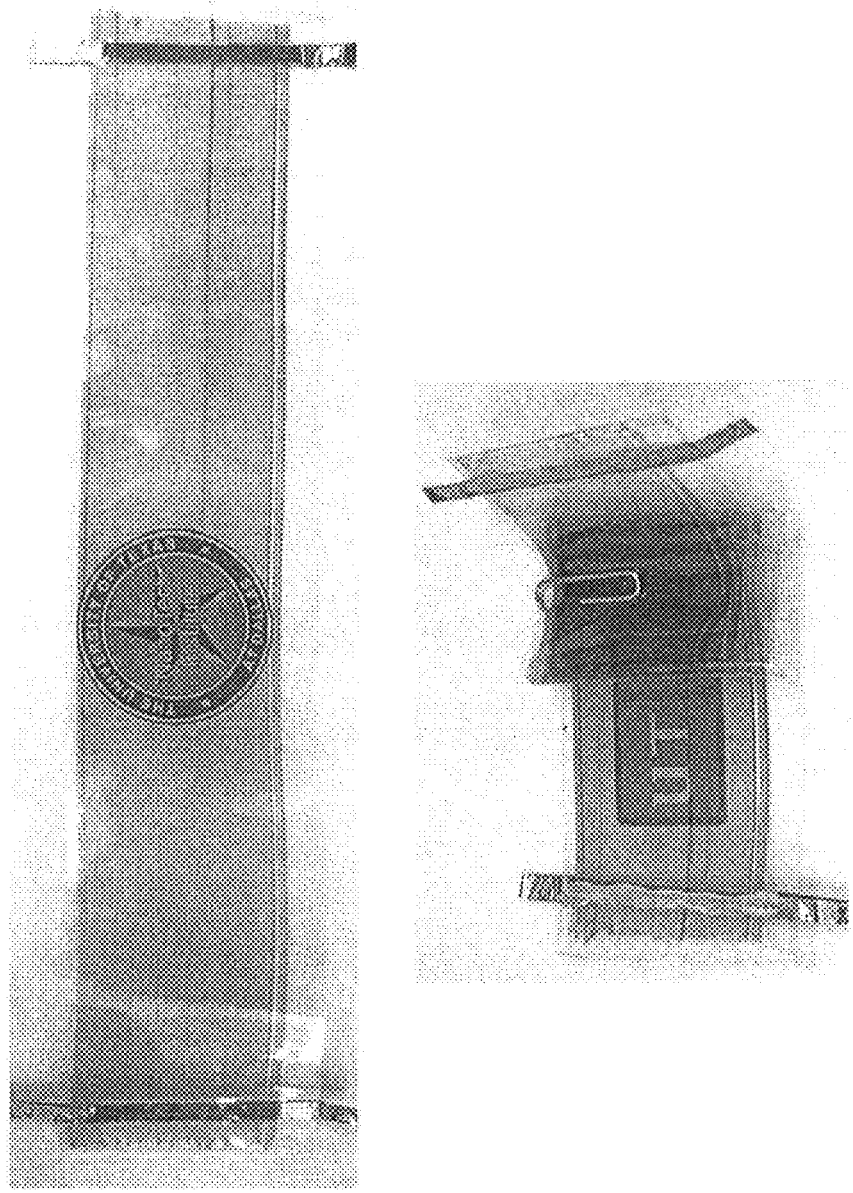
FIG. 34 provides photographs of an electronically conducting and microwave absorbing appliqué comprising an undensified MWNT sheets attached to transparent adhesive tape (Scotch Packaging Tape from 3M Corporation), wherein the transparency of the appliqué is indicated by the visibility of the logo and the "UTD" printed on a paper sheet underneath the appliqués. The appliqué is folded in the bottom picture (and held together using a paper clip) for experiments that show that the sheet resistance is little effected by the folding.

This example shows that by simply contacting the as-drawn MWNT sheets to ordinary adhesive tape, optically transparent adhesive appliqués can be made that could be used for electrical heating and for providing microwave absorption. This example further shows that these conducting polymer appliqués can be severely bent without producing a significant change in electrical conductivity. Conducting appliqués were made by pressing an undensified MWNT sheet (prepared as in Example 21) onto an adhesive-backed tape. Alternatively, the undensified MWNT sheet was simultaneously attached to the adhesive backed tape and a substrate using applied pressure. The ratio of peel strength after MWNT lamination to the peel strength without intermediate MWNT sheet was 0.7 for Al foil duct tape (Nashua® 322) on a poly(ethylene terephthalate) sheet used for overhead transparencies and 0.9 for transparent packaging tape (3M cat. 3501L) attached to a millimeter thick Al sheet. Due to MWNT sheet porosity, the peel strength is largely maintained when an undensified MWNT sheet is laminated between an adhesive tape and a contacted plastic or metal surface. FIG. 34 is a photograph of an undensified MWNT sheets used as electronically conducting and microwave absorbing appliqué. The MWNT sheet was pressed against an adhesive tape (transparent Scotch Packaging Tape from 3M Corporation), which caused the adhesive on the tape to extrude through the pores in the MWNT sheet to provide bonding capability to another surface (in this case a 110-μm-thick sheet of poly(ethylene terephthalate)). UTD is printed on a paper sheet underneath the appliqué in order to demonstrate transparency. A movie taken of a MWNT appliqué (an undensified MWNT sheet sandwiched between a transparent packaging tape (3M cat. 3501L) and a 110-μm sheet of poly(ethylene terephthalate)] shows that this appliqué can be repeatedly folded upon itself without causing a significant increase in electrical resistance. This ability to bend without degradation of electronic conductivity is important for flexible electronic circuits and is not found for conventional transparent conductors like indium tin oxide. The metal strips in FIG. 34 are electrodes used for making contact with the nanotube sheet. Going from the unfolded configuration (top picture) to the highly folded configuration (bottom picture, in which the pictured paper clip is used for retention of the highly folded configuration) caused little change in the inter-electrode resistance.

Example 32

This example demonstrates a method wherein transparent carbon nanotube sheets can be transformed into highly elastomerically deformable electrodes, which can be used as electrodes for high-strain artificial muscles and for conversion of high strain mechanical deformations to electrical energy, and for the tunable dampening of large amplitude mechanical vibrations. The illustrative actuator material is a silicone rubber. A 1 mm thick sheet of silicone rubber (made using ECOFLEX 0040 from Smooth-On, Inc.) was stretched to 105% strain, and then a single, as-drawn MWNT sheet (prepared as in Example 21) was overlaid to provide self-generated adhesive contact prior to strain relaxation. The nanotube sheet can optionally be densified by a claimed liquid-based densification process without undesirably effecting targeted elastomeric properties. As shown in FIG. 35, the initial sheet resistance of the obtained unloaded silicone rubber/MWNT sheet composite was 755 ohms/square. However, after an initial increase in resistance by ~6%, the resistance changed less than 3% during the subsequent four strain cycles to 100% strain. Ordinary conductors cannot undergo nearly such large strains without losing electrical contact with the actuating material. While conducting greases are used to maintain electrical contact to electrostrictive actuator materials that generate 100% or higher strains (R. Pelrine, R. Kornbluh, Q. Pei, and J. Joseph, Science 287, 836 (2000)), these greases are not suitable for use as electrodes for stacks of electrostrictive sheets that can generate large forces and high strains without requiring several thousand volt applied potentials. Further experimentation has shown the general applicability of this method of providing highly elastomeric electrodes on an elastically stretchable substrate. For example, attachment of an undensified nanotube sheet (prepared as in Example 21) to a 120% elongated elastomeric Spandex® fabric (by pressing and by subsequently applying the liquid-based densification process of Example 23) results in a nanotube electrode materials that can be elastically relaxed and re-stretched repeatedly to the initial elongation without undergoing a substantial resistance change. More than one carbon nanotube sheet layers can be applied on top of the Spandex layer without undesirably affecting the performance of the nanotube sheet layers. Suitable Spandex fibers and/or textiles are made by DuPont (and called Lycra®), Dorlastan Fibers LLC, INVESTA, and RadiciSpandex Corporation.

Example 33

Figure 36:
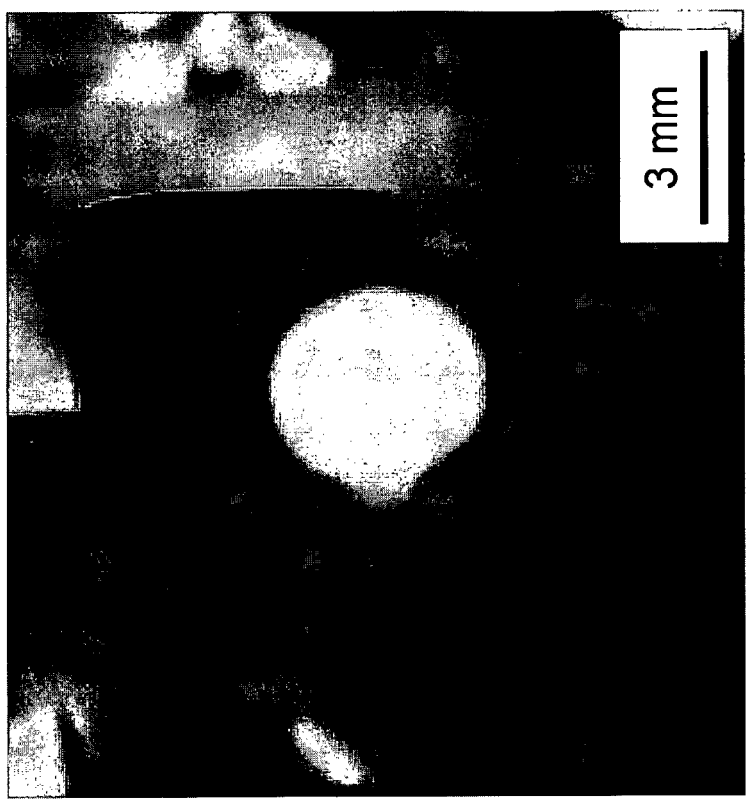
FIG. 36 is a photograph of an organic light emitting diode (OLED) that uses a transparent solid-state-fabricated MWNT sheet as the hole-injecting electrode.

This example demonstrates the use of the solid-state fabricated MWNT sheets as hole injecting electrodes for polymer light emitting diodes (PLEDs), which are a special type of organic light emitting diode (OLED). The free-standing, transparent MWNT sheets were fabricated using the solid-state process and placed on transparent glass or polymer substrates to make either flexible or rigid PLEDs. Two active polymers were used in the devices: PEDOT/PSS and MEH-PPV. PEDOT/PSS is poly(3,4-ethylenedioxythiophene) (PEDOT), which is doped with poly(styrenesulfonate) (PSS). The PEDOT/PSS was obtained as a water dispersion containing 1-3% solids from H. C. Stark and is sold under the trade name of Baytron® P. MEH-PPV, which was synthesized by known methods (C. J. Neef, J. P. Ferraris, Macromolecules 33, 2311 (2000)) is poly(2-methoxy-5-(2'ethyl-hexyloxy)-p-phenylene vinylene). The PEDOT/PSS was used for planarization of the as-drawn MWNT sheets during sheet densification and as a hole transport and buffer layer, which decreases the barrier for hole injection from the MWNTs. The MEH-PPV served as the photo-emissive layer. The PEDOT/PSS was first spin cast onto the MWNT sheet (at 250 rpm for a minute, and then at 760 rpm for an additional minute to remove excess solution). After drying at 110° C. for one hour, the emissive layer of MEH-PPV was deposited in a second spin-casting process (at 3000 rpm for 30 seconds). After drying the MWNT sheet assembly overnight in an inert atmosphere, the device cathode was added, which consisted of a bilayer of calcium (30 nm) and aluminum (120 nm), each deposited in sequence by thermal evaporation. Luminance characterization of the above device showed a low turn-on voltage of 2.4 volts and a maximum brightness of 500 cd/m$^2$. A similar device constructed using PEDOT/PSS and MEH-PPV, but without the MWNT sheet, was highly resistive and showed no light emission. A device fabricated without using a PEDOT/PSS layer (which interpenetrates the MWNT sheet and provides hole transport and planarization) showed high luminance, but required higher turn-on voltage and had a short device lifetime. FIG. 36 shows a polymer-based OLED that uses a solid-state-fabricated MWNT sheet as the hole-injecting electrode. The transparent MWNT sheet, PEDOT/PSS, and MEH-PPV assembly covers the entire picture area, while the Ca/Al cathode is only on the emitting dot. The typical luminance was 350 cd/m$^2$ (at 15 mA), which was further increased to 500 cd/m$^2$. Enhanced hole injection occurs due to high local electric fields on the tips and sides of nanotubes and the three-dimensional interpenetration of the nanotube sheet and the device polymers. Hole injection was limited to a single plane for previous inorganic light emitting diodes using nanotube sheets (see K. Lee, Z. Wu, Z. Chen, F. Ren, S. J. Pearton, A. G. Rinzler, Nano Letters 4, 911 (2004)).

Example 34

This example shows that by transferring the as-drawn MWNT sheets onto non-porous paper and densifying the as-drawn sheet, electrically conductive printing tape comprising MWNT sheet can be made and used for printing electrical circuits on flexible substrates. A free-standing MWNT sheet (made by the method of Example 21) was placed onto non-porous paper (VWR 2005 catalog number 12578-121) used in the laboratory for weighing samples) and densified using the inventors' liquid infiltration/liquid evaporation route of Example 23. After densification, the aerogel nanotube sheet shrank to a thickness of ~50 nm, forming a mechanically robust electrically conductive layer. Placing the densified sheet face down on standard writing paper and writing on the supporting non-porous paper using a sharp object, the nanotube sheet was transferred from the surface of the non-porous paper to the regular paper (FIG. 37). Most important, optical microscopy on the transferred nanotube sheet regions shows that the nanotube alignment present in the printing tape is maintained in the nanotube pattern transferred to the porous paper. Hence, the orientation of nanotubes in transferred circuit patterns can be controlled at will be varying the relative orientation between the image producing and image transfer sheets. In the present example, the image producing sheet is the non-porous paper with the overcoated nanotube sheet and the image transfer sheet is the porous paper upon which the nanotube sheet portions are transferred. Undensified nanotube sheet can similarly be used for printing electronic circuit elements (simply by eliminating the densification step). This process is less attractive than the one using densified sheets, since the nanotubes were transferred to portions of porous paper that were not under the writing instrument. Nevertheless, the nanotubes that were transferred were much more firmly bound to the porous paper than those that were accidentally transferred, so the later could be easily brushed away without disturbing the intentionally transferred nanotubes.

Example 35

This example shows that the nanotube sheets made by the process of Example 21 are a type of self-assembled textile, in which nanofiber bundles branch and then recombine with other branches to form a network having a degree of lateral connectivity orthogonal to the draw direction. The SEM micrograph of FIG. 28 shows this branching and branch recombination. Fibril deviations from draw-direction orientation are scale dependent, so they appear larger at this high magnification than they do at much lower magnifications.

Fibril branching continues throughout the sheet, thereby making a laterally-extended, inherently interconnected fibril network.

Example 36

Figure 47:
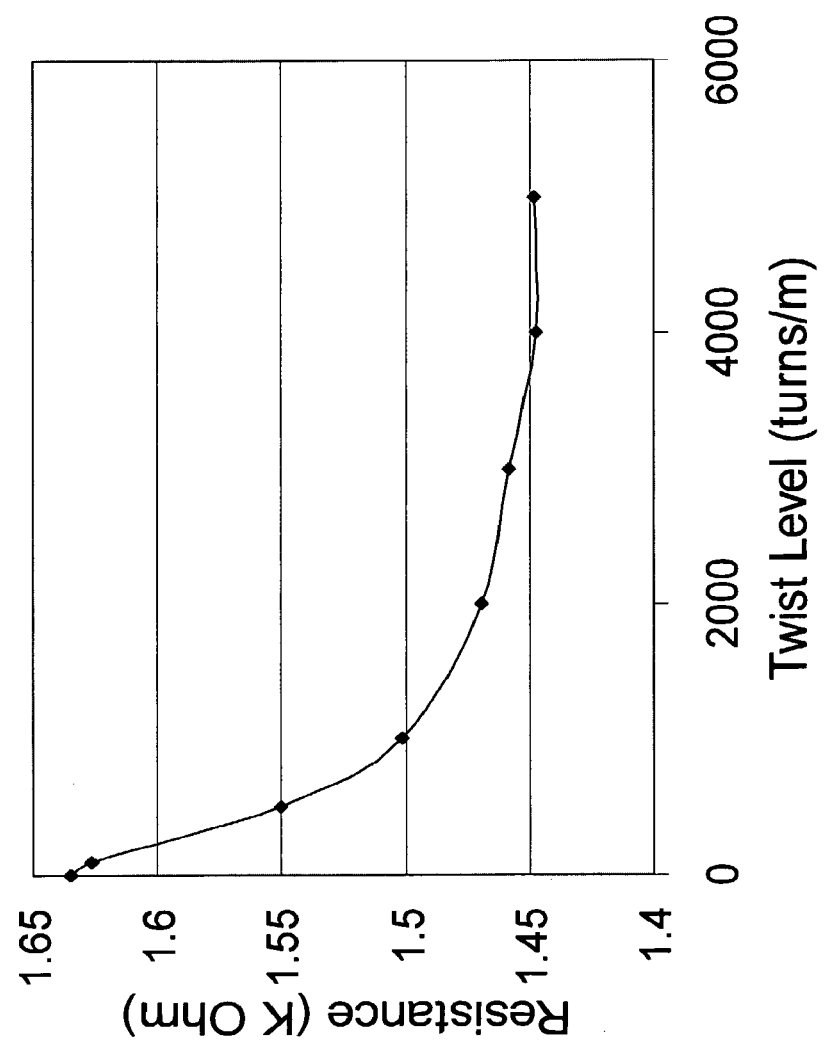
FIG. 47 shows the dependence of electrical resistance upon the twist level (in turns/meter) for a solid-state spun MWNT yarn.

This example demonstrates that free-standing solid-state fabricated MWNT sheet ribbons can be conveniently drawn and twisted to form large diameter yarns having uniform diameter. A 10.5 cm long, 3-cm-wide as-drawn nanotube sheet (made as in Example 21) was folded upon itself along the sheet draw direction to make a quasi-circular assembly having about the same length. One end was attached to the tip of a spindle and the other end was attached to a fixed cupper wire. By introducing twist, uniform spun yarn was formed at a twist level of ~2000 turns/meter. The diameter of the resulting spun yarn was about 50 The change in resistance from untwisted to 5000 turns/meter twist is about 12%, indicating that the interconnected fibril network provides most of the electrical paths in the spun yarn (FIG. 47), and new contacts formed by the twisting process are less important determinants of electrical conductivity.

Example 37

This example describes a method of draw-twist spinning of carbon nanotube yarns from a densified nanotube sheet attached to a substrate. The benefit of such process is that it enables the fabrication and storage of nanotube sheets. Three layers of as-drawn, free-standing MWNT sheet (made as in Example 21) were placed onto a substrate (e.g., glass, plastic, or metal foil) and densified using a liquid (using a process of Example 23). A plastic substrate, like Mylar film, was most conveniently used. A desired width of the densified sheet was easily peeled from the substrate using an adhesive tape to start the draw-twist spinning process. By attaching one end of the peeled-off sheet strip to a motor to introduce twist at the same time that the yarn was drawn, a uniform diameter spun yarn was obtained. This process was also extended to produce thicker yarns, by simply increasing the number of as-drawn nanotube sheets that were initially laminated together. This number of laminated sheets was increased from 3 to 5 and then to 8 sheets.

Example 38

Figure 48:
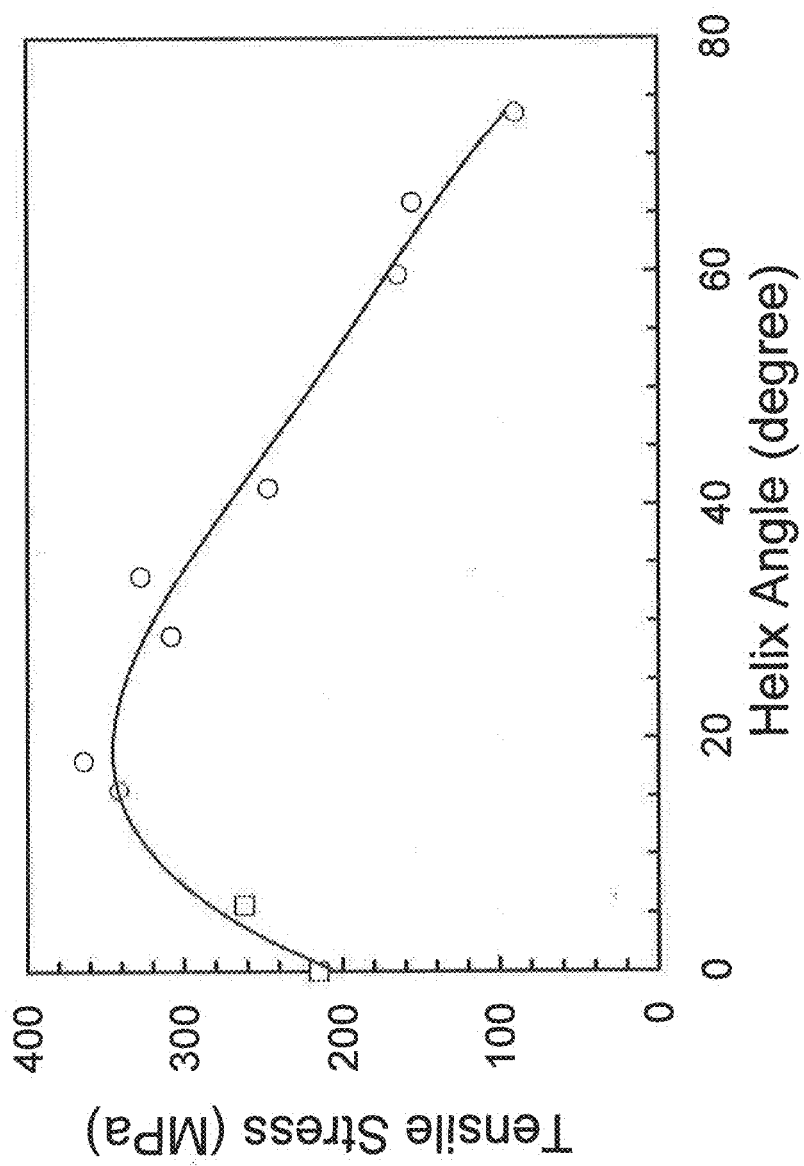
FIG. 48 shows the dependence of ultimate tensile stress as a function of yarn helix angle (with respect to the yarn direction) for a solid-state spun MWNT yarn, where the yarn samples corresponding to open circles are twist spun without any prior treatment and the yarn samples corresponding to open squares where initially densified by liquid infiltration and liquid evaporation in order to avoid too severe a drop-off in nanotube yarn strength with decreasing twist angle.
Figure 49:
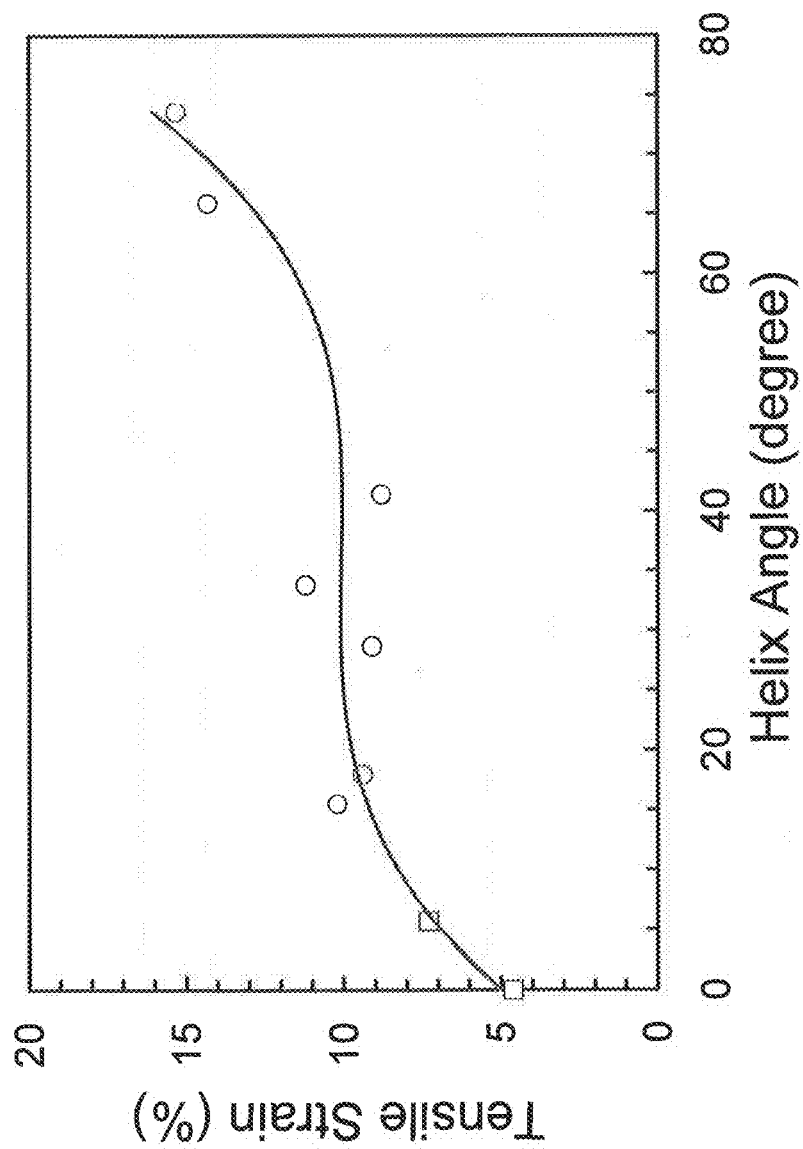
FIG. 49 shows the dependence of failure strain as a function of yarn twist angle (with respect to the yarn direction) for a solid-state spun MWNT yarn samples of FIG. 48.

This example shows the dependence of the tensile strength upon the helix angle obtained by twist as well as the major benefits of densifying yarns by liquid treatment. If no twist is applied and the yarns are used as drawn from the forest, the yarn mechanical strength was too low to be measured using Applicants' apparatus. Also, densification of drawn ribbons prior to twist made it possible to obtain uniformly twisted yarn having uniform thickness from these ribbons even when the applied twist was very low. Application of such low twist (corresponding to a helix angle of) 5° in the absence of pre-applied liquid-based yarn densification resulted in non-uniform twist and yarn diameter. The obtained experimental results are shown in FIG. 48. The data points in FIG. 48 illustrated using circles correspond to yarns with diameters in the 18-20 µm range that were spun using the method of Example 2. In order to obtain a mechanical strength high enough for measurement, the data for zero twist (indicate by the square) was obtained for a yarn that was densified using liquid treatment. The untwisted yarn was obtained from a ~5-mm wide ribbon that was drawn from the forest of Example 1, and then densified using ethanol (like done for nanotube sheets in Example 23). While this rather wide ribbon was employed in the present example, the described strengthening effect also results for much narrower yarns. The effect of this liquid treatment (involving liquid imbibing, and filament densification during liquid evaporation) was to dramatically increase strength, as well as to increase tenacity. The resulting yarn exhibits a non-circular cross section. Since the yarn with 5° twist could not reach uniform twist along its length, this sample was also densified using the ethanol treatment after twist was applied. As shown in FIG. 48, a peak tensile strength of ~340 MPa is achievable with a helix angle of around 20°. In the absence of liquid pre-treatment (like described in Example 23 for nanotube sheets), the data point in FIG. 48 for zero twist would be near zero on the tensile stress scale. Also, in the absence of solvent densification, the data point for 5° twist would correspond to a greatly reduced strength. Too much twist also decreases strength, as shown in FIG. 48. Adding 70 degrees of twist to an untwisted yarn reduces its tensile strength by one-half. Although highly twisted yarns have decreased failure stresses, they have higher failure strain than for more moderately twisted yarns, as is indicated in FIG. 49 (which the tensile strain measurements for the same sample trials as in FIG. 48). Very importantly, the data in FIG. 48 (square data points) shows that useful strengths can be obtained by liquid treatment even when twist has never been applied.

Example 39

Figure 50:
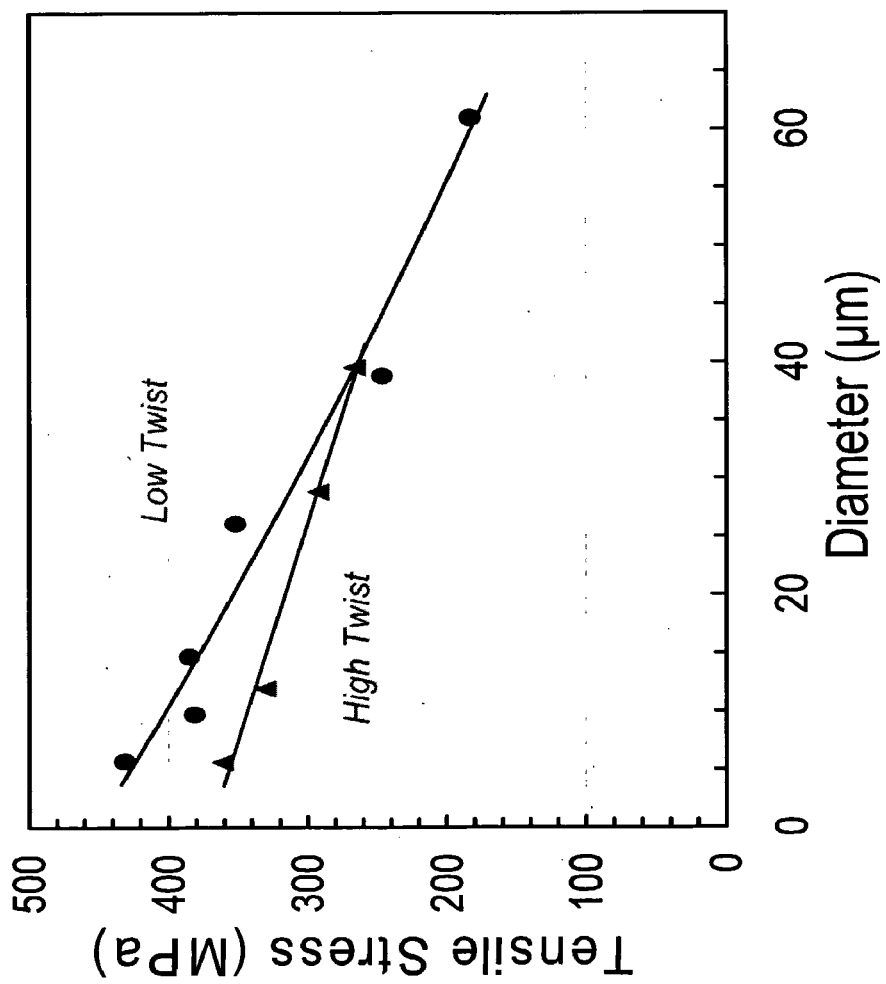
FIG. 50 shows the dependence of ultimate tensile stress as a function of yarn diameter for low and high twist yarns.
Figure 51:
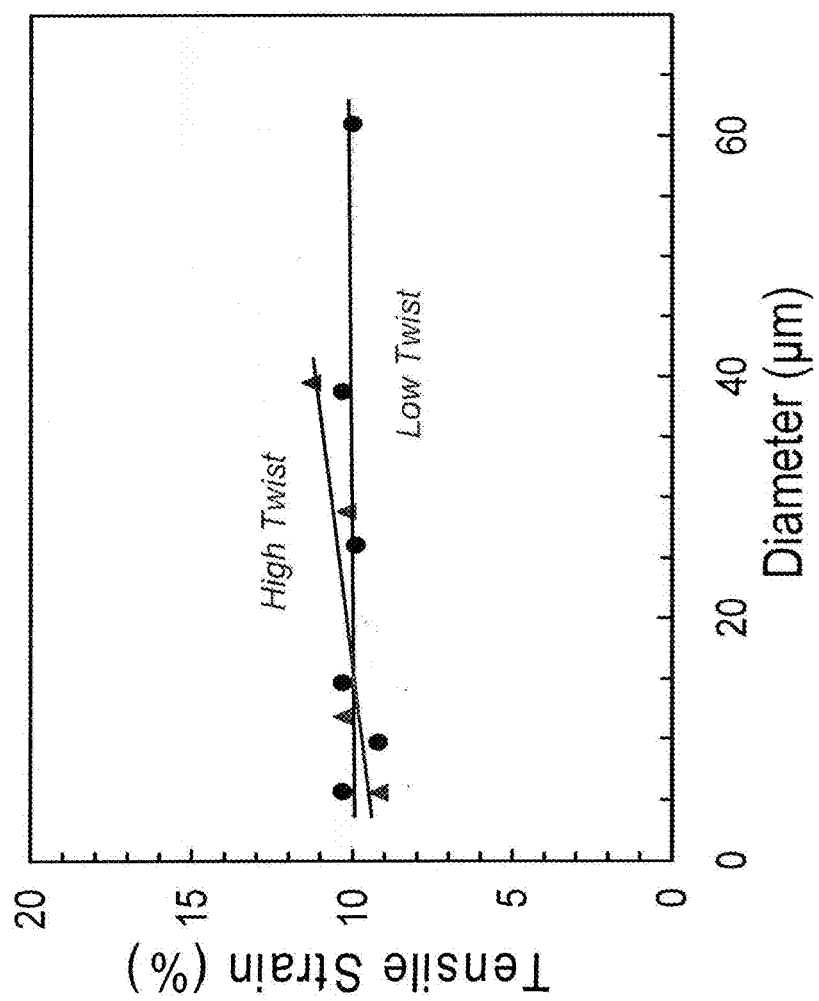
FIG. 51 shows the dependence of failure strain as a function of yarn diameter for low and high twist yarns.

This example shows that yarn's tensile strength decreases as the yarn diameter increases. The yarn spinning method is like that of Example 2. The yarn diameter is controlled by the width of the ribbon from which it is spun and the data points in FIG. 50 correspond to ribbon widths in the 3-27 mm range. Since the yarn's tensile strength is dependent of twist angle, twist angle was maintained constant while varying the yarn diameters. As shown in FIG. 50, higher twist) (~50° yarns (triangle data points) are less susceptible to this decrease in strength with increasing yarn diameter than are those with lower twist) (~15° yarns (circle data points). The failure strain exhibits a much weaker or negligible dependence on the yarn's diameter. The yarns consistently break at around 10% strain (FIG. 51) independent of the yarn diameter.

Example 40

This example shows that twist dramatically increases yarn tensile strength, even when this twist is subsequently eliminated by an equal twist in an opposite direction. Both yarns shown in FIG. 52 were prepared from the same nanotube forest (using the method of Example 2) and the same width of ribbon. Hence, the number of fibrils passing through a yarn cross-section was maintained. The twist for Yarn A is 26000 turns/m clockwise, resulting in a twist angle of 28°. For Yarn B, a 26000 turns/m clockwise twist was introduced first forming a lock-stabilized yarn and then the same twist was introduced anticlockwise to release all the twist. Note that the increase in yarn diameter (compare A and B SEM micrographs of FIG. 52) as a result of twist de-insertion is relatively small. The tensile forces at break are 24 mN for Yarn A and 14 mN for Yarn B. The resulting tensile strengths are 339 MPa for Yarn A and 113 MPa for Yarn B. Since the tensile strength of a never-twisted yarn is too low to even be measured in Applicants' apparatus, these measurement results indicate that the net effect of twisting and untwisting is to dramatically increase tensile strength, and that retention of twist can further increase tensile strength. Since strong untwisted yarns are highly desirable for use in forming nanotube/polymer composite yarns have both high strength and high toughness, this surprising discovery that false twist (twist insertion followed by twist de-insertion) can dramatically increase yarn strength is quite important. This discovery provides the motivation for the false-twist spinning apparatus described in FIGS. 44-46.

Example 41

This example illustrates that carbon nanotube (CNT) sheets can be drawn from a forest, attached to a substrate film (such as a plastic, metal foil, or Teflon film), densified, and wound onto a mandrel. Demonstration of the feasibility of this process for adhesive-free, adhesive-coated, and elastomeric substrates is provided in Examples 23, 31, and 32, respectively. FIG. 53 and FIG. 54 show schematic illustrations of such processes. Element 5302 in FIG. 53 is a nanotube forest prepared as described in Example 1. Element 5301 is a growth substrate, element 5303 is a nanotube sheet drawn from the forest, element 5304 is the substrate film, and element 5305 is nanotube sheet attached to the substrate film. The attached nanotube sheet is densified using a liquid (element 5306), dried by a heater (element 5307), and then wound onto a mandrel. Rollers (two) are represented here by open circles and mandrels (three) are represented by filled circles. By repeating the process, multilayer of nanotube sheets can be applied to the substrate film. A variation of the process is illustrated in FIG. 54. Instead of using liquid, liquid vapor (element 5406) is used to densify the collected sheet and the densified sheet (element 5407) is wound onto a mandrel. The elements are nanotube forest substrate (5401), nanotube forest (5402), CNT sheet (5403), substrate film (5404), CNT sheet attached to substrate film (5405), a heating system for delivery of vapor (5406), densified CNT sheet on substrate film (5407), substrate film delivery mandrel (5408), roller for consolidation of nanotube sheet and substrate film (5409), and collection mandrel (5410). Each of the rollers in FIGS. 53 and 54 can optionally be replaced by pairs of rollers, one on each side of laminated nanotube sheet and substrate film. Importantly, the densified nanotube sheet produced by the apparatus of FIGS. 53 and 54 can be later unwound from the mandrel and separated from the substrate film for the twist-based spinning of yarn (see Example 37), for forming free-standing densified sheets or for mechanical transfer of selected portions of nanotube sheets to other substrates (see Example 34). Also, the substrate can be an elastomeric film (or textile) that is stretched prior to attachment of the nanotube sheet (see example 32) or an adhesive coated substrate sheet (see Example 31). The stretching can be accomplished by controlling the relative rotation rates of substrate delivery and substrate film/nanotube sheet take-up mandrels and rollers (or roller pairs) between these mandrels.

Example 42

Figure 55:
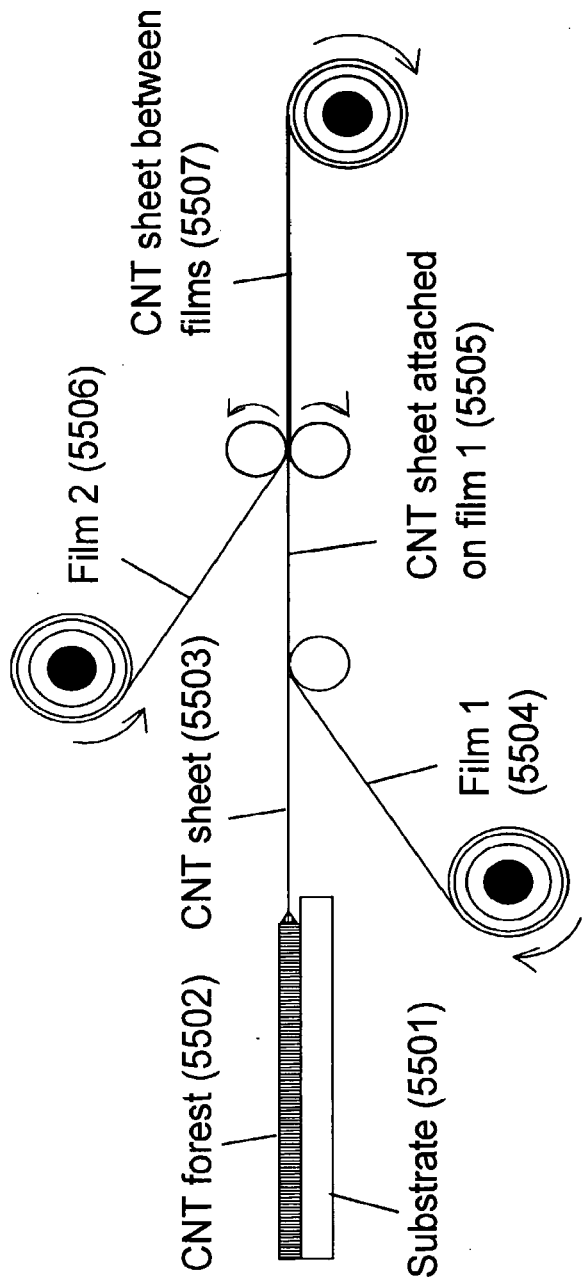
FIG. 55 shows a process for laminating a nanotube sheet between films.

This example illustrates a process by which a nanotube sheet can be drawn from a forest, attached to an adhesive-coated substrate film, sealed with a second film (such as a plastic, metal foil, or Teflon film), and wound onto a mandrel. FIG. 55 shows a schematic illustration of the process. Element 5502 in FIG. 55 is a nanotube forest prepared as described in Example 1. Element 5501 is a growth substrate, element 5503 is a nanotube sheet drawn from the forest, element 5504 is the adhesive coated film 1, and element 5305 is nanotube sheet attached on the adhesive film 1. The attached nanotube sheet is sealed with a film 2 (element 5506), and the sandwiched nanotube sheet (element 5507) is wound onto a mandrel. Film 2 can be later separated from the nanotube sheet/film assembly. Because of the porous nature of nanotube sheet, tape adhesiveness remains and the adhesive sheet with attached nanotube sheet can be conveniently applied to any desired surfaces. In FIG. 55, rollers are represented by open circles and mandrels are represented by filled circles.

Example 43

This example illustrates a method for spinning a single carbon nanotube yarn from the sides of the two nanotube forests. Two nanotube forests were placed in close proximity, so that the tops of these forests provided either inter-forest contact or the closest approach between the nanotube forests. Narrow nanotube ribbons were simultaneously drawn from these two stacked forests, attached to the tip of a spindle, and simultaneously twisted and drawn to provide a single unplied nanotube yarn.

Example 44

This example shows a method of initiating draw of a nanotube sheet. First, a straight line is scratched on the back side of silicon wafer substrate that is optionally used for nanotube growth, the wafer is broken into two forest sections, and then these two forest sections are separated preferably in a direction orthogonal to the original scratch direction. Since nanotube bundles are interconnected in the forest, nanotube sheet forms between the two sidewalls of the forests. In this configuration, the allowable sheet production rate can be doubled because nanotubes are fed from both sides. The scratch line can be made before or after forest growth.

Example 45

This example demonstrates a method wherein stacks of carbon nanotube sheets can be deposited on a contoured surface and densified on this surface, so that the shape of the contoured surface is retained in the shape of the nanotube sheet array. This application demonstration enables, for example, the deposition of carbon nanotube sheets as a layer in a contoured composite (such as an aircraft panel), as a contoured heating element for deicing on an air vehicle, or a contoured supercapacitor that provides both an energy storage and structural component for a contoured car panel. The contoured surface used for this demonstration was an oval shaped plastic bottle. The long and short axis of the oval cross-sectional area went from 4.1 cm by 2.7 cm at the base to 3.6 cm by 1.8 cm at a height of 4.3 cm from the bottle base. This section of this lower part of the bottle was used for the contouring process. An absorbent material (a single ply of a two-ply cellulose facial tissue) was wrapped around the bottle. After wetting the tissue with isopropyl alcohol, an undensified 4 cm wide nanotube sheet (prepared as in Example 21) was wrapped around the sides of the bottle base (so that the nanofiber orientation direction is circumferential) and the isopropyl alcohol was allowed to dry, thereby densifying the nanotube sheet in the shape of the bottle. This process was repeated twenty to thirty times to produce a densified stack of nanotube sheet layers having the shape of the lower region of the bottle. Upon removal of the nanotube sheet and attached tissue paper sheet from the bottle mandrel, it was observed that the nanotube sheet stack maintained the shape of the bottle. Moreover, this contoured shape recovered after forcing the sheet stack to be planar by applying a load, and then removing this load.

Example 46

This example describes methods for initiating the drawing of a nanotube sheet, ribbon, ribbon array, yarn, or yarn array from a nanotube forest using an adhesive, an array of pins, or a combination of an adhesive and an array of pins. Interestingly, the inventors find that contact of an adhesive tape to either the top or sidewall (edge) of the nanotube forest is useful for providing the mechanical contact that enables the start of sheet draw. Using nanotube forests prepared as in Example 1, various adhesive types worked well for initiating sheet draw, including the adhesive attached to a 3M Post-it Note, Scotch Transparent Tape (600 from 3M), Scotch Packaging Tape (3M 3850 Series), and Al foil duct tape (Nashua 322). Contact of a straight adhesive strip (so that the adhesive strip is orthogonal to the draw direction) worked especially efficiently to start the draw of a high structural perfection sheet. The reason that this top contact method is especially advantageous is that nanotube forests typically have non-straight sidewalls, and the use of a straight adhesive strip (or a straight array of suitably spaced pins) provides straight contact for the forest draw. An array of closely spaced pins was also usefully employed to start sheet draw. In one experiment, the pin array consisted of a single line of pins. The mechanical contact needed for spinning was in this case initiated by partial insertion of the linear pin array into the nanotube forest. The pin diameter was 100 micron, the pin tip was less than one micron, and the spacing between the edges of adjacent pins was less than a millimeter. Satisfactory sheet draw was achieved using pin penetration of between ⅓ and ¾ of the height of the forest (in the range between 200 and 300 microns). Draw processes of multiple ribbons or yarns can be similarly initiated using a linear array of adhesive patches or a linear array of pins that are separated into segments. The separation distance between adhesive patches along the length of the linear array determines the ribbon width or the width of the sheet strip used to make the yarn (by, for instance, twist-based spinning, false-twist spinning, liquid-densification-based spinning, or any combinations thereof). Mechanical separation of the sheet strip patches or the pin patches in the linear array during the start of draw is usefully employed in order to avoid interference during processing of adjacent ribbons or yarns, such as during the introduction of twist. Use of adhesive patches (or pin patches) that have different lengths along the strip direction can be usefully employed—such as to draw-twist adjacent strips to produce different diameter yarns (which can be optionally combined to provide a plied yarn in which different singles yarns in the plied yarn have different diameters). Different degrees of twist or directions of twist can be conveniently and usefully applied to different singles yarns that are drawn using the segmented adhesive or pin strip, and these different singles yarns can then be optionally plied together in a yarn containing a freely-selected number of plies. Importantly, using the above methods for introducing different diameter singles yarns into a plied yarn can be employed to produce a plied yarn having enhanced density, since smaller diameter single yarns can help fill-in void spaces between larger diameter singles yarns.

Example 47

Figure 42:
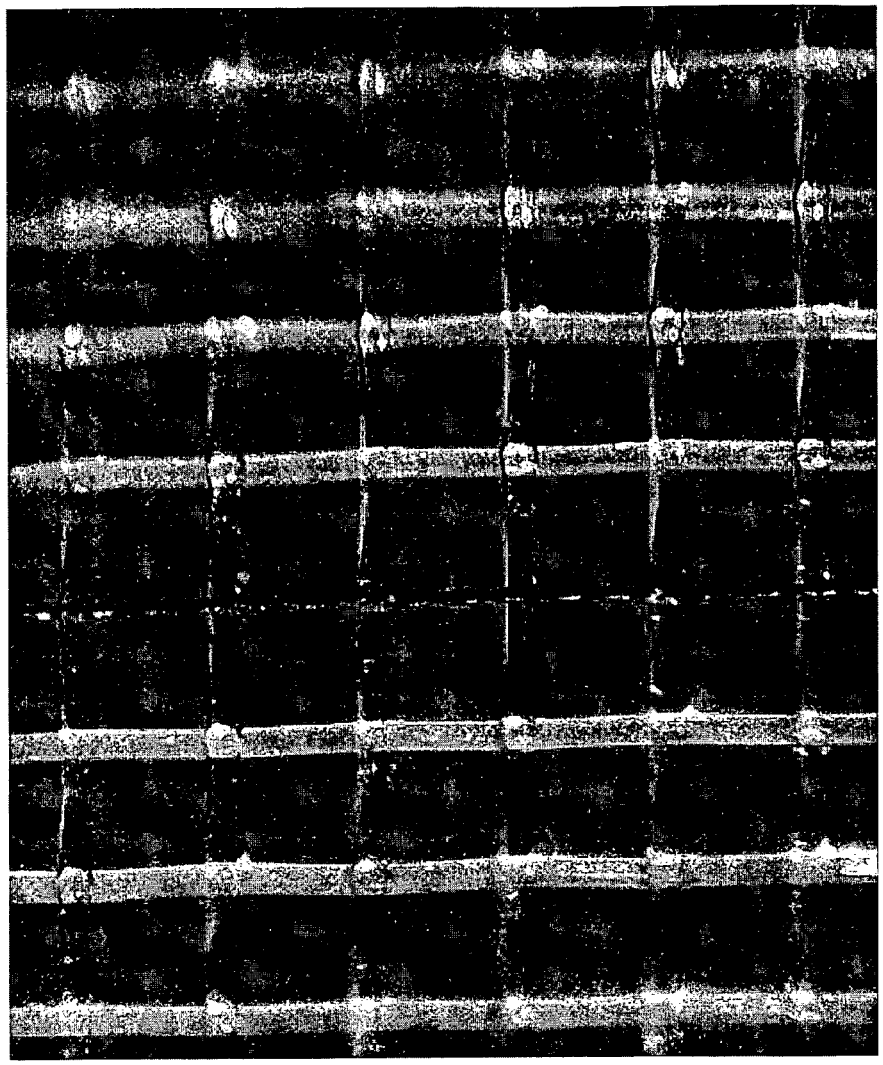
FIG. 42 is an optical micrograph showing a two-ply MWNT yarn (comprised of 12 µm diameter singles yarns) that has been inserted in a conventional fabric comprising 40 µm diameter melt-spun filaments.

This example shows that the spun nanotube yarns of invention embodiments can be easily inserted into conventional textiles, to thereby provide electrical interconnects, sensors, and other electronic elements in these textiles. The optical micrograph of FIG. 42 shows a two-ply MWNT yarn (comprised of 12 µm diameter singles yarns) that has been inserted in a conventional fabric comprising 40 µm diameter melt-spun filaments. The insertion method was accomplished by tying the nanotube yarn (made by the process of Example 4) onto the end of a filament in the original fabric, and pulling this filament out of the fabric as the nanotube yarn is pulled into the fabric.

Example 48

This example demonstrates a novel continuous spinning apparatus for spinning fine and ultra-fine nanofiber yarns, which introduces twist as it winds the spun yarn onto a bobbin. The apparatus is shown schematically in FIG. 38 and described in Section 5 on "Elaboration on Twist Insertion and Filament Storage Methods during Spinning". The spinning apparatus in this example comprises a spindle, a donut-shaped winding disk with an associated winding yarn guide, an electromagnet, and a donut-shaped metal magnetic disk, which contacts the ferromagnetic spindle base, which is typically made of steel. The diameter of donut-shaped winding disk is 20 mm with a thickness of 3 mm. The robins used are typically 5 mm in diameter and 30 mm long. The spindle is driven by a variable-speed DC motor, which is controlled through a computer interface and has a maximum speed of 15,000 rpm. An electromagnet is used to introduce a variable braking force onto the winding disk, which reduces its angular speed relative to the spindle. The rotation of the drafted nanofiber assembly about the axis of the spindle introduces twist, thereby forming the yarn, while the slower rotation of the winding disk winds the spun yarn onto the spindle. Advantageously, both twist level and spinning speed can be independently controlled by an electronic interface to independently regulate motor speed and applied magnetic field. This system imposes minimal tension to the spun yarns and can handle spinning of yarns with either high or low breaking force. This same apparatus can also be utilized to ply multiple single-strand yarns together to continuously make multi-strand yarns. In such cases nanotube forest is replaced by reels of unplied yarn.

Example 49

The inventors find that too low a density of nanotubes in a forest renders a forest difficult to spin as a yarn or draw as a ribbon or sheet. This is illustrated in FIG. 56 where SEM micrographs of the growth substrates are compared for spinable and practically non-spinable nanotube forests (after removal of the nanotubes), wherein the small diameter pits on the growth substrate correspond to the growth site of MWNTs. The nanotube diameters (about 10 nm) are roughly the same for both of these spinable and practically non-spinable forests. However, the inventors observed (by counting the pit densities on the growth substrate) nanotube forest base area densities of 90 billion to 200 billion nanotubes/$cm^2$ for nanotube forests that are highly spinable, as compared with 9 billion to 12 billion nanotubes/cm$^2$ for low density nanotube forests that were difficult or impossible to spin or draw. Also, the inventors observed that the percentage of the forest base area that was occupied by nanotubes was much higher (7% to 15%) for highly spinable forests, as compared with 1.1% to 2.5% for nanotube forests that were difficult or impossible to spin.

Example 50

This example demonstrates that nanotube sheets can be deposited on a substrate, densified by using the liquid infiltration method, and then peeled from the substrate to provide a free-standing, densified sheet array. The importance of this demonstration is that it enables the storage of densified nanotube sheets on a mandrel, and subsequent retrieval of these densified sheets from the sheet substrate (typically a plastic film carrier) for applications. Either three, five, or eight layers of as-drawn, free-standing MWNT sheet (made as in Example 21) were placed onto a substrate (e.g., glass, plastic, or metal foil) and densified using a liquid (using a process of Example 23). A plastic substrate, like Mylar film, was most conveniently used. Any desired width (or the entire width) of the densified sheet was easily peeled from the substrate using an adhesive tape to start the sheet removal process.

Example 51

The example shows that very thin densified carbon nanotube sheet stacks (down to less than 150 nm in thickness) can be rolled onto a mandrel for storage and possible shipment, and then subsequently unrolled for application without supporting the nanotube sheets with a carrier sheet (like in the Mylar film in Example 50) during this operation. This demonstration was provided by pressing two free-standing densified nanotube sheet stacks together (after they were peeled from the Mylar film substrate in the process of Example 50) and observing that the two nanotube sheet stacks had no significant tendency to stick together.

Example 52

This example shows that liquid densified nanotube sheet stacks can be formed on cellulose tissue paper, that the nanotube sheets or ribbons can be easily peeled from this cellulose substrate, and that these ribbons can be twist spun to make strong nanotube yarn. The investigated sheet stack/tissue laminate was made as in Example 45. Despite the fact that the nanotube sheet stacks were contoured as a result of being formed on a mandrel having oval cross-section, either the entire nanotube sheet stack width (4 cm) or narrow ribbons could be uniformly pulled from the cellulose tissue substrate. Ribbons pulled from the tissue substrate (3 mm and 5 mm in width) were twist spun to make strong nanotube yarn.

Example 53

This example demonstrates a twist-based method for making a fiber composite of two different fibrous materials, one comprising electronically conducting carbon nanotubes and the other comprising electronically insulating cellulose microfibers. Also, this example demonstrates a method that provides either the insulating microfibers or the conducting carbon nanofibers on the outer surface of the twisted yarn. In addition, this demonstration shows how a carbon nanotube yarn can be covered with an insulating layer. Also, by replacing the cellulose sheet with a similar sheet comprising fusible polymer microfibers (such as polypropylene or polyethylene-based non-woven paper), the methods of this example can be used to make polymer/nanotube composite yarns that are either twisted or false twisted prior to fusion of the polymer onto the nanofibers in the yarn by thermal or microwave heating. This demonstration uses the tissue paper/nanotube stack composite that has been contoured using the method of Example 45. Three millimeter width ribbons were cut parallel to the nanotube orientation direction from the composite stack, and twisted to provide a moderate strength yarn. Apparently, because of the contouring on the oval mandrel (with the nanotube fiber direction in the circumferential direction), the inventors found that (depending upon the direction of twist) either the insulating cellulose microfibers or the electrically conducting carbon nanofibers would appear on the surface of the twisted yarn.

Example 54

Figure 59:
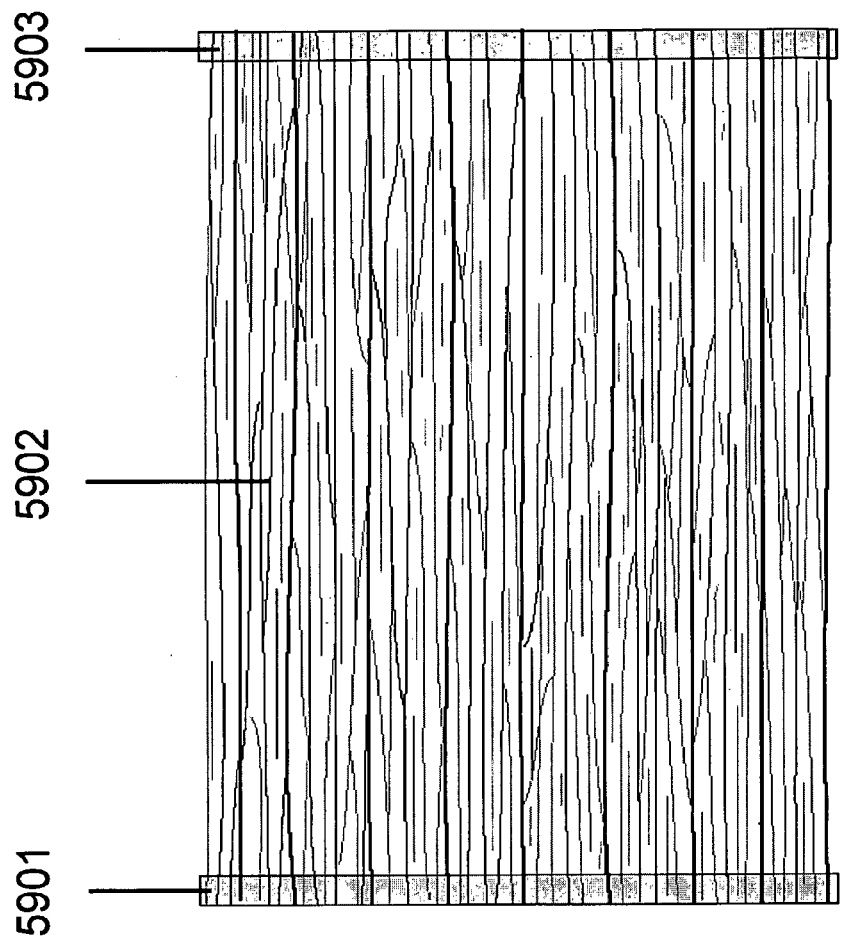
FIG. 59 A-C schematically illustrate components and successive stages during the fabrication of a matrix addressable bolometer. A) depicts a free-standing nanofiber sheet conductor, which has highly anisotropic electrical and thermal conductivities as a result of nanofiber orientation; B) depicts a frame comprising arrays of metal electrode pads and having a rectangular central opening over which two nanofiber sheet conductors (of the type shown in A) can be suspended from opposite frame sides so that the orientation direction of the nanofiber sheet conductors are orthogonal. The metallic electrode pads are covered with a thin film of temperature sensitive material. C) depicts the two orthogonally aligned nanofiber sheets attached to opposite sides of the frame in accordance with some embodiments of the present invention.
Figure 59:
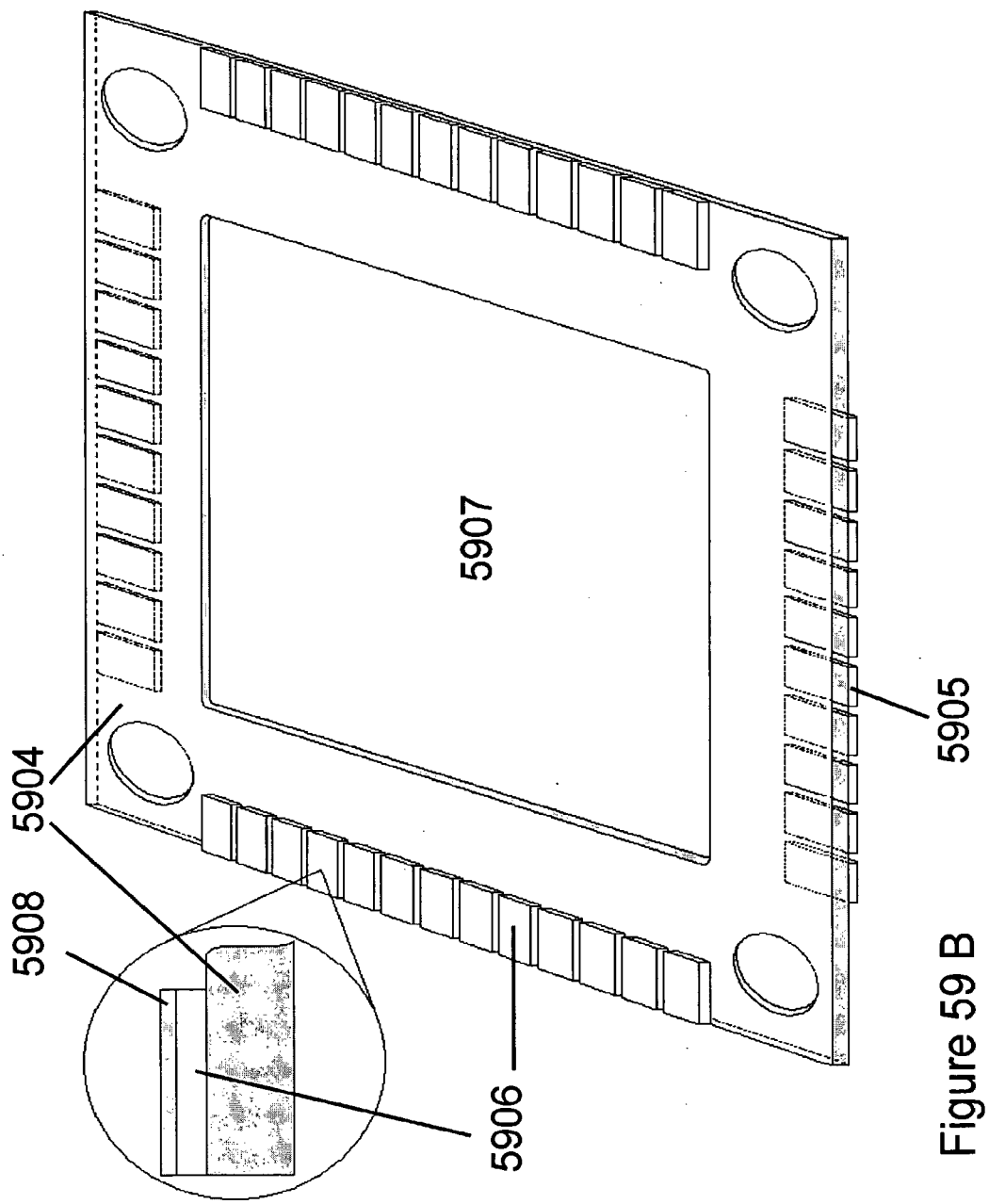
Figure 59:
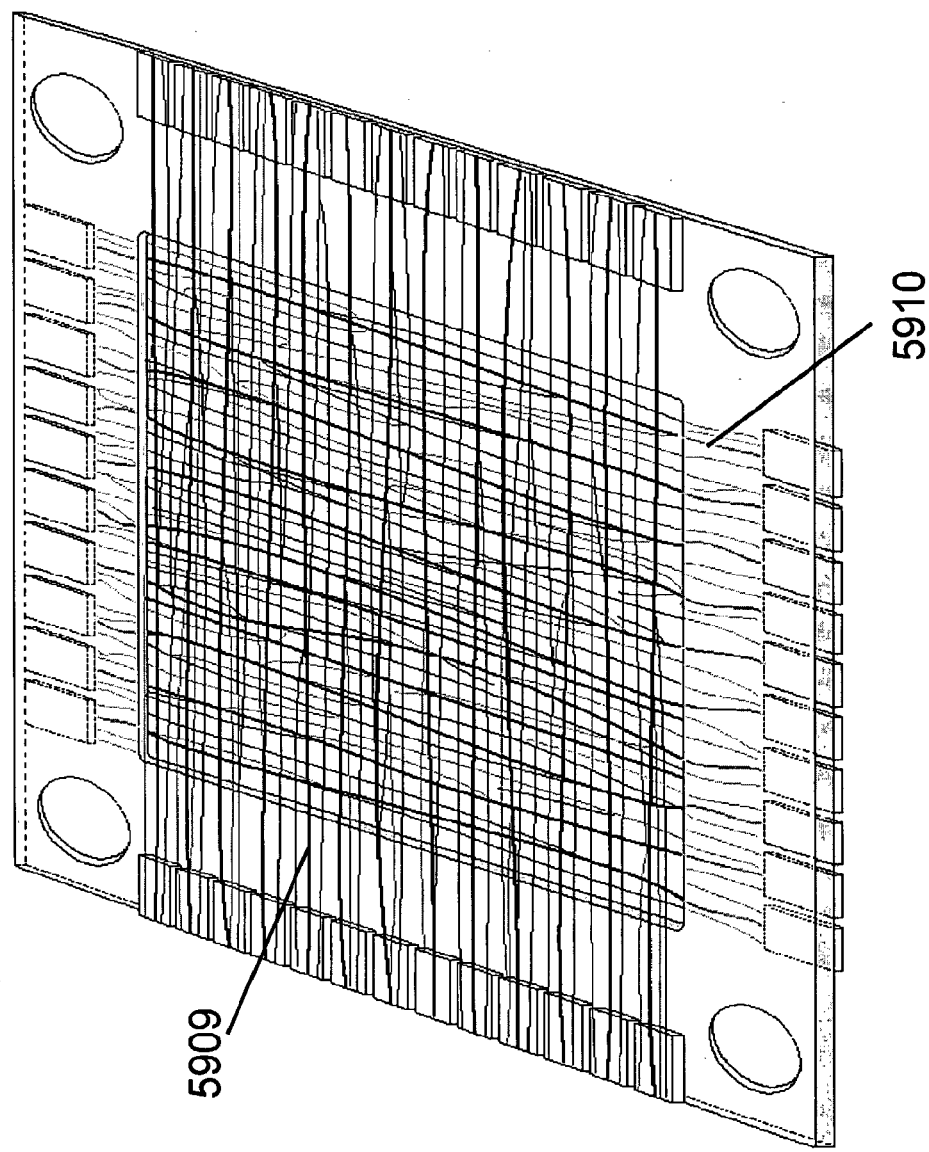
Figure 59:
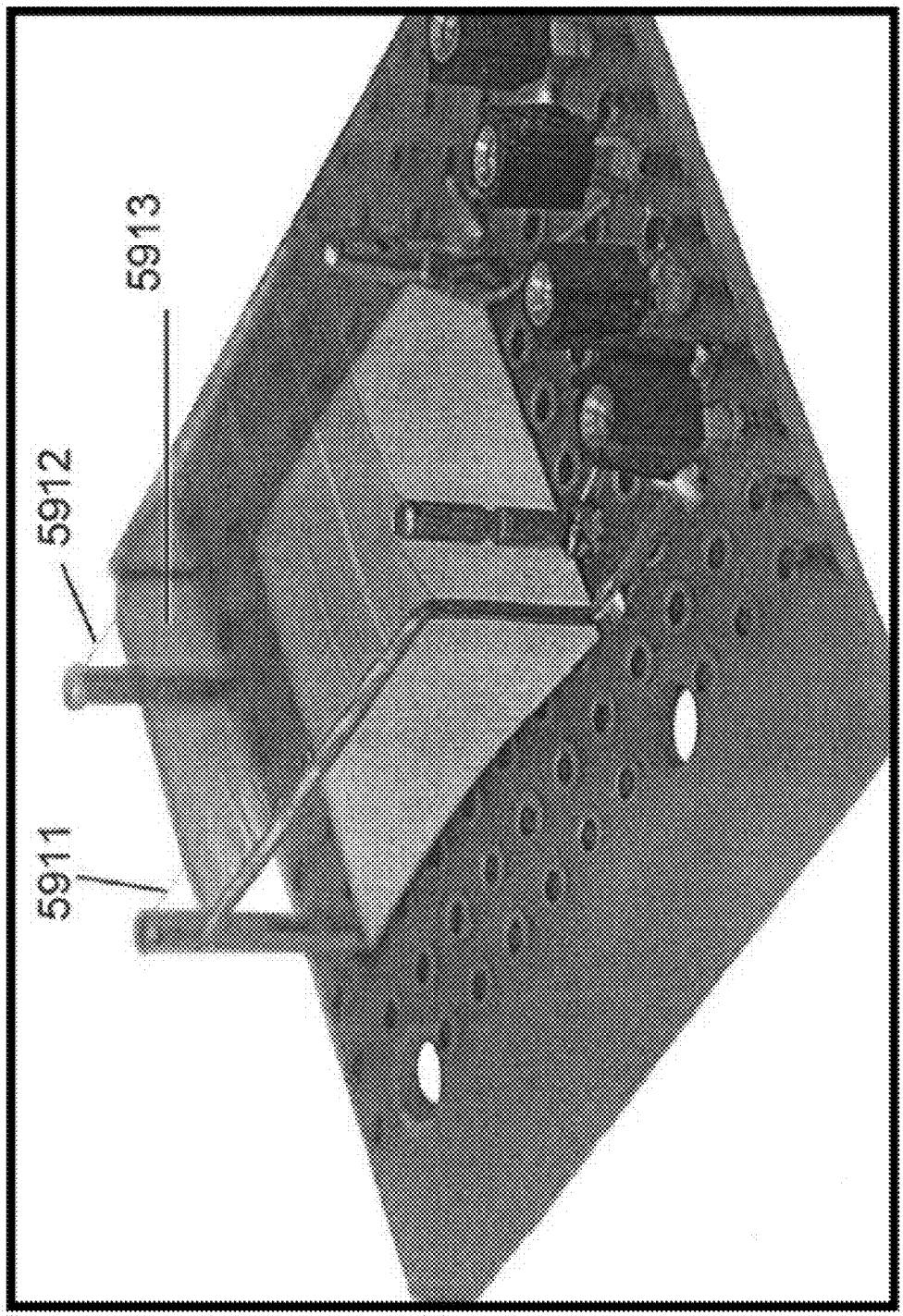

This example describes the application of highly anisotropic carbon nanotube sheets for making a bolometer in which the nanotube assembly is used as a heat delivery materials rather that as a sensing material. An extremely high thermal diffusivity (D of above 0.1 m$^2$/s) and a high thermal conductivity of solid-state drawn MWNT nanofiber sheets (K=50 W/mK) of the present invention (see preparation in 21) allows for rapid highly anisotropic transfer of temperature fluctuations to column and/or row electrodes of a matrix addressable sensor with minimal energy dissipation. The electrical signal(s) are established through heating at the nanotube sheet-electrode interface. A process of forming a thermal imaging display is shown in FIGS. 59 A-C. FIG. 59 A shows a free-standing MWNT sheet 5902 suspended between two holders 5901 and 5903. Substrate 5904 of FIG. 59 B (which serves to frame and support two orthogonally oriented nanotube sheets) is formed of an insulating dielectric material, like polycarbonate or a fiber glass sheet. Row metallic electrode pads 5906 are formed on top of substrate 5904. The column metallic electrode pads 5905 are formed on the other side of substrate 5904. A temperature sensing layer 5908 is formed on electrode pads of a material responsive to temperature fluctuation. In some embodiments, the temperature-sensitive layer is formed of a vanadium dioxide (or other suitable semiconductor material) that exhibits a high temperature coefficient of resistivity at room temperature and changes the series resistance of the entire circuit comprising: metallic electrode/semiconductor layer/nanotube assembly/semiconductor layer/metallic electrode. In other embodiments, the temperature sensitive layer 5908 is formed of a thermocouple material (e.g., iron) on one side of the electrodes and constantan on another. The carbon nanotube assembly delivers the heat to both ends. The thermocouple layers convert the temperature fluctuation into a thermoelectric potential. Once the electrodes are formed, highly-aligned MWNT nanofiber sheets are attached to both sides of the substrate, positioning the nanotube alignment of each respective sheet orthogonal to the other. The high anisotropy of thermal and electrical conductivities of suspended MWNT sheets minimizes lateral cross-talk between nanofiber orientation and orthogonal directions and permits high resolution thermal imaging of heat-radiating objects.

Example 55

Figure 60:
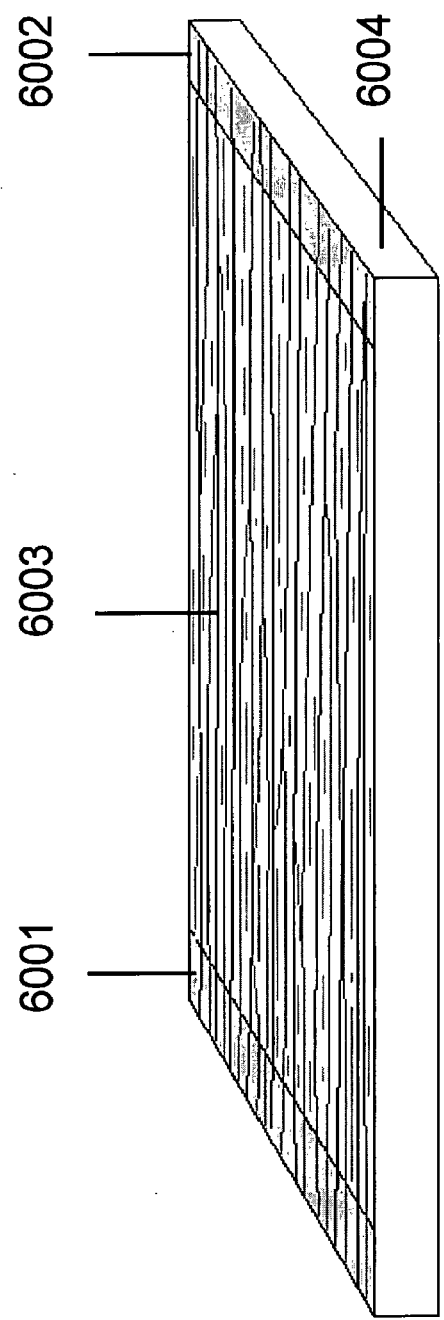
FIG. 60 schematically illustrates an anisotropic resistor with low temperature coefficient of resistivity, which can deposited on a flat insulating substrate or rolled on an insulating cylindrical substrate to provide a required resistance determined according to the utilized number of turns.

This example serves to illustrate how extremely low 1/f (f-frequency) noise and a low thermal coefficient of resistivity (see Example 25) enable application of MWNT carbon nanotube sheets as precision resistors, in accordance with some embodiments of the present invention. A schematic of the device is shown in FIG. 60. The free-standing MWNT sheet 5902 (optionally prepared using the process of Example 21) is superimposed on the substrate 6004, which comprises metallic electrodes 6001 and 6002, prior to the deposition of these electrodes by optionally screen printing. Substrate 6004 is a supporting dielectric material having a low thermal expansion coefficient, such as alumina. After the attachment of sheets to the substrate, the entire device is liquid densified using the process of Example 23. After drying, the film exhibits strong adhesion to the substrate surface. To avoid environmental influences on the resistance, the nanofiber sheet resistor is preferably packaged using technology similar to that used for organic light emitting organic diodes. The as-fabricated resistor exhibits an extremely low temperature coefficient of resistivity ($\alpha=7.5\times10^{-4}$ $K^{-1}$) and low 1/f noises.

Example 56

Figure 61:
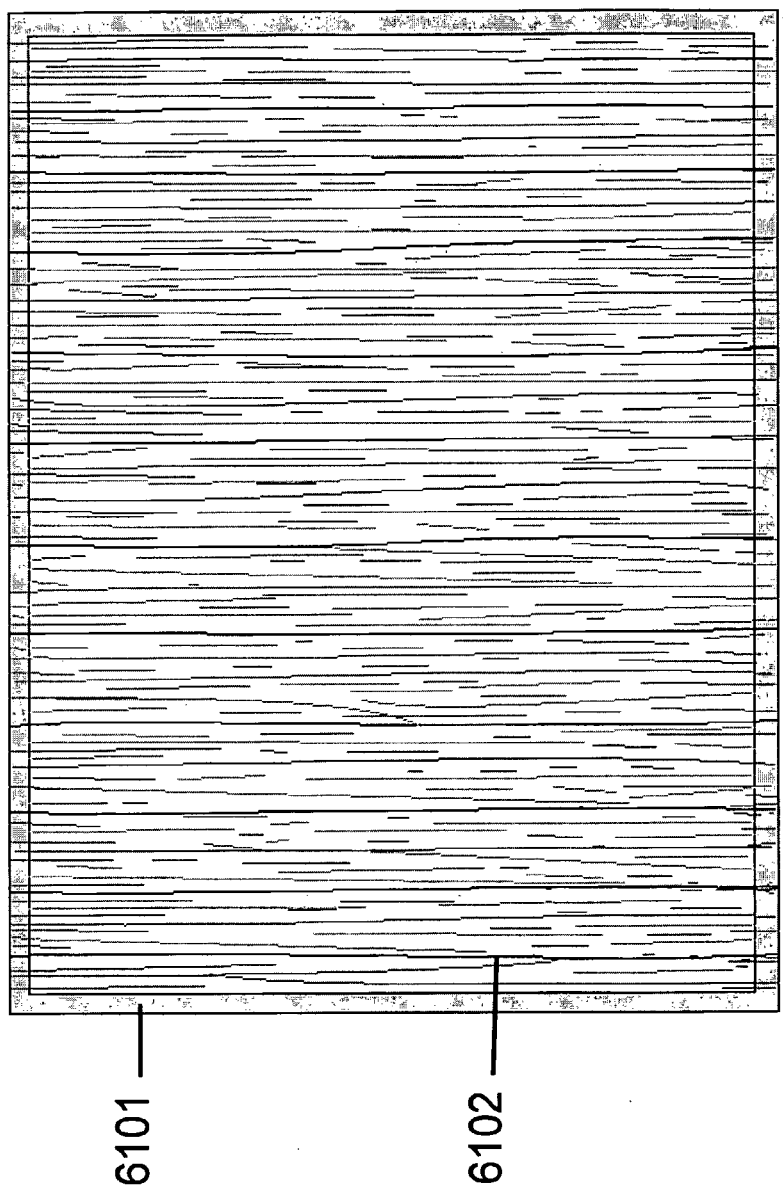
FIG. 61 shows schematically aligned nanofiber sheets in the architecture of a transparent electromagnetic (EM) shield, which can advantageously use the flexibility, electrical conductivity, transparency, radiofrequency and microwave frequency absorption, and dichrosim obtainable for solid-state drawn nanofiber sheets.

This example illustrates the fabrication of a screen for electromagnetic (EM) shielding, in accordance with some embodiments of the present invention. A schematic illustration of such an EM shielding device is shown in FIG. 61. This EM shielding screen can be optionally fabricated as a free-standing transparent sheet using a solid-state nanofiber sheet draw process (Example 21), attached to a surface (such as a display screen surface using a sheet deposition process like in Example 18, and an optional sheet densification process like that shown in Example 23). Nanotube orientation can optionally be aligned along the patterning direction of a front transparent electrode of the display screen in order to obtain efficient EM shielding. Alternatively, the EM shield can comprise nanotube sheet stack in which orientation directions of sheet stacks are not in the same direction (for the purpose of eliminating polarization effects for the screen.

Example 57

Figure 62:
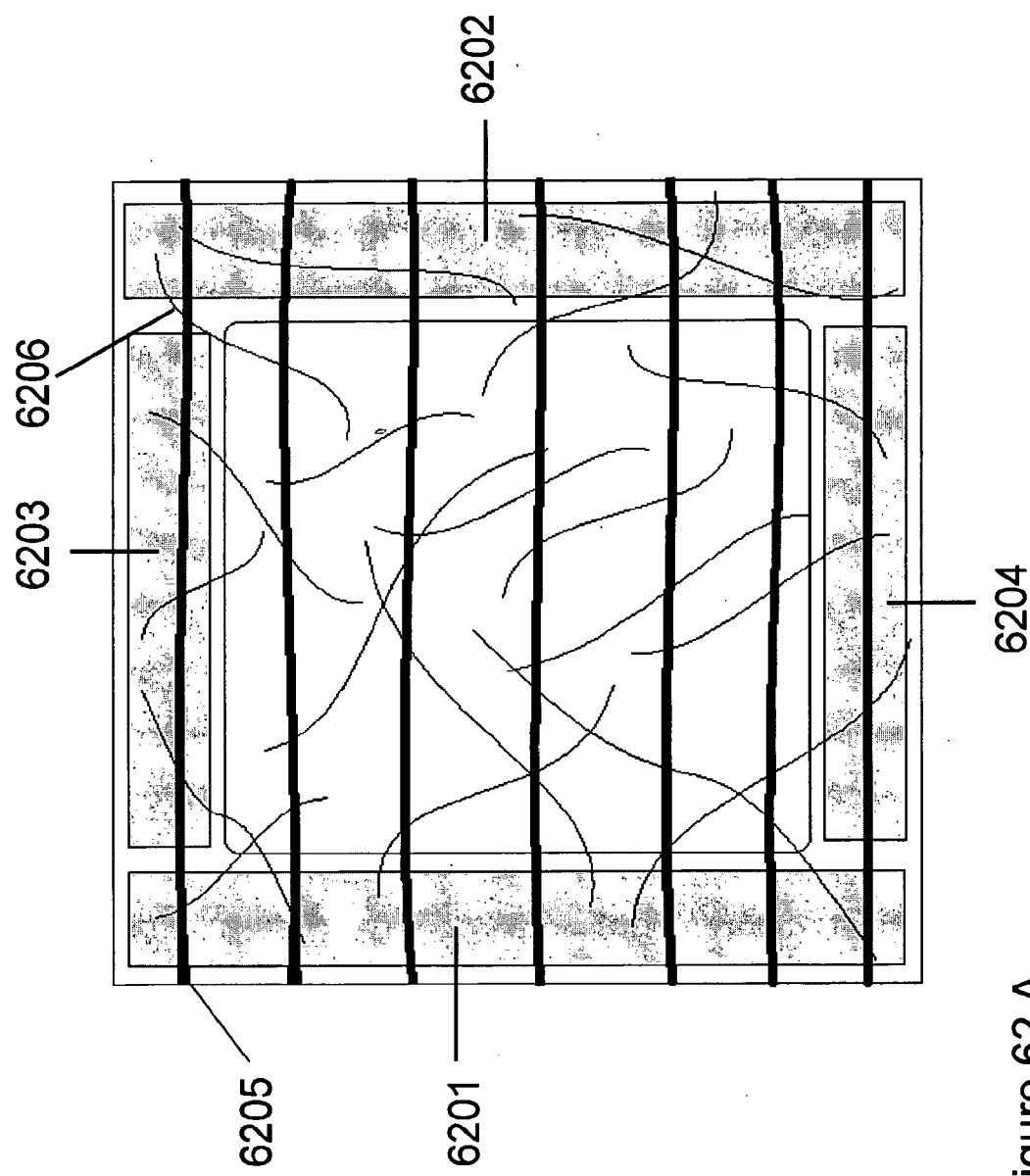
FIG. 62 A schematically illustrates a gas sensor using a carbon MWNT nanotube sheet, whose sensitivity is increased by the use of a deposited layer of SWNTs. While the MWNT sheet is herein schematically represented using a series of parallel lines it should be recognized that there is a degree of lateral connectivity for the MWNT sheets and this degree of lateral connectivity both increases sheet mechanical robustness and decreases sheet anisotropy.
Figure 62:
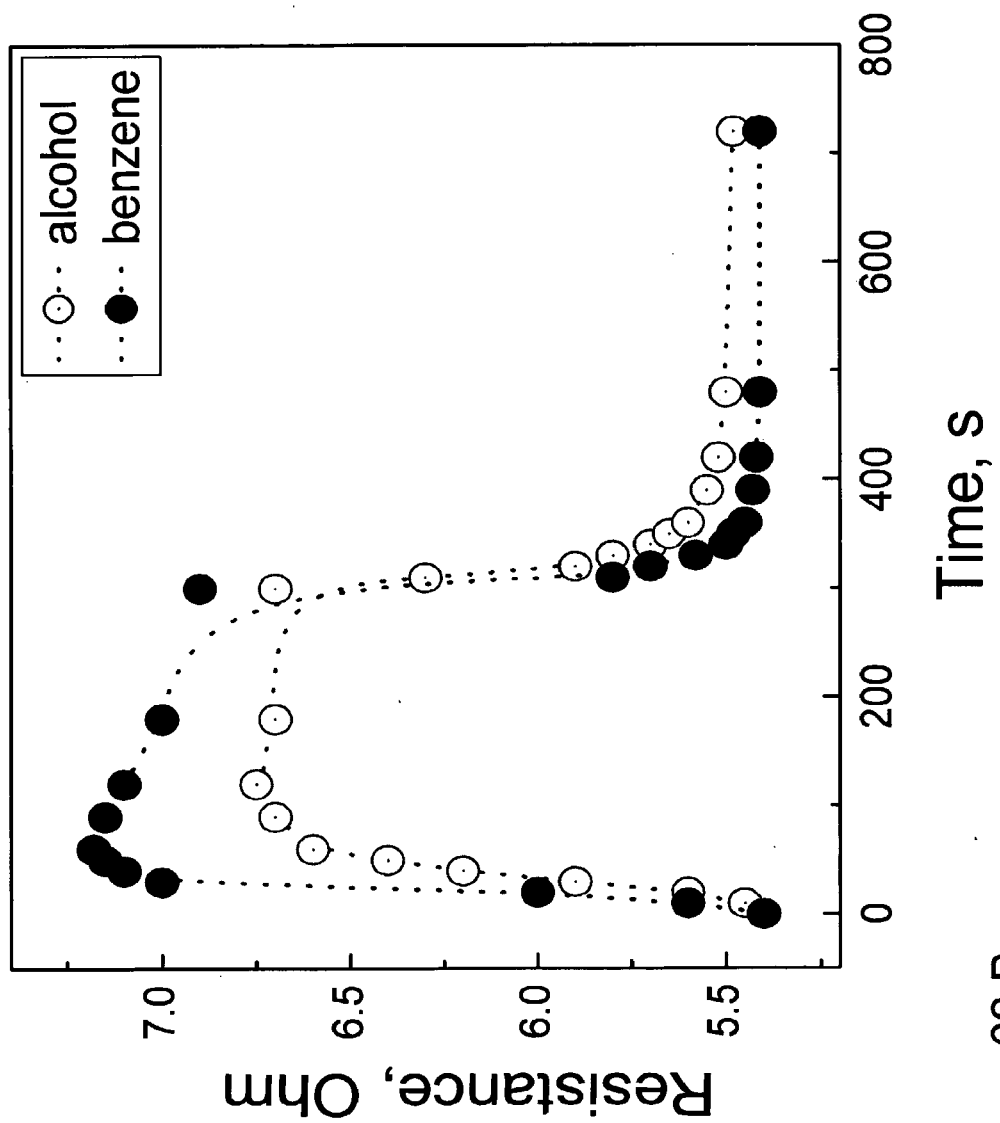

This example demonstrates the use of a highly aligned and porous MWNT nanofiber sheet as a host material for a gas sensor, in accordance with some embodiments of the present invention. MWNTs are not by themselves highly sensitive to adsorbed gases. However, a suspended sheet of MWNTs is mechanically strong, has high porosity, and has very anisotropic conductivity along and perpendicular to the nanotube alignment direction. The anisotropy factor is usually above 20, but it can be easily increased by mechanical treatment to above 100. To sensitize the MWNT sheet, SWNTs from suspension are deposited onto the MWNT sheet (such as by SWNT deposition from a liquid dispersion) or by growth of the SWNTs on the MWNT sheets (such as by known CVD processes). In one embodiment (illustrated in FIG. 62 A), the MWNT sheet is deposited on a dielectric substrate (such as a glass or ceramic) on which there are previously deposited electrodes 6201, 6202, 6203, and 6204. In another embodiment, an opening in the substrate allows gas to flow through the porous MWNT sheet comprising the deposited SWNTs. As a result, the conductivity across the MWNT sheet is determined by the conductivity of the deposited SWNTs 6206 which are very sensitive to the gas environment due to their intrinsic properties. FIG. 62 B demonstrates the high sensitivity of SWNT sheets (filtration produced HiPco nanotube paper) to the vapor of benzene and alcohol. After each exposure to the gas and measurement cycle, the sensing surface of the device is recovered by heating the MWNT sheet to optionally about 300° C. by applying current along the host MWNTs, i.e., to electrodes 6201 and 6202 of FIG. 62 A.

Example 58

This Example illustrates an application whereby nanotube sheets and yarns are used as antenna, in accordance with some embodiments of the present invention. Such antenna comprising the nanotube sheets of Example 21 can be transparent, which is also the case for antennas based on sparsely weaving the nanotube yarns of invention embodiments into transparent textiles. The optically transparent antennas can be laminated on structures that need to be viewed optically, such as radio-frequency identification (RFID) tags overlaid on bar codes, pictures, photo-frames, displays, etc. In some such above-described embodiments, the antenna have a structure like that shown in FIG. 63, where such an antenna is composed of a microstrip line type feeder, made of a copper line or any other conductive strip, which can be also transparent, like another nanofiber sheet or ITO film. In some embodiments, a thin insulating layer of polymer, 5-10 microns thick, is coated on the top of a microstrip line feeder and the antenna reflector plane, which is made of a single nanofiber sheet, or several sheets with yarns for better conduction is laminated on top of it. The resonance wavelength of the antenna can be tuned by the length of the nanofiber element L, which has an average thickness derived from the nanofiber forest array, from which the nanofiber sheet or yarn is optionally spun.

Example 59

This example serves to illustrate a heat exchanger based on MWNT nanofiber sheets. Drawn from a MWNT forest, such suspended sheets exhibits extremely high thermal diffusivity and high thermal conductivity. Densification of the sheet on a substrate dramatically decreases the heat transport by two orders of magnitude because of improved heat dissipation to the substrate. Meanwhile the thermal transport along the nondensified sheet remains very high. In this example, the use of a MWNT sheet as a heat exchanger for a computer mother board is described. The high electronics density laptop computer contains several highly-integrated processors distributed on the mother board. It is impossible to provide each processor with its own cooling fan, such as is often used for the main processor in desktop computers. Laptop computers usually use a copper heat exchanger to direct all heat to a metallic plate cooled with a fan cooler built into some corner of the computer body. The thermal diffusivity of MWNT sheets is two orders of magnitude higher than that of bulk copper. As shown in FIG. 64, to improve the heat exchange, Applicants propose that the copper plate 6403 be covered with MWNT sheet 6401 to enforce the delivery of thermal energy to the cooler 6404 built into some corner of the computer body. The surface area above the contact with processor (or other heat sources), 6402 and fan cooler are preferably densified to improve the heat exchange between the copper plate and the MWNT sheet. The heat delivery bus can optionally be un-densified.

Example 60

Figure 67:
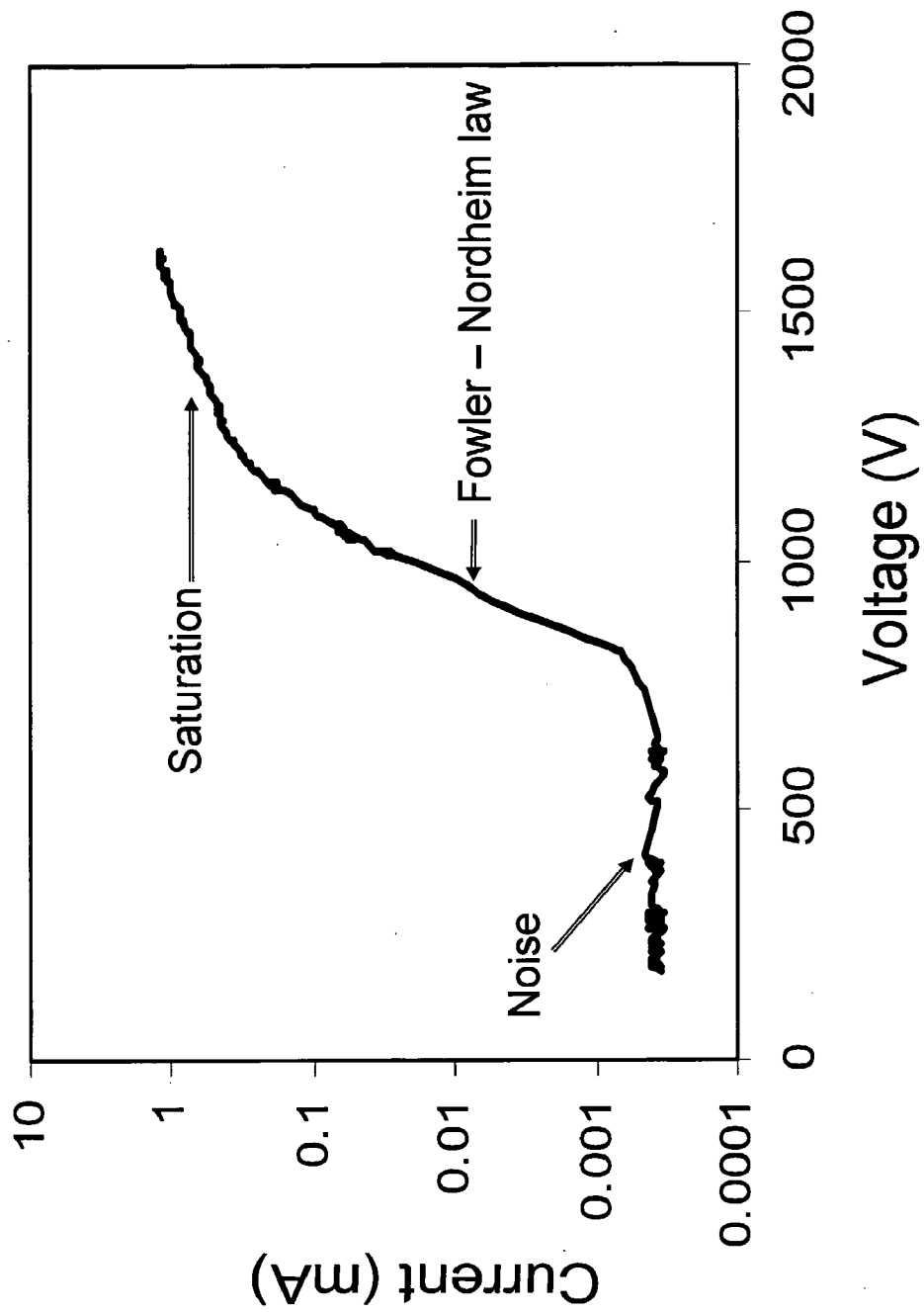
FIG. 67 is a typical current-voltage (I-V) plot of field emission from a MWNT yarn in the vertical, single-end geometry. A short (1 ms) high voltage pulse (2 kV) was pre-applied to raise the yarn vertically.

This example shows that Field emission properties of the twisted MWNT yarns were studied in the single end geometry (FIG. 66 B). MWNT yarns of 10 μm diameter were obtained using the draw-twist spinning process of Example 2, and automated versions of this process (such as shown in Example 48). One end of a 6 mm long yarn was affixed to a flat nickel plate using conductive tape that is used for scamming electron microscopy. Thus, a 5 mm MWNT yarn that is free-standing at an arbitrary angle was obtained. The resulting MWNT cathode so produced was introduced into a vacuum chamber along with a tungsten anode plate and the chamber was pumped down to $10^{-7}$ Torr. The distance between the nickel plate and the tungsten anode plate was 10 mm. A short (1 ms) high voltage (2000 v) conditioning pulse was applied to raise the MWNT yarn up to roughly vertical orientation. Subsequent to that, I-V measurements were performed in the DC regime. FIG. 67 shows an I-V curve for the field emission of the yarns in the single end geometry. The three stages of field emission are easily seen. At low voltages, no current is observed except noise from the measurement system. From 700 V to 1200 V, the field emission seems to obey Fowler-Nordheim (FN) law (R. Gomer, Field Emission and Field Ionization, Harvard University Press, Cambridge, Mass., 1961, Chaps. 1-2). Above 1200 V, the FE I-V curve deviates considerably from FN law, which may be attributed to some saturation of current due to an adsorbate-enhanced field emission mechanism.

Example 61

This example serves to illustrate light emission from a vertical geometry for a single yarn end-tip cathode, in accordance with some embodiments of the present invention. In a single yarn end-tip geometry incandesced light emission was observed from the end of the yarn when the applied voltage exceeded 1460 V (see FIG. 68, inset). Such emission is attributed to Joule heating. FIG. 68 shows the spectra of the incandesced light, wherein the temperature is about 2200 K based on the color of the emitted light.

Example 62

Figure 70:
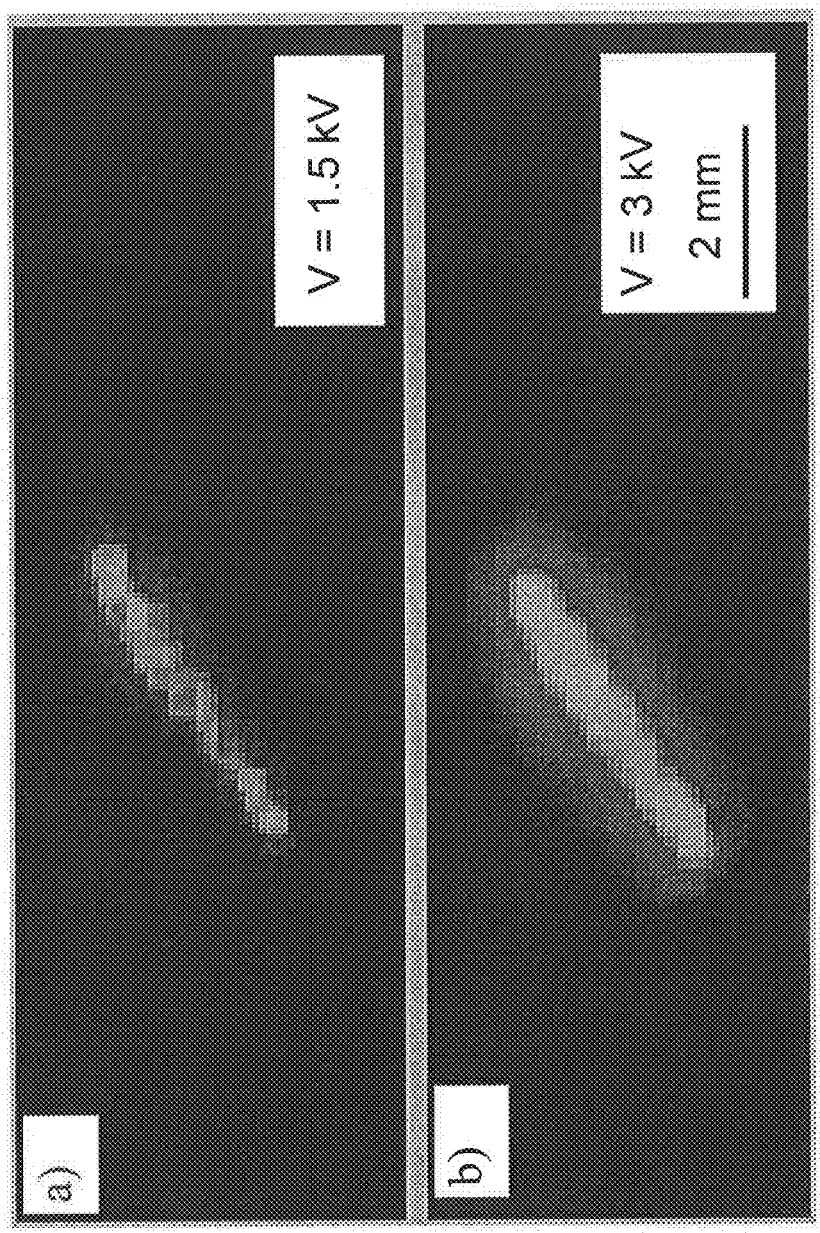
FIGS. 70 A and 70 B are phosphor-screen images showing the emission uniformity of the carbon multiwall nanotube yarns in lateral geometry (i.e., emission lateral to a side of a nanotube yarn). Images were taken using a one millimeter gap between the cathode and the phosphor screen anode. The voltages applied were negative pulses of 1.5 kV and 3 kV for the A and B images, respectively.
Figure 71:
FIG. 71 is phosphor screen image showing a prototype of a patterned alpha numeric display based on electron emission from multiwalled nanotube yarns in a flat, patterned geometry. Images were taken with a 1 mm gap between the cathode and the phosphor screen anode. Negative 3 kV voltage pulses were applied to the cathode. The repetition rate of the pulses was 1 kHz and duty cycle was 1%.

This example serves to illustrate electron emission from a planar geometry configuration for a nanofiber yarn cathode, in accordance with some embodiments of the present invention. From a MWNT yarn of 10 μm diameter and meter length, a 12 mm long segment was extracted and connected to a flat nickel plate using electrically conducting SEM tape on both ends. So taped, about 10 mm of said yarn remained uncovered. The prepared sample was introduced into a vacuum chamber along with a tungsten anode plate, and the chamber was pumped down to $10^{-7}$ Torr. The geometry of the experiment is depicted in FIG. 66 A. The field emission properties of the lateral side of the 10 mm long segment of exposed yarn were examined in the DC regime with a Keithley 237 unit. FIG. 69 shows I-V plots for lateral electron field emission from the MWNT yarn. Typical I-V (current (I) versus voltage (V)) plots in this geometry show hysteresis behavior. Initial (first rise) I-V plots go considerably steeper and have a large threshold field value (0.9 V/μm) than those observed in the following set of measurements (0.7 V/μm). This hysteresis behavior may be a result of electrostatic forces which tousle the MWNT on the yarn, thereby making it fuzzier. After this, the Fowler-Nordheim plots became repeatable and may likely be interpreted within the framework of the Fowler-Nordheim theory of cold cathode electron emission. Once a rather high field was applied, on the order of about 5-8 kV for 10-15 hours, the electrostatic hairy forest evolved further protrusions of nanotubes. This resulted in the formation of hairy parts on the MWNT yarn surface (see FIGS. 74 A and B). The same said lateral geometry was also used with a phosphor screen anode instead of a tungsten plate. Typical images of field emission from said yarns in this lateral geometry taken with a phosphor screen anode are depicted at FIGS. 70 and 71. To avoid rapid phosphor burning in the DC regime, the negative pulsed voltage was applied with a HV Pulse M25k-50-N unit to the cathode. The repetition rate of the pulses was 1 kHz and the duty cycle was 1%. It is clearly seen that the field emission properties of the MWNT yarn are very uniform. Moreover, at certain applied voltages, the field emission sites cannot be distinguished. This property of uniform lateral emission from the MWNT yarn may be widely used in different types of flat panel displays and indicators, such as letters and/or alpha numeric code numbers (shown in FIG. 71).

Example 63

This example describes the application of transparent MWNT nanofiber sheets as a cold cathode for electron emission. A nanotube fiber sheet has been prepared by the above-described of Example 21, and was placed on a square piece of glass (25 mm×25 mm, 1 mm thickness) and then densified two times in methanol using the densification method of Example 23. After that, all of the borders of the nanotube sheet were covered with SEM electrically conducting tape, such that a 10 mm border strip of said sheet was fully covered. An uncovered square surface of 5 mm×5 mm was left. FIG. 79 is a schematic illustration of a flat cold cathode prepared this way. The cathode was introduced into a vacuum chamber along with a tungsten anode plate and pumped down to $10^{-7}$ Torr. Field emission properties of the uncovered square of MWNT transparent sheet cathode were studied with a Keithly 237 unit. The distance between the cathode and tungsten anode plate was 250 μm. I-V plot of the field emission of said MWNT transparent sheet shows that the threshold field (when a field emission current reached 100 nA) was 0.8 V/μm.

Example 64

This example demonstrates the application of transparent nanotube sheets for a conventional display technology wherein the phosphor screen is between the electron emitting elements and the viewer (like for FIG. 82). A cathode prepared as in the previous example was introduced into a vacuum chamber along with a phosphor screen anode and the chamber was pumped down to $10^{-7}$ Torr. The phosphor screen comprised ITO coated glass further coated with a "green" TV phosphor. The cathodoluminescent images were observed through the glass window of the chamber. In this example, the phosphor screen was placed between the cathode and the glass window of the chamber (like for the schematic illustration of FIG. 82). The distance between the cathode and the phosphor screen anode was approximately 200 μm. Typical images of field emission from said cold cathode taken with the phosphor screen anode show a quite nonuniform intensity distribution, probably due to variation of density of end-tips. To avoid rapid phosphor burning in the DC regime, the negatively-pulsed voltage was applied to the cathode by using a HV Pulse M25k-50-N power supply. The repetition rate of the pulses was 1 kHz and the duty cycle was 1%. Typical negative pulse amplitudes that were applied were between 300 V and 3 kV.

Example 65

This example demonstrates a novel type of display technology or invention embodiments in which a transparent nanofiber sheet cathode electron emitter separates the phosphorescent light emitting layer from the viewer. A cathode as prepared in the previous example was introduced into a vacuum chamber along with the above-described phosphor screen anode, and the chamber was pumped down to $10^{-7}$ Torr. A transparent nanotube sheet cold cathode was placed between the phosphor screen and the glass window of the chamber (as shown at FIG. 83). Typical images of field emission from said cold cathode taken with the phosphor screen anode are shown in FIG. 71. The details of voltage pulsing and the utilized power source were the same as for Example 64.

Example 66

This Example serves to illustrate a carbon nanotube-based polymeric LED device: PLED on a flexible plastic, in accordance with some embodiments of the present invention. Such a device can comprise the following structure: carbon nanotube (CNT) sheet/PEDOT:PSS/MEH-PPV/calcium/aluminum, similar to device described in Example 32. To make the above-described device, a free-standing carbon nanotube (CNT) nanofiber sheet (shown as 8505 at FIG. 85) is placed on a substrate (8507) of flexible plastic (polyethylene terephthalate (PET) or poly(ethylene-2,6-naphthalate (PEN)). The undensified sheet is weakly bound to the substrate and can be rubbed off very easily. Care must be taken during subsequent processing so that this does not occur. The substrate with the CNT sheet on top is then densified. The densification process is performed by placing the substrate into a beaker of methanol or ethanol. The substrate is held vertically and dipped into the solvent along the direction of the sheet orientation. The substrate is then placed onto a cloth and allowed to dry. This procedure of dipping and drying is performed two more times. The CNT sheet has now been densified and has a thickness of approximately 200 nm. Several layers of the hole-injecting polymer PEDOT:PSS (shown as 8504) are deposited after the solvent has been dried from the densified CNT sheet. PEDOT:PSS (Bayer Co.) is filtered prior to depositing onto the CNT substrate. A first layer is deposited at a spin rate of 6100 rpm, with an initial acceleration of 21,500 rpm/second for 20 seconds. A plastic syringe is filled with a solution of the PEDOT:PSS in water. The spinner is started and the solution is immediately dropped onto the substrate while acceleration is still occurring. This produces a thin film of PEDOT:PSS. The substrate is then baked at a temperature of 120° C. for 30 minutes. A second layer of PEDOT:PSS is deposited using the a spin process with a slower acceleration of 160 rpm/second, but the same target rate of 6100 rpm and time of 20 seconds. The solution is dropped onto the substrate prior to the start of spinning, however, unlike the first film for which spinning was started before dropping the solution on. This film is then baked under the previous conditions of 120° C. for 30 minutes. Third and fourth layers are deposited using the same spinning conditions as used with the second layer (6100 rpm, 160 rpm/second acceleration, 20 seconds) and baked after each deposition for 30 minutes at 120° C. The emissive layer of the device (8503 layer) is produced from a solution of 0.2 wt % MEH-PPV in chloroform. The MEH-PPV solution is dropped (i.e., deposited) onto the substrate containing the CNT sheet and PEDOT:PSS films. Spinning is done at a rate of 3000 rpm, with an initial acceleration of 3400 rpm/s for 30 seconds. Spinning is started and the MEH-PPV/chloroform solution is immediately dropped onto the accelerating substrate from a plastic syringe. A single film of MEH-PPV is produced on the device. The MEH-PPV film is dried overnight in an argon-filled glove box. The device fabrication is finalized by depositing cathodes onto the CNT/PEDOT:PSS/MEH-PPV structure of FIG. 85. The deposition of the cathodes is performed in a high vacuum chamber equipped with thermal deposition equipment. Calcium (8502 in FIG. 85) and aluminum (8501) are deposited in a single pump-down cycle from separate sources. The base pressure in the chamber prior to the start of deposition is <$2\times10^{-6}$ Torr. A shadow mask is used to place the cathodes in the desired locations on the substrate. The calcium is deposited first at an initial rate of 0.5 Å/s second. After 100 Å of Ca has been accumulated, the rate is ramped at 2 Å/s over a 60 second period. This rate is held until 300 Å of calcium have been deposited. Aluminum (Al) is then deposited at a constant rate of 5 Å/s until 1200 Å have been deposited. Testing shows results similar to those described in Example 32

Example 67

This Example serves to illustrate a carbon nanotube-based small-molecule OLED on display glass or flexible plastic, in accordance with some embodiments of the present invention. This device is similar to the previously-described polymeric devices, however, it incorporates thermally-evaporated molecular films in place of polymeric films as the active layers. The device structure is as follows: carbon nanotube (CNT) sheet/PEDOT:PSS/α-NPD/Alq$_3$/Aluminum shown in FIG. 86. To fabricate the above-described device, a free-standing carbon nanotube (CNT) sheet (8606) is placed on a substrate of Corning 1737 display glass (8607) or flexible plastic (PET or PEN 8608)). The sheet is weakly bound to the substrate and can be rubbed off very easily. Care must be taken during subsequent processing so that this does not occur. The substrate with the CNT sheet on top is then densified. The densification process is performed by placing the substrate into a beaker of methanol or ethanol. The substrate is held vertically and dipped into the solvent along the direction of the sheet orientation. The substrate is then placed onto a cloth and allowed to dry. This procedure of dipping and drying is performed two more times. The CNT sheet has now been densified and has a thickness of approximately 200 nm. Several layers of the hole-injecting polymer PEDOT:PSS (the 8605 layers) are deposited after the solvent has been dried from the densified CNT sheet. PEDOT:PSS is obtained from (Bayer Co.) and is filtered prior to depositing onto the CNT substrate. A first layer is deposited at a spin rate of 6100 rpm, with an initial acceleration of 21,500 rpm/second, for 20 seconds. A plastic syringe is filled with the solution of PEDOT:PSS in water. The spinner is started and the solution is immediately dropped onto the substrate while acceleration is still occurring. This produces a thin film of PEDOT:PSS. The substrate is then baked at a temperature of 120° C. for 30 minutes. A second layer of PEDOT:PSS is deposited using the same spin process, but with a slower acceleration of 160 rpm/second (but the same target rate of 6100 rpm and time of 20 seconds). The solution is dropped onto the substrate prior to the start of spinning. This film is then baked under the previous conditions of 120° C. for 30 minutes. A third and fourth layer are deposited using the same spinning conditions as for the second layer (6100 rpm, 160 rpm/second acceleration, 20 seconds) and baked after each deposition for 30 minutes at 120° C. The transport (8603) and emissive layers (8604) of the device are produced in a high vacuum chamber equipped with thermal deposition sources. The layers are deposited by resistively heating tungsten or molybdenum boats containing organic powders at a base pressure $<2\times10^{-6}$ Torr. The first layer ($\alpha$-NPD, hole-transport layer: 8603) is deposited onto the existing CNT/PEDOT:PSS layers at a constant rate of 1 Å/s until 700 Å are accumulated. The second layer (Alq$_3$, emissive and electron transport layer: 8604) is deposited at a rate of 1 Å/s until 500 Å are accumulated. The chamber is then vented and a shadow mask used for cathode deposition is placed on the substrate. The chamber is pumped again, and a bilayer cathode of lithium fluoride and aluminum is deposited onto the structure. The layer of lithium fluoride is deposited at a rate of 0.1 Å/s until a 10 Å thickness is accumulated. The final layer of aluminum is deposited at an initial rate of 0.2 Å/s. Once 100 Å have been deposited, the rate is ramped up to 5 Å/s over a 60 second period. This rate is held until 1200 Å of aluminum have been deposited.

Example 68

Figure 88:
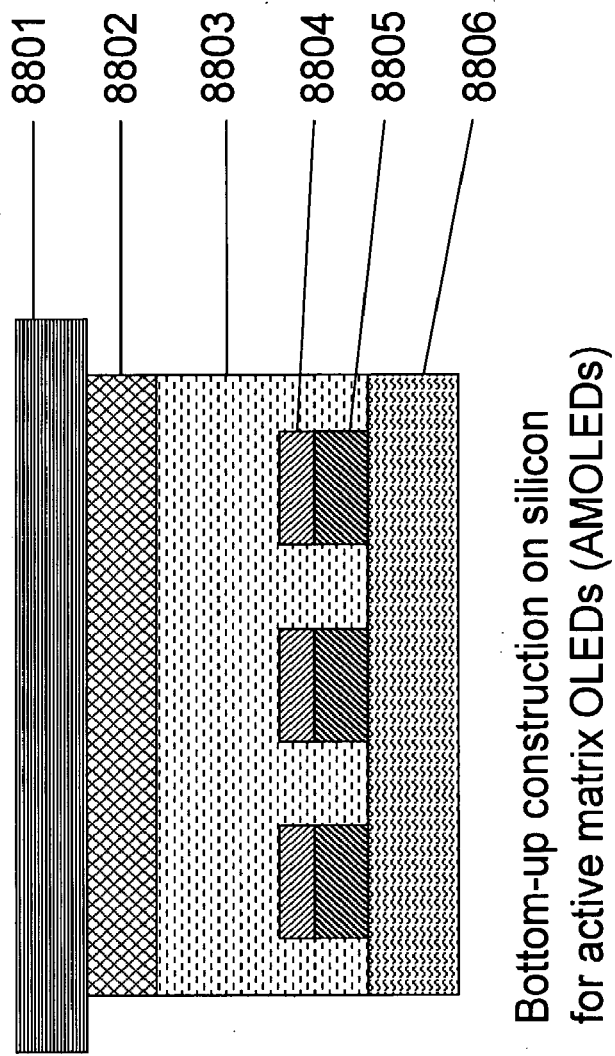
FIG. 88 depicts the bottom-up structure described in FIG. 87 on a silicon wafer for active matrix OLED. The silicon wafer may contain aluminum/calcium contact pads or transistors. The polymeric layers are deposited first, followed by the nanotube sheet anode on the top.

This Example serves to illustrate a carbon nanotube-based PLED with a bottom-up structure for construction on drive electronics for active-matrix displays, as shown in FIGS. 87 and 88. The device structure is as follows: Aluminum/Calcium/MEH-PPV/PEDOT:PSS/CNT sheet. Fabrication of the above-described device starts with a substrate of either display glass: 8706 layer in FIG. 87 or n-type silicon (8806 in FIG. 88). The substrates are put onto a shadow mask and placed inside a vacuum chamber equipped with tungsten or molybdenum sources for thermally evaporating metals. For the fabrication of the bottom-up OLED of FIG. 87, a layer of aluminum (8705) is deposited at a rate of 5 Å/s to obtain a final thickness of 1000 Å. A 300 Å thick layer of calcium (8704) is then deposited, also at a rate of 5 Å/s. The metal-coated substrate is removed from the vacuum chamber directly into an inert atmosphere so that the calcium film is not exposed to oxygen. While enclosed in the inert atmosphere, a film of MEH-PPV (8703) is spin-cast onto the substrate from a solution of 0.2 wt % MEH-PPV in chloroform. A syringe is used to drop the solution onto the accelerating spinner. A spin speed of 3000 rpm with an acceleration of 3400 rpm/s and a duration of 30 seconds is used to deposit the film. The film is dried overnight before subsequent film deposition. After drying the film, several layers of PEDOT:PSS are added (8702). The first layer is deposited by starting the spinner with an acceleration of about 160 rpm/s and immediately dropping the solution onto the substrate from a syringe. The target spin rate for the spinner is 6100 rpm, and the duration of the deposition is 20 seconds. Subsequent layers use the same spinning parameters, however, the solution is dropped onto the substrate before starting the spinner. After each film is deposited, it is baked for 30 minutes at 120° C. For the final step of making the device, the substrate with Al/Ca/MEH-PPV/PEDOT:PSS is place onto a stand, and a free-standing sheet of nanotubes (8701) is placed on top of the existing films. The sheet is now weakly bound to the substrate. The entire substrate is held vertically and dipped into a beaker of ethanol or methanol with the dipping motion in the same direction as the orientation of the nanotube sheet. This is repeated several times, allowing the solvent to dry in between dips.

Example 69

This Example serves to illustrate an essentially transparent PLED, based on use of carbon nanotube sheets as both anode and cathode, as shown at FIG. 89. Nanotube anode is placed on display glass or flexible plastic, in accordance with some embodiments of the present invention. Such a device comprises the following structure: CNT sheet/PEDOT:PSS/MEH-PPV/Calcium-coated CNT sheet. To fabricate such an above-described device, free-standing carbon nanotube (CNT) sheet (8904) is placed on a substrate of Corning 1737 display glass (8905) or flexible plastic (e.g., PET or PEN). The sheet is weakly bound to the substrate and can be rubbed off very easily. Care must be taken during subsequent processing so that this does not occur. The substrate with the CNT sheet on top is then densified. The densification process is performed by placing the substrate into a beaker of methanol or ethanol. The substrate is held vertically and dipped into the solvent along the direction of the sheet orientation. The substrate is then placed onto a cloth and allowed to dry. This procedure of dipping and drying is performed two more times. The CNT sheet has now been densified and has a thickness of approximately 200 nm. Several layers of the hole-injecting polymer PEDOT:PSS (8903) are deposited after the solvent has been dried from the densified CNT sheet. PEDOT:PSS (Bayer Co.) is filtered prior to depositing onto the CNT substrate. A first layer is deposited at a spin rate of 6100 rpm (with an initial acceleration of 21,500 rpm/second) for 20 seconds. A plastic syringe is filled with the solution of PEDOT:PSS in water. The spinner is started and the solution is immediately dropped onto the substrate while acceleration is still occurring. This produces a thin film of PEDOT:PSS, but one which acts to provide enhanced adhesion of the CNT sheet to the substrate. The substrate is then baked at a temperature of 120° C. for 30 minutes. A second layer of PEDOT:PSS is deposited using the spin process with a slower acceleration of 160 rpm/second, but the same target spin rate of 6100 rpm and time of 20 seconds. The solution is dropped onto the substrate prior to the start of spinning, however, unlike the first film for which spinning was started before dropping the solution on. This film is then baked under the previous conditions of 120° C. for 30 minutes. A third and fourth layer are deposited using the same spinning conditions as used for the second layer (6100 rpm, 160 rpm/second acceleration, 20 seconds) and baked after each deposition for 30 minutes at 120° C. Before adding the emissive layer (8902) it is necessary to coat a free-standing CNT sheet with calcium. This is done in a vacuum chamber equipped with a tungsten or molybdenum source for evaporating metals. The chamber is pumped to a base pressure $<2\times10^{-6}$ Torr, and a layer of calcium is deposited at a rate of 1 Å/s until a 300 Å thickness has been deposited. The emissive layer (8902) of the device is produced by drop-casting a 0.15 wt % solution of MEH-PPV onto the substrate using a syringe. Instead of spinning the film, the substrate is tipped vertically and the excess solution is allowed to run off onto an absorbent, lint-free clean room cloth. The substrate is positioned horizontally again and, while the film is still wet, the coated, free-standing CNT sheet (8901) is placed onto the film with the calcium side on the film. This is allowed to dry overnight in an inert atmosphere. After drying, the CNT nanofiber sheet (8901) is densified in inert atmosphere using a solution of methanol or ethanol containing a very small concentration of MEH-PPV. The substrate is dipped vertically into the solution along the direction of orientation of the CNT sheet. The solvent is removed by drying for several hours, and the device is then ready for use.

Example 70

Figure 90:
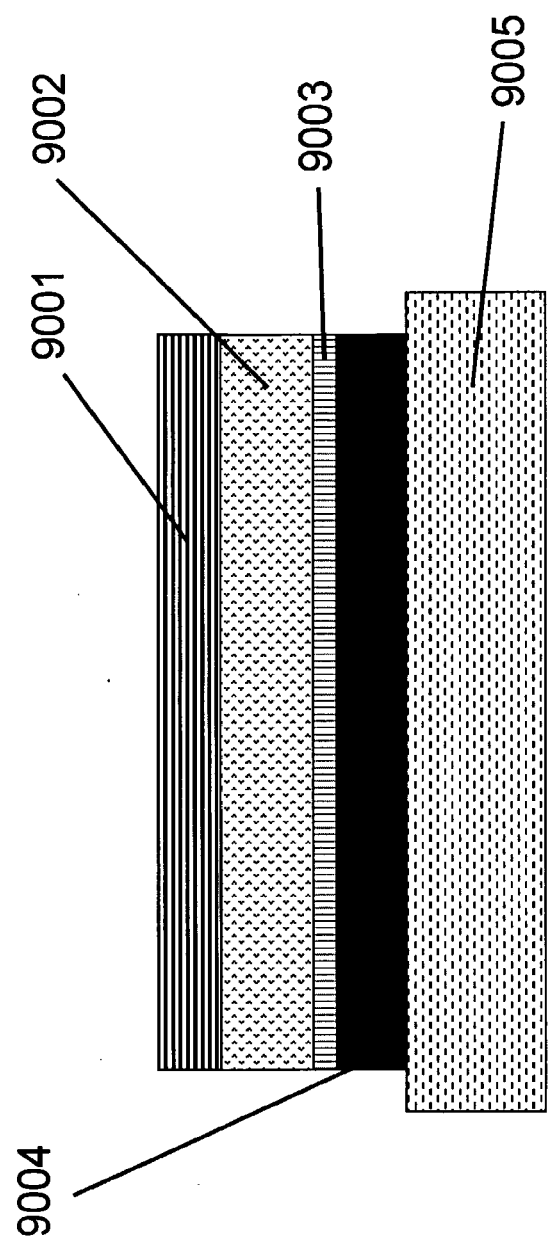
FIG. 90 illustrates a solar cell or photodetector based on carbon nanotube ribbons as a top transparent conducting electrode, in accordance with some embodiments of the present invention.

FIG. 90 depicts an organic solar cell or photodetector based on carbon nanotube ribbons as a front-surface transparent conducting electrode. As shown in FIG. 90, an organic solar cell or photodetector can be formed on a glass substrate 9005. First, the aluminum electrode 9004 is deposited on a glass substrate. ITO-coated glass substrates (<15 Ohm/sq with ~85% light transmission) were obtained from Delta Technologies Ltd. EL-grade PEDOT-PSS was purchased from Bayer AG. RR-P3HT and PCBM were purchased from American Dye Source. All materials were used as received without further purification. Applicants fabricated four devices on each substrate, each having an area of ~9 mm². The ITO-coated glass substrate was etched and cleaned before being plasma-treated for five minutes (90 seconds for flexible substrates) under $O_2$ gas. A layer of PEDOT:PSS 9003 was then spin-coated onto the substrate at 6100 rpm creating a 30-35 nm layer. The sample was then dried by being heated at ~120° C. for 100 minutes (60 minutes at 110° C. for flexible substrates) in a glove box. The photoactive material solution was dispersed by a magnetic stirrer for 3-7 days until it was optimally dispersed. The solution was then spin-coated onto the sample at 700 rpm creating a 50-60 nm layer using a toluene solution consisting of roughly a 1:2 ratio of PCBM and RR-P3HT. The final layer was made up of 65% RR-P3HT and 35% PCBM 9002. A carbon nanotube ribbon 9001 was then deposited. A surface profiler (AMBIOS XP-1) was used to measure film thickness. The finalized device was then annealed on a hot plate in a glove box at the desired temperature for a desired amount of time. The organic semiconductor or mixture of organic p-type and n-type semiconductors were deposited on this electrode. The solar cell was completed by application of the carbon nanotube nanofiber sheet. Nanotube sheets can be optionally densified using surface tension effects of an imbibed liquid. The rapid evaporation of the solvent absorbed in the sheet causes shrinkage in the sheet thickness direction leading to densification.

Example 71

As shown in FIG. 90, an organic solar cell or photodetector is formed on a plastic substrate (polyethylene naphthalate or polyethylene teraphthalate) as in Example 70 and in accordance with embodiments of the present invention.

Example 72

Figure 91:
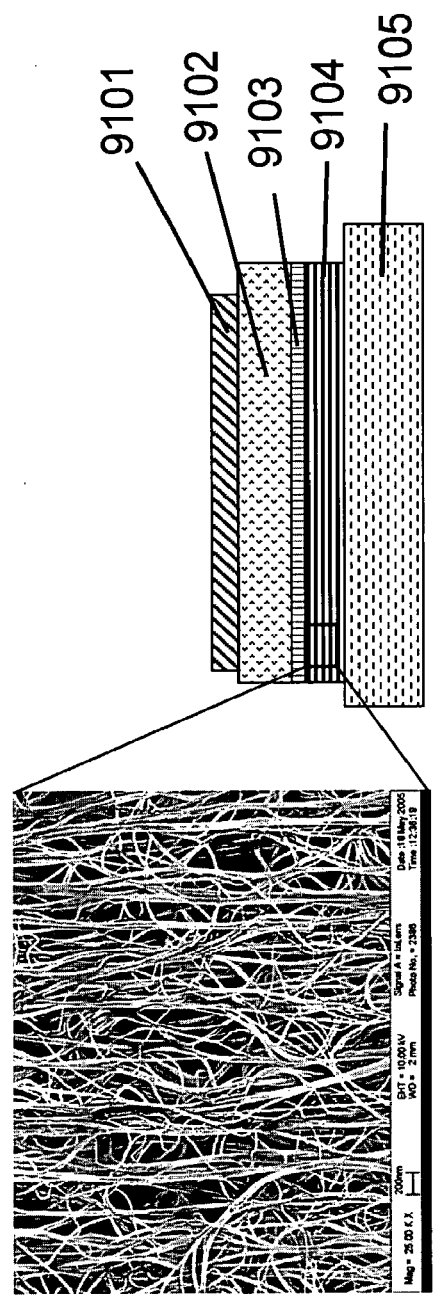
FIG. 91 illustrates a solar cell or photodetector based on carbon nanotube ribbons as a bottom transparent conducting electrode, in accordance with some embodiments of the present invention. A SEM image of part of the carbon nanotube ribbon electrode is also shown on the left, after 90° rotation from alignment in the device.

FIG. 91 shows a solar cell or photodetector based on carbon nanotube ribbons as a bottom transparent conducting electrode on a glass substrate. First, the aligned carbon nanotube sheet 9104 is deposited on a glass substrate 9105. An SEM image of enlarged aligned carbon nanotube sheet 9104 is shown on the left side of FIG. 91. Nanotube sheets can be optionally densified using the surface tension effects of an imbibed liquid. The rapid evaporation of the solvent absorbed in the sheet causes shrinkage leading to densification. A layer of PEDOT:PSS 9103 was then spin-coated onto the substrate at 6100 rpm creating a 30-35 nm layer. The sample was then dried by being heated at ~120° C. for 100 minutes (60 minutes at 110° C. for flexible substrates) in a glove box. The organic semiconductor or mixture of organic p-type and n-type semiconductors 9102 are then deposited on this electrode as in Example 70. The solar cell is completed by application of the aluminum electrode 9101 (typically by thermal vacuum deposition).

Example 73

This Example serves to illustrate a solar cell or photodetector based on carbon nanotube ribbons as a bottom transparent conducting electrode on a flexible plastic substrate (polyethylene naphthalate or polyethylene teraphthalate) as in Example 72. First, the carbon nanotube sheet is deposited on a glass substrate. Nanotube sheets can be optionally densified using the surface tension effects of an imbibed liquid (see above). The rapid evaporation of the solvent absorbed in the sheet causes shrinkage leading to densification. The organic semiconductor or mixture of organic p-type and n-type semiconductors are deposited on this electrode as in Example 70. The solar cell is completed by application of the aluminum electrode (typically by thermal vacuum deposition).

Example 74

Figure 92:
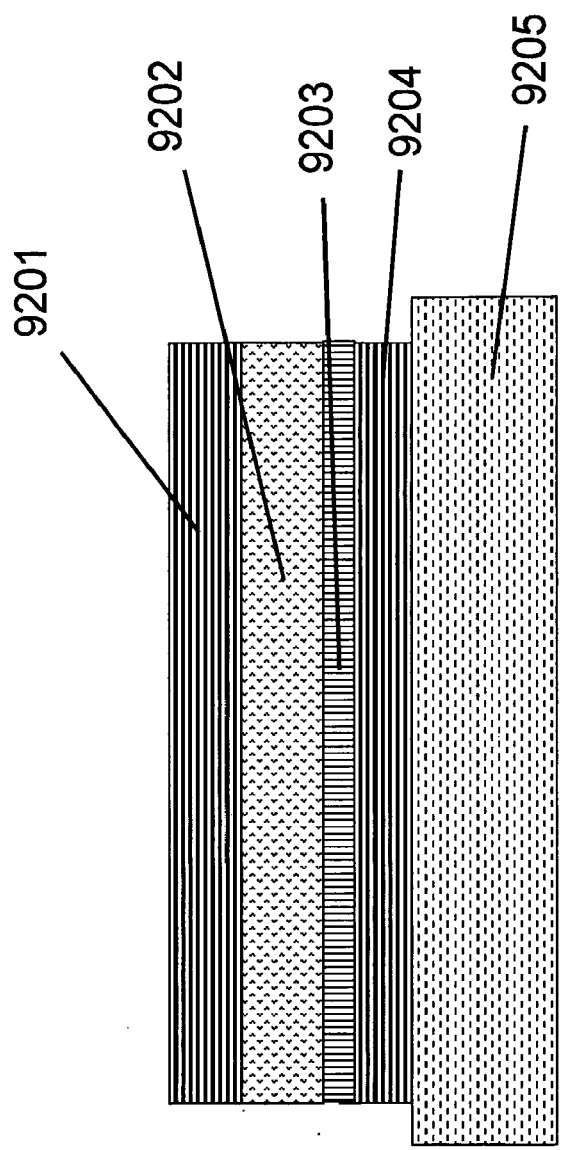
FIG. 92 illustrates a transparent solar cell or photodetector based on carbon nanotube ribbons as top and bottom transparent conducting electrodes, in accordance with some embodiments of the present invention.

This Example serves to illustrate the fabrication of a transparent solar cell with two transparent CNT sheets, in accordance with some embodiments of the present invention. FIG. 92 demonstrates a transparent solar cell or photodetector based on carbon nanotube ribbons/sheets as top and bottom transparent conducting electrodes. First, the carbon nanotube sheet 9204 is deposited on a solid glass or flexible plastic substrate 9205. Nanotube sheets can be optionally densified using the surface tension effects of an imbibed liquid. The rapid evaporation of the solvent absorbed in the sheet causes shrinkage leading to densification. A very thin Al layer 9203 (<100 nm) is then deposited on top of the CNT sheet. An organic semiconductor or mixture of organic p-type and n-type semiconductors 9202 are deposited on this Al-coated electrode. Owing to the small organic layer thickness, the active organic layer is also transparent. The transparent device is completed by application of the carbon nanotube sheet 9201. Nanotube sheets can be optionally densified using the surface tension effects of an imbibed liquid. The rapid evaporation of the solvent absorbed in the sheet causes shrinkage leading to densification. The transparent solar cells, for example, can be used in smart windows, displays, or smart multifunctional ceilings and covers for buildings.

Example 75

Figure 93:
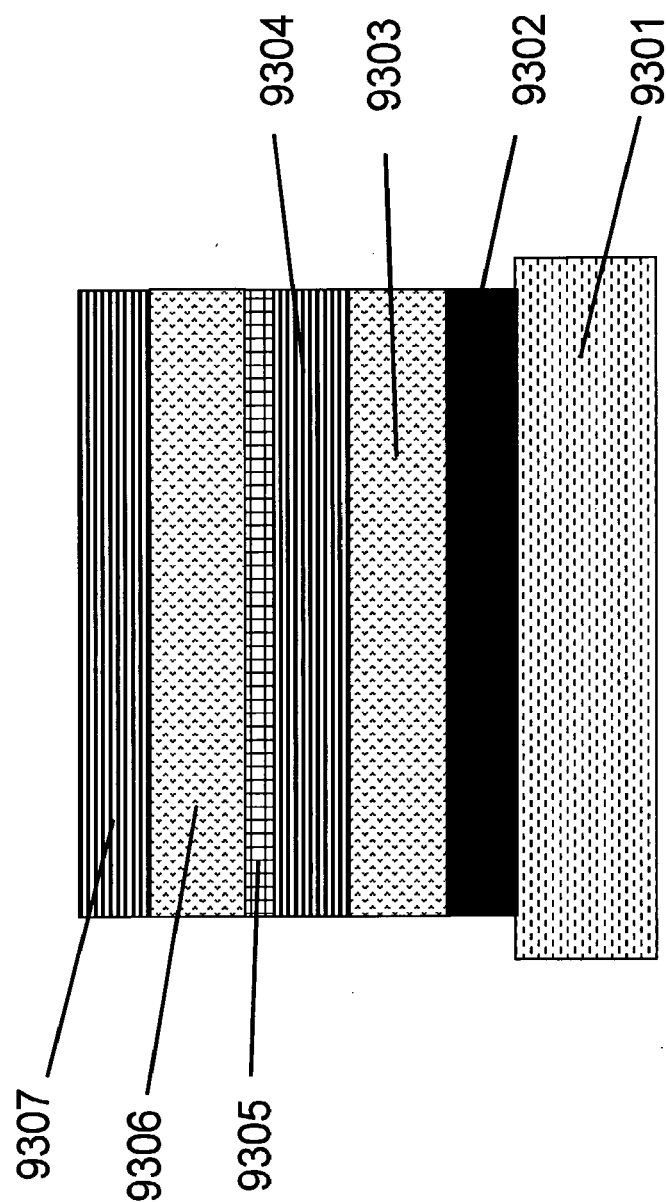
FIG. 93 illustrates a tandem solar cell or photodetector based on carbon nanotube ribbons as a upper transparent conducting electrodes.

FIG. 93 demonstrates a tandem solar cell or photodetector based on carbon nanotube ribbons/sheets as a top transparent conducting electrode. First, the bottom reflective aluminum electrode 9302 is deposited on a substrate 9301. The organic semiconductor or mixture of organic p-type and n-type semiconductors 9303 are deposited on this electrode. The first solar cell is completed by application of a carbon nanotube sheet 9304 as a transparent separation layer (also called charge recombination layer). Nanotube sheets can be optionally densified using the surface tension effects of an imbibed liquid. The rapid evaporation of the solvent absorbed in the sheet causes shrinkage in the thickness direction, leading to densification. A thin aluminum layer 9305 can be optionally deposited on a nanotube sheet electrode before application onto first cell to reduce voltage losses. The second layer of organic semiconductor or mixture of organic p-type and n-type semiconductors 9306 are deposited on this electrode. The tandem solar cell is completed by application of a top carbon nanotube sheet 9307. Again, such nanotube sheets can be optionally densified using the surface tension effects of an imbibed liquid.

Example 76

Figure 94:
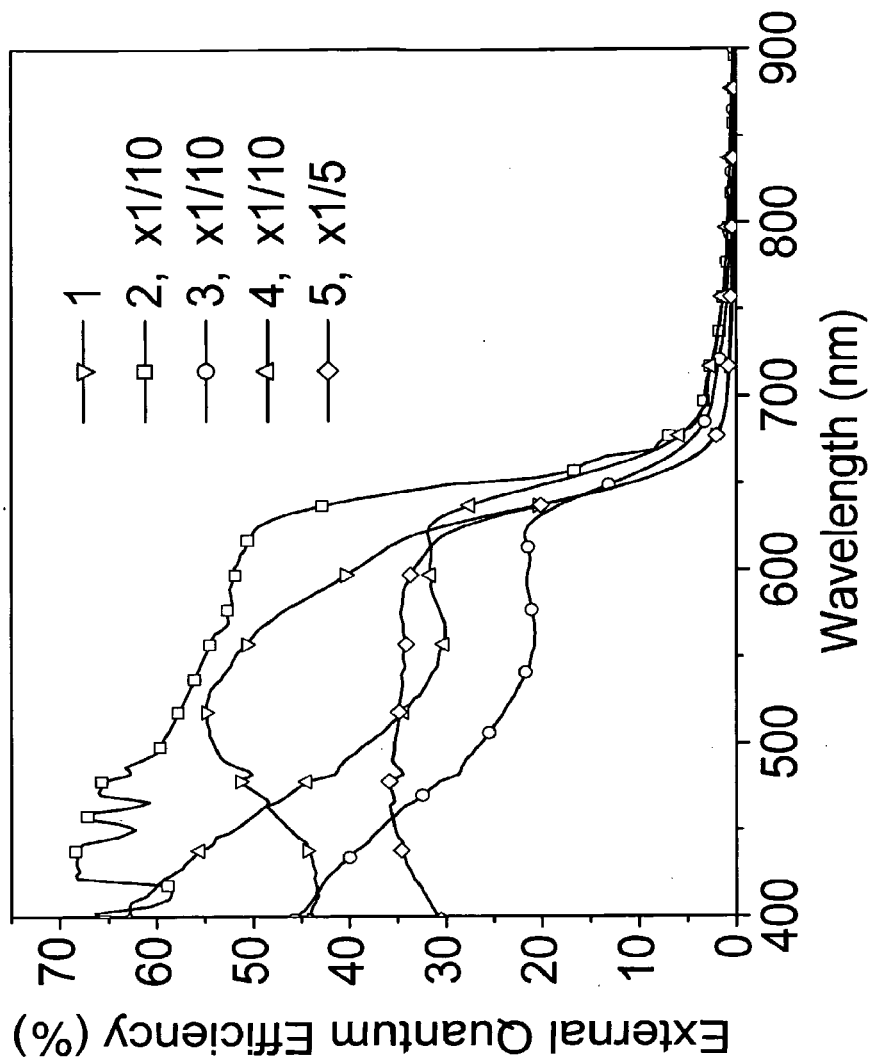
FIG. 94 shows the examples of spectral sensitivity of polymeric solar cells, demonstrating the additional functionality of carbon nanotube charge collectors for enhancement of light absorption and charge generation in UV and IR spectral bands. Curve 1 corresponds to ITO anode, curves 2-4 to carbon nanotube sheet anode, and curve 5 to carbon nanotube sheet anode coated with very thin Au/Pd layer.

This example demonstrates the additional functionality of carbon nanotube charge collectors for enhancement of light absorption and charge generation due to three-dimensionality and a nano-antenna effect in the solar cells (see FIG. 94). The large interface and nanoscale morphology between organic material and carbon nanotubes significantly improves the photo induced charge transfer, charge separation and collection. There is experimental evidence (FIG. 94) that spectral sensitivity is broadened due to additional photo induced charge transfer between organic material and carbon nanotubes. The extended and aligned nature of CNT sheets can improve the morphology between the acceptor and donor materials and extend the spectral sensitivity into the infrared range. It is known that localized plasmon excitations can occur in small metal nanoparticles by direct light absorption due to simpler selection rules. The excited plasmon can lead to an increased amount of photoexcited electrons in the metal which are capable of surmounting the Schottky barrier. For this purpose, carbon nanotubes decorated with metal nanoparticles have been examined. The high electric field strength in the vicinity of the excited surface plasmon can also lead to increased absorption of photons in the organic matrix. Thus, the effect of surface plasmons can lead to enhancement of photocurrent in organic solar cells in spectral regions where an organic material does not absorb much. The plasmon excitations in carbon nanotubes and metal coated nanofibers can enhance the UV spectral sensitivity of CNT-based solar cells and photodetectors. The absorption spectra were measured on a Perkin-Elmer Lambda 900 UV-Vis-NIR Spectrophotometer. The current-voltage characteristics were recorded with a Keithley 236 source-measure unit. A solar simulator (150W Xenon lamp with AM0 and AM1.5 filters from Spectra-Physics and focusing lens), with light intensity calibrated at 100 mW/cm$^2$, was used as the light source for solar cell efficiency measurements. The reported efficiency measurement was not corrected for spectral mismatch.

Example 77

Figure 97:
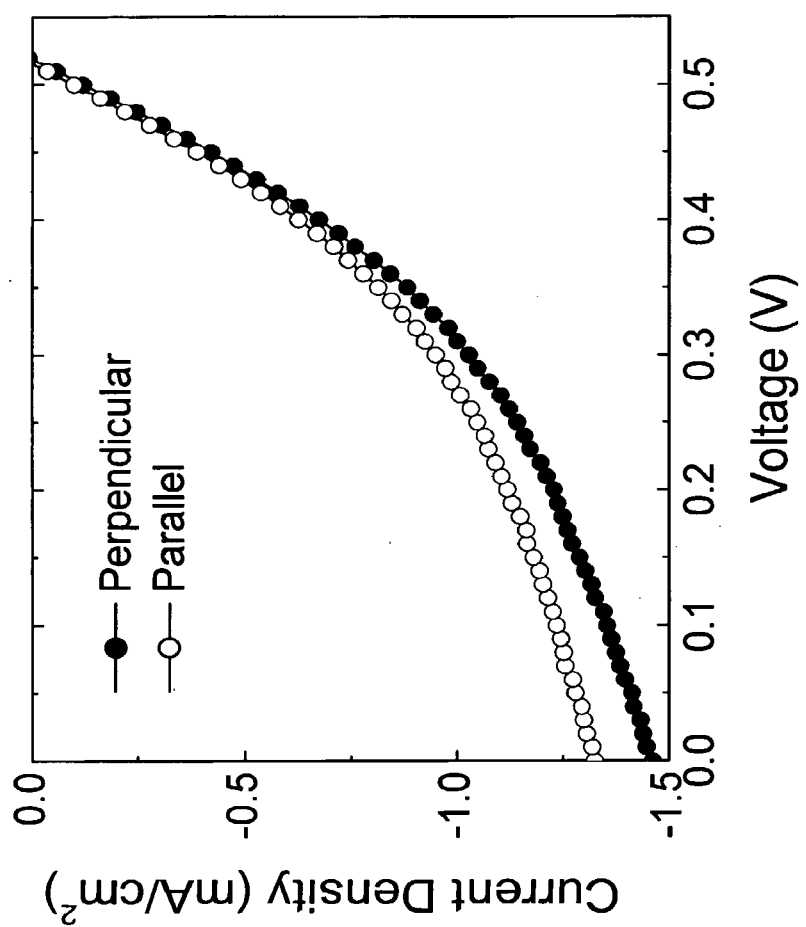
FIG. 97 shows current versus voltage curves of a polarization-sensitive photocell that utilizes a transparent oriented carbon nanotube sheet anode.

This example shows a transparent carbon nanotube sheet embedded in polarization-sensitive photodetectors. The high anisotropy of the aligned CNT sheet allows increasing the polarization ratio by 25%, as shown at I-V curve in FIG. 97. A broadband (300 nm-10 µm) polarization sensitive photodetector comprises carbon nanotube ribbons/sheets as a top transparent polarizing conducting electrode and an aluminum bottom electrode deposited on a glass or plastic substrate. The organic semiconductor or mixture of organic p-type and n-type semiconductors are deposited on this electrode. The high polarization ratio is achieved by mechanical rubbing of the organic layer or by other means (e.g., electric field alignment). The solar cell is completed by application of the carbon nanotube sheet. Nanotube sheets can be optionally densified using the surface tension effects of an imbibed liquid. The rapid evaporation of the solvent absorbed in the sheet causes shrinkage in the thickness direction leading to densification. The polarization ratio can be additionally increased by placing an additional CNT sheet on the Al bottom electrode to polarize the light reflected back from the Al electrode.

Example 78

Figure 98:
FIG. 98 shows an SEM image of a carbon nanotube sheet in which a very thin film (5 nm) of Au/Pd was sputtered on top of the nanotubes. An SEM image of an uncoated nanotube sheet is shown for comparison.
Figure 98:

This example shows a method of improving electrical conductivity and modulating the work function of carbon nanotube sheets by deposition of thin films of high work function metals such as Au or Pt on carbon sheet, as shown in FIG. 98. Sheet resistance can be lowered at least 5 times to 100 ohm/square. Coated by high work function metals such as Au or Pt, free-standing CNT sheets can be used as anodes for solar cells. FIG. 98 shows SEM image of Au/Pd-coated carbon nanotubes sheet.

Example 79

This example illustrates a method of improving electrical conductivity and modification of work function of carbon nanotube sheets by depositing thin films of low work function metals such as Al or Ca on such carbon sheets. Sheet resistance was lowered at least 5 times to 100 ohm/square. Coated by low work function metals such as Al or Ca, free-standing CNTs can be used as cathodes for solar cell.

Example 80

Figure 99:
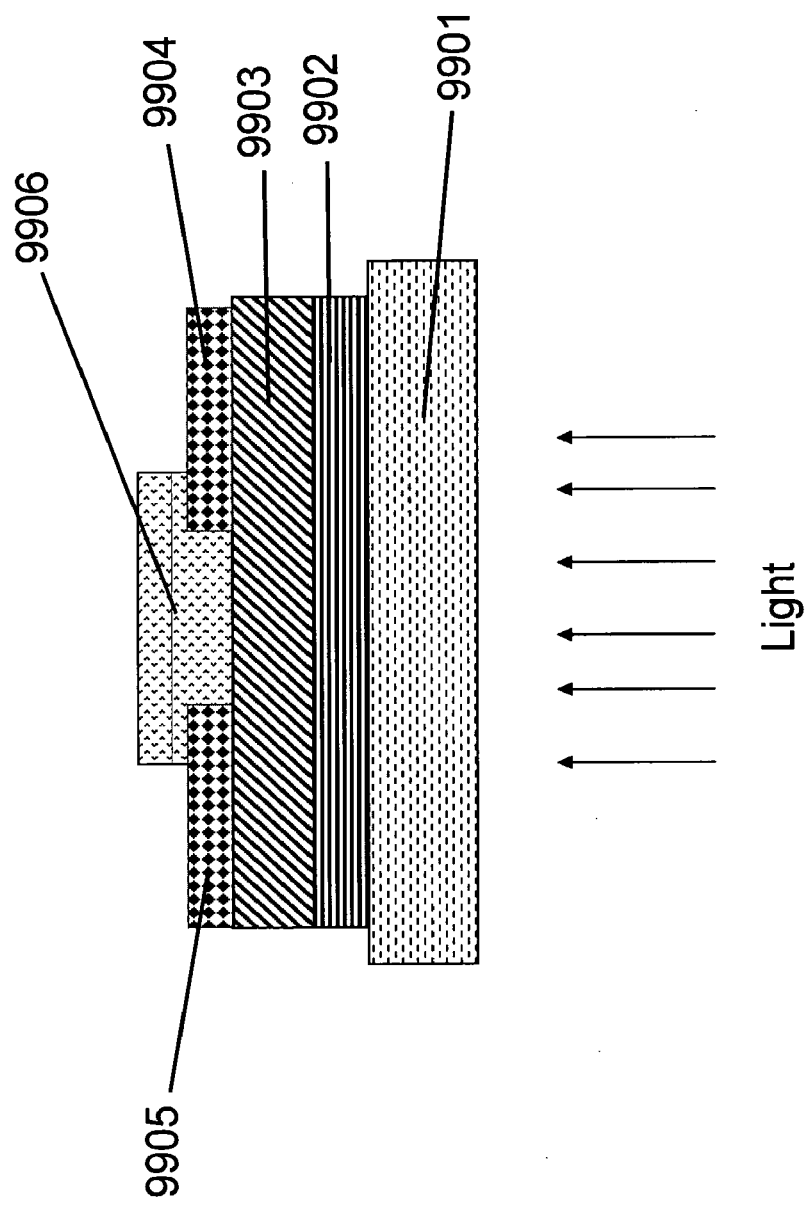
FIG. 99 schematically illustrates a transparent organic field effect transistor (OFET) with transparent gate, source and drain electrodes made of carbon nanotube sheets and the active channel of organic or polymeric semiconductor. The transparency of this device enables photomodulation of source-drain current, which is useful for optical chip-to-chip information transfer.

In some embodiments, the present invention can be broadly applied to a thin transparent organic transistor or phototransistor which comprises transparent CNT sheet electrodes, thin transparent under-gate insulator (inorganic or organic), and an organic photoactive layer, and can be used in the fabrication of a variety of transparent integrated circuits, including those for display applications and photodetectors. FIG. 99 depicts a transparent phototransistor based on carbon nanotube ribbons/sheets as a bottom transparent conducting electrode. First, the bottom transparent CNT sheet electrode 9902 is deposited on a substrate 9901. A transparent gate dielectric 9903, such as SiO$_2$ or Al$_2$O$_3$ or polymeric insulator such as parylene, is coated on top of electrode 9902. The source 9904 and drain electrodes 9905 are formed by placing two transparent carbon nanotube ribbons on top of the insulating layer. The transparent phototransistor is completed by deposition of organic semiconductor or mixture of organic p-type and n-type semiconductors 9906 on top of the structure. Nanotube sheets can be optionally densified using the surface tension effects of an imbibed liquid. The evaporation of the solvent absorbed in the sheet causes shrinkage in the thickness direction, leading to densification. The transparency of this device enables photomodulation of source-drain current, which is useful for optical chip-to-chip information transfer.

Example 81

This Example serves to illustrate the preparation of a transparent nanofiber-metal oxide photoelectrode, in accordance with some embodiments of the present invention. Transparent nanotube sheets made by the process of Examples 18 and 21 were deposited as an aligned sheet stack on a glass substrate. Because the nanotubes are well aligned in the sheet, the electrical and optical properties are anisotropic. Referring to FIG. 101, the transparent porous nanofiber electrode 10102 was fabricated according to the present invention. A semiconductor photoelectrode 10103 containing the metal oxide nanoparticles (for example, 10-20 nm TiO$_2$ nanoparticles) was coated on the rough surface of the transparent porous nanofiber electrode 10102 by a printing method or sol-gel method to form a film of approximately 10-20 µm thickness. Sintering and anatase phase formation was performed at 450° C. in the inert atmosphere for 30-60 minutes. After sintering, the layer exhibits a porosity of 0.5-0.65. A monolayer of red dye molecules was incorporated in the highly porous nanofiber-metal oxide electrode by impregnation, for example, with an absolute ethanol solution of the ruthenium dye-II cis-dithiocyanato-N,N'-bis (2,2'-bipyridyl-4,4'-dicarboxylic acid)-($H_2$)($TBA$)$_2$$RuL_2$(NCS)$_2$ ($H_2O$)$_4$ sensitizer at a concentration of 20 mg of dye per 100 ml of solution. The impregnation process can be done at room temperature overnight. The electrode was rinsed with ethanol and then dried.

Example 82

This Example serves to illustrate the preparation of a transparent nanofiber-metal oxide photoelectrode by microwave irradiation, in accordance with some embodiments of the present invention. Referring to FIG. 101, the transparent porous nanofiber electrode 10102 on plastic substrate was fabricated according to the Example 81. A semiconductor photoelectrode 10103 containing the metal oxide nanoparticles (for example, 10-20 nm $TiO_2$ nanoparticles) was coated on the rough surface of the transparent porous nanofiber electrode 10102 by a printing method or sol-gel method to form a film of approximately 10-20 μm thickness. Rapid sintering and anatase phase formation was performed by a multi-mode microwave heating at a frequency chosen from the range varying from 2 to 30 GHz and power of about 1 kW for 5 minutes. After sintering, the layer exhibits a porosity of 0.5-0.65. A monolayer of red dye molecules is attached to the surface of the highly porous nanofiber-metal oxide electrode by impregnation, for example, with an absolute ethanol solution of the Ruthenium dye-II cis-Dithiocyanato-N,N'-bis(2,2'-bipyridyl-4,4'-dicarboxylic acid)-($H_2$)($TBA$)$_2$$RuL_2$(NCS)$_2$($H_2O$)$_4$ sensitizer at a concentration of 20 mg of dye per 100 ml of solution. The impregnation process can be done at room temperature overnight. The electrode was rinsed with ethanol and then dried.

Example 83

This Example serves to illustrate the preparation of a nanofiber reduction electrode, in accordance with some embodiments of the present invention. The transparent porous nanofiber reduction electrode 10105 of FIG. 101 was fabricated according to embodiments of the present invention. No platinization of counter-electrode is necessary because the nanofibers work both as a charge collecting electrode and as a catalyst.

Example 84

This Example serves to illustrate the preparation of a dye-sensitized solar cell, in accordance with some embodiments of the present invention. The dye-sensitized solar cell is prepared by using semiconductor photo electrode and the nanofiber sheet reduction electrode obtained from Examples 81-82. These two electrodes are maintained at an interelectrode separation of 50-100 μm by using a spacer. The charge conducting agent is introduced in the space between these two electrodes and sealed. The charge conducting agent can be a redox couple in a liquid (including the following redox electrolytes: 1) iodolyte TG-50 (from Solaronix); 2) one based on methoxypropionitrile which has a low viscosity but low boiling point (bp 163-165 C); 3) one based on gamma-butyrolactone which also has low viscosity but higher boiling point (bp 206 C)) or quasi solid-state electrolyte, or solid-state hole conductor such as conjugated polymers (such as poly(3-hexylthiophene) or small organic molecules (such as TPD). The electrons generated from the photosensitive dye or quantum dots can be easily be transferred to an external circuit by using a highly conducting nanoporous nanofiber sheet comprising three-dimensionally distributed nanofibers. One optionally preferred is the carbon nanofiber sheets of invention embodiments. In addition, the electrodes can be made flexible and lightweight by using thin flexible transparent substrates. Such solar cell can be utilized in portable devices.

Example 85

This Example serves to illustrate the preparation of a transparent dye-sensitized solar cell (DSC), in accordance with some embodiments of the present invention. The dye-sensitized solar cell was prepared by using transparent semiconductor photoelectrode and the transparent reduction electrode obtained from Examples 81-83. To have a transparent DSC, the thickness of the top photoelectrode was limited by 10 μm. The thickness of the multi-walled carbon nanotube nanofiber ribbons/sheets is limited by 1-2 layers. Both electrodes maintain a spacing of 10-100 μm by a spacer. A charge conducting agent was introduced into the space between two electrodes and sealed. The charge conducting agent can be a redox couple in a liquid (including the following redox electrolytes: 1) iodolyte TG-50 (from Solaronix); 2) one based on methoxypropionitrile which has a low viscosity but low boiling point (bp 163-165° C.); 3) one based on gamma-butyrolactone which also has low viscosity but higher boiling point (bp 206° C.) or a quasi solid-state electrolyte, or a solid-state hole conductor, such as conjugated polymers (such as poly(3-hexylthiophene) or small organic molecules (such as TPD). The electrons generated from the photosensitive dye or quantum dots can be more easily transferred to an external circuit by a 3-dimensional distributed nanofiber electrode. In addition, the electrodes can be made flexible and lightweight by using thin flexible transparent substrates. Such solar cells can be utilized in portable devices.

Example 86

Figure 102:
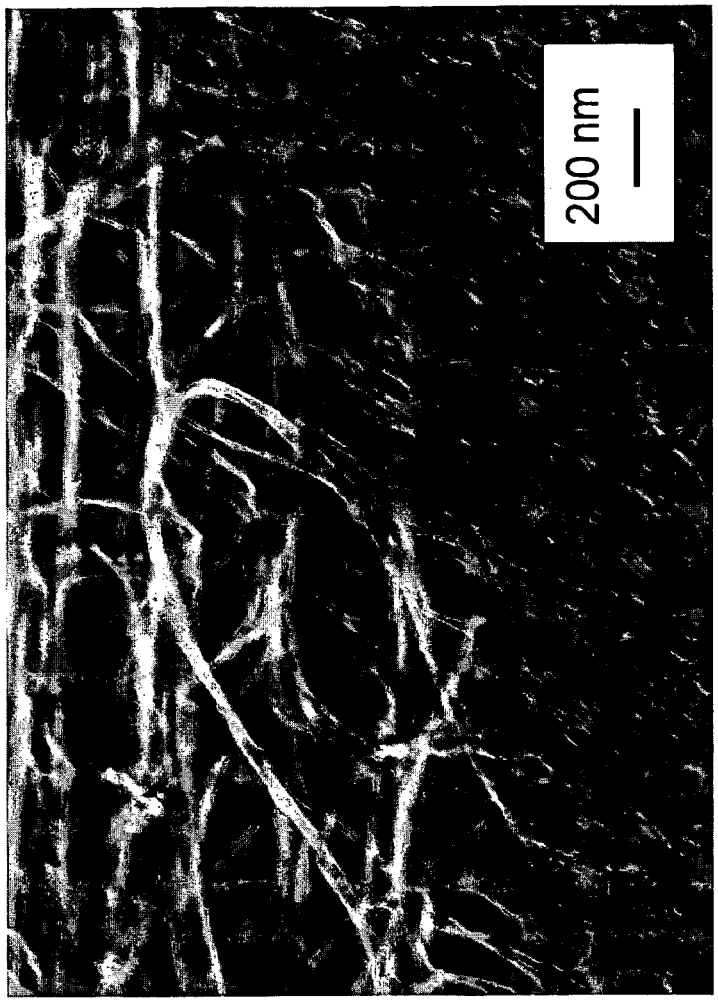
FIG. 102 shows an SEM image of single wall carbon nanotubes deposited from a liquid onto a transparent sheet of multiwall carbon nanotubes made using a solid-state sheet fabrication process or invention embodiments.

This example demonstrates that the performance of a dye-sensitized solar cell (DSC) can be improved by using the catalytic electrochemical properties of single wall nanotubes by coating them on the transparent anode made of multiwall nanotube transparent sheets of the present invention (see SEM image of such electrode in FIG. 102). By this process, Applicants show the enhancement of the electrochemical charge transfer of holes to the SWNT-coated anode. This example also describes a method for fabricating a composite nanotube sheet that is an effective anode for a photoelectrochemical device, i.e., a Graetzel cell. A ruthenium dye-II cis-dithiocyanato-N,N'-bis(2,2'-bipyridyl-4,4'-dicarboxylic acid)-($H_2$)($TBA$)$_2$$RuL_2$(NCS)$_2$($H_2O$)$_4$ (Dyesol, B2/N719) was used as a sensitizer for the $TiO_2$ particles. The prepared solution was $3 \times 10^{-4}$ M Ru (-II) dye in absolute ethanol ($CH_3CH_2OH$). The chemical structure of the dye is $RuC_{58}H_{86}N_8O_8S_2 \cdot 4H_2O$. The electrolyte was iodide-based redox electrolyte-iodolyte TG-50 (from "Solaronix"). Porous titania, $TiO_2$ (from "Dyesol") coated conducting substrate, fluorine-doped $SnO_2$ over layer with transmission >85% was used as the photo-electrode in assembling DSC cells. Before sensitizing the $TiO_2$, it was sintered at 450° C. for 30 minutes. The annealed film was immersed in a $3 \times 10^{-4}$ M Ru (-II) dye containing ethanol solution overnight (~12 hours) at room temperature. The $TiO_2$ electrode was dipped into the dye solution while it was still hot, i.e., its temperature was about 80° C. After the completion the dye adsorption, the electrode was dried under a stream of nitrogen, $N_2$.

The typical electrolyte was iodolyte TG-50 (from Solaronix), but other electrolytes also have been tested. The counter electrode was prepared of aligned multiwall carbon nanotube (MWNT) sheets on a glass substrate. On top of the sheet, a suspension of single wall nanotubes (SWNTs) was deposited by a 3 step method: (i) vacuum-filtering a dilute, surfactant-based suspension of purified nanotubes onto a filtration membrane (forming a homogeneous film on the membrane); (ii) washing away the surfactant with purified water; and (iii) dissolving the filtration membrane in solvent. The dissolvable filter was from Millipore (GS-0.22 micron). About 0.3 mg of SWNTs (HiPco from Carbon Nanotechnologies Inc.) in a 100 mL surfactant (Triton-1000) solution was used to make the SWNT dispersion. 3 mL of SWNT dispersion was added to 500 mL deionized water to make nanotube ink. Having prepared the necessary materials, photo and counter electrodes were placed together offsetting them against each other. The strip of each electrode served as contact points. In order to hold the electrodes together, two binder clips were used.

Example 87

This example shows that the performance of DSC can be further increased by using multiple nanotube sheets: Measurements show that current density—voltage characteristics of the MWNT sheet are comparable to the current density—voltage characteristic obtained when using only ITO as a counter electrode. The sheet of MWNTs works as an electrochemical catalyst, but due to high serial resistance of very thin electrodes the efficiency is lower than that for conventional ITO-based DSC. If, however, the number of MWNT sheets is increased, measurement shows higher electrochemical activity in the redox electrolyte system and the short circuit current ($I_{sc}$) increases with increasing number of MWNT sheets. Because of the increase in the number of layers, the contact area of MWNTs with electrolyte increases. Additionally, the serial resistance of the electrode decreases.

Example 88

Figure 103:
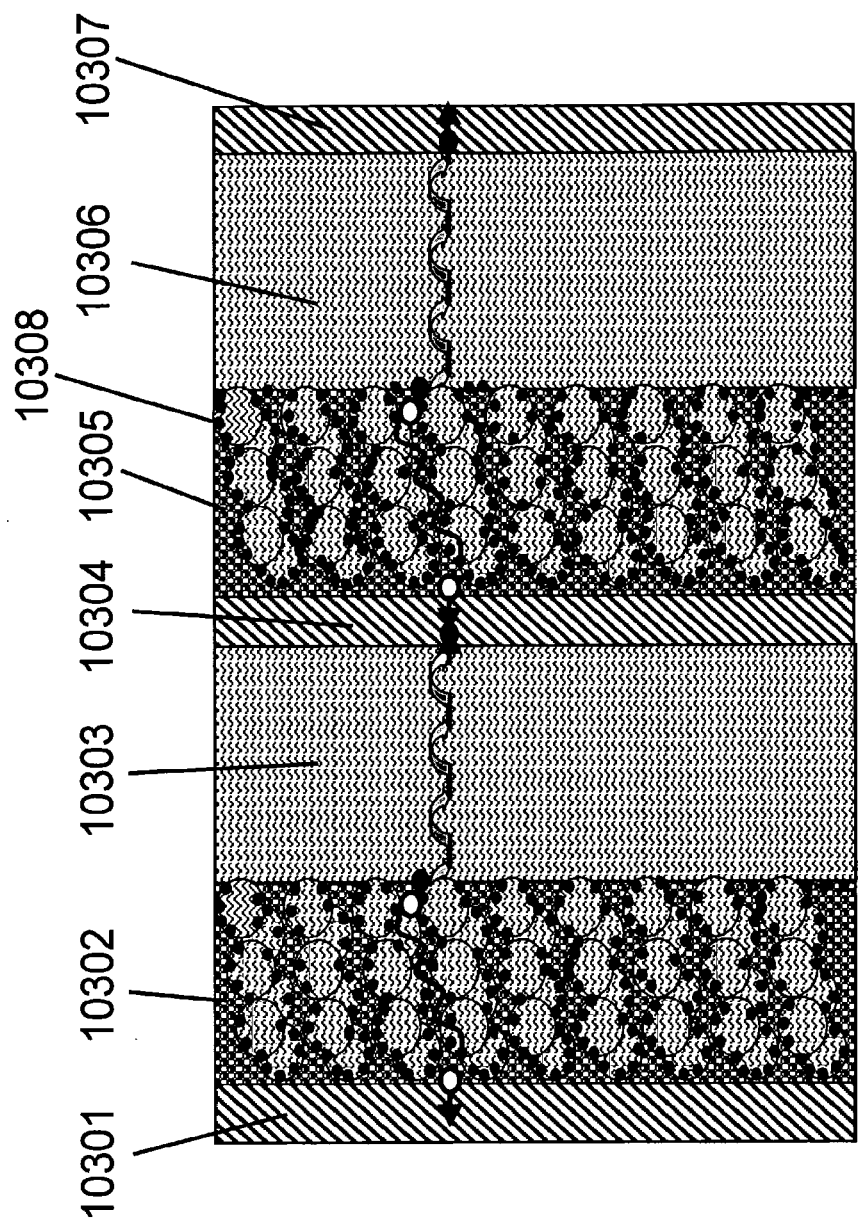
FIG. 103 illustrates a multijunction solar cell (tandem solar cell), in which the transparent top electrode (10301), and one or more transparent inner interconnect electrode sheets enable increased energy harvesting efficiency through expanding the harvested light to a broader region of the solar spectrum.

This Example serves to illustrate the preparation of a tandem solar cell, in accordance with some embodiments of the present invention. FIG. 103 illustrates a multijunction solar cell (or tandem solar cell) in which the top transparent electrode is sketched as 10301, together with transparent separation layer 10304 between the layers of single junction solar cells having selective spectral sensitivity to visible (cell 1, parts 10301-10304) and near infrared parts of solar spectrum (cell 2, parts 10304-10308). The tandem solar cell comprises two compartment cells. The top compartment is a dye- or quantum dot sensitized solar cell prepared by method described in Example 83. The porous metal oxide layer 10302 in the first compartment comprises nanoparticles with an average diameter of 10-20 nm. A monolayer of the red dye molecules 10308 (Ruthenium dye-II cis-Dithiocyanato-N,N'-bis(2,2'-bipyridyl-4,4'-dicarboxylic acid)-($H_2$)(TBA)$_2$RuL$_2$(NCS)$_2$($H_2$O)$_4$) is attached to the surface of the highly porous nanofiber-metal oxide electrode by impregnation, for example, with an ethanol solution of the RuC$_{58}$H$_{86}$N$_8$O$_8$S$_2$·4H$_2$O. This porous layer 10302 was then impregnated with redox electrolyte. The two compartments are separated with a transparent electrically-conducting nanofiber sheet 10304 imbedded in a transparent non-porous metal oxide matrix. This transparent separation electrode has a transparency of at least 70% in the region of interest. The second compartment is an infrared quantum dot sensitized solar cell prepared by method described in Example 83. The porous metal oxide layer 10305 in the second compartment comprises nanoparticles with an average diameter of 50-300 nm. A monolayer of the infrared quantum dot sensitizer is attached to the surface of the highly porous nanofiber-metal oxide electrode by impregnation with a hexane solution or by growing the quantum dots in situ inside pores of the metal oxide matrix. The infrared quantum dot sensitizers include, for example, PbSe or PbS semiconductor nanocrystals possessing charge multiplication properties. This porous layer was then impregnated with redox electrolyte 10306.

Example 89

This Example serves to illustrate the preparation of a tandem solar cell with a double sheet charge separation layer, in accordance with some embodiments of the present invention. The dye-sensitized tandem solar cell was prepared by using a semiconductor photo electrode and the reduction electrode obtained from Example 88. A double sheet charge separation layer in a tandem, with a transparent nanotube sheet of p-type (high work function) facing the first junction, while the n-type (low work function) nanotube sheet coated on first one acts as an electron collecting layer from the second junction. Electrical conductivity and modification of the work function of the charge separation layer in a tandem is accomplished by deposition of thin film of gold Au metal (50 nm) on the carbon sheet on one side (which decrease sheet resistance 5 times to 100 ohm/square) and the other side is coated by a low work function metal such as Al or Ca.

Example 90

This example shows that an elastomerically deformable nanotube sheet can be made by the process of Example 32 and then overcoated with a second elastomeric silicone rubber sheet, while retaining the ability of the nanotube sheet to be elastomerically deformed without producing a significant dependence of nanotube sheet resistance on elongation of the nanotube sheet. The importance of this demonstration is that it enables the fabrication of high strain actuator stacks comprising more that one layer of actuator material (such as an electrostrictive rubber like silicone rubber) and more than two electrodes. After fabrication of the silicone-rubber-attached elastomeric nanotube sheet of Example 32, stretch was relaxed and a second silicone rubber sheet was attached on top of the carbon nanotube sheet by liquid coating with a silicone rubber resin followed by setting of the silicone liquid resin. After this process (which produced an elastomerically deformable nanotube sheet between two silicone rubber sheets), the inventors found that the nanotube sheet (and associated silicone rubber sheets) can be highly elongated without causing a significant change in the resistance of the nanotube sheet. This process can be conveniently extended to produce elastomerically-deformable stacks comprising one or more nanotube electrode sheets that are laminated between sheets of elastomer, wherein the number of alternating nanotube sheet electrodes and elastomer sheet electrodes is arbitrarily large. The method of this example and Example 32 can be used to produce inflatable balloons containing one or more layers of conducting nanotube sheets. To start the process of conducting balloon formation, the initial inner balloon layer can optionally be inflated using a gas or liquid or formed on a mandrel will in non-inflated state, and subsequently un-expanded before application of the first nanotube sheet.

Example 91

Figure 63:
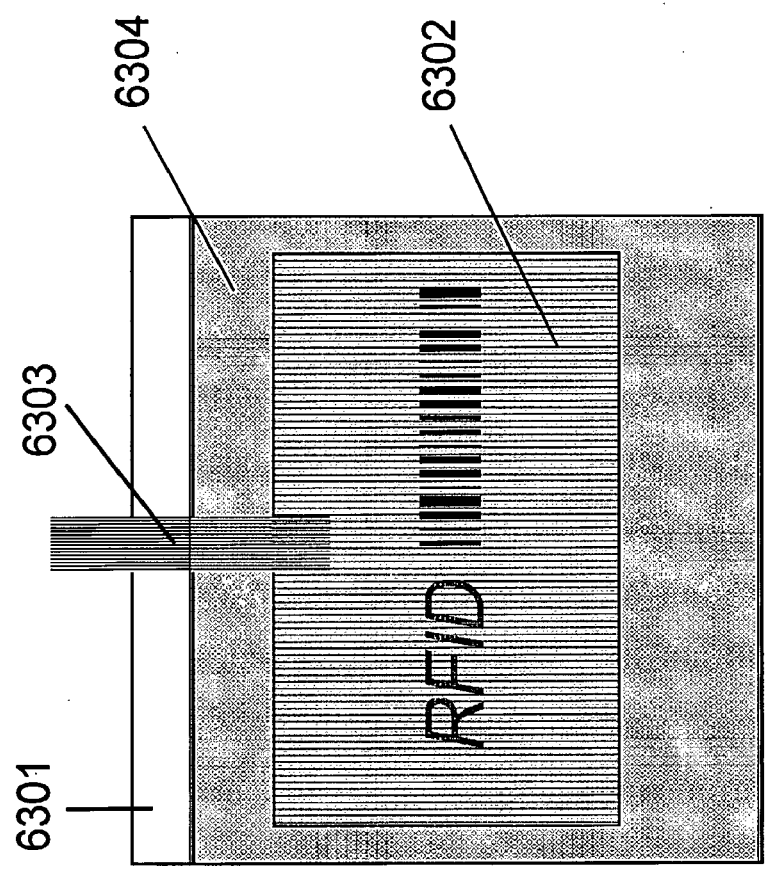
FIG. 63 schematically illustrates a transparent antenna, made of oriented nanofiber sheets that are laminated on an optionally flexible or elastomeric insulating substrate FIG. 64 schematically illustrates a nanofiber-sheet-based heat exchanger for dissipation of excessive heat from microelectronic chips. The nanotube sheet is connected by lamination to the heat sink, shown as a copper plate.

This example describes a flexible and or elastomeric transparent antenna, shown schematically at FIG. 63. Such antenna can be made by laminating the optionally rigid, or flexible (and/or elastomeric) insulating substrate with the following components: a remote feeder, in a form of a microstrip line, such a feeder been separated by a thin insulating layer and located below the radiator/receiver layer, which is made of transparent oriented nanofiber ribbons that are laminated on a flexible or elastomeric. Such antenna, in a receiving mode, can be used in radio-frequency identification (RFID) systems. Reflecting the transparency of nanofiber sheets of invention embodiments, the nanofiber-sheet-based antennas can be transparent. This transparency can enable, for instance, readability of underlying bar code lines associated with the tag. The device configuration and components are shown in FIG. 63. Component 6301 of said antenna is composed of substrate 6301, aligned nanotube sheet radiator/receiver plate 6302, and nanotube sheet or yarn array feeder 6303, and the thin insulating separation layer 6304. The patterning of sheet 6302 will allow one to adjust the frequency of the antenna. Such optionally elastomeric antennas can be made of one uniform size, and then stretched to obtain a desired size and desired antennae properties.

All patents and publications referenced herein are hereby incorporated by reference. The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process of producing a nanofiber ribbon or sheet comprising the following steps:
    (a) arranging nanofibers to provide a substantially parallel nanofiber array having a degree of inter-fiber connectivity within the nanofiber array; and
    (b) drawing said nanofibers from the nanofiber array as a ribbon or sheet without substantially twisting the ribbon or sheet, wherein the ribbon or sheet is at least one millimeter in width.

2. The process of claim 1 further comprising depositing said ribbon or sheet on a substrate.

3. The process of claim 1 wherein
    (a) the nanofibers have a minimum length-to-thickness ratio of at least approximately 10, and
    (b) the minimum ratio of nanofiber length to ribbon or sheet thickness is greater than approximately 5.

4. The process of claim 1 wherein the ribbon or sheet is at least 3.4 centimeters in width.

5. A process for producing a nanofiber ribbon or sheet from a nanofiber forest that comprises the following steps:
    (a) producing a nanofiber forest comprising nanofibers, wherein the nanofiber forest is suitable for drawing ribbons or sheets from the nanofiber forest, wherein the ribbon or sheet would be at least one millimeter in width, and wherein the nanofiber forest has a sidewall;
    (b) connecting an attachment to the sidewall or near the sidewall of the nanofiber forest; and
    (c) drawing the nanofiber ribbon or sheet from the nanofiber forest by drawing upon the attachment.

6. The process of claim 5, wherein the nanofiber forest is a forest of carbon nanotubes in which the carbon nanotubes are intermittently bundled.

7. A process comprises the following steps:
    (a) producing a carbon nanotube forest comprising nanotubes, wherein the carbon nanotube forest is suitable for drawing ribbons or sheets from the carbon nanotube forest, wherein the ribbon or sheet is at least one millimeter in width and wherein the carbon nanotube forest has a sidewall;
    (b) connecting an attachment to the sidewall or near the sidewall of the carbon nanotube forest;
    (c) drawing the ribbon or sheet from the carbon nanotube forest by drawing upon the attachment, wherein the ribbon or sheet is a highly oriented aerogel ribbon or sheet; and
    (d) infiltrating the sheet or ribbon with a liquid and subsequently evaporating the liquid from the sheet or ribbon, wherein the infiltration and evaporation at least partially densifies the sheet or ribbon and forms a densified sheet or ribbon.

8. The process of claim 2 further comprising infiltrating the ribbon or sheet with a liquid and subsequently evaporating the liquid from the ribbon or sheet, wherein the infiltration and evaporation at least partially densifies the ribbon or sheet and forms a densified ribbon or sheet.

9. The process of claim 1, wherein the ribbon or sheet drawn from the array is a highly oriented aerogel ribbon or sheet.

10. The process of claim 1, wherein the nanofiber array is a forest of nanofibers, and said drawing is from a sidewall of the forest, and wherein said degree of inter-fiber connectivity comprises a degree of intermittent bundling in the forest in which individual nanofibers migrate between different bundles of the nanofibers whereby said drawing of the nanofibers from a sidewall of the forest draws the nanofibers as a ribbon or sheet without twisting of the ribbon or sheet.

11. The process of claim 10, wherein the forest of nanofibers is a forest of carbon nanotubes.

12. The process of claim 2, wherein the nanofiber array is a forest of nanofibers, and said drawing is from a sidewall of the forest, and wherein said degree of inter-fiber connectivity comprises a degree of intermittent bundling in the forest in which individual nanofibers migrate between different bundles of the nanofibers whereby said drawing of the nanofibers from a sidewall of the forest draws the nanofibers as a ribbon or sheet without twisting of the ribbon or sheet.

13. The process of claim 12, wherein the forest of nanofibers is a forest of carbon nanotubes.

14. A process of producing a nanofiber ribbon or sheet comprising the following steps:
    (a) arranging nanofibers to provide a forest of parallel nanofibers, and
    (b) drawing said nanofibers from a sidewall of the forest without twisting,
    wherein
        (i) the nanofibers of the forest have a degree of intermittent bundling in the forest in which individual nanofibers migrate between different bundles of the nanofibers whereby said drawing of the nanofibers from a sidewall of the forest draws the nanofibers as a ribbon or sheet without twisting of the ribbon or sheet, and
        (ii) the ribbon or sheet is a least one millimeter in width.

15. The process of claim 14 further comprising depositing said ribbon or sheet on a substrate.

16. The process of claim 14 further comprising infiltrating the ribbon or sheet with a liquid and subsequently evaporating the liquid from the ribbon or sheet, wherein the infiltration and evaporation at least partially densifies the ribbon or sheet and forms a densified ribbon or sheet.

17. The process of claim 14, wherein the ribbon or sheet drawn from the array is a highly oriented aerogel ribbon or sheet.

18. The process of claim 14, wherein the forest of nanofibers is a forest of carbon nanotubes.

* * * * *